United States Patent
Sasada et al.

(10) Patent No.: US 11,271,166 B2
(45) Date of Patent: Mar. 8, 2022

(54) LIGHT EMITTING DEVICE AND COMPOSITION USEFUL FOR PRODUCTION OF SAME LIGHT EMITTING DEVICE

(71) Applicant: Sumitomo Chemical Company, Limited, Tokyo (JP)

(72) Inventors: Toshiaki Sasada, Tsukuba (JP); Ryuji Matsumoto, Tsukuba (JP); Tomoyasu Yoshida, Tokyo (JP)

(73) Assignee: SUMITOMO CHEMICAL COMPANY, LIMITED, Tokyo (JP)

( * ) Notice: Subject to any disclaimer, the term of this patent is extended or adjusted under 35 U.S.C. 154(b) by 417 days.

(21) Appl. No.: 16/333,871

(22) PCT Filed: Sep. 27, 2017

(86) PCT No.: PCT/JP2017/034966
§ 371 (c)(1),
(2) Date: Mar. 15, 2019

(87) PCT Pub. No.: WO2018/062278
PCT Pub. Date: Apr. 5, 2018

(65) Prior Publication Data
US 2019/0214569 A1    Jul. 11, 2019

(30) Foreign Application Priority Data
Sep. 29, 2016 (JP) .............................. JP2016-190842

(51) Int. Cl.
*H01L 51/50* (2006.01)
*H01L 51/00* (2006.01)

(52) U.S. Cl.
CPC ........ *H01L 51/0061* (2013.01); *H01L 51/007* (2013.01); *H01L 51/0039* (2013.01); *H01L 51/0043* (2013.01); *H01L 51/0067* (2013.01); *H01L 51/0072* (2013.01); *H01L 51/0073* (2013.01); *H01L 51/0074* (2013.01); *H01L 51/50* (2013.01); *H01L 51/0003* (2013.01); *H01L 51/5012* (2013.01); *H01L 51/5016* (2013.01); *H01L 51/5088* (2013.01); *H01L 51/5092* (2013.01); *H01L 2251/5376* (2013.01)

(58) Field of Classification Search
None
See application file for complete search history.

(56) References Cited

U.S. PATENT DOCUMENTS

| | | |
|---|---|---|
| 2012/0199825 A1 | 8/2012 | Soga et al. |
| 2016/0043325 A1 | 2/2016 | Gorohmaru et al. |
| 2016/0056393 A1 | 2/2016 | Oikawa et al. |
| 2017/0040541 A1 | 2/2017 | Kugler |
| 2017/0084844 A1 | 3/2017 | Parham et al. |
| 2017/0117491 A1 | 4/2017 | Sasada et al. |
| 2017/0186972 A1* | 6/2017 | Ren ............... C07D 487/14 |
| 2017/0358751 A1 | 12/2017 | Pan et al. |
| 2017/0369773 A1 | 12/2017 | Parham et al. |
| 2018/0269406 A1 | 9/2018 | Stoessel et al. |

FOREIGN PATENT DOCUMENTS

| | | | |
|---|---|---|---|
| JP | 2010174051 A | 8/2010 | |
| JP | 2012028726 | * 2/2012 | ............ H01L 51/50 |
| JP | 2012028726 A | 2/2012 | |
| WO | 2012096263 A1 | 7/2012 | |
| WO | 2014163083 A1 | 10/2014 | |
| WO | 2015135625 A1 | 9/2015 | |
| WO | 2015156235 A1 | 10/2015 | |
| WO | 2015159090 A1 | 10/2015 | |
| WO | 2016086886 A1 | 6/2016 | |
| WO | 2016091351 A1 | 6/2016 | |
| WO | 2016091353 A1 | 6/2016 | |

OTHER PUBLICATIONS

Office Action dated Sep. 17, 2020 in TW Application No. 106133131.
Extended European Search Report dated Apr. 3, 2020 in EP Application No. 17856227.8.
Office Action dated Jan. 16, 2020 in JP Application No. 2018542647.
International Search Report dated Dec. 26, 2017 in International Application No. PCT/JP2017/034966.
Written Opinion dated Dec. 26, 2017 in International Application No. PCT/JP2017/034966.
Office Action dated Jul. 22, 2020 in CN Application No. 201780059346.0.
Office Action dated Jun. 4, 2020 in JP Application No. 2018542647 (with English Machine Translation).
Office Action dated Mar. 26, 2021 in KR Application No. 1020197011474.
Office Action dated Oct. 22, 2021 in EP Application No. 17856227.8.

* cited by examiner

*Primary Examiner* — Gregory D Clark
(74) *Attorney, Agent, or Firm* — Panitch Schwarze Belisario & Nadel LLP

(57) ABSTRACT

A light emitting device having an anode, a cathode, a first organic layer disposed between the anode and the cathode and a second organic layer disposed between the anode and the cathode is provided. The first organic layer is a layer containing a compound (T) in which the absolute value of the difference between the energy level at the lowest triplet excited state and the energy level at the lowest singlet excited state is 0.5 eV or less and not containing a phosphorescent metal complex. The second organic layer is a layer containing a crosslinked body of a polymer compound containing a crosslink constitutional unit and the energy level at the lowest triplet excited state of the polymer compound is 2.25 eV or more.

19 Claims, No Drawings

LIGHT EMITTING DEVICE AND COMPOSITION USEFUL FOR PRODUCTION OF SAME LIGHT EMITTING DEVICE

CROSS-REFERENCE TO RELATED APPLICATION

This application is a Section 371 of International Application No. PCT/JP2017/034966, filed Sep. 27, 2017, which was published in the Japanese language on Apr. 5, 2018 under International Publication No. WO 2018/062278 A1, which claims priority under 35 U.S.C. § 119(b) to Japanese Application No. 2016-190842, filed Sep. 29, 2016, and the disclosures of which are incorporated herein by reference.

TECHNICAL FIELD

The present invention relates to a light emitting device and a composition useful for production of the light emitting device.

BACKGROUND ART

Organic electroluminescent devices (hereinafter, referred to also as light emitting device) can be used suitably for applications of display and illumination, and have been researched and developed. For example, Patent Document 1 describes a light emitting device having an organic layer containing a polymer compound (P-2) represented by the following formula and a light emitting layer containing a light emitting material having a carbazole skeleton.

[Chemical Formula 1]

polymer compound (P-2)

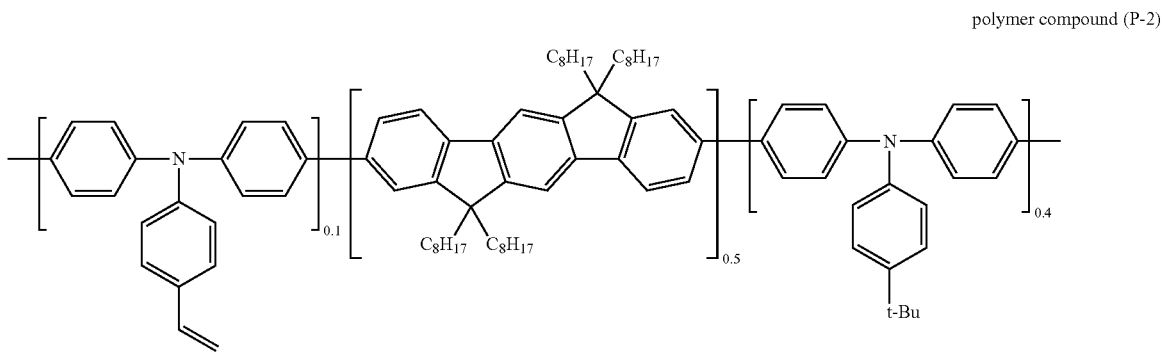

PRIOR ART DOCUMENT

Patent Document

Patent Document 1: International Publication WO2016/091351

SUMMARY OF THE INVENTION

Problem to be Solved by the Invention

However, the light emitting device described above is not necessarily sufficient in external quantum efficiency.

Then, the present invention has an object of providing a light emitting device excellent in external quantum efficiency. Further, the present invention has an object of providing a composition which is useful for production of this light emitting device.

Means for Solving the Problem

The present invention provides the following [1] to [13].
[1] A light emitting device having an anode, a cathode, a first organic layer disposed between the anode and the cathode and a second organic layer disposed between the anode and the cathode, wherein
the above-described first organic layer is a layer containing a compound (T) in which the absolute value of the difference between the energy level at the lowest triplet excited state and the energy level at the lowest singlet excited state is 0.5 eV or less and not containing a phosphorescent metal complex,
[2] the above-described second organic layer is a layer containing a crosslinked body of a polymer compound containing a crosslink constitutional unit and the energy level at the lowest triplet excited state of the polymer compound is 2.25 eV or more.
[2] The light emitting device according to [1], wherein the above-described crosslink constitutional unit is a constitutional unit having at least one crosslink group selected from Group A of crosslink group:
(Group A of Crosslink Group)

[Chemical Formula 2]

 (XL-1)

-continued

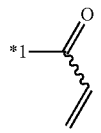 (XL-2)

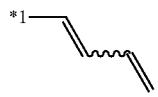 (XL-3)

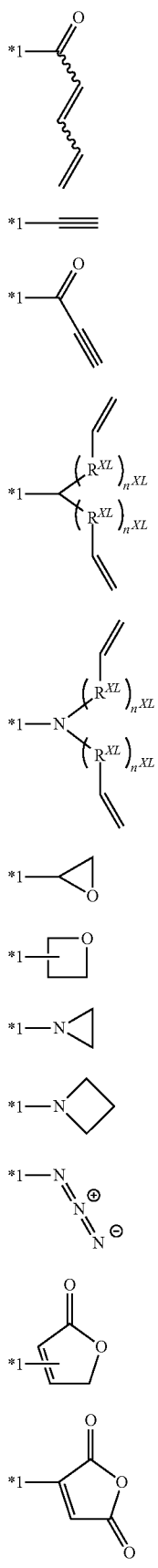

(XL-4)

(XL-5)

(XL-6)

(XL-7)

(XL-8)

(XL-9)

(XL-10)

(XL-11)

(XL-12)

(XL-13)

(XL-14)

(XL-15)

-continued

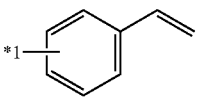 (XL-16)

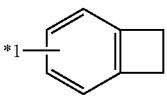 (XL-17)

[wherein, $R^{XL}$ represents a methylene group, an oxygen atom or a sulfur atom, and $n^{XL}$ represents an integer of 0 to 5. When a plurality of $R^{XL}$ are present, they may be the same or different. When a plurality of $n^{XL}$ are present, they may be the same or different. *1 represents a binding position. These crosslink groups optionally have a substituent.].

[3] The light emitting device according to [2], wherein the above-described crosslink constitutional unit is a constitutional unit represented by the formula (2) or a constitutional unit represented by the formula (2'):

[Chemical Formula 3]

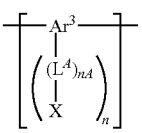 (2)

[wherein, nA represents an integer of 0 to 5, and n represents 1 or 2. When a plurality of nA are present, they may be the same or different.

$Ar^3$ represents an aromatic hydrocarbon group or a hetero ring group, and these groups optionally have a substituent.

$L^A$ represents an alkylene group, a cycloalkylene group, an arylene group, a divalent hetero ring group, a group represented by —N(R')—, an oxygen atom or a sulfur atom, and these groups optionally have a substituent. R' represents a hydrogen atom, an alkyl group, a cycloalkyl group, an aryl group or a monovalent hetero ring group, and these groups optionally have a substituent. When a plurality of $L^A$ are present, they may be the same or different.

X represents a crosslink group selected from the above-described Group A of crosslink group. When a plurality of X are present, they may be the same or different.]

[Chemical Formula 4]

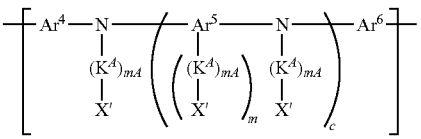 (2')

[wherein, mA represents an integer of 0 to 5, m represents an integer of 1 to 4 and c represents 0 or 1. When a plurality of mA are present, they may be the same or different.

$Ar^5$ represents an aromatic hydrocarbon group, a hetero ring group or a group in which at least one aromatic hydrocarbon ring and at least one hetero ring are bonded directly, and these groups optionally have a substituent.

$Ar^4$ and $Ar^6$ each independently represent an arylene group or a divalent hetero ring group, and these groups optionally have a substituent.

$Ar^4$, $Ar^5$ and $Ar^6$ each may be bonded directly or bonded via an oxygen atom or a sulfur atom to a group other than this group, bonded to a nitrogen atom to which the group is attached, to form a ring.

$K^A$ represents an alkylene group, a cycloalkylene group, an arylene group, a divalent hetero ring group, a group represented by —N(R')—, an oxygen atom or a sulfur atom, and these groups optionally have a substituent. R' represents the same meaning as described above. When a plurality of $K^A$ are present, they may be the same or different.

X' represents a crosslink group selected from the above-described Group A of crosslink group, a hydrogen atom, an alkyl group, a cycloalkyl group, an aryl group or a monovalent hetero ring group, and these groups optionally have a substituent. When a plurality of X' are present, they may be the same or different. However, at least one X' is a crosslink group selected from the above-described Group A of crosslink group.].

[4] The light emitting device according to any one of [1] to [3], wherein the above-described compound (T) is a compound represented by the formula (T-1):

[Chemical Formula 5]

(T-1)

[wherein, $n^{T1}$ represents an integer of 0 or more and 5 or less. When a plurality of $n^{T1}$ are present, they may be the same or different.

$Ar^{T1}$ represents an aryl group, a substituted amino group or a monovalent hetero ring group, and these groups optionally have a substituent. When a plurality of $Ar^{T1}$ are present, they may be the same or different and may be bonded directly or bonded via a divalent group to form a ring. However, at least one of $Ar^{T1}$ is a substituted amino group or a monovalent hetero ring group containing a nitrogen atom having no double bond in the ring and not containing a group represented by =N—, a boron atom, a group represented by —C(=$Z^{T1}$)—, a group represented by —S(=O)—, a group represented by —S(=O)$_2$— and a group represented by the formula (P):

[Chemical Formula 6]

(P)

in the ring. $Z^{T1}$ represents an oxygen atom, a sulfur atom or a group represented by =N($R^{ZT1}$)—. $R^{ZT1}$ represents a hydrogen atom, an alkyl group, a cycloalkyl group, an aryl group or a monovalent hetero ring group, and these groups optionally have a substituent.

$L^{T1}$ represents an alkylene group, a cycloalkylene group, an arylene group, a divalent hetero ring group, a group represented by —N($R^{T1'}$)—, an oxygen atom or a sulfur atom, and these groups optionally have a substituent. $R^{T1'}$ represents a hydrogen atom, an alkyl group, a cycloalkyl group, an aryl group or a monovalent hetero ring group, and these groups optionally have a substituent. When a plurality of $L^{T1}$ are present, they may be the same or different and may be bonded directly or bonded via a divalent group to form a ring.

$Ar^{T2}$ is a boron atom, a group represented by —C(=$Z^{T1}$)—, a group represented by —S(=O)—, a group represented by —S(=O)$_2$—, a group represented by the above-described formula (P)—, an aromatic hydrocarbon group having an electron withdrawing group or a hetero ring group containing a group represented by =N— in the ring, and these groups optionally have a substituent.

$n^{T2}$ represents an integer of 1 or more and 15 or less. When $Ar^{T2}$ is a boron atom or a group represented by the above-described formula (P)—, $n^{T2}$ is 3. When $Ar^{T2}$ is a group represented by —C(=$Z^{T1}$)—, a group represented by —S(=O)— or a group represented by —S(=O)$_2$—, $n^{T2}$ is 2.

$Ar^{T1}$ and $L^{T1}$ may be bonded directly or bonded via a divalent group to form a ring. $Ar^{T2}$ and $L^{T1}$ may be bonded directly or bonded via a divalent group to form a ring. $Ar^{T1}$ and $Ar^{T2}$ may be bonded directly or bonded via a divalent group to form a ring.].

[5] The light emitting device according to [4], wherein at least one of the above-described $Ar^{T1}$ is a group represented by the formula (T1-1):

[Chemical Formula 7]

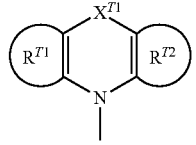

(T1-1)

[wherein, the ring $R^{T1}$ and the ring $R^{T2}$ each independently represent an aromatic hydrocarbon ring not containing a group represented by —C(=$Z^{T1}$)— in the ring or a hetero ring not containing a group represented by =N—, a boron atom, a group represented by —C(=$Z^{T1}$)—, a group represented by —S(=O)—, a group represented by —S(=O)$_2$— and a group represented by the above-described formula (P)— in the ring, and these rings optionally have a substituent. $Z^{T1}$ represents the same meaning as described above.

$X^{T1}$ represents a single bond, an oxygen atom, a sulfur atom, a group represented by —N($R^{XT1}$)— or a group represented by —C($R^{XT1'}$)$_2$-. $R^{XT1}$ and $R^{XT1'}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and these groups optionally have a substituent. A plurality of $R^{XT1'}$ may be the same or different and may be combined together to form a ring together with carbon atoms to which they are attached.

$R^{XT1}$ and the substituent which the ring $R^{T1}$ optionally has, $R^{XT1}$ and the substituent which the ring $R^{T2}$ optionally has, $R^{XT1'}$ and the substituent which the ring $R^{T1}$ optionally has, and $R^{XT1'}$ and the substituent which the ring $R^{T2}$ optionally has each may be bonded directly or bonded via a divalent group to form a ring together with atoms to which they are attached.]

[6] The light emitting device according to [5], wherein the above-described group represented by the formula (T1-1) is a group represented by the formula (T1-1A), a group represented by the formula (T1-1B), a group represented by the formula (T1-1C) or a group represented by the formula (T1-1D):

[Chemical Formula 8]

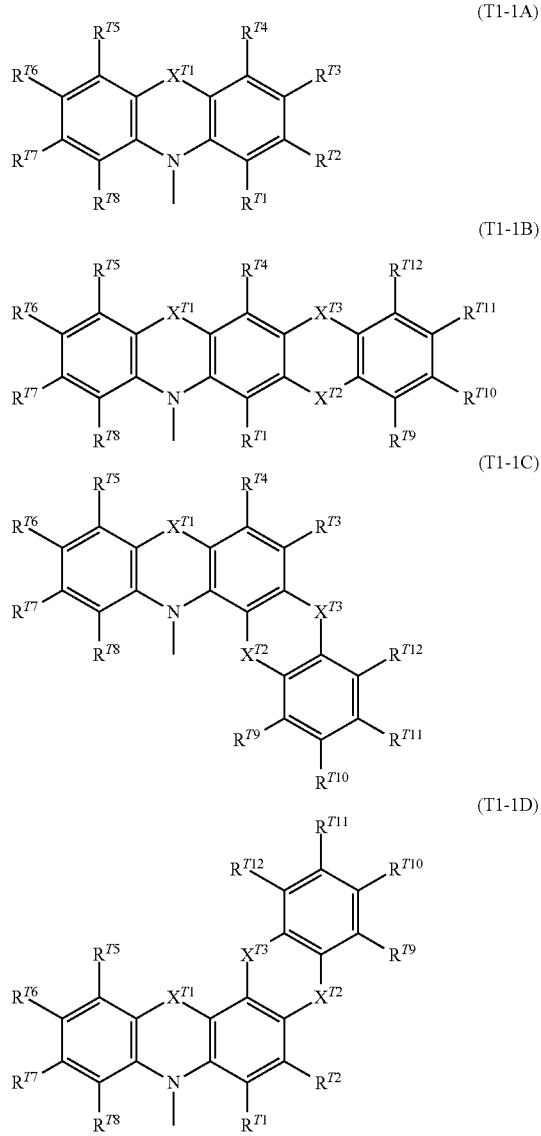

[wherein, $X^{T1}$ represents the same meaning as described above.

$X^{T2}$ and $X^{T3}$ each independently represent a single bond, an oxygen atom, a sulfur atom, a group represented by —N($R^{XT2'}$)— or a group represented by —C($R^{XT2'}$)$_2$—. $R^{XT2}$ and $R^{XT2'}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and these groups optionally have a substituent. A plurality of $R^{XT2'}$ may be the same or different and may be bonded directly or bonded via a divalent group to form a ring together with carbon atoms to which they are attached.

$R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and these groups optionally have a substituent.

$R^{T1}$ and $R^{T2}$, $R^{T2}$ and $R^{T3}$, $R^{T3}$ and $R^{T4}$, $R^{T5}$ and $R^{T6}$, $R^{T6}$ and $R^{T7}$, $R^{T7}$ and $R^{T8}$, $R^{T9}$ and $R^{T10}$, $R^{T10}$ and $R^{T11}$, and $R^{T11}$ and $R^{T12}$ may each be combined directly or combined via a divalent group to form a ring together with carbon atoms to which they are attached.].

[7] The light emitting device according to any one of [4] to [6], wherein the above-described $Ar^{T2}$ is a hetero ring group containing a group represented by =N— in the ring (the group optionally has a substituent.).

[8] The light emitting device according to [7], wherein the above-described $Ar^{T2}$ is a group obtained by removing from a diazole ring, a triazole ring, an oxadiazole ring, a thiadiazole ring, a thiazole ring, an oxazole ring, an isothiazole ring, an isooxazole ring, a benzodiazole ring, a benzotriazole ring, a benzooxadiazole ring, a benzothiadiazole ring, a benzothiazole ring, a benzooxazole ring, an azacarbazole ring, a diazacarbazole ring, a pyridine ring, a diazabenzene ring, a triazine ring, an azanaphthalene ring, a diazanaphthalene ring, a triazanaphthalene ring, a tetraazanaphthalene ring, an azaanthracene ring, a diazaanthracene ring, a triazaanthracene ring, a tetraazaanthracene ring, an azaphenanthrene ring, a diazaphenanthrene ring, a triazaphenanthrene ring or a tetraazaphenanthrene ring one hydrogen atom bonding directly to an atom constituting the ring (the group optionally has a substituent).

[9] The light emitting device according to any one of [1] to [8], wherein the oscillator strength of the above-described compound (T) is 0.0001 or more.

[10] The light emitting device according to any one of [1] to [9], wherein the above-described first organic layer further contains at least one selected from the group consisting of a host material, a hole transporting material, a hole injection material, an electron transporting material, an electron injection material, a fluorescent light emitting material and an antioxidant.

[11] The light emitting device according to any one of [1] to [10], wherein the above-described first organic layer and the above-described second organic layer are adjacent.

[12] The light emitting device according to any one of [1] to [11], wherein the above-described second organic layer is a layer disposed between the above-described anode and the above-described first organic layer.

[13] A composition comprising a compound (T) in which the absolute value of the difference between the energy level at the lowest triplet excited state and the energy level at the lowest singlet excited state is 0.5 eV or less and a polymer compound containing a constitutional unit represented by the formula (Y) and not comprising a phosphorescent metal complex:

[Chemical Formula 9]

[wherein, $Ar^{Y1}$ represents an arylene group, a divalent hetero ring group or a divalent group in which at least one arylene group and at least one divalent hetero ring group are bonded directly, and these groups optionally have a substituent.].

Effect of the Invention

According to the present invention, it is possible to provide a light emitting device excellent in external quantum efficiency and a composition useful for production of the light emitting device.

MODES FOR CARRYING OUT THE INVENTION

Suitable embodiments of the present invention will be illustrated in detail below.

Explanation of Common Terms

Terms commonly used in the present specification have the following meanings unless otherwise stated.

Me represents a methyl group, Et represents an ethyl group, Bu represents a butyl group, i-Pr represents an isopropyl group and t-Bu represents a tert-butyl group.

A hydrogen atom may be a heavy hydrogen atom or a light hydrogen atom.

In the formula representing a metal complex, the solid line representing a bond with the central metal means a covalent bond or a coordination bond.

"Polymer compound" means a polymer having molecular weight distribution and having a polystyrene-equivalent number-average molecular weight of $1 \times 10^3$ to $1 \times 10^8$.

The polymer compound may be any of a block copolymer, a random copolymer, an alternating copolymer and a graft copolymer, and may also be another form.

The end group of the polymer compound is preferably a stable group since if a polymerization active group remains intact there, there is a possibility of a decrease in a light emitting property or luminance life when the polymer compound is used for fabrication of a light emitting device. The end group of the polymer compound is preferably a group conjugatively bonded to the main chain and includes, for example, an aryl group bonding to the main chain of the polymer compound via a carbon-carbon bond or a group bonded to a monovalent hetero ring group.

"Low molecular compound" means a compound having no molecular weight distribution and having a molecular weight of $1 \times 10^4$ or less.

"Constitutional unit" means a unit occurring once or more times in the polymer compound.

"Alkyl group" may be any of linear and branched. The number of carbon atoms of the linear alkyl group is, not including the number of carbon atoms of the substituent, usually 1 to 50, preferably 3 to 30, more preferably 4 to 20. The number of carbon atoms of the branched alkyl group is, not including the number of carbon atoms of the substituent, usually 3 to 50, preferably 3 to 30, more preferably 4 to 20.

The alkyl group optionally has a substituent and examples thereof include, for example, a methyl group, an ethyl group, a propyl group, an isopropyl group, a butyl group, a 2-butyl group, an isobutyl group, a tert-butyl group, a pentyl group, an isoamyl group, a 2-ethylbutyl group, a hexyl group, a heptyl group, an octyl group, a 2-ethylhexyl group, a 3-propylheptyl group, a decyl group, a 3,7-dimethyloctyl group, a 2-ethyloctyl group, a 2-hexyldecyl group and a dodecyl group, and groups obtained by substituting a hydrogen atom in these groups with a cycloalkyl group, an alkoxy group, a cycloalkoxy group, an aryl group, a fluorine atom and the like (for example, a trifluoromethyl group, a pentafluoroethyl group, a perfluorobutyl group, a perfluorohexyl group, a perfluorooctyl group, a 3-phenylpropyl group, a 3 (4-methylphenyl)propyl group, a 3 (3,5-di-hexylphenyl)propyl group, a 6-ethyloxyhexyl group).

The number of carbon atoms of "cycloalkyl group" is, not including the number of carbon atoms of the substituent, usually 3 to 50, preferably 3 to 30, more preferably 4 to 20.

The cycloalkyl group optionally has a substituent and examples thereof include a cyclohexyl group, a cyclohexylmethyl group and a cyclohexylethyl group.

"Aryl group" means an atomic group remaining after removing from an aromatic hydrocarbon one hydrogen atom bonding directly to a carbon atom constituting the ring. The number of carbon atoms of the aryl group is, not including the number of carbon atoms of the substituent, usually 6 to 60, preferably 6 to 20, more preferably 6 to 10.

The aryl group optionally has a substituent and examples thereof include a phenyl group, a 1-naphthyl group, a 2-naphthyl group, a 1-anthracenyl group, a 2-anthracenyl group, a 9-anthracenyl group, a 1-pyrenyl group, a 2-pyrenyl group, a 4-pyrenyl group, a 2-fluorenyl group, a 3-fluorenyl group, a 4-fluorenyl group, a 2-phenylphenyl group, a 3-phenylphenyl group and a 4-phenylphenyl group, and groups obtained by substituting a hydrogen atom in these groups with an alkyl group, a cycloalkyl group, an alkoxy group, a cycloalkoxy group, an aryl group, a fluorine atom and the like.

"Alkoxy group" may be any of linear and branched. The number of carbon atoms of the linear alkoxy group is, not including the number of carbon atoms of the substituent, usually 1 to 40, preferably 4 to 10. The number of carbon atoms of the branched alkoxy group is, not including the number of carbon atoms of the substituent, usually 3 to 40, preferably 4 to 10.

The alkoxy group optionally has a substituent and examples thereof include a methoxy group, an ethoxy group, a propyloxy group, an isopropyloxy group, a butyloxy group, an isobutyloxy group, a tert-butyloxy group, a pentyloxy group, a hexyloxy group, a heptyloxy group, an octyloxy group, a 2-ethylhexyloxy group, a nonyloxy group, a decyloxy group, a 3,7-dimethyloctyloxy group and a lauryloxy group, and groups obtained by substituting a hydrogen atom in these groups with a cycloalkyl group, an alkoxy group, a cycloalkoxy group, an aryl group, a fluorine atom or the like.

The number of carbon atoms of the "cycloalkoxy group" is, not including the number of carbon atoms of the substituent, usually 3 to 40, preferably 4 to 10.

The cycloalkoxy group optionally has a substituent and examples thereof include a cyclohexyloxy group.

The number of carbon atoms of the "aryloxy group" is, not including the number of carbon atoms of the substituent, usually 6 to 60, preferably 6 to 48.

The aryloxy group optionally has a substituent and examples thereof include a phenoxy group, a 1-naphthyloxy group, a 2-naphthyloxy group, a 1-anthracenyloxy group, a 9-anthracenyloxy group and a 1-pyrenyloxy group, and groups obtained by substituting a hydrogen atom in these groups with an alkyl group, a cycloalkyl group, an alkoxy group, a cycloalkoxy group, a fluorine atom or the like.

"p-valent hetero ring group" (p represents an integer of 1 or more) means an atomic group remaining after removing from a heterocyclic compound p hydrogen atoms among hydrogen atoms bonding directly to carbon atoms or hetero atoms constituting the ring. Of the p-valent hetero ring groups, "p-valent aromatic hetero ring group" as an atomic group remaining after removing from an aromatic heterocyclic compound p hydrogen atoms among hydrogen atoms bonding directly to carbon atoms or hetero atoms constituting the ring is preferable.

"Aromatic heterocyclic compound" means a compound in which the hetero ring itself shows aromaticity such as oxadiazole, thiadiazole, thiazole, oxazole, thiophene, pyrrole, phosphole, furan, pyridine, pyrazine, pyrimidine, triazine, pyridazine, quinoline, isoquinoline, carbazole, dibenzophosphole and the like, and a compound in which an aromatic ring is condensed to the hetero ring even if the hetero ring itself shows no aromaticity such as phenoxazine, phenothiazine, dibenzoborole, dibenzosilole, benzopyran and the like.

The number of carbon atoms of the monovalent hetero ring group is, not including the number of carbon atoms of the substituent, usually 2 to 60, preferably 4 to 20.

The monovalent hetero ring group optionally has a substituent and examples thereof include a thienyl group, a pyrrolyl group, a furyl group, a pyridinyl group, a piperidinyl group, a quinolinyl group, an isoquinolinyl group, a pyrimidinyl group and a triazinyl group, and groups obtained by substituting a hydrogen atom in these groups with an alkyl group, a cycloalkyl group, an alkoxy group, a cycloalkoxy group or the like.

"Halogen atom" denotes a fluorine atom, a chlorine atom, a bromine atom or an iodine atom.

"Amino group" optionally has a substituent, and a substituted amino group is preferred. The substituent which the amino group has is preferably an alkyl group, a cycloalkyl group, an aryl group or a monovalent hetero ring group.

The substituted amino group includes, for example, a dialkylamino group, a dicycloalkylamino group and a diarylamino group.

The amino group includes, for example, a dimethylamino group, a diethylamino group, a diphenylamino group, a bis(4-methylphenyl)amino group, a bis(4-tert-butylphenyl)amino group and a bis(3,5-di-tert-butylphenyl)amino group.

"Alkenyl group" may be any of linear and branched. The number of carbon atoms of the linear alkenyl group is, not including the number of carbon atoms of the substituent, usually 2 to 30, preferably 3 to 20. The number of carbon atoms of the branched alkenyl group is, not including the number of carbon atoms of the substituent, usually 3 to 30, preferably 4 to 20.

The number of carbon atoms of the "cycloalkenyl group" is, not including the number of carbon atoms of the substituent, usually 3 to 30, preferably 4 to 20.

The alkenyl group and the cycloalkenyl group optionally have a substituent and examples thereof include a vinyl group, a 1-propenyl group, a 2-propenyl group, a 2-butenyl group, a 3-butenyl group, a 3-pentenyl group, a 4-pentenyl group, a 1-hexenyl group, a 5-hexenyl group and a 7-octenyl group, and these groups having a substituent.

"Alkynyl group" may be any of linear and branched. The number of carbon atoms of the alkynyl group is, not including the number of carbon atoms of the substituent, usually 2 to 20, preferably 3 to 20. The number of carbon atoms of the branched alkynyl group is, not including the number of carbon atoms of the substituent, usually 4 to 30, preferably 4 to 20.

The number of carbon atoms of the "cycloalkynyl group" is, not including the number of carbon atoms of the substituent, usually 4 to 30, preferably 4 to 20.

The alkynyl group and the cycloalkynyl group optionally have a substituent and examples thereof include an ethynyl group, a 1-propynyl group, a 2-propynyl group, a 2-butynyl group, a 3-butynyl group, a 3-pentynyl group, a 4-pentynyl group, a 1-hexynyl group and a 5-hexynyl group, and these groups having a substituent.

"Arylene group" means an atomic group remaining after removing from an aromatic hydrocarbon two hydrogen atoms bonding directly to carbon atoms constituting the ring. The number of carbon atoms of the arylene group is, not including the number of carbon atoms of the substituent, usually 6 to 60, preferably 6 to 30, more preferably 6 to 18.

The arylene group optionally has a substituent and examples thereof include a phenylene group, a naphthalenediyl group, an anthracenediyl group, a phenanthrenediyl group, a dihydrophenanthrenediyl group, a naphthacenediyl group, a fluorenediyl group, a pyrenediyl group, a perylenediyl group and a chrysenediyl group, and these groups having a substituent, and groups represented by the formula (A-1) to the formula (A-20) are preferable. The arylene group includes groups obtained by bonding a plurality of these groups.

[Chemical Formula 10]

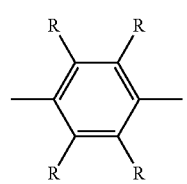

(A-1)

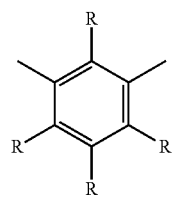

(A-2)

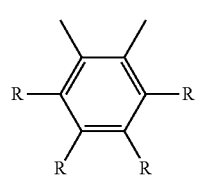

(A-3)

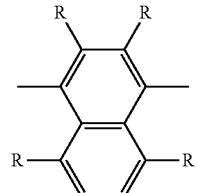

(A-4)

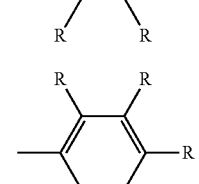

(A-5)

-continued
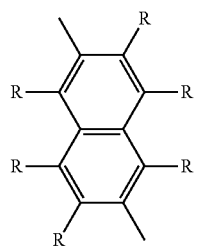
[Chemical Formula 11]
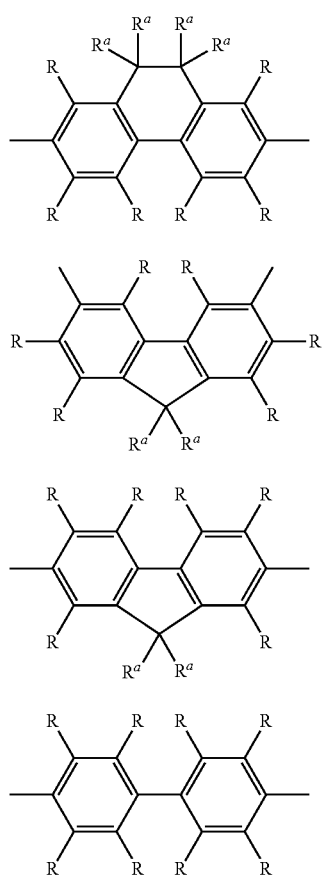
[Chemical Formula 12]
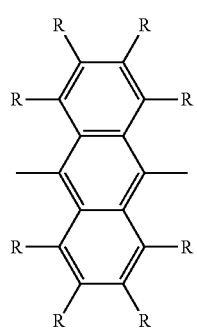
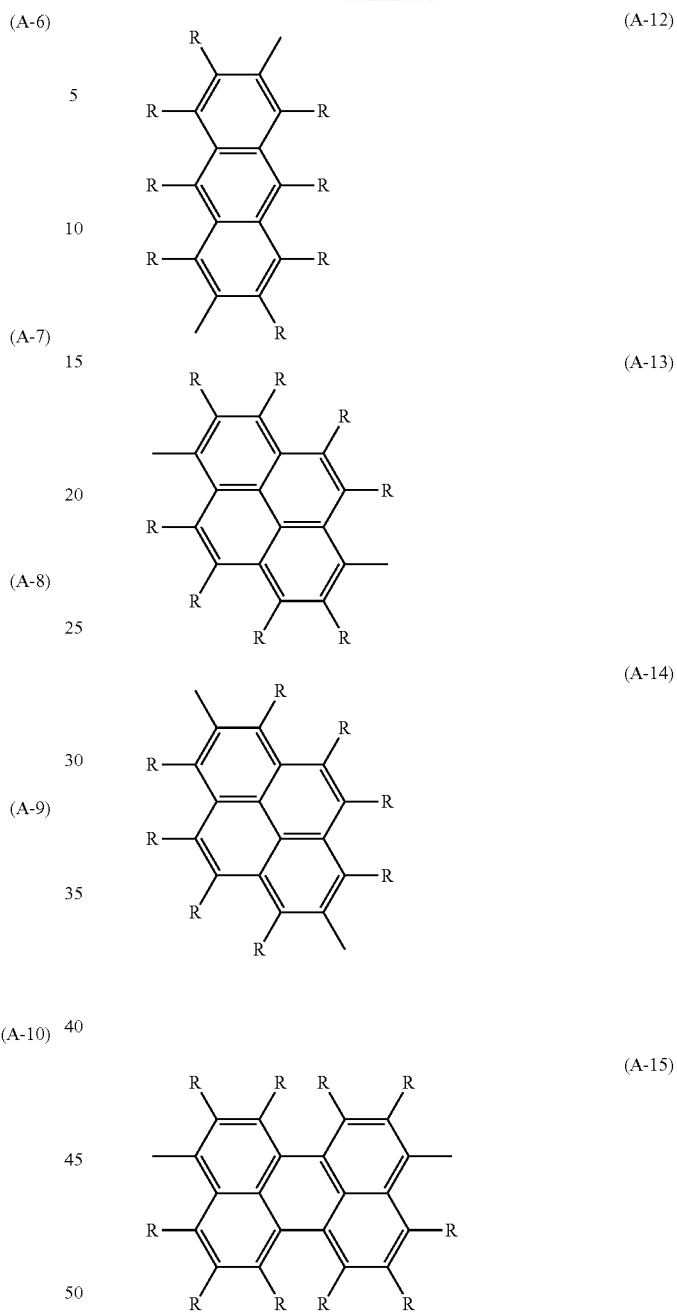
[Chemical Formula 13]
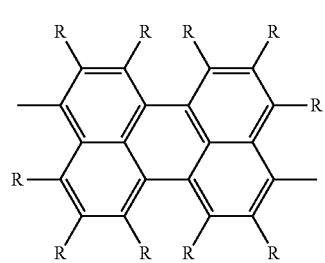

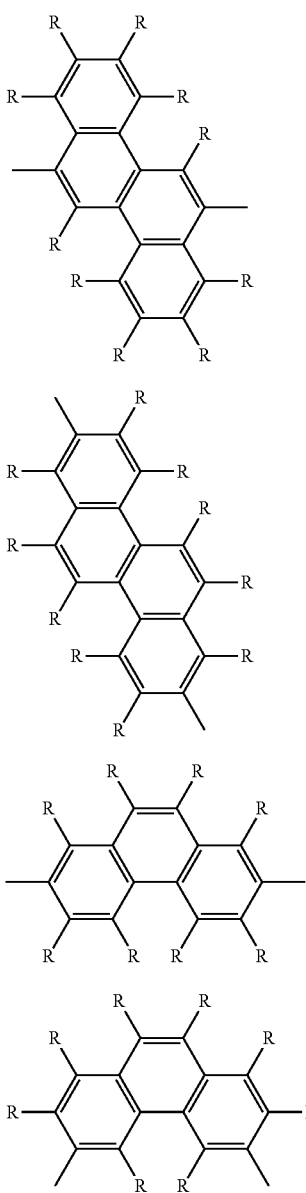

(A-17)

(A-18)

(A-19)

(A-20)

[wherein, R and $R^a$ each independently represent a hydrogen atom, an alkyl group, a cycloalkyl group, an aryl group or a monovalent hetero ring group. A plurality of R and $R^a$ may be the same or different at each occurrence, and groups $R^a$ may be combined together to form a ring together with atoms to which they are attached.]

The number of carbon atoms of the divalent hetero ring group is, not including the number of carbon atoms of the substituent, usually 2 to 60, preferably 3 to 20, more preferably 4 to 15.

The divalent hetero ring group optionally has a substituent and examples thereof include divalent groups obtained by removing from pyridine, diazabenzene, triazine, azanaphthalene, diazanaphthalene, carbazole, dibenzofuran, dibenzothiophene, dibenzosilole, phenoxazine, phenothiazine, acridine, dihydroacridine, furan, thiophene, azole, diazole and triazole two hydrogen atoms among hydrogen atoms bonding directly to carbon atoms or hetero atoms constituting the ring, preferably groups represented by the formula (AA-1) to the formula (AA-34). The divalent hetero ring group includes groups obtained by bonding a plurality of these groups.

[Chemical Formula 14]

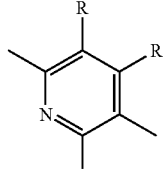

(AA-1)

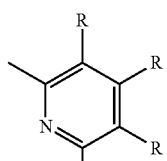

(AA-2)

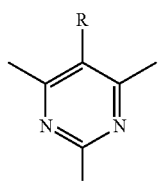

(AA-3)

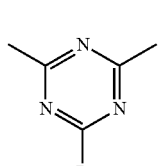

(AA-4)

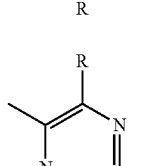

(AA-5)

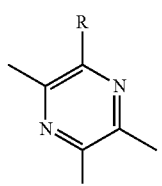

(AA-6)

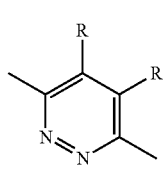

(AA-7)

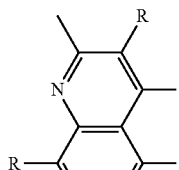

[Chemical Formula 15]

(AA-8)

(AA-9)

(AA-10)

(AA-11)

(AA-12)

[Chemical Formula 16]

(AA-13)

(AA-14)

(AA-15)

(AA-16)

[Chemical Formula 17]

(AA-17)

(AA-18)

(AA-19)

(AA-20)

[Chemical Formula 18]

(AA-21)

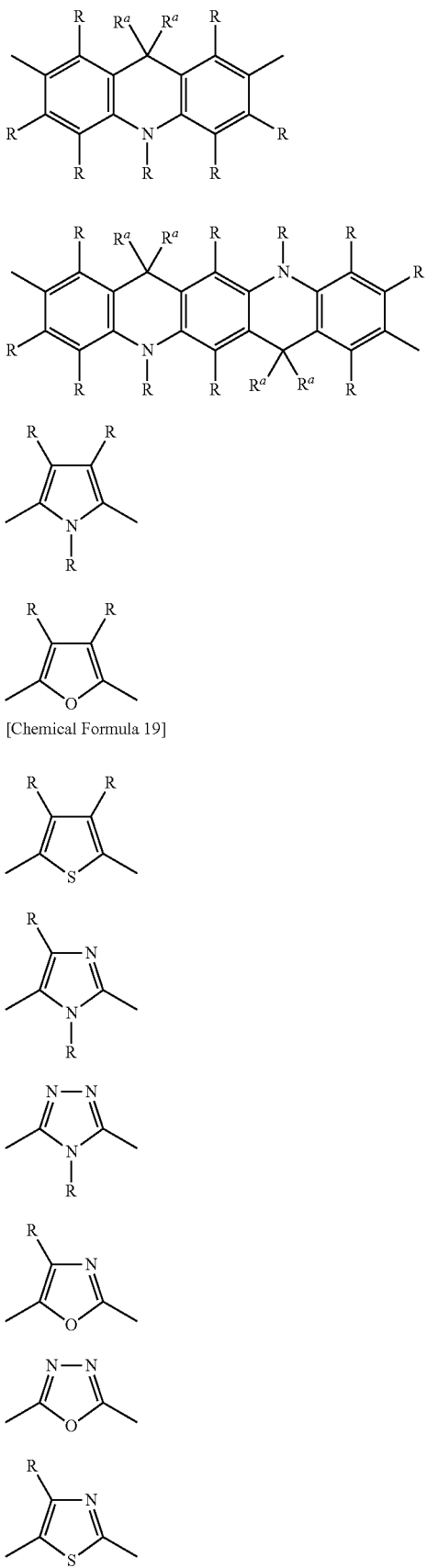
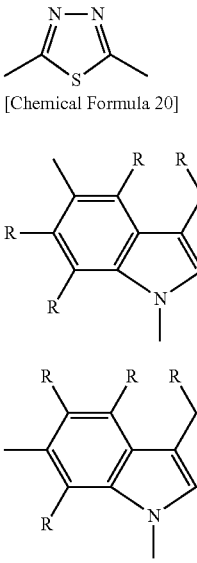

[Chemical Formula 19]

[Chemical Formula 20]

[wherein, R and $R^a$ represent the same meaning as described above.]

"Crosslink group" refers to a group capable of generating a new bond by being subjected to a heating treatment, an ultraviolet irradiation treatment, a near-ultraviolet irradiation treatment, a visible light irradiation treatment, an infrared irradiation treatment, a radical reaction and the like, preferably includes crosslink groups represented by the formula (XL-1) to the formula (XL-17) in the above-described Group A of crosslink group.

"Substituent" denotes a halogen atom, a cyano group, an alkyl group, a cycloalkyl group, an aryl group, a monovalent hetero ring group, an alkoxy group, a cycloalkoxy group, an aryloxy group, an amino group, a substituted amino group, an alkenyl group, a cycloalkenyl group, an alkynyl group or a cycloalkynyl group. The substituent may also be a crosslink group.

<Light Emitting Device>

The light emitting device of the present invention is a light emitting device having an anode, a cathode, a first organic layer disposed between the anode and the cathode and a second organic layer disposed between the anode and the cathode, wherein the above-described first organic layer is a layer containing a compound (T) in which the absolute value of the difference between the energy level at the lowest triplet excited state and the energy level at the lowest singlet excited state (hereinafter, referred to also as "$\Delta E_{ST}$") is 0.5 eV or less and not containing a phosphorescent metal complex, the above-described second organic layer is a layer containing a crosslinked body of a polymer compound containing a crosslink constitutional unit and the energy level at the lowest triplet excited state of the polymer compound is 2.25 eV or more.

The phosphorescent metal complex is a metal complex showing light emission from the triplet excited state at room temperature (25° C.).

The method for forming the first organic layer and the second organic layer includes, for example, dry methods such as a vacuum vapor deposition method and the like and wet methods such as a spin coat method, an inkjet printing method and the like, and wet methods are preferable.

When the first organic layer is formed by a wet method, it is preferable to use a first ink described later.

When the second organic layer is formed by a wet method, it is preferable to use a second ink described later. After formation of the second organic layer, a polymer compound containing a crosslink constitutional unit (namely, a constitutional unit having a crosslink group) contained in the second organic layer can be crosslinked by heating or light irradiation, and it is preferable that a polymer compound containing a crosslink constitutional unit contained in the second organic layer is crosslinked by heating. Since the second organic layer contains a polymer compound containing a crosslink constitutional unit in cross-linked state (crosslinked body of a polymer compound containing a crosslink constitutional unit), the second organic layer is substantially insolubilized with respect to a solvent. Hence, the second organic layer can be suitably used for lamination of a light emitting device.

The temperature of heating for causing crosslinking is usually 25° C. to 300° C., preferably 50° C. to 260° C., more preferably 130° C. to 230° C., further preferably 180° C. to 210° C.

The time of heating is usually 0.1 minutes to 1000 minutes, preferably 0.5 minutes to 500 minutes, more preferably 1 minute to 120 minutes, further preferably 10 minutes to 60 minutes.

The kind of the light used for irradiation includes, for example, ultraviolet, near-ultraviolet and visible light.

The method for analyzing components contained in the first organic layer and the second organic layer includes, for example, chemical separation and analysis methods such as extraction and the like, instrumental analysis methods such as infrared spectroscopy (IR), nuclear magnetic resonance spectroscopy (NMR), mass spectrometry (MS) and the like, and analysis methods combining chemical separation and analysis methods with instrumental analysis methods.

By performing solid-liquid extraction on the first organic layer and the second organic layer using an organic solvent such as toluene, xylene, chloroform, tetrahydrofuran and the like, the components can be separated into components substantially insoluble in an organic solvent (insoluble component) and components soluble in an organic solvent (soluble component). The insoluble component can be analyzed by infrared spectroscopy or nuclear magnetic resonance spectroscopy and the soluble component can be analyzed by nuclear magnetic resonance spectroscopy or mass spectrometry.

<First Organic Layer>
[Compound (T)]

The compound (T) is preferably a thermally activated delayed fluorescence (TADF) material. The TADF material is preferably a low molecular compound.

$\Delta E_{ST}$ of the compound (T) is preferably 0.45 eV or less, more preferably 0.40 eV or less, further preferably 0.30 eV or less, particularly preferably 0.20 eV or less, especially preferably 0.13 eV or less, especially more preferably 0.11 eV or less. $\Delta E_{ST}$ of the compound (T) is preferably 0.0001 eV or more, more preferably 0.001 eV or more, further preferably 0.005 eV or more, particularly preferably 0.01 eV or more. $\Delta E_{ST}$ of the compound (T) is preferably 0.0001 eV or more and 0.45 eV or less, more preferably 0.0001 eV or more and 0.40 eV or less, further preferably 0.001 eV or more and 0.20 eV or less, particularly preferably 0.005 eV or more and 0.13 eV or less, especially preferably 0.01 eV or more and 0.11 eV or less, since the light emitting device of the present invention is excellent in external quantum efficiency.

The oscillator strength of the compound (T) is preferably 0.0001 or more, more preferably 0.001 or more, further preferably 0.01 or more, particularly preferably 0.05 or more, especially preferably 0.1 or more. The oscillator strength of the compound (T) is preferably 1 or less, more preferably 0.8 or less, further preferably 0.6 or less, particularly preferably 0.3 or less. The oscillator strength of the compound (T) is preferably 0.0001 or more and 1 or less, more preferably 0.001 or more and 0.8 or less, further preferably 0.01 or more and 0.6 or less, particularly preferably 0.1 or more and 0.3 or less, since the light emitting device of the present invention is excellent in external quantum efficiency.

For calculation of $\Delta E_{ST}$ and oscillator strength value of a compound, the structure of the ground state of the compound is optimized by the B3LYP level density functional method, and 6-31G* is used as the basis function in this operation. Using Gaussian09 as a quantum chemical calculation program, $\Delta E_{ST}$ and oscillator strength of a compound are calculated by the B3LYP level time-dependent density functional method. However, when an atom for which 6-31G' cannot be used is contained, LANL2DZ is used for the atom.

The molecular weight of the compound (T) is preferably $1 \times 10^2$ to $1 \times 10^4$, more preferably $2 \times 10^2$ to $5 \times 10^3$, further preferably $3 \times 10^2$ to $3 \times 10^3$, particularly preferably $5 \times 10^2$ to $1.5 \times 10^3$.

The compound (T) is preferably a compound represented by the formula (T-1), since the light emitting device of the present invention is excellent in external quantum efficiency.

$n^{T1}$ is preferably an integer of 0 or more and 3 or less, more preferably an integer of 0 or more and 2 or less, further preferably 0 or 1, since the light emitting device of the present invention is excellent in external quantum efficiency.

$n^{T2}$ is preferably an integer of 1 or more and 10 or less, more preferably an integer of 1 or more and 7 or less, further preferably an integer of 1 or more and 5 or less, particularly preferably 2 or 3, since the light emitting device of the present invention is excellent in external quantum efficiency.

$Ar^{T1}$ represents an aryl group, a substituted amino group or a monovalent hetero ring group, and these groups optionally have a substituent. However, at least one of $Ar^{T1}$ is a substituted amino group or a monovalent hetero ring group containing a nitrogen atom having no double bond in the ring and not containing a group represented by =N—, a boron atom, a group represented by —C(=$Z^{T1}$)—, a group represented by —S(=O)—, a group represented by —S(=O) 2- and a group represented by the formula (P)— in the ring.

The aryl group represented by $Ar^{T1}$ includes, for example, groups obtained by removing from a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring, a chrysene ring or a ring obtained by condensing these rings one hydrogen atom bonding directly to a carbon atom constituting the ring, preferably, groups obtained by removing from a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring, or a chrysene ring one hydrogen atom bonding directly to a carbon atom constituting the ring, and is more preferably a phenyl group, a naphthyl group, an anthracenyl group, a phenanthrenyl group, a dihydrophenanthrenyl group, a fluorenyl group or a spirobifluorenyl group, further preferably a phenyl group, a naphthyl group, a fluorenyl group or a spirobifluorenyl group, particularly preferably a phenyl group, and these groups optionally have a substituent.

The monovalent hetero ring group represented by $Ar^{T1}$ includes, for example, monovalent hetero ring groups other than the monovalent donor type hetero ring group described later, and is preferably a group obtained by removing from a carbazole ring, a 9,10-dihydroacridine ring, a 5,10-dihydrophenazine ring, a phenoxazine ring, a phenothiazine ring, an indolocarbazole ring, an indenocarbazole ring, a pyridine ring, a diazabenzene ring, a triazine ring, an azanaphthalene ring, a diazanaphthalene ring, an azaanthracene ring, a diazaanthracene ring, an azaphenanthrene ring, a diazaphenanthrene ring, a dibenzofuran ring, a dibenzothiophene ring, an azacarbazole ring or a diazacarbazole ring one hydrogen atom bonding directly to a carbon atom or a hetero atom constituting the ring, more preferably a group obtained by removing from a carbazole ring, an indolocarbazole ring, an indenocarbazole ring, a pyridine ring, a diazabenzene ring, a triazine ring, a dibenzofuran ring or a dibenzothiophene ring one hydrogen atom bonding directly to a carbon atom or a hetero atom constituting the ring, further preferably a group obtained by removing from a carbazole ring, a dibenzofuran ring or a dibenzothiophene ring one hydrogen atom bonding directly to a carbon atom or a hetero atom constituting the ring, and these groups optionally have a substituent.

In the substituted amino group represented by $Ar^{T1}$, the substituent which the amino group has is preferably an alkyl group, a cycloalkyl group, an aryl group or a monovalent hetero ring group, more preferably an aryl group or a monovalent hetero ring group, further preferably an aryl group, and these groups optionally further have a substituent. The examples and the preferable range of the aryl group as the substituent which the amino group has are the same as the examples and the preferable range of the aryl group represented by $Ar^{T1}$. The examples and the preferable range of the monovalent hetero ring group as the substituent which the amino group has are the same as the examples and the preferable range of the monovalent hetero ring group represented by $Ar^{T1}$.

"Nitrogen atom having no double bond" denotes a nitrogen atom having only a single bond between the nitrogen atom and all atoms bonded to the nitrogen atom.

"Containing a nitrogen atom having no double bond in the ring" means that a group represented by —N(—$R^N$)— (in the formula, $R^N$ represents a hydrogen atom or a substituent.) or a group represented by the formula:

[Chemical Formula 21]

is contained in the ring.

In the monovalent hetero ring group containing a nitrogen atom having no double bond in the ring and not containing a group represented by =N—, a boron atom, a group represented by —C(=$Z^{T1}$)—, a group represented by —S(=O)—, a group represented by —S(=O)$_2$— and a group represented by the above-described formula (P) in the ring (in the present specification, referred to also as "monovalent donor type hetero ring group"), the number of the nitrogen atom having no double bond constituting the ring is usually 1 to 10, preferably 1 to 5, more preferably 1 to 3, further preferably 1 or 2, particularly preferably 1.

In the monovalent donor type hetero ring group, the number of carbon atoms constituting the ring is usually 2 to 60, preferably 5 to 40, more preferably 10 to 25.

The monovalent donor type hetero ring group includes, for example, groups obtained by removing from a pyrrole ring, an indole ring, an isoindole ring, a carbazole ring, a 9,10-dihydroacridine ring, a 5,10-dihydrophenazine ring, an acridone ring, a phenoxazine ring, a phenothiazine ring, an indolocarbazole ring, an indenocarbazole ring or a ring obtained by condensing an aromatic hydrocarbon ring and/or a hetero ring to these hetero rings one hydrogen atom bonding directly to a carbon atom or a hetero atom constituting the ring, and these groups optionally have a substituent. The aromatic hydrocarbon ring which may be condensed to the hetero ring is an aromatic hydrocarbon ring not containing a group represented by —C(=$Z^{T1}$)— in the ring described later. The hetero ring which may be condensed to the hetero ring is a hetero ring not containing a group represented by =N—, a boron atom, a group represented by —C(=$Z^{T1}$)—, a group represented by —S(=O)—, a group represented by —S(=O)$_2$— and a group represented by the above-described formula (P) in the ring described above.

The monovalent donor type hetero ring group is preferably a group obtained by removing from a pyrrole ring, an indole ring, an isoindole ring, a carbazole ring, a 9,10-dihydroacridine ring, a 5,10-dihydrophenazine ring, an acridone ring, a phenoxazine ring, a phenothiazine ring, an indolocarbazole ring or an indenocarbazole ring one hydrogen atom bonding directly to a carbon atom or a hetero atom constituting the ring, more preferably a group obtained by removing from a carbazole ring, a 9,10-dihydroacridine ring, a 5,10-dihydrophenazine ring, a phenoxazine ring, a phenothiazine ring, an indolocarbazole ring or an indenocarbazole ring one hydrogen atom bonding directly to a carbon atom or a hetero atom constituting the ring, further preferably a group obtained by removing from a carbazole ring, an indolocarbazole ring or an indenocarbazole ring one hydrogen atom bonding directly to a carbon atom or a hetero atom constituting the ring, particularly preferably a group obtained by removing from a carbazole ring one hydrogen atom bonding directly to a carbon atom or a hetero atom constituting the ring, and these groups optionally have a substituent.

The number of carbon atoms of the monovalent hetero ring group other than the monovalent donor type hetero ring group is, not including the number of carbon atoms of the substituent, usually 2 to 60, preferably 3 to 20.

The monovalent hetero ring group other than the monovalent donor type hetero ring group includes, for example, groups obtained by removing from a diazole ring, a triazole ring, a furan ring, a thiophene ring, an oxadiazole ring, a thiadiazole ring, a pyridine ring, a diazabenzene ring, a triazine ring, an azanaphthalene ring, a diazanaphthalene ring, a triazanaphthalene ring, an azaanthracene ring, a diazaanthracene ring, a triazaanthracene ring, an azaphenanthrene ring, a diazaphenanthrene ring, a triazaphenanthrene ring, a dibenzofuran ring, a dibenzothiophene ring, a dibenzosilole ring, a dibenzophosphole ring, an azacarbazole ring, a diazacarbazole ring, a ring obtained by condensing these hetero rings and a ring obtained by condensing an aromatic hydrocarbon ring to these hetero rings one hydrogen atom bonding directly to a carbon atom or a hetero atom constituting the ring, and is preferably a group obtained by removing from a diazole ring, a triazole ring, a furan ring, a thiophene ring, an oxadiazole ring, a thiadiazole ring, a pyridine ring, a diazabenzene ring, a triazine ring, an azanaphthalene ring, a diazanaphthalene ring, a triazanaphthalene ring, an azaanthracene ring, a diazaanthracene ring, a triazaanthracene ring, an azaphenanthrene ring, a diazaphenanthrene ring, a triazaphenanthrene ring, a dibenzofuran ring, a dibenzothiophene ring, a dibenzosilole ring, a dibenzophosphole ring, an azacarbazole ring or a diazacarbazole ring one hydrogen atom bonding directly to a carbon atom or a hetero atom constituting the ring, more preferably a group obtained by removing from a pyridine ring, a diazabenzene ring, a triazine ring, an azanaphthalene ring, a diazanaphthalene ring, an azaanthracene ring, a diazaanthracene ring, an azaphenanthrene ring, a diazaphenanthrene ring, a dibenzofuran ring, a dibenzothiophene ring, an azacarbazole ring or a diazacarbazole ring at least one hydrogen atom bonding directly to a carbon atom or a hetero atom constituting the ring, further preferably a group obtained by removing from a pyridine ring, a diazabenzene ring, a triazine ring, a dibenzofuran ring or a dibenzothiophene ring one hydrogen atom bonding directly to a carbon atom constituting the ring, particularly preferably a group obtained by removing from a dibenzofuran ring or a dibenzothiophene ring one hydrogen atom bonding directly to a carbon atom constituting the ring, and these groups optionally have a substituent.

As the substituent which $Ar^{T1}$ optionally has, an alkyl group, a cycloalkyl group, an alkoxy group, a cycloalkoxy group, an aryl group, an aryloxy group, a monovalent hetero ring group, a substituted amino group, a halogen atom or a cyano group is preferable, an alkyl group, a cycloalkyl group, an alkoxy group, a cycloalkoxy group, an aryl group, a monovalent hetero ring group, a substituted amino group or a cyano group is more preferable, an alkyl group, a cycloalkyl group, an aryl group, a monovalent hetero ring group or a substituted amino group is further preferable, an alkyl group, an aryl group or a substituted amino group is particularly preferable, a substituted amino group is especially preferable, and these groups optionally further have a substituent.

The examples and the preferable range of the aryl group, the monovalent hetero ring group and the substituted amino group as the substituent which $Ar^{T1}$ optionally has are the same as the examples and the preferable range of the aryl group, the monovalent hetero ring group and the substituted amino group represented by $Ar^{T1}$, respectively.

The substituent which the substituent which $Ar^{T1}$ optionally has optionally further has is preferably an alkyl group, a cycloalkyl group, an alkoxy group, a cycloalkoxy group, an aryl group, an aryloxy group, a monovalent hetero ring group, a substituted amino group, a halogen atom or a cyano group, more preferably an alkyl group, a cycloalkyl group, an alkoxy group, a cycloalkoxy group, an aryl group, a monovalent hetero ring group or a substituted amino group, further preferably an alkyl group, a cycloalkyl group, an aryl group, a monovalent hetero ring group or a substituted amino group, particularly preferably an alkyl group or a cycloalkyl group, and these groups optionally further have a substituent.

The examples and the preferable range of the aryl group, the monovalent hetero ring group and the substituted amino group as the substituent which the substituent which $Ar^{T1}$ optionally has optionally further has are the same as the examples and the preferable range of the aryl group, the monovalent hetero ring group and the substituted amino group represented by $Ar^{T1}$, respectively.

At least one of $Ar^{T1}$ is preferably a monovalent donor type hetero ring group, more preferably a group represented by the formula (T1-1), and these groups optionally have a substituent, since the light emitting device of the present invention is excellent in external quantum efficiency.

That is, the monovalent donor type hetero ring group is preferably a group represented by the formula (T1-1).

When $Ar^{T1}$ is not the substituted amino group and the monovalent donor type hetero ring group, $Ar^{T1}$ is preferably an aryl group or a monovalent hetero ring group other than the monovalent donor type hetero ring group, more preferably an aryl group, and these groups optionally have a substituent, since the light emitting device of the present invention is excellent in external quantum efficiency.

$Ar^{T1}$ is preferably an aryl group or a monovalent donor type hetero ring group, more preferably an aryl group or a group represented by the formula (T1-1), and these groups optionally have a substituent, since the light emitting device of the present invention is more excellent in external quantum efficiency.

When a plurality of $Ar^{T1}$ are present, they may be the same or different and may be bonded directly or bonded via a divalent group to form a ring, however, it is preferable that they do not form a ring.

"Divalent group" includes an alkylene group, a cycloalkylene group, an arylene group, a divalent hetero ring group, a group represented by —N($R^{ArT1}$)—, a group represented by —B($R^{ArT1}$)—, a group represented by —P($R^{ArT1}$)—, a group represented by —(O=)P($R^{ArT1}$)—, a group represented by —Si($R^{ArT1}$)$_2$-, a group represented by —S(=O)—, a group represented by —S(=O)$_2$-, a group represented by —C(=$Z^{T1}$)—, an oxygen atom or a sulfur atom, and is preferably an alkylene group, a cycloalkylene group, an arylene group, a divalent hetero ring group, a group represented by —N($R^{ArT1}$)—, a group represented by —P($R^{ArT1}$)—, a group represented by —Si($R^{ArT1}$)$_2$—, an oxygen atom or a sulfur atom, more preferably an alkylene group, a cycloalkylene group, a group represented by —N($R^{ArT1}$)—, a group represented by —P($R^{ArT1}$)—, a group represented by —Si($R^{ArT1}$)$_2$—, an oxygen atom or a sulfur atom, further preferably an alkylene group, a group represented by —N($R^{ArT1}$)—, an oxygen atom or a sulfur atom, particularly preferably an oxygen atom or a sulfur atom, and these groups optionally have a substituent.

The examples and the preferable range of the substituent which the divalent group optionally has are the same as the examples and the preferable range of the substituent which $A^{rT1}$ optionally has.

The examples and the preferable range of the substituent which the substituent which the divalent group optionally has optionally further has are the same as the examples and the preferable range of the substituent which the substituent which $Ar^{T1}$ optionally has optionally further has.

The examples and the preferable range of the alkylene group as the divalent group are the same as the examples and the preferable range of the alkylene group represented by $L^A$ described later. The examples and the preferable range of the cycloalkylene group as the divalent group are the same as the examples and the preferable range of the cycloalkylene group represented by $L^A$ described later.

The examples and the preferable range of the arylene group as the divalent group are the same as the examples and the preferable range of the arylene group represented by $L^{T1}$ described later. The examples and the preferable range of the divalent hetero ring group as the divalent group are the same as the examples and the preferable range of the divalent hetero ring group represented by $L^{T1}$ described later.

$R^{ArT1}$ and $R^{ArT1'}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and these groups optionally have a substituent.

The examples and the preferable range of $R^{ArT1}$ are the same as the examples and the preferable range of $R^{XT1}$ described later.

The examples and the preferable range of $R^{ArT1'}$ are the same as the examples and the preferable range of $R^{XT1'}$ described later.

Group Represented by the Formula (T1-1)

The number of carbon atoms of "the aromatic hydrocarbon ring not containing a group represented by $-C(=Z^{T1})-$ in the ring" is, not including the number of carbon atoms of the substituent, usually 6 to 60, preferably 6 to 30, more preferably 6 to 18.

The aromatic hydrocarbon ring not containing a group represented by $-C(=Z^{T1})-$ in the ring includes, for example, a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring, a chrysene ring and a ring obtained by condensing these rings, and is preferably a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring or a chrysene ring, more preferably a benzene ring, a naphthalene ring, an anthracene ring, a phenanthrene ring, a dihydrophenanthrene ring, a fluorene ring or a spirobifluorene ring, further preferably a benzene ring, a naphthalene ring, a fluorene ring or a spirobifluorene ring, particularly preferably a benzene ring or a fluorene ring, especially preferably a benzene ring, and these rings optionally have a substituent.

The number of carbon atoms of "the hetero ring not containing a group represented by $=N-$, a boron atom, a group represented by $-C(=Z^{T1})-$, a group represented by $-S(=O)-$, a group represented by $-S(=O)_2-$ and a group represented by the above-described formula (P) in the ring" is, not including the number of carbon atoms of the substituent, usually 2 to 60, preferably 3 to 30, more preferably 4 to 15.

The hetero ring not containing a group represented by $=N-$, a boron atom, a group represented by $-C(=Z^{T1})-$, a group represented by $-S(=O)-$, a group represented by $-S(=O)_2-$ and a group represented by the above-described formula (P) in the ring includes, a pyrrole ring, a furan ring, a thiophene ring, a silole ring, a phosphole ring, an indole ring, a benzofuran ring, a benzothiophene ring, a benzosilole ring, a benzophosphole ring, a carbazole ring, a dibenzofuran ring, a dibenzothiophene ring, a dibenzosilole ring, a dibenzophosphole ring, a phenoxazine ring, a phenothiazine ring, a 9,10-dihydroacridine ring, a 5,10-dihydrophenazine ring, rings obtained by condensing these rings, and rings obtained by condensing an aromatic hydrocarbon ring not containing a group represented by $-C(=Z^{T1})-$ in the ring to these rings, and is preferably a pyrrole ring, a furan ring, a thiophene ring, a silole ring, a phosphole ring, an indole ring, a benzofuran ring, a benzothiophene ring, a benzosilole ring, a benzophosphole ring, a carbazole ring, a dibenzofuran ring, a dibenzothiophene ring, a dibenzosilole ring, a dibenzophosphole ring, a phenoxazine ring, a phenothiazine ring, a 9,10-dihydroacridine ring or a 5,10-dihydrophenazine ring, more preferably an indole ring, a benzofuran ring, a benzothiophene ring, a carbazole ring, a dibenzofuran ring, a dibenzothiophene ring, a phenoxazine ring, a phenothiazine ring, a 9,10-dihydroacridine ring or a 5,10-dihydrophenazine ring, further preferably a carbazole ring, a dibenzofuran ring, a dibenzothiophene ring, a phenoxazine ring, a phenothiazine ring, a 9,10-dihydroacridine ring or a 5,10-dihydrophenazine ring, particularly preferably a carbazole ring, a dibenzofuran ring or a dibenzothiophene ring, especially preferably a carbazole ring, and these rings optionally have a substituent.

The examples and the preferable range of the substituent which the ring $R^{T1}$ and the ring $R^{T2}$ optionally have are the same as the examples and the preferable range of the substituent which $Ar^{T1}$ optionally has.

The examples and the preferable range of the substituent which the substituent which the ring $R^{T1}$ and the ring $R^{T2}$ optionally have optionally further has are the same as the examples and the preferable range of the substituent which the substituent which $Ar^{T1}$ optionally has optionally further has.

At least one of the ring $R^{T1}$ and the ring $R^{T2}$ is preferably an aromatic hydrocarbon ring not containing a group represented by $-C(=Z^{T1})-$ in the ring, more preferably a benzene ring, and these rings optionally have a substituent.

Both the ring $R^{T1}$ and the ring $R^{T2}$ are each preferably an aromatic hydrocarbon ring not containing a group represented by $-C(=Z^{T1})-$ in the ring, more preferably a benzene ring, and these rings optionally have a substituent.

$X^{T1}$ is preferably a single bond, an oxygen atom, a sulfur atom or a group represented by $-C(R^{XT1'})_2-$, more preferably a single bond, an oxygen atom or a sulfur atom, further preferably a single bond.

$R^{XT1}$ is preferably an alkyl group, a cycloalkyl group, an aryl group, a monovalent hetero ring group or a substituted amino group, more preferably an aryl group or a monovalent hetero ring group, further preferably an aryl group, and these groups optionally have a substituent.

$R^{XT1'}$ is preferably an alkyl group, a cycloalkyl group, an aryl group or a monovalent hetero ring group, more preferably an alkyl group, a cycloalkyl group or an aryl group, further preferably an alkyl group or a cycloalkyl group, and these groups optionally have a substituent.

A plurality of $R^{XT1'}$ may be the same or different and may be combined together to form a ring together with carbon atoms to which they are attached, however, it is preferable that they do not form a ring.

The examples and the preferable range of the aryl group, the monovalent hetero ring group and the substituted amino group represented by $R^{XT1}$ and $R^{XT1'}$ are the same as the examples and the preferable range of the aryl group, the monovalent hetero ring group and the substituted amino group represented by $Ar^{T1}$, respectively.

The examples and the preferable range of the substituent which $R^{XT1}$ and $R^{XT1'}$ optionally have are the same as the examples and the preferable range of the substituent which the substituent which $Ar^{T1}$ optionally has optionally further has.

$R^{XT1}$ and the substituent which the ring $R^{T1}$ optionally has, $R^{XT1}$ and the substituent which the ring $R^{T2}$ optionally has, $R^{XT1'}$ and the substituent which the ring $R^{T1}$ optionally has, and $R^{XT1'}$ and the substituent which the ring $R^{T2}$ optionally has each may be bonded directly or bonded via a divalent group to form a ring together with atoms to which they are attached, however, it is preferable that they do not form a ring.

The group represented by the formula (T1-1) is preferably a group represented by the formula (T1-1A), a group represented by the formula (T1-1B), a group represented by the formula (T1-1C) or a group represented by the formula (T1-1D), more preferably a group represented by the formula (T1-1A), a group represented by the formula (T1-1B) or a group represented by the formula (T1-1C), further preferably a group represented by the formula (T1-1A).

$X^{T2}$ and $X^{T3}$ are each preferably a single bond, a group represented by —N($R^{XT2}$)— or a group represented by —C($R^{XT2'}$)$_2$—, more preferably a single bond or a group represented by —C($R^{XT2'}$)$_2$—.

It is preferable that at least one of $X^{T2}$ and $X^{T3}$ is a single bond, it is more preferable that $X^{T3}$ is a single bond.

When at least one of $X^{T2}$ and $X^{T3}$ is a single bond, the other is preferably an oxygen atom, a sulfur atom, a group represented by —N($R^{XT2}$)— or a group represented by —C($R^{XT2'}$)$_2$—, more preferably a group represented by —N($R^{XT2}$)— or a group represented by —C($R^{XT2'}$)$_2$—, further preferably a group represented by —C($R^{XT2'}$)$_2$—.

The examples and the preferable range of $R^{XT2}$ are the same as the examples and the preferable range of $R^{XT1}$.

The examples and the preferable range of $R^{XT2'}$ are the same as the examples and the preferable range of $R^{XT1'}$.

The examples and the preferable range of the substituent which $R^{XT2}$ and $R^{XT2'}$ optionally have are the same as the examples and the preferable range of the substituent which $R^{XT1}$ and $R^{XT1'}$ optionally have.

$R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ are each preferably a hydrogen atom, an alkyl group, a cycloalkyl group, an alkoxy group, a cycloalkoxy group, an aryl group, a monovalent hetero ring group, a substituted amino group or a cyano group, more preferably a hydrogen atom, an alkyl group, a cycloalkyl group, an aryl group, a monovalent hetero ring group or a substituted amino group, and these groups optionally further have a substituent.

In the group represented by the formula (T1-1A), $R^{T1}$, $R^{T2}$, $R^{T4}$, $R^{T5}$, $R^{T7}$ and $R^{T8}$ are each preferably a hydrogen atom, an alkyl group, an aryl group, a monovalent hetero ring group or a substituted amino group, more preferably a hydrogen atom or an alkyl group, further preferably a hydrogen atom, and these groups optionally further have a substituent.

In the group represented by the formula (T1-1A), $R^{T3}$ and $R^{T6}$ are each preferably an alkyl group, an aryl group, a monovalent hetero ring group or a substituted amino group, more preferably an aryl group, a monovalent hetero ring group or a substituted amino group, further preferably a substituted amino group, and these groups optionally further have a substituent.

In the groups represented by the formula (T1-1B), the formula (T1-1C) and the formula (T1-1D), $R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ are each preferably a hydrogen atom, an alkyl group, an aryl group, a monovalent hetero ring group or a substituted amino group, more preferably a hydrogen atom or an alkyl group, further preferably a hydrogen atom, and these groups optionally further have a substituent.

The examples and the preferable range of the aryl group, the monovalent hetero ring group and the substituted amino group represented by $R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ are the same as the examples and the preferable range of the aryl group, the monovalent hetero ring group and the substituted amino group represented by $Ar^{T1}$, respectively.

The examples and the preferable range of the substituent which $R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ optionally have are the same as the examples and the preferable range of the substituent which the substituent which $Ar^{T1}$ optionally has optionally further has $R^{T1}$ and $R^{T2}$, $R^{T2}$ and $R^{T3}$, $R^{T3}$ and $R^{T4}$, $R^{T5}$ and $R^{T6}$, $R^{T6}$ and $R^{T7}$, $R^{T7}$ and $R^{T8}$, $R^{T9}$ and $R^{T10}$, $R^{T10}$ and $R^{T11}$, and $R^{T11}$ and $R^{T12}$ may each be combined directly or combined via a divalent group to form a ring together with carbon atoms to which they are attached, however, it is preferable that they do not form a ring.

$L^{T1}$ represents an alkylene group, a cycloalkylene group, an arylene group, a divalent hetero ring group, a group represented by —N($R^{T1'}$)—, an oxygen atom or a sulfur atom, and these groups optionally have a substituent.

$L^{T1}$ represents preferably an alkylene group, a cycloalkylene group, an arylene group or a divalent hetero ring group, more preferably an arylene group or a divalent hetero ring group, further preferably an arylene group, and these groups optionally have a substituent.

The arylene group represented by $L^{T1}$ is preferably a phenylene group, a naphthalenediyl group, a fluorenediyl group, a phenanthrenediyl group or a dihydrophenanthrenediyl group, more preferably a group represented by the formula (A-1) to the formula (A-9), the formula (A-19) or the formula (A-20), further preferably a group represented by the formula (A-1) to the formula (A-3), particularly preferably a group represented by the formula (A-1) or (A-2), especially preferably a group represented by the formula (A-1), and these groups optionally have a substituent.

The divalent hetero ring group represented by $L^{T1}$ is preferably a group represented by the formula (AA-1) to the formula (AA-34), more preferably a group represented by the formula (AA-1) to the formula (AA-6), the formula (AA-10) to the formula (AA-21) or the formula (AA-24) to the formula (AA-34), further preferably a group represented by the formula (AA-1) to the formula (AA-4), the formula (AA-10) to the formula (AA-15) or the formula (AA-29) to the formula (AA-34), particularly preferably a group represented by the formula (AA-2), the formula (AA-4), the formula (AA-10), the formula (AA-12) or the formula (AA-14).

The examples and the preferable range of the substituent which $L^{T1}$ optionally has are the same as the examples and the preferable range of the substituent which $Ar^{T1}$ optionally has.

The examples and the preferable range of the substituent which the substituent which $L^{T1}$ optionally has optionally further has are the same as the examples and the preferable range of the substituent which the substituent which $Ar^{T1}$ optionally has optionally further has.

$R^{T1'}$ is preferably an aryl group or a monovalent hetero ring group, more preferably an aryl group, and these groups optionally have a substituent.

The examples and the preferable range of the aryl group and the monovalent hetero ring group represented by $R^{T1'}$ are the same as the examples and the preferable range of the aryl group and the monovalent hetero ring group represented by $Ar^{T1}$, respectively.

The examples and the preferable range of the substituent which $R^{T1'}$ optionally has are the same as the examples and the preferable range of the substituent which the substituent which $Ar^{T1}$ optionally has optionally further has.

When a plurality of $L^{T1}$ are present, they may be the same or different and may be bonded directly or bonded via a divalent group to form a ring, however, it is preferable that they do not form a ring.

$Ar^{T2}$ is a boron atom, a group represented by —C(=$Z^{T1}$)—, a group represented by —S(=O)—, a group represented by —S(=O)$_2$—, a group represented by the above-described formula (P), an aromatic hydrocarbon group having an electron withdrawing group or a hetero ring group containing a group represented by =N— in the ring, and these groups optionally have a substituent.

$Ar^{T2}$ is preferably a boron atom, a group represented by —C(=$Z^{T1}$)—, a group represented by —S(=O)$_2$—, a group represented by the above-described formula (P), an aromatic hydrocarbon group having an electron withdrawing group or a hetero ring group containing a group represented by =N— in the ring, more preferably a boron atom, a group represented by —C(=$Z^{T1}$)—, a group represented by —S(=O)$_2$—, an aromatic hydrocarbon group having an electron withdrawing group or a hetero ring group containing a group represented by =N— in the ring, further preferably a group represented by —S(=O)$_2$—, an aromatic hydrocarbon group having an electron withdrawing group or a hetero ring group containing a group represented by =N— in the ring, particularly preferably an aromatic hydrocarbon group having an electron withdrawing group or a hetero ring group containing a group represented by =N— in the ring, especially preferably a hetero ring group containing a group represented by =N— in the ring, and these groups optionally have a substituent, since the light emitting device of the present invention is excellent in external quantum efficiency.

$Z^{T1}$ is preferably an oxygen atom.

$R^{ZT1}$ is preferably an alkyl group, a cycloalkyl group, an aryl group or a monovalent hetero ring group, more preferably an aryl group or a monovalent hetero ring group, further preferably an aryl group, and these groups optionally have a substituent.

The examples and the preferable range of the aryl group and the monovalent hetero ring group represented by $R^{ZT1}$ are the same as the examples and the preferable range of the aryl group and the monovalent hetero ring group represented by $Ar^{T1}$, respectively.

The examples and the preferable range of the substituent which $R^{ZT1}$ optionally has are the same as the examples and the preferable range of the substituent which the substituent which $Ar^{T1}$ optionally has optionally further has.

In the aromatic hydrocarbon group having an electron withdrawing group, the number of carbon atoms of the aromatic hydrocarbon group is, not including the number of carbon atoms of the substituent, usually 6 to 60, preferably 6 to 30, more preferably 6 to 18.

In the aromatic hydrocarbon group having an electron withdrawing group, the aromatic hydrocarbon group includes, for example, groups obtained by removing from a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring, a chrysene ring and a ring obtained by condensing these rings at least one hydrogen atom bonding directly to a carbon atom constituting the ring, and is preferably a group obtained by removing from a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring or a chrysene ring at least one hydrogen atom bonding directly to a carbon atom constituting the ring, more preferably a group obtained by removing from a benzene ring, a naphthalene ring, an anthracene ring, a phenanthrene ring, a dihydrophenanthrene ring, a fluorene ring or a spirobifluorene ring at least one hydrogen atom bonding directly to a carbon atom constituting the ring, further preferably a group obtained by removing from a benzene ring, a naphthalene ring, a fluorene ring or a spirobifluorene ring at least one hydrogen atom bonding directly to a carbon atom constituting the ring, particularly preferably a group obtained by removing from a benzene ring or a fluorene ring at least one hydrogen atom bonding directly to a carbon atom constituting the ring, especially preferably a group obtained by removing from a benzene ring one hydrogen atom bonding directly to a carbon atom constituting the ring, and these groups optionally have a substituent.

The electron withdrawing group includes, for example, an alkyl group having a fluorine atom as a substituent, a fluorine atom, a cyano group and a nitro group, and is preferably an alkyl group having a fluorine atom as a substituent, a fluorine atom or a cyano group, more preferably a cyano group.

The alkyl group having a fluorine atom as a substituent is preferably a trifluoromethyl group, a pentafluoroethyl group, a perfluorobutyl group, a perfluorohexyl group or a perfluorooctyl group.

In the aromatic hydrocarbon group having an electron withdrawing group, the number of the electron withdrawing group which the aromatic hydrocarbon group has is usually 1 to 10, preferably 1 to 5, more preferably 1 to 3, further preferably 1 or 2.

In the hetero ring group containing a group represented by =N— in the ring, the number of the nitrogen atom having a double bond constituting the ring is usually 1 to 10, preferably 1 to 7, more preferably 1 to 5, further preferably 1 to 3, particularly preferably 3.

In the hetero ring group containing a group represented by =N— in the ring, the number of carbon atoms constituting the ring is usually 1 to 60, preferably 2 to 30, more preferably 3 to 15, particularly preferably 3 to 5.

The hetero ring group containing a group represented by =N— in the ring includes, for example, groups obtained by removing from a diazole ring, a triazole ring, an oxadiazole ring, a thiadiazole ring, a thiazole ring, an oxazole ring, an isothiazole ring, an isooxazole ring, a benzodiazole ring, a benzotriazole ring, a benzooxadiazole ring, a benzothiadiazole ring, a benzothiazole ring, a benzooxazole ring, an azacarbazole ring, a diazacarbazole ring, a pyridine ring, a diazabenzene ring, a triazine ring, an azanaphthalene ring, a diazanaphthalene ring, a triazanaphthalene ring, a tetraazanaphthalene ring, an azaanthracene ring, a diazaanthracene ring, a triazaanthracene ring, a tetraazaanthracene ring, an azaphenanthrene ring, a diazaphenanthrene ring, a triazaphenanthrene ring, a tetraazaphenanthrene ring or a ring obtained by condensing an aromatic ring to these hetero rings at least one hydrogen atom bonding directly to a carbon atom or a hetero atom constituting the ring, and is preferably a group obtained by removing from a diazole ring, a triazole ring, an oxadiazole ring, a thiadiazole ring, a thiazole ring, an oxazole ring, an isothiazole ring, an isooxazole ring, a benzodiazole ring, a benzotriazole ring, a benzooxadiazole ring, a benzothiadiazole ring, a benzothiazole ring, a benzooxazole ring, an azacarbazole ring, a diazacarbazole ring, a pyridine ring, a diazabenzene ring, a triazine ring, an azanaphthalene ring, a diazanaphthalene ring, a triazanaphthalene ring, a tetraazanaphthalene ring, an azaanthracene ring, a diazaanthracene ring, a triazaanthracene ring, a tetraazaanthracene ring, an azaphenanthrene ring, a diazaphenanthrene ring, a triazaphenanthrene ring or a tetraazaphenanthrene ring at least one hydrogen atom bonding directly to a carbon atom or a hetero atom constituting the ring, more preferably a group obtained by removing from a triazole ring, an oxadiazole ring, a thiadiazole ring, an azacarbazole ring, a diazacarbazole ring, a pyridine ring, a diazabenzene ring, a triazine ring, an azanaphthalene ring, a diazanaphthalene ring, a triazanaphthalene ring, a tetraazanaphthalene ring, an azaanthracene ring, a diazaanthracene ring, a triazaanthracene ring, a tetraazaanthracene ring, an azaphenanthrene ring, a diazaphenanthrene ring, a triazaphenanthrene ring or a tetraazaphenanthrene ring at least one hydrogen atom bonding directly to a carbon atom or a hetero atom constituting the ring, further preferably a group obtained by removing from a triazole ring, an oxadiazole ring, a thiadiazole ring, a pyridine ring, a diazabenzene ring, a triazine ring, an azanaphthalene ring, a diazanaphthalene ring, an azaanthracene ring, a diazaanthracene ring, an azaphenanthrene ring or a diazaphenanthrene ring at least one hydrogen atom bonding directly to a carbon atom or a hetero atom constituting the ring, particularly preferably a group obtained by removing from a pyridine ring, a diazabenzene ring, a triazine ring, a quinoline ring, an isoquinoline ring, a quinazoline ring, a quinoxaline ring, an acridine ring, a phenazine ring or a phenanthroline ring at least one hydrogen atom bonding directly to a carbon atom constituting the ring, especially preferably a group obtained by removing from a pyridine ring, a diazabenzene ring or a triazine ring at least one hydrogen atom bonding directly to a carbon atom constituting the ring, and these groups optionally have a substituent.

The substituent which $Ar^{T2}$ optionally has (different from a group represented by the formula (1T') describe later, the same shall apply hereinafter) is preferably an alkyl group, a cycloalkyl group, an alkoxy group, a cycloalkoxy group, a halogen atom or a cyano group, more preferably an alkyl group, a cycloalkyl group, a fluorine atom or a cyano group, further preferably an alkyl group or a cycloalkyl group, and these groups optionally have a substituent.

The examples and the preferable range of the substituent which the substituent which $Ar^{T2}$ optionally has optionally further has are the same as the examples and the preferable range of the substituent which the substituent which $Ar^{T1}$ optionally has optionally further has.

It is preferable that $Ar^{T1}$ and $L^{T1}$ are not bonded directly or bonded via a divalent group to form a ring. It is preferable that $Ar^{T2}$ and $L^{T1}$ are not bonded directly or bonded via a divalent group to form a ring. It is preferable that $Ar^{T1}$ and $Ar^{T2}$ are not bonded directly or bonded via a divalent group to form a ring.

In the compound represented by the formula (T-1), when $Ar^{T2}$ is a hetero ring group containing a group represented by =N— in the ring, the compound represented by the formula (T-1) is preferably a compound represented by the formula (T'-1) to the formula (T'-14), more preferably a compound represented by the formula (T'-1) to the formula (T'-8) or the formula (T'-12) to the formula (T'-14), further preferably a compound represented by the formula (T'-1) to the formula (T'-4) or the formula (T'-12) to the formula (T'-14), particularly preferably a compound represented by the formula (T'-1) to the formula (T'-4), especially preferably a compound represented by the formula (T'-4), since the light emitting device of the present invention is excellent in external quantum efficiency.

In the compound represented by the formula (T-1), when $Ar^{T2}$ is an aromatic hydrocarbon group having an electron withdrawing group, the compound represented by the formula (T-1) is preferably a compound represented by the formula (T'-15) to the formula (T'-18), more preferably a compound represented by the formula (T'-15), the formula (T'-17) or the formula (T'-18), further preferably a compound represented by the formula (T'-15), since the light emitting device of the present invention is excellent in external quantum efficiency.

In the compound represented by the formula (T-1), when $Ar^{T2}$ is a boron atom, a group represented by —C(=$Z^{T1}$)—, a group represented by —S(=O)—, a group represented by —S(=O)$_2$— or a group represented by the above-described formula (P), the compound represented by the formula (T-1) is preferably a compound represented by the formula (T'-18) to the formula (T'-22), more preferably a compound represented by the formula (T'-19) to the formula (T'-22), further preferably a compound represented by the formula (T'-20) or the formula (T'-21), particularly preferably a compound represented by the formula (T'-21), since the light emitting device of the present invention is excellent in external quantum efficiency.

The compound represented by the formula (T-1) is preferably a compound represented by the formula (T'-1) to the formula (T'-4), the formula (T'-12) to the formula (T'-14), the formula (T'-15), the formula (T'-17), the formula (T'-18), the formula (T'-20) or the formula (T'-21), more preferably a compound represented by the formula (T'-1) to the formula (T'-4), the formula (T'-15) or the formula (T'-21), further preferably a compound represented by the formula (T'-1) to the formula (T'-4), particularly preferably a compound represented by the formula (T'-4), since the light emitting device of the present invention is more excellent in external quantum efficiency.

The compound represented by the formula (T-1) is preferably a compound represented by the formula (T'-1) to the formula (T'-4) or the formula (T'-19) to the formula (T'-22), more preferably a compound represented by the formula (T'-4) or the formula (T'-19) to the formula (T'-21), further preferably a compound represented by the formula (T'-19), since values of x and y in the CIE chromaticity coordinate of the light emitting device of the present invention lower (for example, x in the chromaticity coordinate is 0.25 or less and y in the chromaticity coordinate is 0.45 or less) and the light emitting device of the present invention is more excellent in external quantum efficiency.

[Chemical Formual 22]

(T'-1)

(T'-2)

(T'-3)

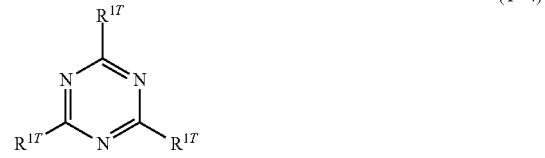

(T'-4)

-continued
[Chemical Formual 23]
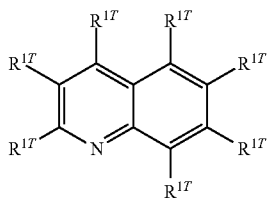
(T'-5)
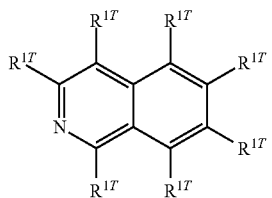
(T'-6)
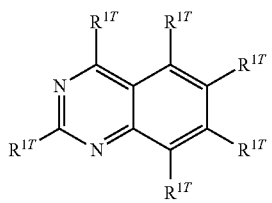
(T'-7)
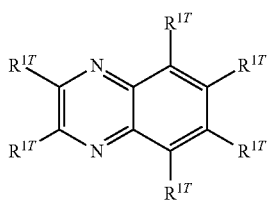
(T'-8)
[Chemical Formual 24]
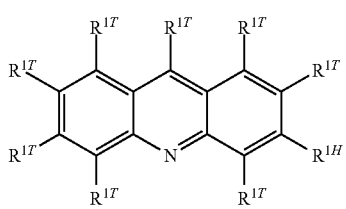
(T'-9)
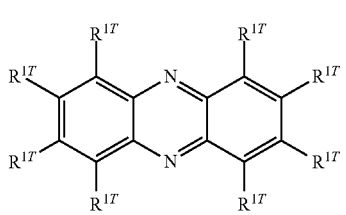
(T'-10)
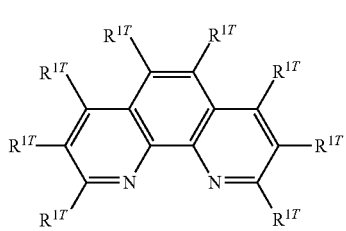
(T'-11)
[Chemical Formula 25]
$$R^{1T}\!-\!\!\underset{O}{\overset{N\!-\!N}{\diagdown\!\diagup}}\!\!-\!R^{1T}$$
(T'-12)
$$R^{1T}\!-\!\!\underset{S}{\overset{N\!-\!N}{\diagdown\!\diagup}}\!\!-\!R^{1T}$$
(T'-13)
(T'-14)
[Chemical Formula 26]
(T'-15)
(T'-16)
(T'-17)
(T'-18)
[Chemical Formula 27]
$$R^{1T}\!-\!\!\underset{\underset{R^{1T}}{|}}{B}\!-\!R^{1T}$$
(T'-19)
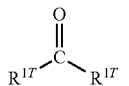
(T'-20)

-continued

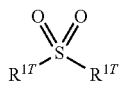
(T'-21)

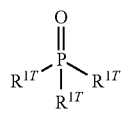
(T'-22)

[wherein, $R^{1T}$ represents a hydrogen atom, an alkyl group, a cycloalkyl group, an alkoxy group, a cycloalkoxy group, a halogen atom, a cyano group or a group represented by the formula (1T'), and these groups optionally have a substituent. A plurality of $R^{1T}$ may be the same or different and may be bonded directly or bonded via a divalent group to form a ring. At least one of a plurality of $R^{1T}$ is a group represented by the formula (1T').

$R^{1T_t}$ represents a hydrogen atom, an alkyl group, a cycloalkyl group, an alkoxy group, a cycloalkoxy group, an electron withdrawing group or a group represented by the formula (1T'), and these groups optionally have a substituent. A plurality of $R^{1T_t}$ may be the same or different and may be bonded directly or bonded via a divalent group to form a ring. At least one of a plurality of $R^{1T_t}$ is a group represented by the formula (1T') and at least one of them is an electron withdrawing group.].

It is preferable that one or two groups $R^{1T}$ among a plurality of $R^{1T}$ are each a group represented by the formula (1T').

It is preferable that one or two groups $R^{1T_t}$ among a plurality of $R^{1T_t}$ are each a group represented by the formula (1T').

Of a plurality of $R^{1T_t}$, 1 to 5 groups $R^{1T_t}$ are each preferably an electron withdrawing group, 1 to 3 groups $R^{1T_t}$ are each more preferably an electron withdrawing group, 1 or 2 groups $R^{1T_t}$ are each further preferably an electron withdrawing group.

[Chemical Formula 28]

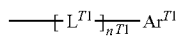
(1T')

[wherein, $L^{T1}$, $n^{T1}$ and $Ar^{T1}$ represent the same meaning as described above.]

$R^{1T}$ is preferably a hydrogen atom, an alkyl group, a cycloalkyl group, an alkoxy group, a cycloalkoxy group, a fluorine atom, a cyano group or a group represented by the formula (1T'), more preferably a hydrogen atom, an alkyl group, a cycloalkyl group or a group represented by the formula (1T'), further preferably a hydrogen atom, an alkyl group or a group represented by the formula (1T'), particularly preferably a hydrogen atom or a group represented by the formula (1T'), and these groups optionally have a substituent.

$R^{1T_t}$ is preferably a hydrogen atom, an alkyl group, a cycloalkyl group, an alkoxy group, a cycloalkoxy group, an electron withdrawing group or a group represented by the formula (1T'), more preferably a hydrogen atom, an alkyl group, a cycloalkyl group, an electron withdrawing group or a group represented by the formula (1T'), further preferably a hydrogen atom, an alkyl group, electron withdrawing group or a group represented by the formula (1T'), particularly preferably a hydrogen atom, an electron withdrawing group or a group represented by the formula (1T'), and these groups optionally have a substituent.

The examples and the preferable range of the substituent which $R^{1T}$ and $R^{1T_t}$ optionally have are the same as the examples and the preferable range of the substituent which the substituent which $Ar^{T1}$ optionally has optionally further has.

The compound (T) includes, for example, compounds represented by the following formulae. I the formulae, $Z^1$ represents a group represented by —N= or a group represented by —CH=. $Z^2$ represents an oxygen atom or a sulfur atom. A plurality of $Z^1$ and $Z^2$ may be the same or different at each occurrence.

[Chemical Formula 29]

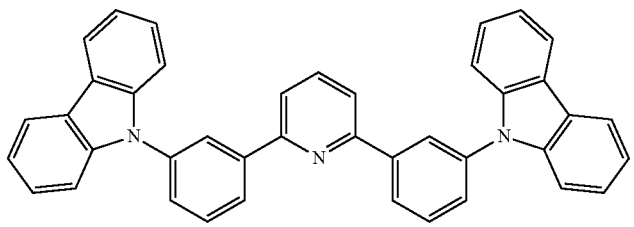

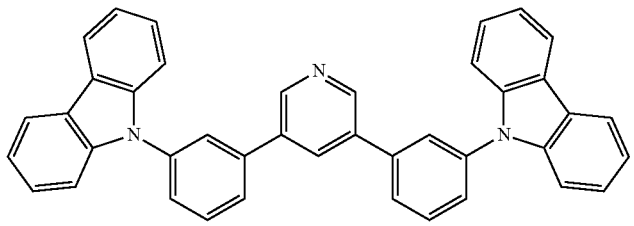

-continued
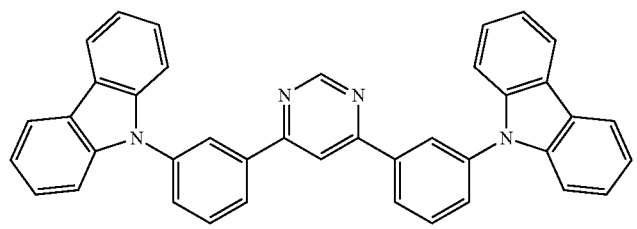
[Chemical Formula 30]
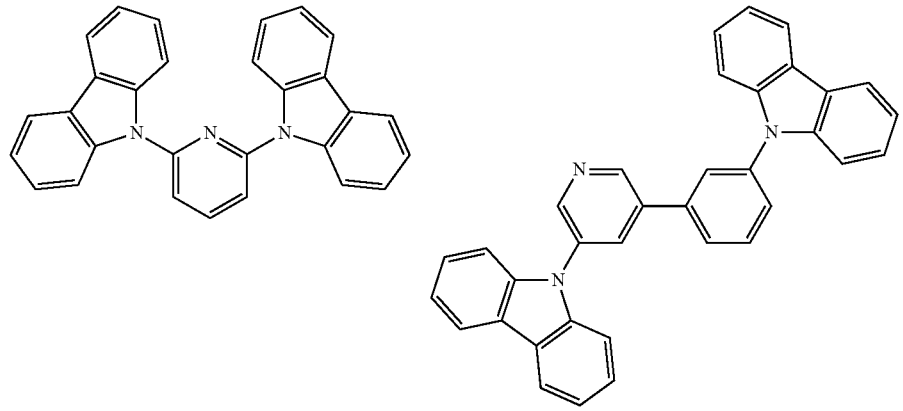
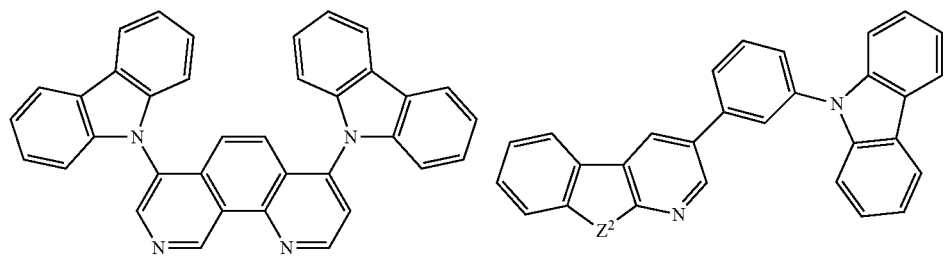
[Chemical Formula 31]
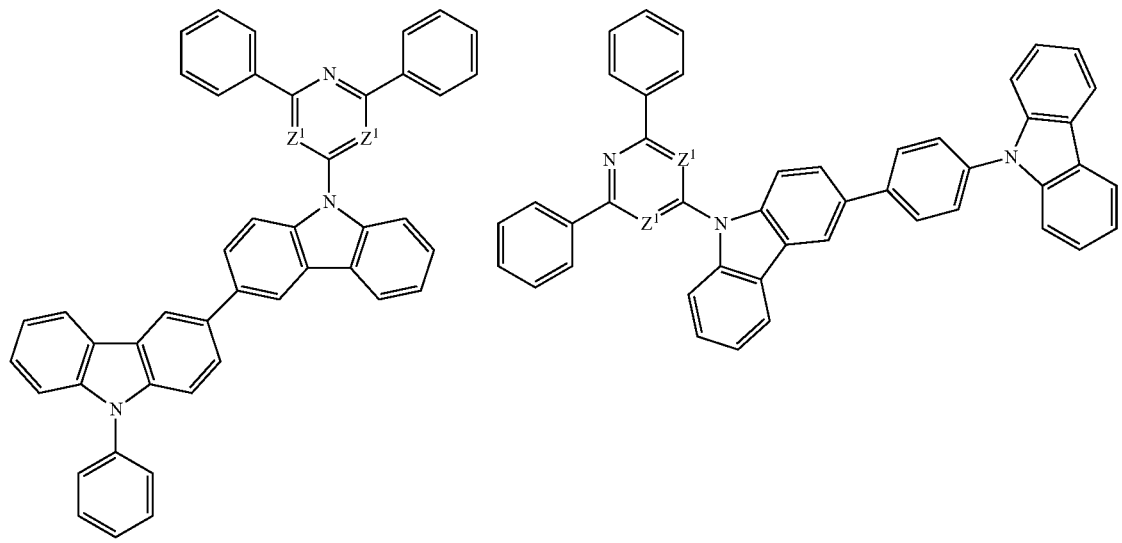

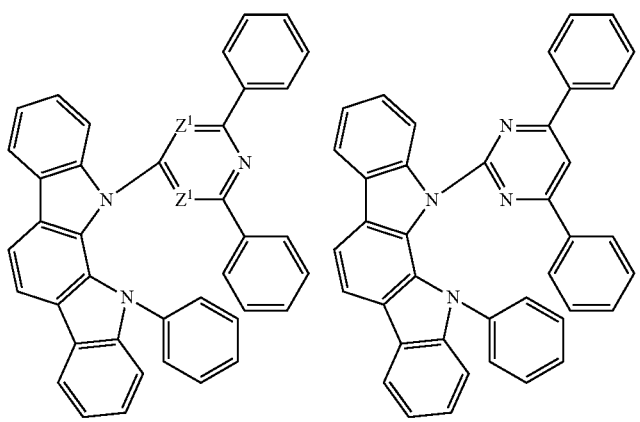
[Chemical Formula 32]
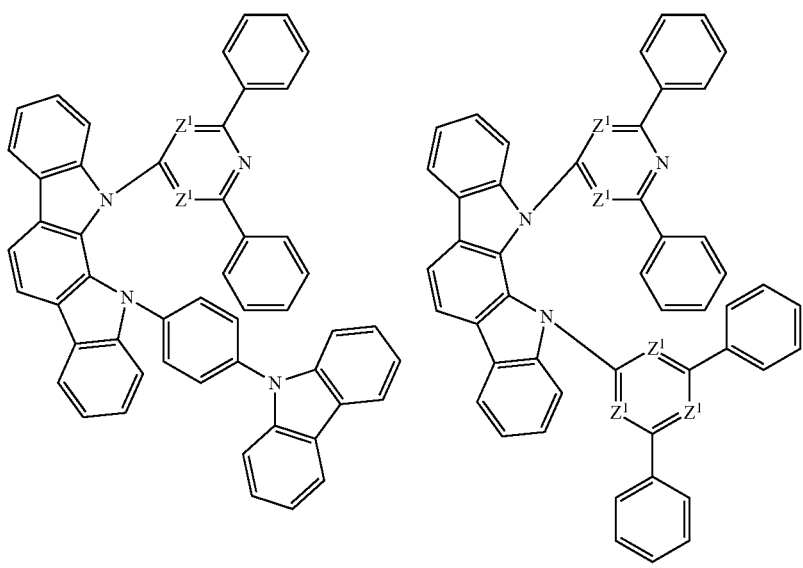
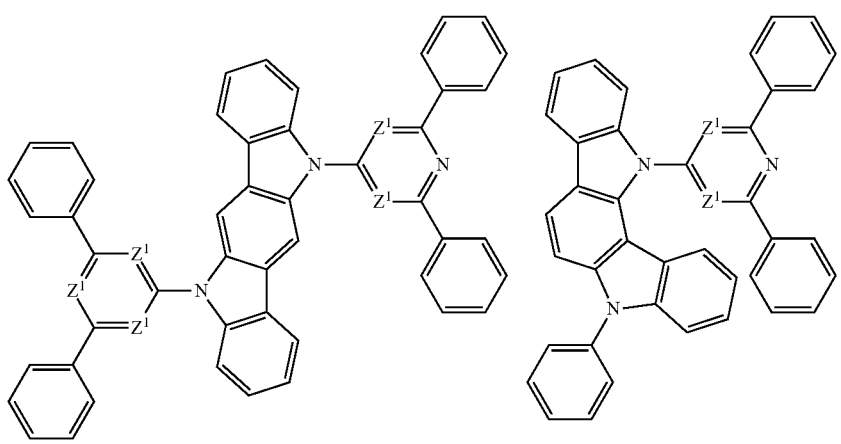

[Chemical Formula 33]
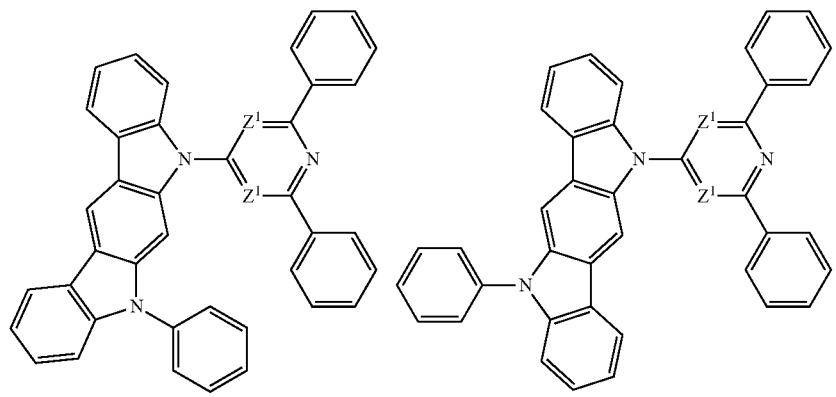
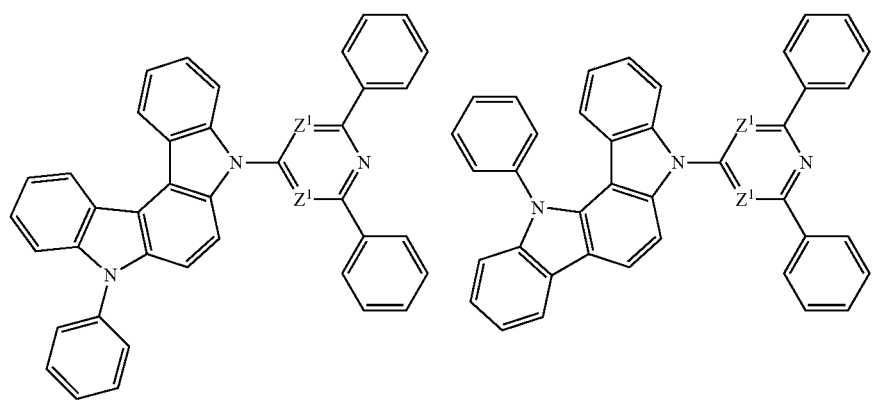
[Chemical Formula 34]
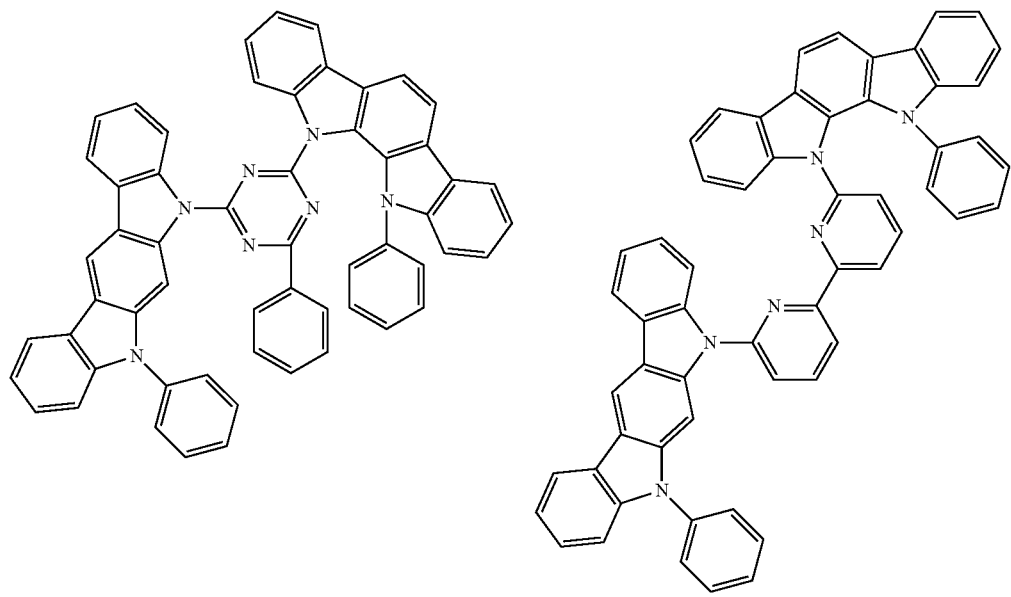

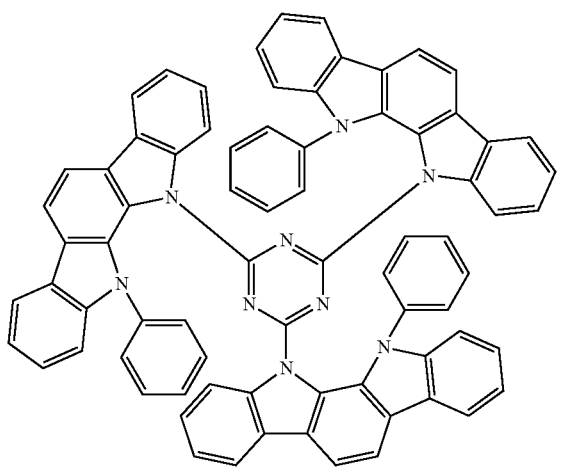
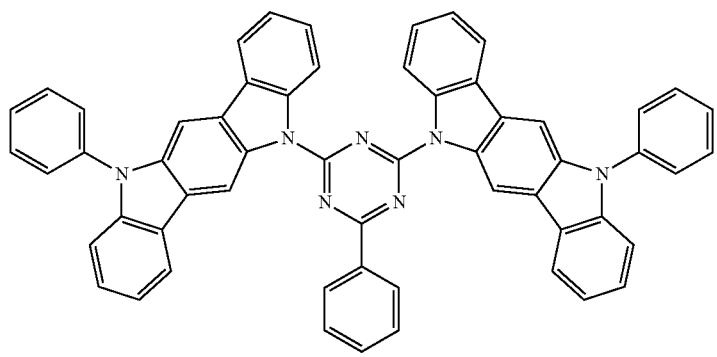
[Chemical Formula 35]
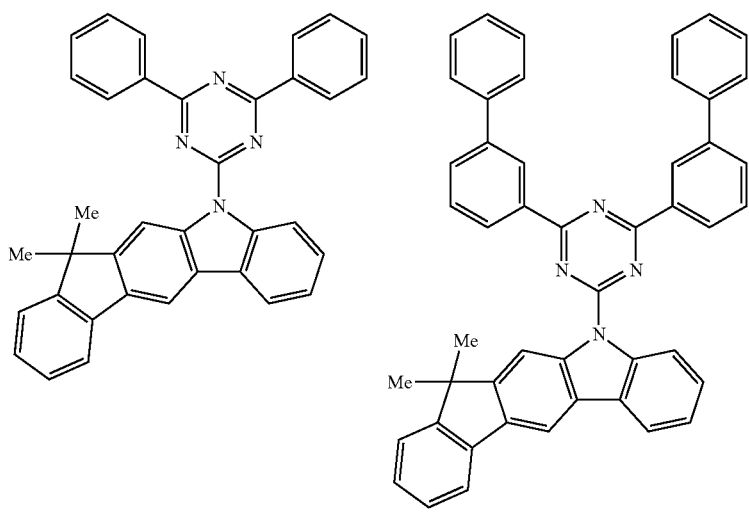

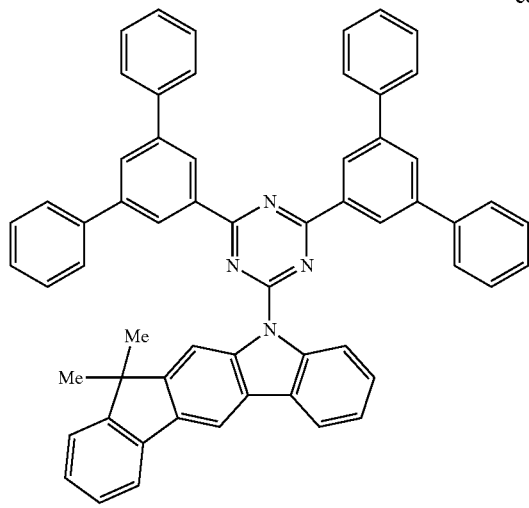
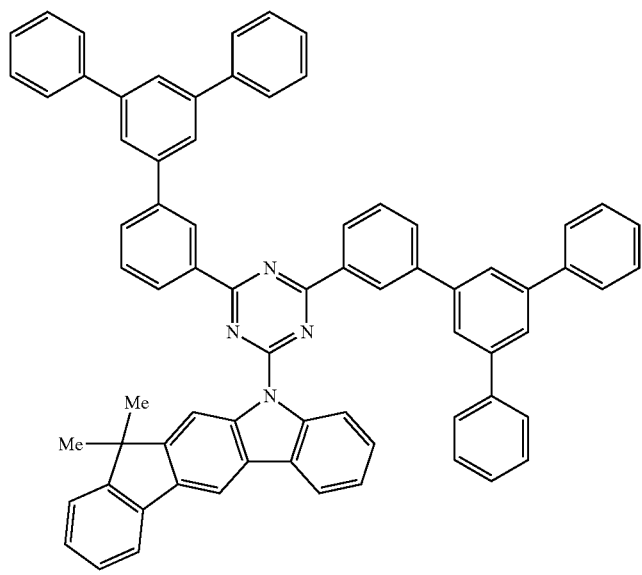
[Chemical Formula 36]
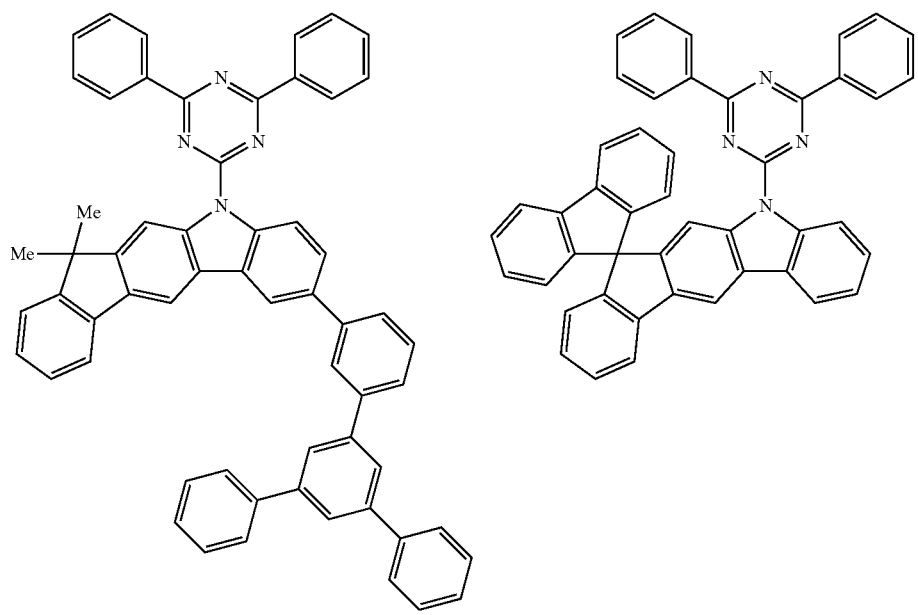

-continued
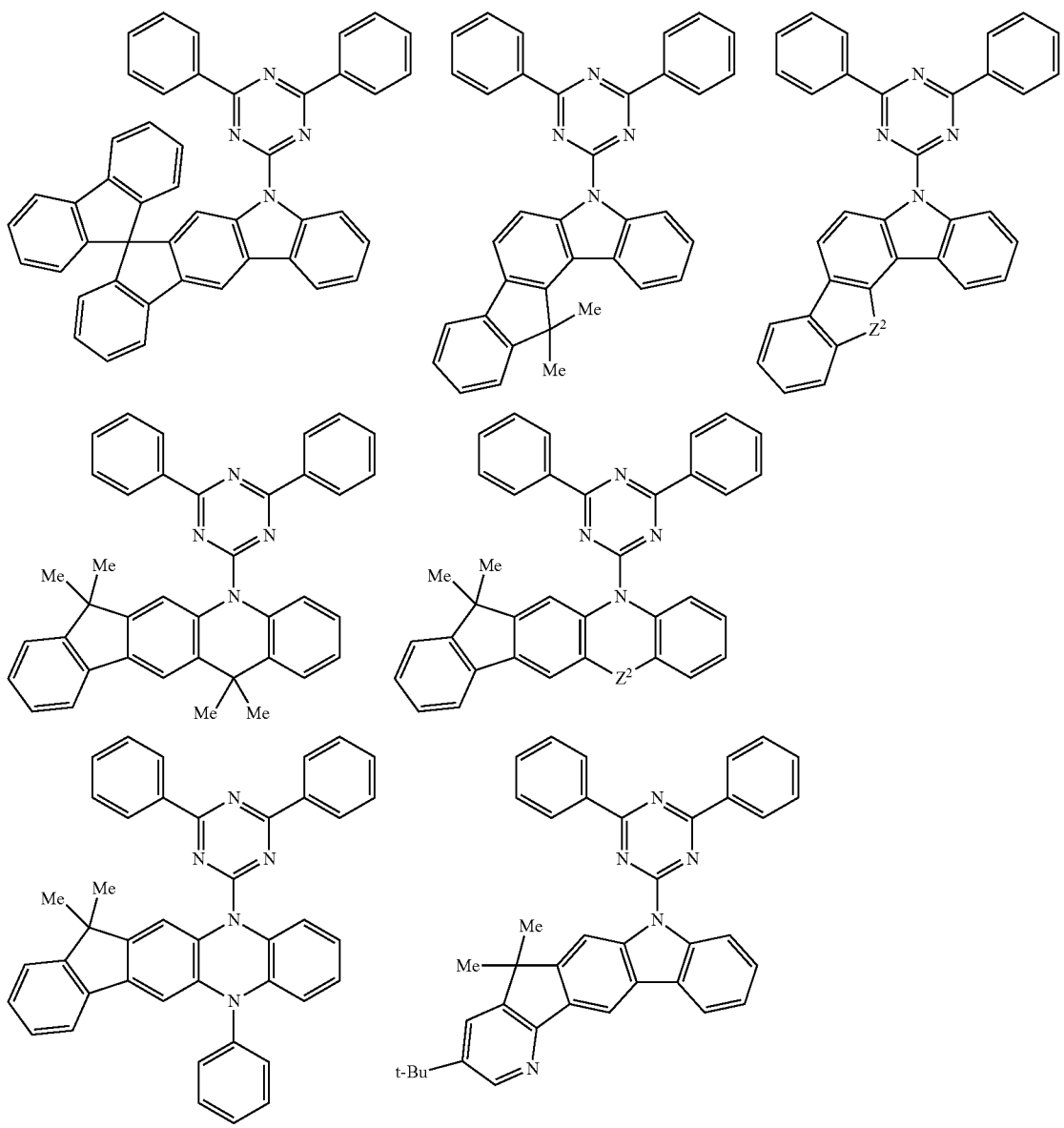
[Chemical Formula 37]
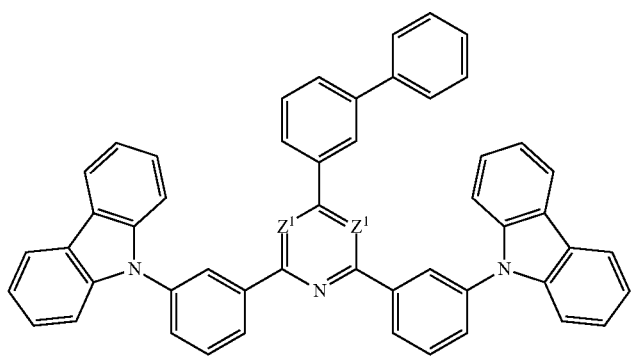

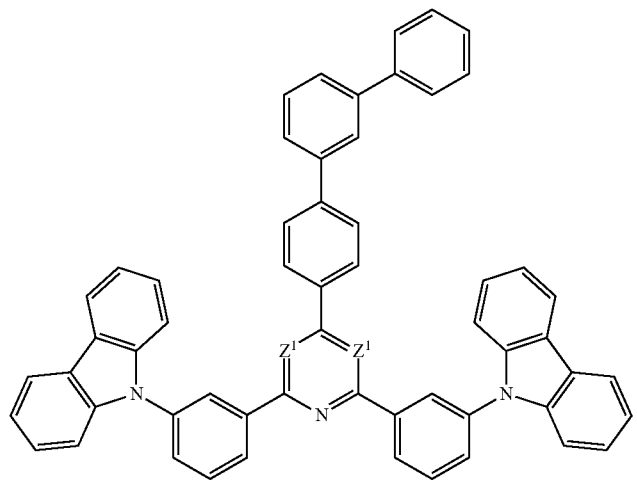
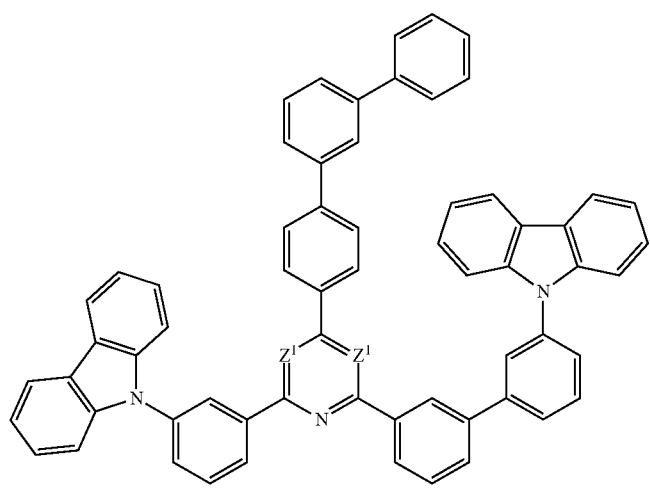
[Chemical Formula 38]
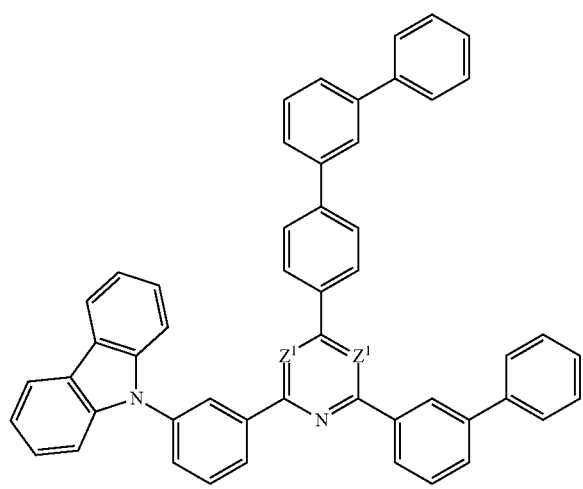

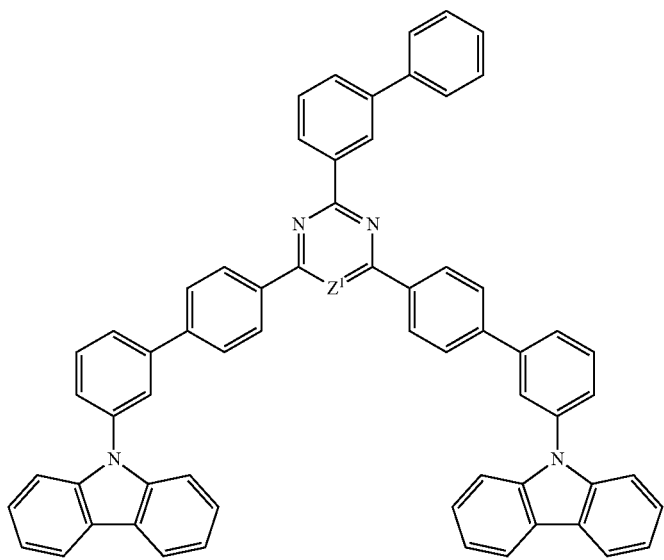
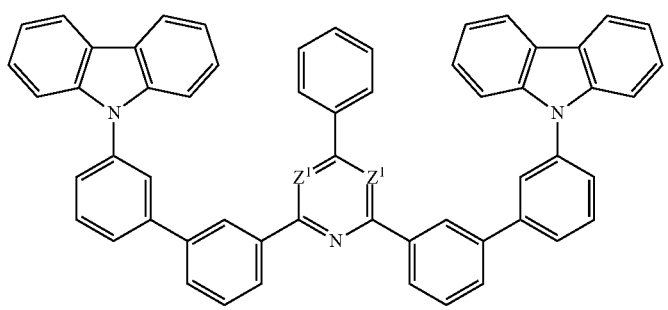
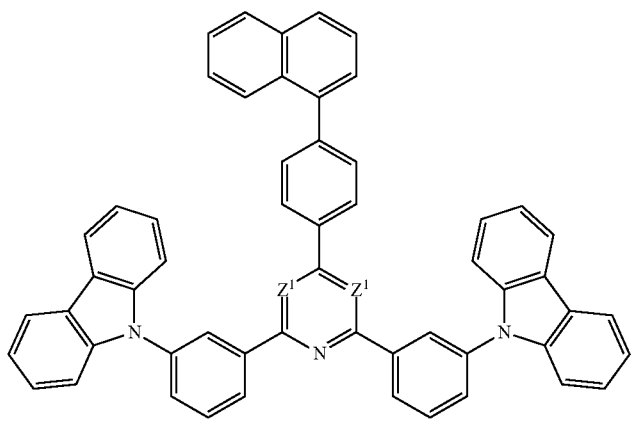

[Chemical Formula 39]
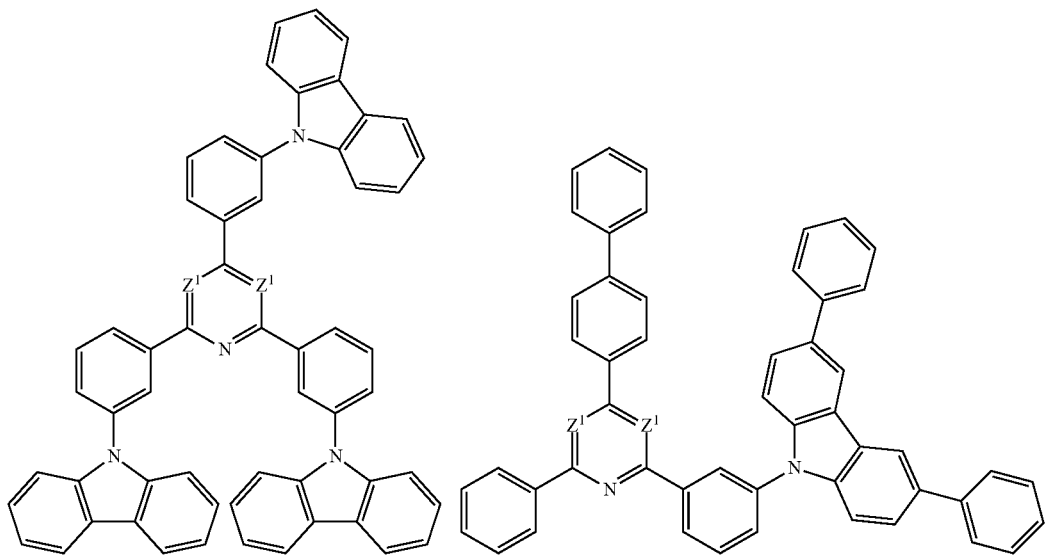
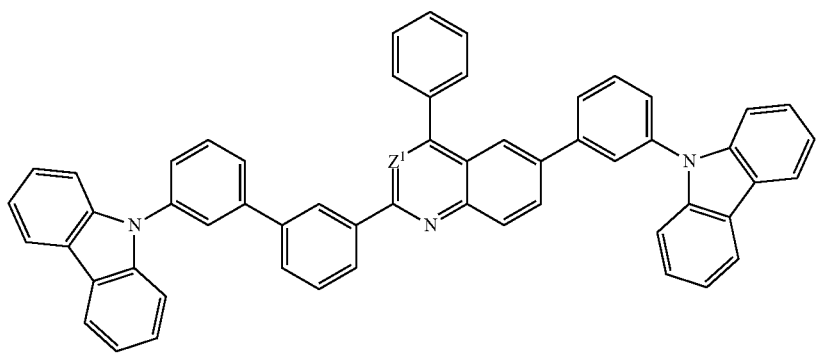
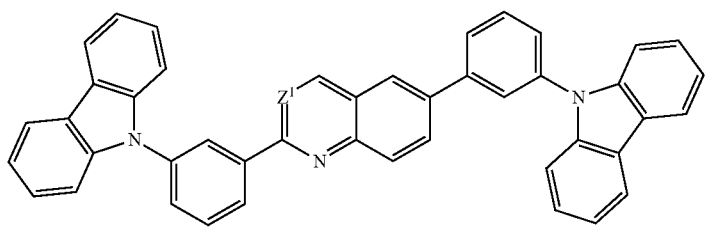
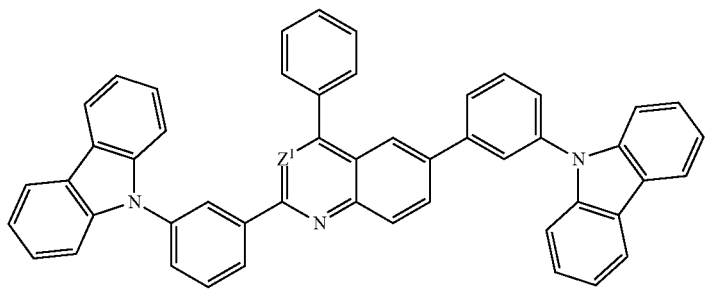

-continued
[Chemical Formula 40]
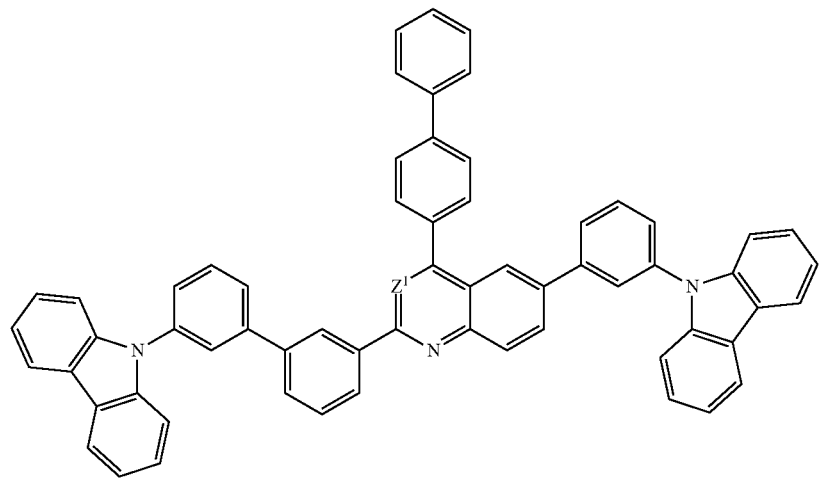
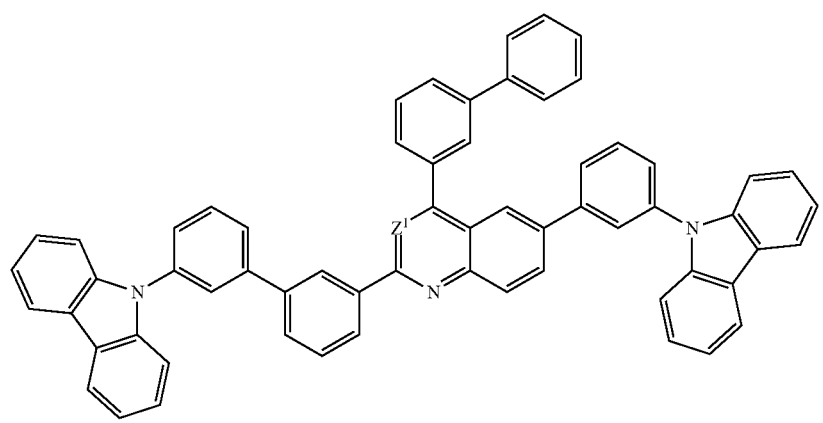
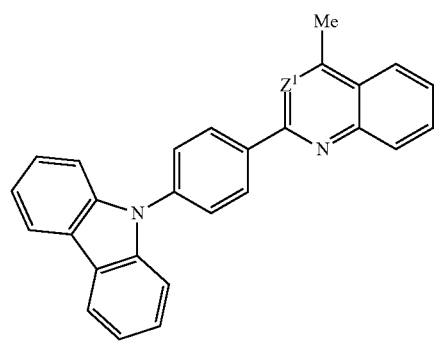

[Chemical Formula 41]
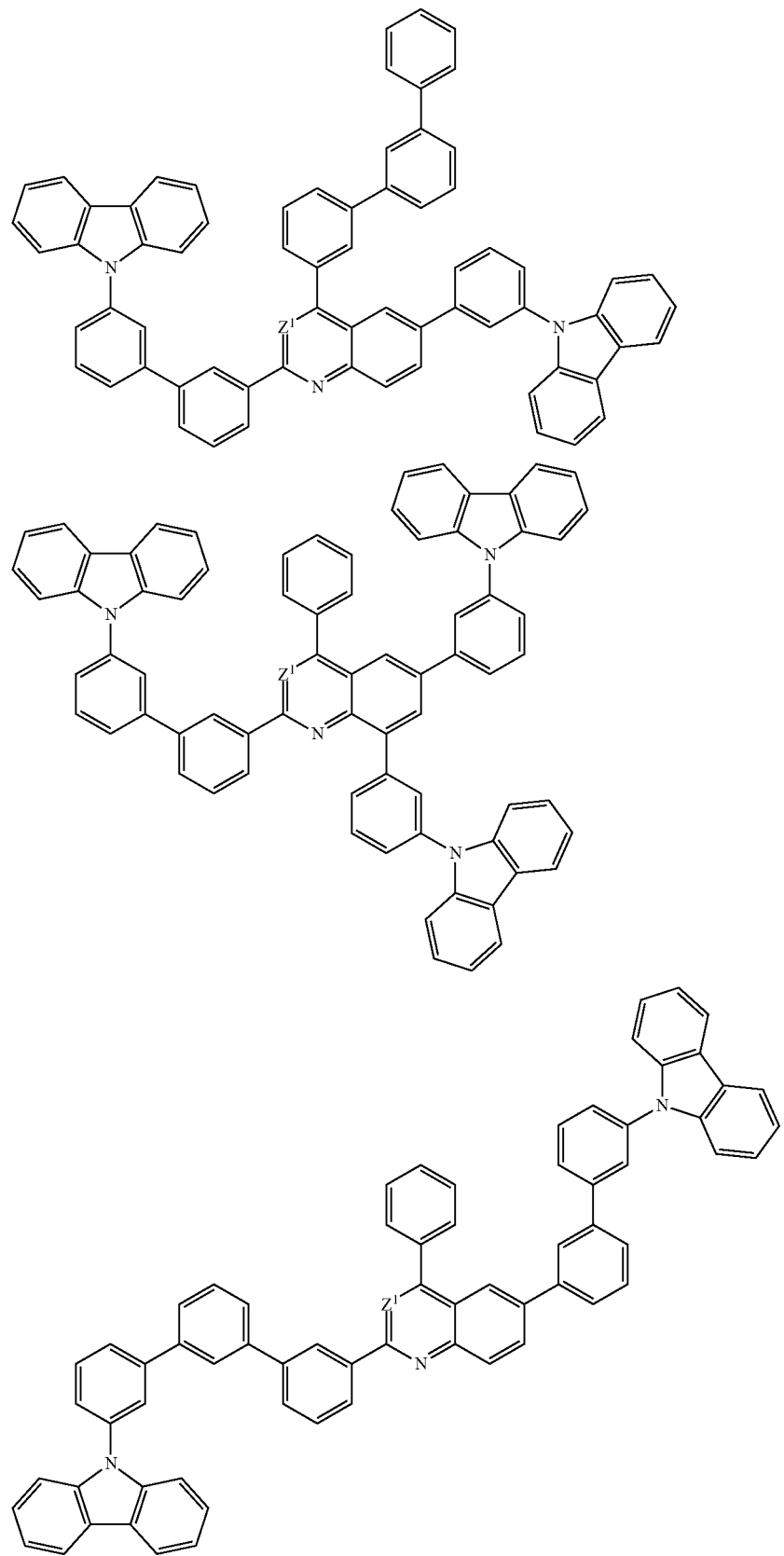

[Chemical Formula 42]
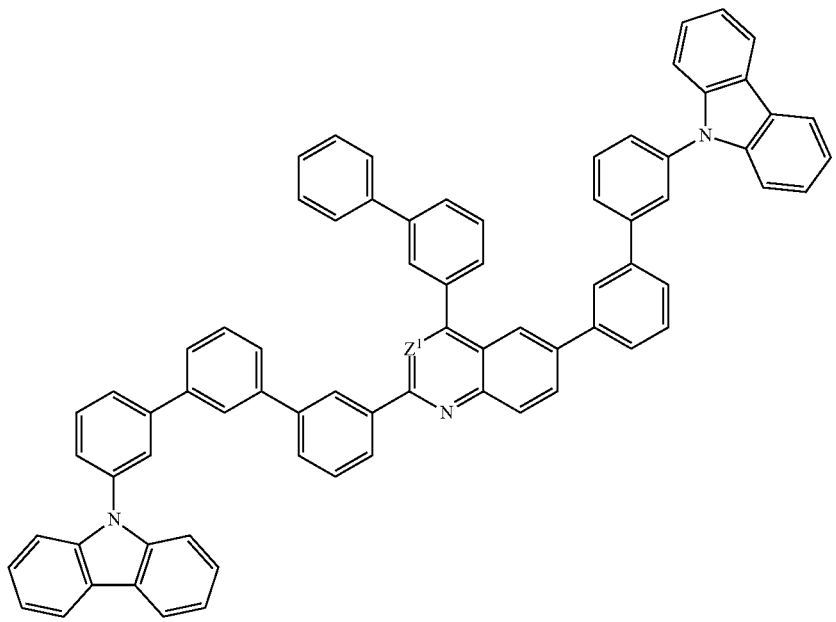
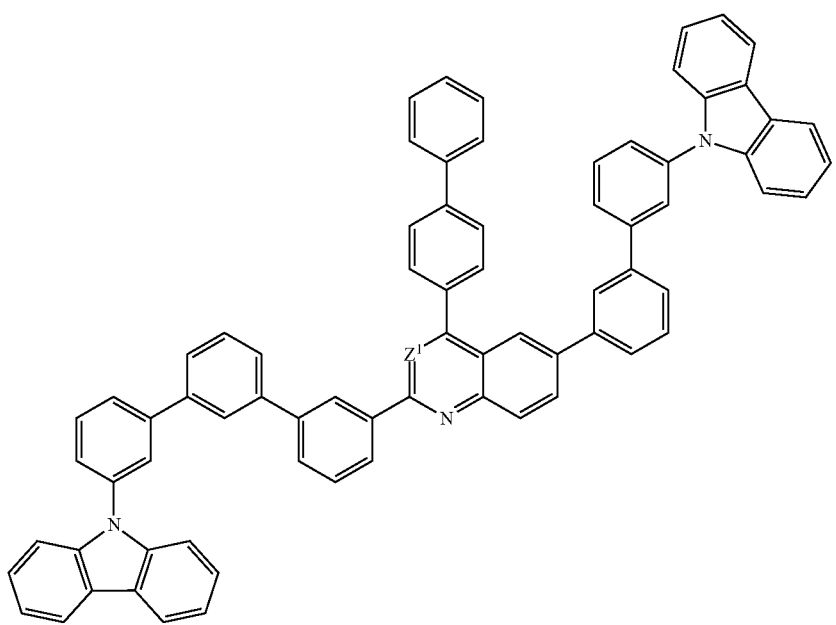

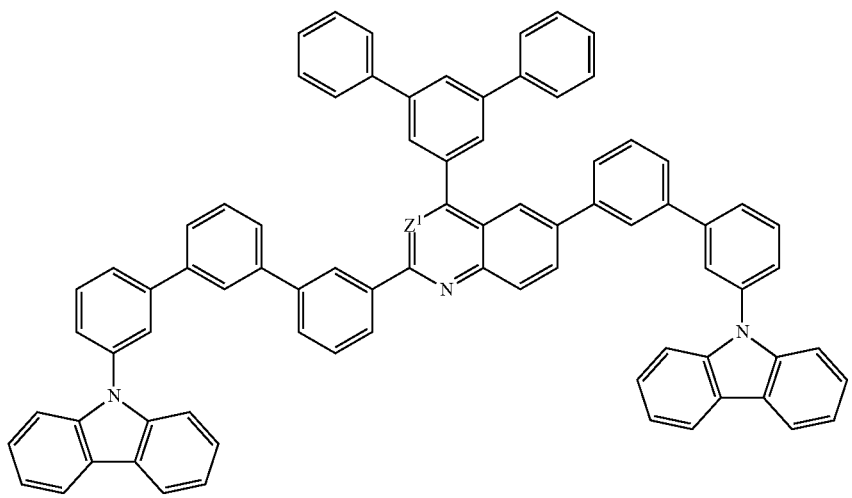
[Chemical Formula 43]
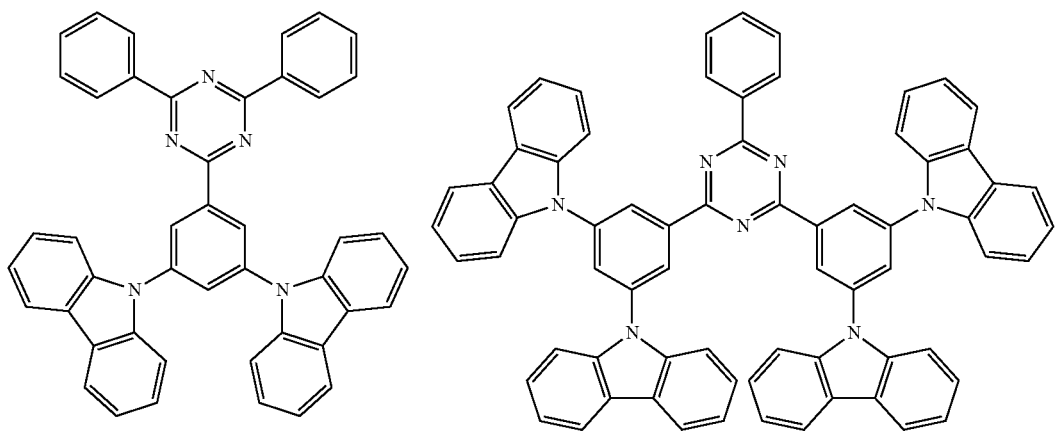
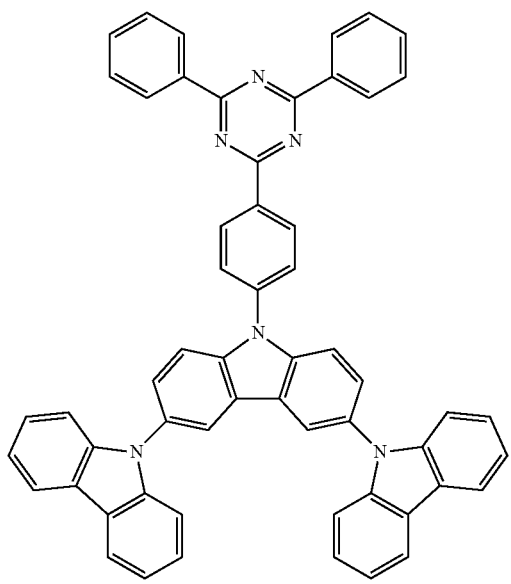

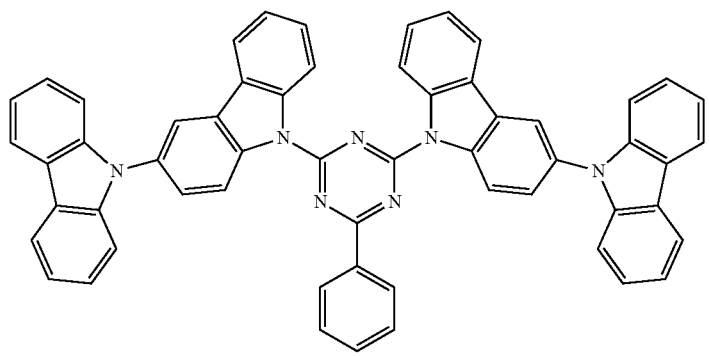
[Chemical Formula 44]
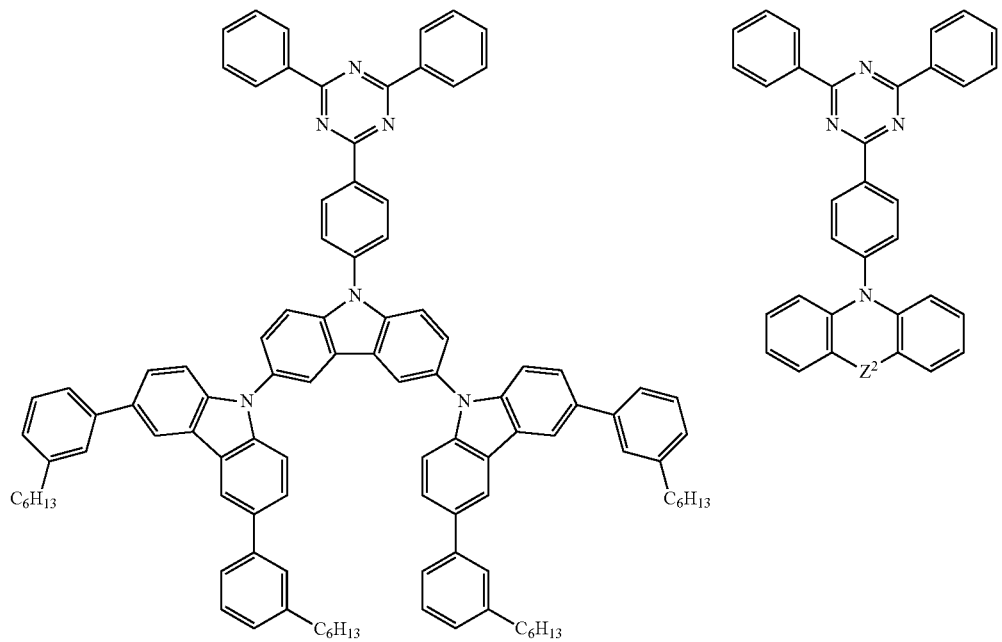
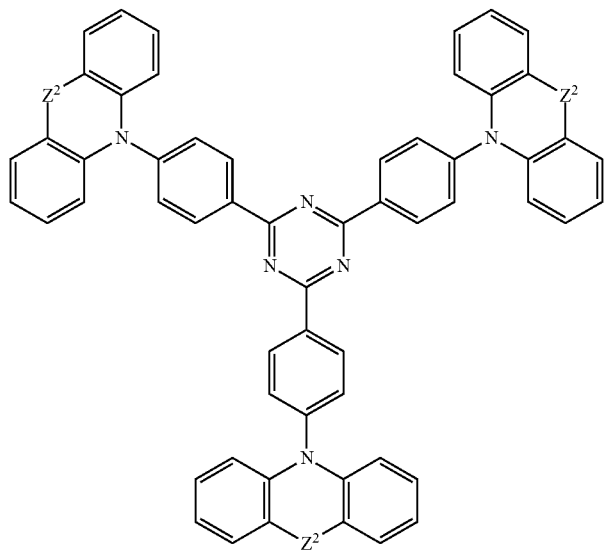

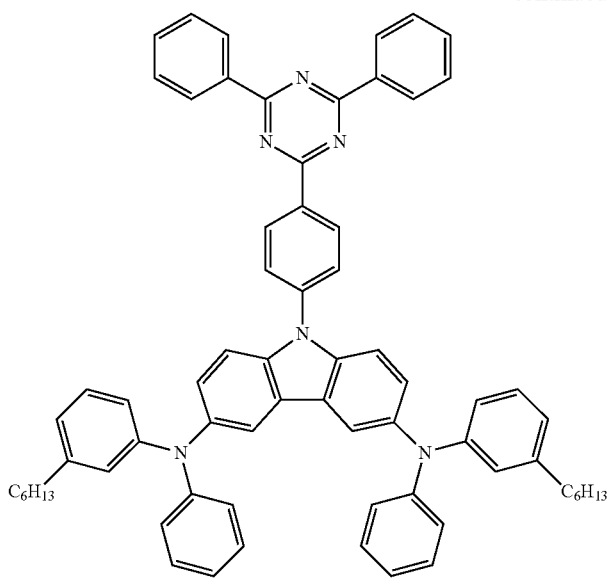
[Chemical Formula 45]
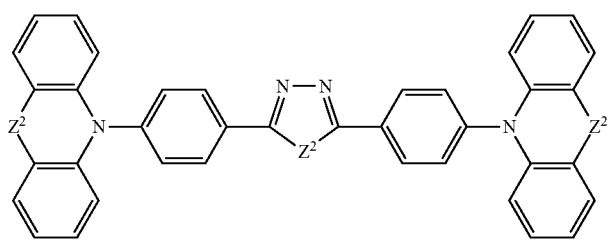
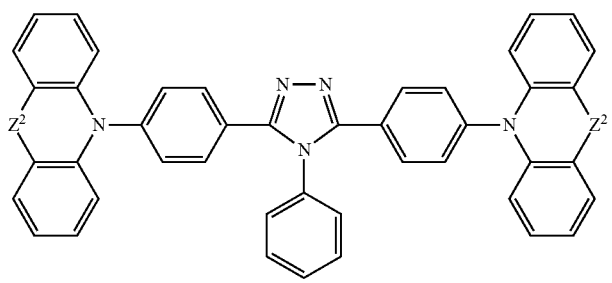
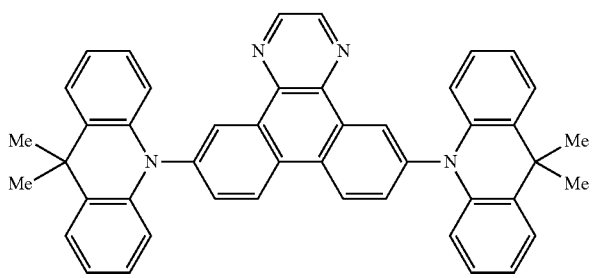

[Chemical Formula 46]
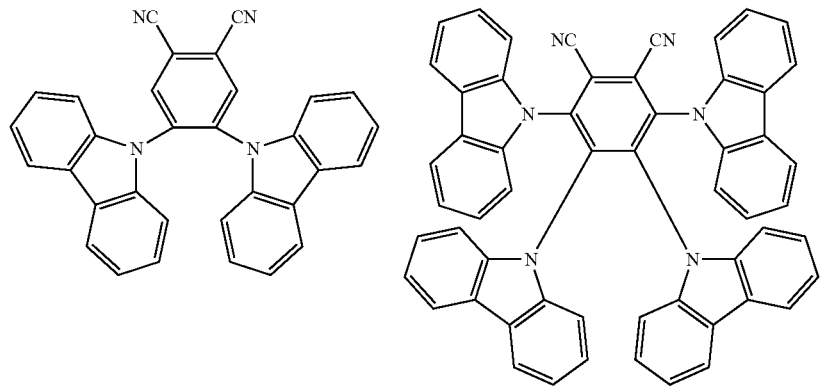
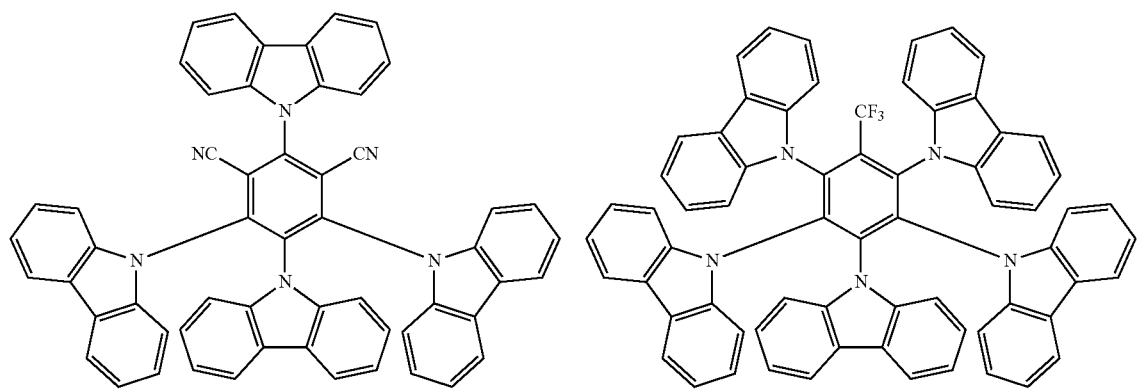
[Chemical Formula 47]
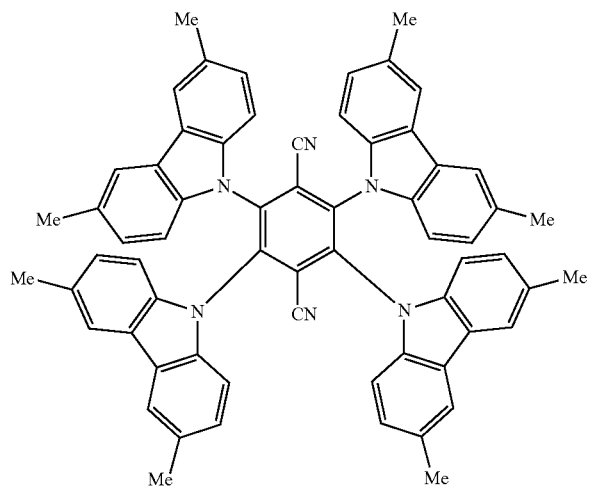

-continued
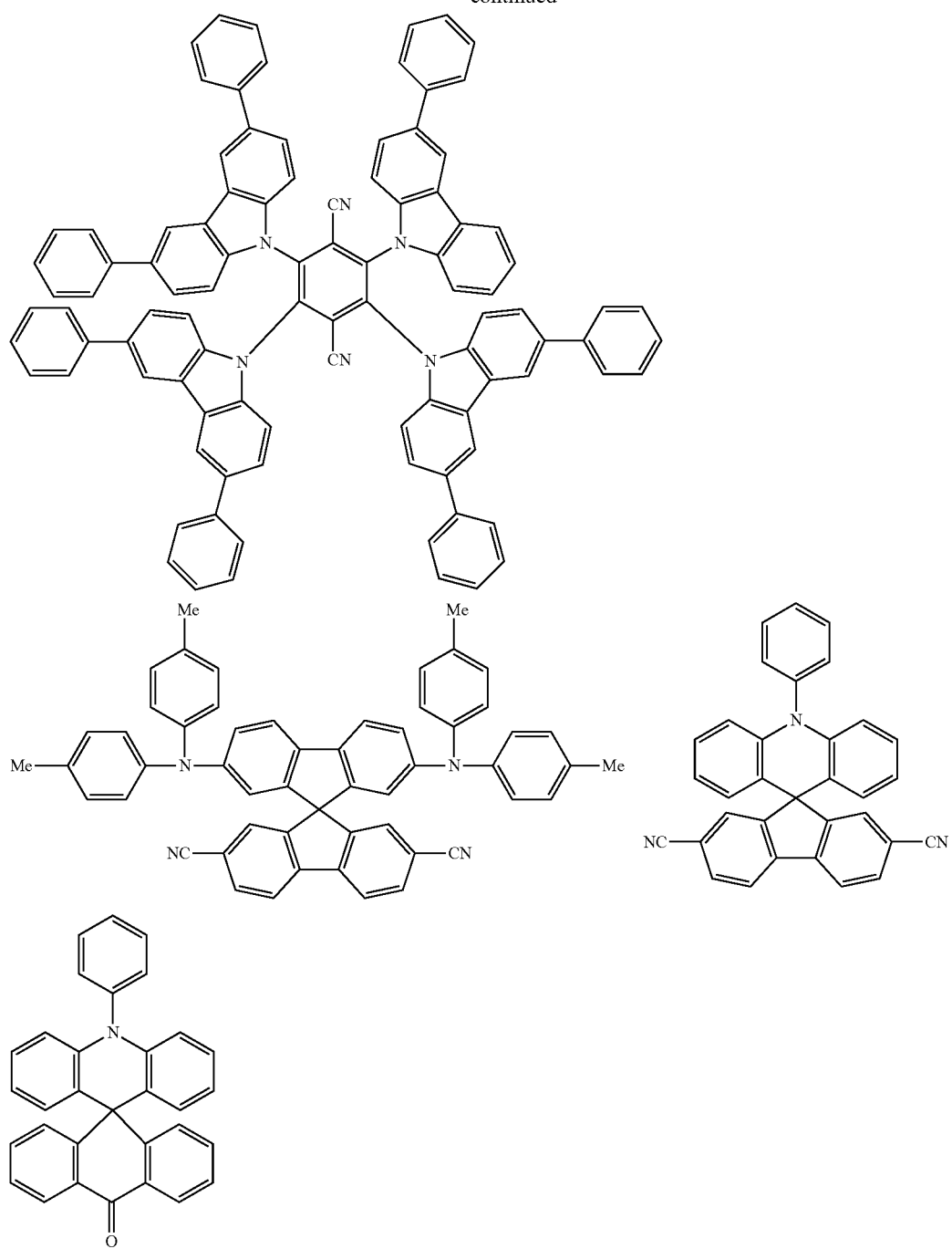
[Chemical Formula 48]
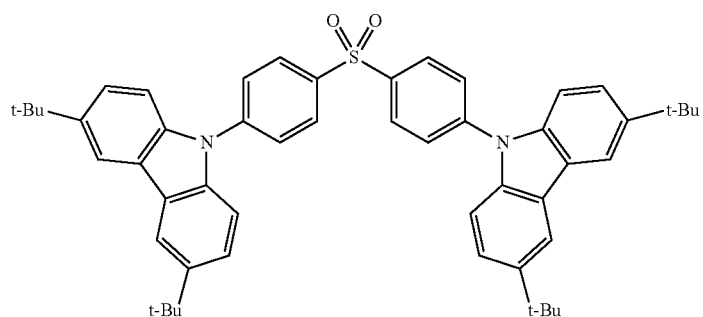

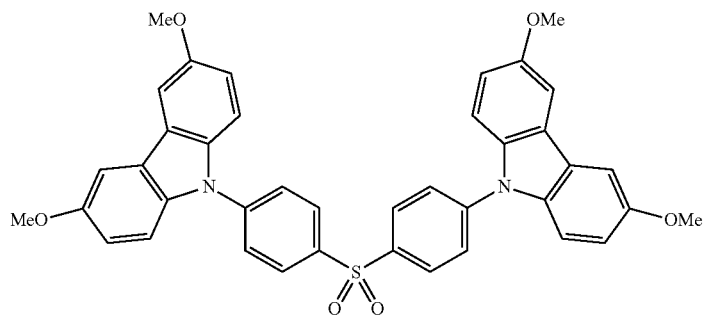
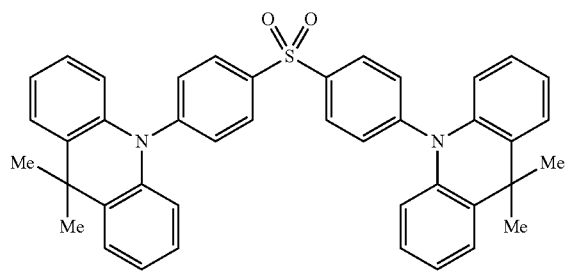
[Chemical Formula 49]
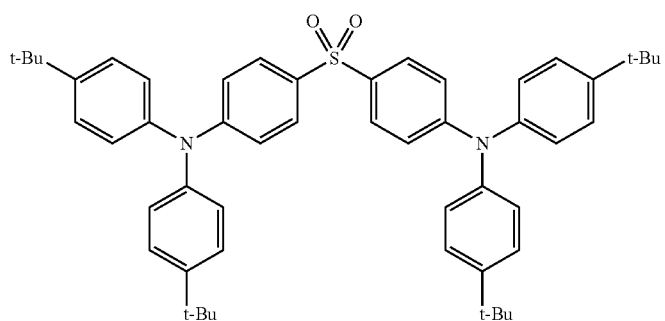
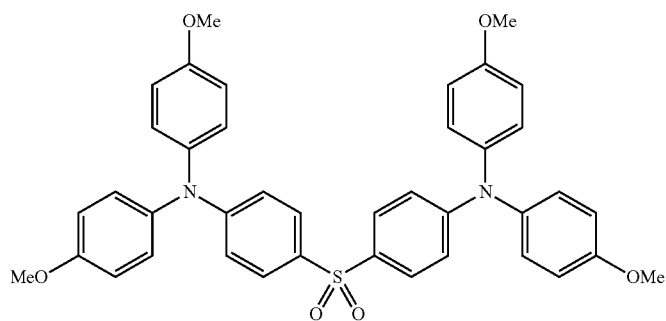
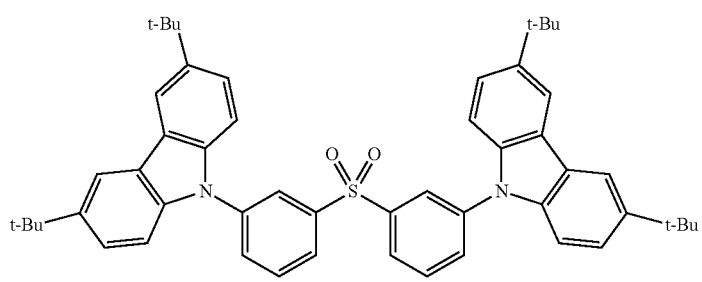

[Chemical Formula 50]
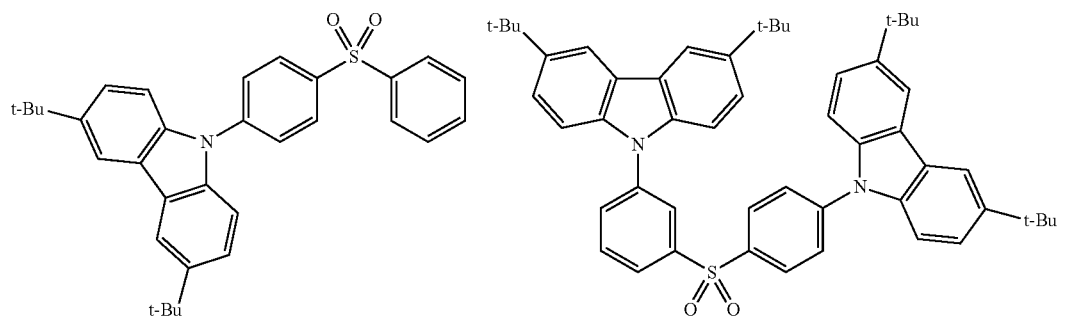
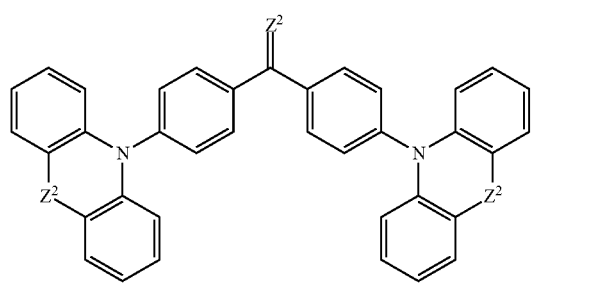
[Chemical Formula 51]
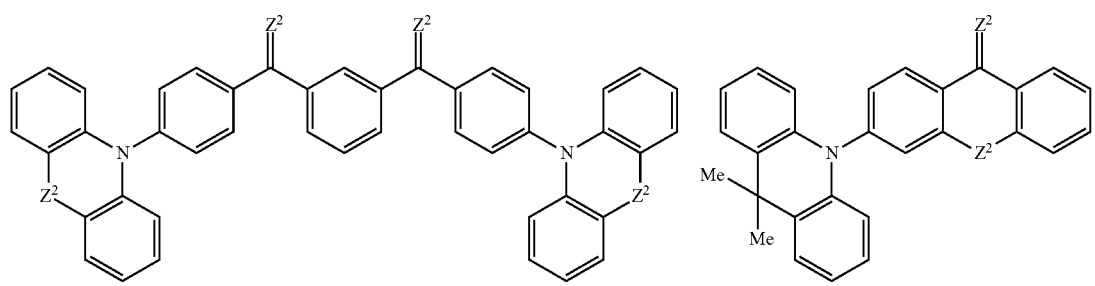

[Chemical Formula 52]
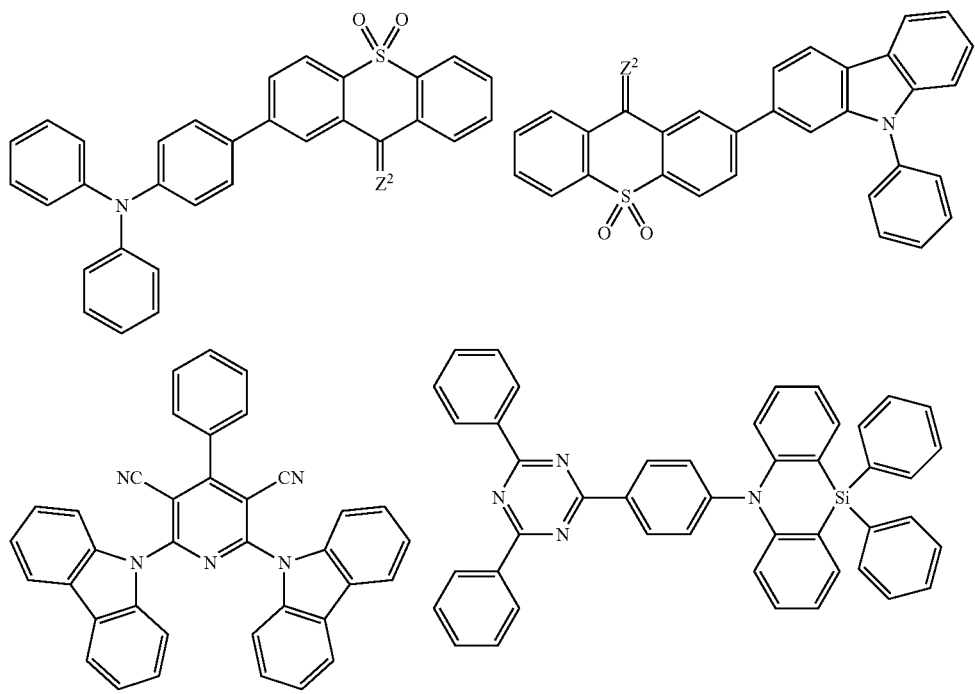
[Chemical Formula 53]
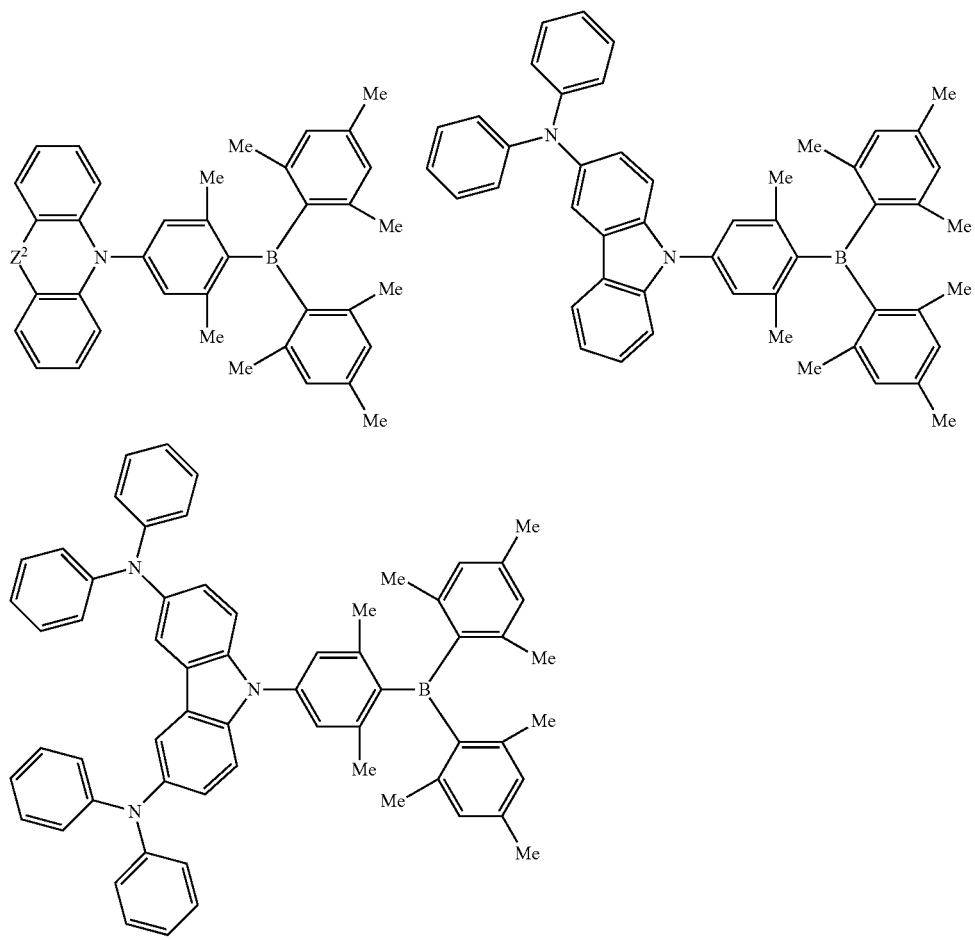

[Chemical Formula 54]

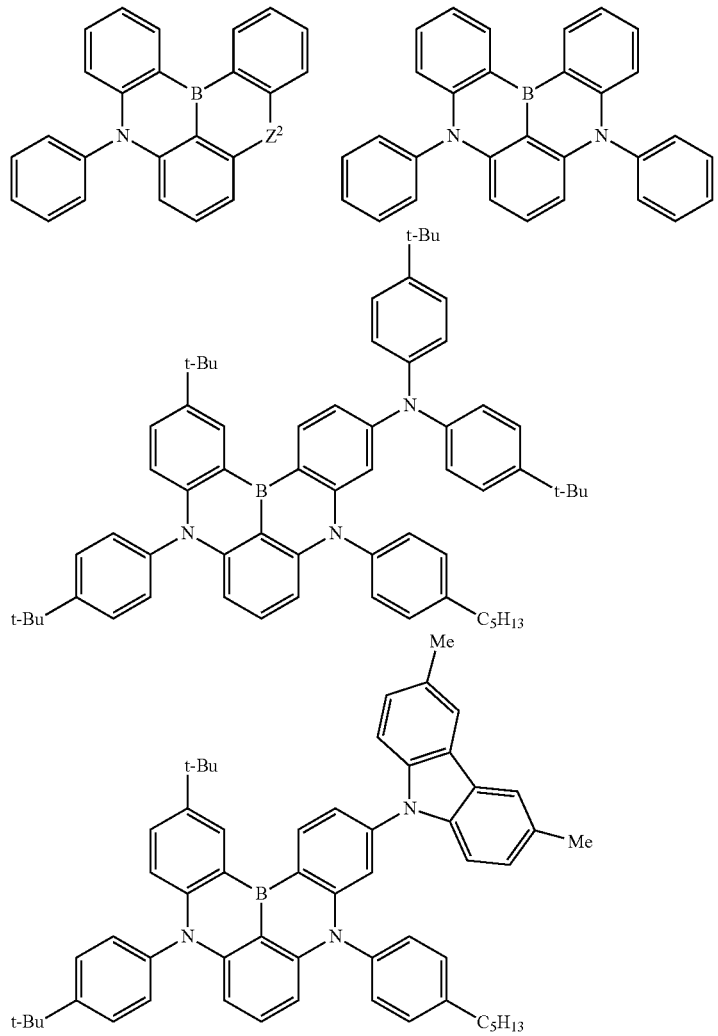

$Z^1$ represents preferably a group represented by —N═. $Z^2$ is preferably an oxygen atom.

The compound (T) is available from Aldrich, Luminescence Technology Corp. and the like. Additionally, the compound (T) can be synthesized according to methods described in, for example, International Publication WO2007/063754, International Publication WO2008/056746, International Publication WO2011/032686, International Publication WO2012/096263, JP-A No. 2009-227663, JP-A No. 2010-275255, Advanced Materials (Adv. Mater), vol. 26, pp. 7931-7958, 2014.

[Host Material]

The first organic layer is preferably a layer containing the compound (T) and a host material having at least one function of hole injectability, hole transportability, electron injectability and electron transportability, since the light emitting device of the present invention is excellent in external quantum efficiency.

The host material is classified into low molecular compounds and polymer compounds, and polymer compounds are preferable, and polymer compounds containing a constitutional unit represented by the formula (Y) are more preferable.

In other words, the first organic layer is preferably a layer containing a composition containing the compound (T) and a polymer compound containing a constitutional unit represented by the formula (Y) and not containing a phosphorescent metal complex, since the light emitting device of the present invention is more excellent in external quantum efficiency.

When the first organic layer is a layer containing the compound (T) and a host material, the host material may be contained singly or in combination of two or more kinds thereof. However, the compound (T) is different from the host material.

When the first organic layer is a layer containing the compound (T) and a host material, the compound (T) is preferably a light emitting material.

The host material means a material which plays a role of transferring electric energy to the light emitting material. It is preferable that the lowest excited triplet state of the host material is at energy level higher than the lowest excited triplet state of the light emitting material and the lowest excited singlet state of the host material is at energy level higher than the lowest excited singlet state of the light emitting material, since the light emitting material is allowed to emit light more efficiently by efficiently transferring electric energy from the host material to the light emitting material.

When the first organic layer is a layer containing the compound (T) and a host material, the content of the compound (T) is usually 0.1 to 50 parts by mass, preferably 1 to 45 parts by mass, more preferably 5 to 40 parts by mass, further preferably 10 to 20 parts by mass when the sum of the compound (T) and the host material is taken as 100 parts by mass.

The host material is preferably one showing solubility with respect to the solvent capable of dissolving the compound (T) contained in the first organic layer, since the light emitting device of the present invention can be fabricated by a solution application process.

[Low Molecular Host]

The low molecular compound preferable as the host material (hereinafter, referred to as "low molecular host") is preferably a compound represented by the formula (H-1) or a compound represented by the formula (H-2), more preferably a compound represented by the formula (H-1). However, the compound represented by the formula (H-1) and the compound represented by the formula (H-2) are different from the compound (T). The compound represented by the formula (H-1) is different from the compound represented by the formula (H-2).

[Chemical Formula 55]

(H-1)

[wherein, $n^{H1}$ represents an integer of 0 or more and 10 or less.

$Ar^{H1}$ and $Ar^{H2}$ each independently represent a group obtained by removing from an aromatic hydrocarbon ring not containing a group represented by —C(=$Z^{T1}$)— in the ring one hydrogen atom bonding directly to a carbon atom constituting the ring (the group optionally has a substituent other than the electron withdrawing group), or a group obtained by removing from a hetero ring not containing a group represented by =N—, a boron atom, a group represented by —C(=$Z^{T1}$)—, a group represented by —S(=O)—, a group represented by —S(=O)$_2$— and a group represented by the above-described formula (P) in the ring one hydrogen atom bonding directly to a carbon atom or a hetero atom constituting the ring (the group optionally has a substituent).

$L^{H1}$ is an alkylene group optionally having a substituent or a cycloalkylene group optionally having a substituent, or a group obtained by removing from an aromatic hydrocarbon ring not containing a group represented by —C(=$Z^{T1}$)— in the ring two hydrogen atoms bonding directly to carbon atoms constituting the ring (the group optionally has a substituent other than the electron withdrawing group), or a group obtained by removing from a hetero ring not containing a group represented by =N—, a boron atom, a group represented by —C(=$Z^{T1}$)—, a group represented by —S(=O)—, a group represented by —S(=O)$_2$— and a group represented by the above-described formula (P) in the ring two hydrogen atoms bonding directly to carbon atoms or hetero atoms constituting the ring (the group optionally has a substituent). When a plurality of $L^{H1}$ are present, they may be the same or different.

$Z^{T1}$ represents the same meaning as described above.].

$n^{H1}$ is preferably an integer of 0 or more and 5 or less, more preferably an integer of 0 or more and 3 or less, further preferably 1 or 2, particularly preferably 1.

$Ar^{H1}$ and $Ar^{H2}$ are each preferably a group obtained by removing from a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring, a chrysene ring, a pyrrole ring, a furan ring, a thiophene ring, a silole ring, a phosphole ring, an indole ring, a benzofuran ring, a benzothiophene ring, a benzosilole ring, a benzophosphole ring, a carbazole ring, a dibenzofuran ring, a dibenzothiophene ring, a dibenzosilole ring, a dibenzophosphole ring, a phenoxazine ring, a phenothiazine ring, a 9,10-dihydroacridine ring, a 5,10-dihydrophenazine ring and a ring obtained by condensing these rings one hydrogen atom bonding directly to a carbon atom or a hetero atom constituting the ring, more preferably a group obtained by removing from a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring, a chrysene ring, a pyrrole ring, a furan ring, a thiophene ring, a silole ring, a phosphole ring, an indole ring, a benzofuran ring, a benzothiophene ring, a benzosilole ring, a benzophosphole ring, a carbazole ring, a dibenzofuran ring, a dibenzothiophene ring, a dibenzosilole ring, a dibenzophosphole ring, a phenoxazine ring, a phenothiazine ring, a 9,10-dihydroacridine ring or a 5,10-dihydrophenazine ring one hydrogen atom bonding directly to a carbon atom or a hetero atom constituting the ring, further preferably a group obtained by removing from a benzene ring, a fluorene ring, a spirobifluorene ring, a carbazole ring, a dibenzofuran ring, a dibenzothiophene ring, a phenoxazine ring, a phenothiazine ring, a 9,10-dihydroacridine ring or a 5,10-dihydrophenazine ring one hydrogen atom bonding directly to a carbon atom or a hetero atom constituting the ring, particularly preferably a group obtained by removing from a benzene ring, a fluorene ring, a spirobifluorene ring, a carbazole ring, a dibenzofuran ring or a dibenzothiophene ring one hydrogen atom bonding directly to a carbon atom or a hetero atom constituting the ring, especially preferably a group obtained by removing from a carbazole ring, a dibenzofuran ring or a dibenzothiophene ring one hydrogen atom bonding directly to a carbon atom or a hetero atom constituting the ring, and these groups optionally have a substituent.

$L^{H1}$ is preferably a group obtained by removing from a group obtained by removing from a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring, a chrysene ring, a pyrrole ring, a furan ring, a thiophene ring, a silole ring, a phosphole ring, an indole ring, a benzofuran ring, a benzothiophene ring, a benzosilole ring, a benzophosphole ring, a carbazole ring, a dibenzofuran ring, a dibenzothiophene ring, a dibenzosilole ring, a dibenzophosphole ring, a phenoxazine ring, a phenothiazine ring, a 9,10-dihydroacridine ring, a 5,10-dihydrophenazine ring and a ring obtained by condensing these rings two hydrogen atoms bonding directly to carbon atoms or hetero atoms constituting the ring, more preferably a group obtained by removing from a benzene ring, a naphthalene ring, an anthracene ring, a phenanthrene ring, a dihydrophenanthrene ring, a naphthacene ring, a fluorene ring, a spirobifluorene ring, an indene ring, a pyrene ring, a perylene ring, a chrysene ring, a pyrrole ring, a furan ring, a thiophene ring, a silole ring, a phosphole ring, an indole ring, a benzofuran ring, a benzothiophene ring, a benzosilole ring, a benzophosphole ring, a carbazole ring, a dibenzofuran ring, a dibenzothiophene ring, a dibenzosilole ring, a dibenzophosphole ring, a phenoxazine ring, a phenothiazine ring, a 9,10-dihydroacridine ring or a 5,10-dihydrophenazine ring two hydrogen atoms bonding directly to carbon atoms or hetero atoms constituting the ring, further preferably a group obtained by removing from a benzene ring, a fluorene ring, a spirobifluorene ring, a carbazole ring, a dibenzofuran ring, a dibenzothiophene ring, a phenoxazine ring, a phenothiazine ring, a 9,10-dihydroacridine ring or a 5,10-dihydrophenazine ring two hydrogen atoms bonding directly to carbon atoms or hetero atoms constituting the ring, particularly preferably a group obtained by removing from a benzene ring, a fluorene ring, a spirobifluorene ring, a carbazole ring, a dibenzofuran ring or a dibenzothiophene ring two hydrogen atoms bonding directly to carbon atoms or hetero atoms constituting the ring, especially preferably a group obtained by removing from a carbazole ring, a dibenzofuran ring or a dibenzothiophene ring two hydrogen atoms bonding directly to carbon atoms or hetero atoms constituting the ring, and these groups optionally have a substituent.

The substituent which $Ar^{H1}$, $Ar^{H2}$ and $L^{H1}$ optionally have is preferably an alkyl group, a cycloalkyl group, an alkoxy group, a cycloalkoxy group, an aryl group, a monovalent hetero ring group or a substituted amino group, more preferably an alkyl group, a cycloalkyl group, an aryl group, a monovalent hetero ring group or a substituted amino group, further preferably an alkyl group, a cycloalkyl group, an aryl group or a monovalent hetero ring group, particularly preferably an alkyl group or a cycloalkyl group, and these groups optionally further have a substituent.

The aryl group as the substituent which $Ar^{H1}$, $Ar^{H2}$ and $L^{H1}$ optionally have is a group obtained by removing from an aromatic hydrocarbon ring not containing a group represented by —C(=$Z^{T1}$)— in the ring one hydrogen atom bonding directly to a carbon atom constituting the ring (the group optionally has a substituent other than the electron withdrawing group), and the monovalent hetero ring group as the substituent which $Ar^{H1}$, $Ar^{H2}$ and $L^{H1}$ optionally have is a group obtained by removing from a hetero ring not containing a group represented by =N—, a boron atom, a group represented by —C(=$Z^{T1}$)—, a group represented by —S(=O)—, a group represented by —S(=O)$_2$— and a group represented by the above-described formula (P) in the ring one hydrogen atom bonding directly to a carbon atom or a hetero atom constituting the ring (the group optionally has a substituent).

The substituent which the substituent which $Ar^{H1}$, $Ar^{H2}$ and $L^{H1}$ optionally have optionally further has is preferably an alkyl group, a cycloalkyl group, an alkoxy group or a cycloalkoxy group, more preferably an alkyl group or a cycloalkyl group.

[Chemical Formula 56]

$$Ar^{H4} - \left[ L^{H2} \right]_{n^{H2}} Ar^{H3} \quad \text{(H-2)}$$

[wherein, $n^{H2}$ represents an integer of 1 or more and 10 or less.

$Ar^{H3}$ and $Ar^{H4}$ each independently represent a monovalent hetero ring group containing a group represented by =N— in the ring, a hydrogen atom, a halogen atom, a cyano group, an alkyl group, a cycloalkyl group, an alkoxy group, a cycloalkoxy group, an aryloxy group or an aryl group, and these groups optionally have a substituent.

$L^{H2}$ represents a divalent hetero ring group containing a group represented by =N— in the ring, an alkylene group, a cycloalkylene group or an arylene group, and these groups optionally have a substituent. When a plurality of $L^{H2}$ are present, they may be the same or different. However, at least one of $L^{H2}$ is a divalent hetero ring group containing a group represented by =N— in the ring.]

$Ar^{H3}$ and $Ar^{H4}$ are each preferably a monovalent hetero ring group containing a group represented by =N— in the ring, a hydrogen atom, an alkyl group, a cycloalkyl group, an alkoxy group, a cycloalkoxy group or an aryl group, more preferably a monovalent hetero ring group containing a group represented by =N— in the ring, an alkyl group, a cycloalkyl group or an aryl group, further preferably a monovalent hetero ring group containing a group represented by =N— in the ring or an aryl group, particularly preferably an aryl group, and these groups optionally have a substituent.

The examples and the preferable range of the aryl group represented by $Ar^{H3}$ and $Ar^{H4}$ are the same as the examples and the preferable range of the aryl group represented by $Ar^{T1}$.

The monovalent hetero ring group containing a group represented by =N— in the ring is a group obtained by removing from a hetero ring group containing a group represented by =N— in the ring one hydrogen atom bonding directly to a carbon atom or a hetero atom constituting the ring.

$n^{H2}$ is preferably an integer of 1 or more and 5 or less, more preferably an integer of 1 or more and 3 or less, further preferably 1 or 2, particularly preferably 1.

$L^{H2}$ is preferably a divalent hetero ring group containing a group represented by =N— in the ring or an arylene group, more preferably a divalent hetero ring group containing a group represented by =N— in the ring, and these groups optionally have a substituent.

The examples and the preferable range of the arylene group represented by $L^{M2}$ are the same as the examples and the preferable range of the arylene group represented by $L^{T1}$.

The divalent hetero ring group containing a group represented by =N— in the ring is a group obtained by removing from a hetero ring group containing a group represented by =N— in the ring two hydrogen atoms bonding directly to carbon atoms or hetero atoms constituting the ring.

The substituent which $L^{H2}$, $Ar^{H3}$ and $Ar^{H4}$ optionally have is preferably a monovalent hetero ring group containing a group represented by =N—, an alkyl group, a cycloalkyl group, an alkoxy group, a cycloalkoxy group or an aryl group, more preferably a monovalent hetero ring group containing a group represented by =N—, an alkyl group, a cycloalkyl group or an aryl group, further preferably an alkyl group, a cycloalkyl group or an aryl group, and these groups optionally further have a substituent.

The examples and the preferable range of the aryl group as the substituent which $L^{H2}$, $Ar^{H3}$ and $Ar^{H4}$ optionally have are the same as the examples and the preferable range of the aryl group represented by $Ar^{T1}$.

The substituent which the substituent which $L^{H2}$, $Ar^{H3}$ and $Ar^{H4}$ optionally have optionally further hast is preferably an alkyl group, a cycloalkyl group, an alkoxy group or a cycloalkoxy group, more preferably an alkyl group or a cycloalkyl group.

The compound represented by formula (H-1) includes, for example, compounds represented by the formula (H-101) to the formula (H-106) and the formula (H-113) to the formula (H-118). The compound represented by the formula (H-2) includes, for example, compounds represented by the formula (H-107) to the formula (H-112).

[Chemical Formula 57]

(H-101)

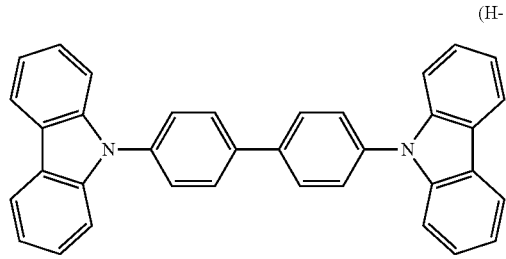

(H-102)

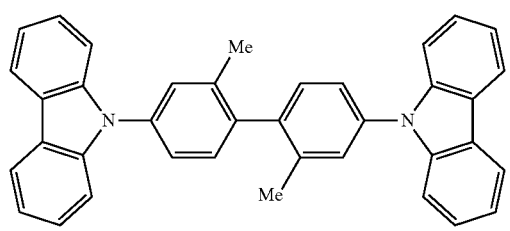

(H-103)

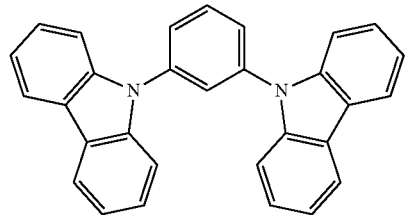

(H-104)

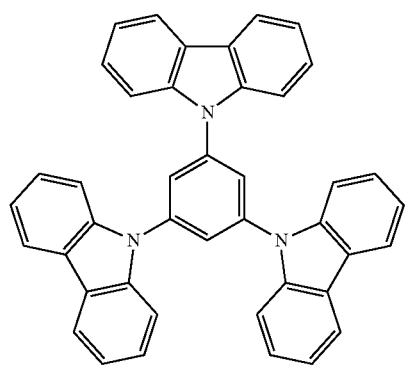

-continued (H-105)

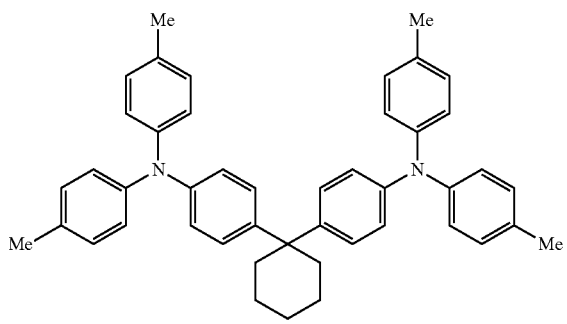

(H-106)

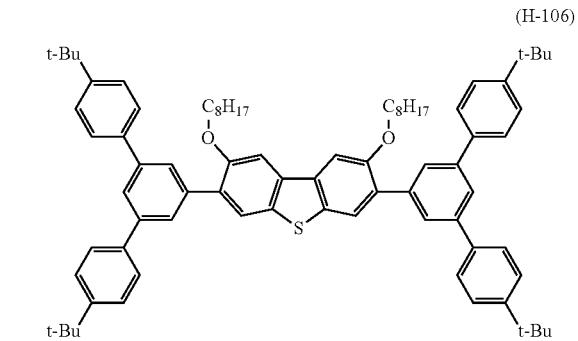

[Chemical Formula 58]

(H-107)

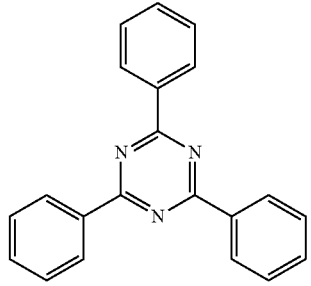

(H-108)

-continued
(H-109)
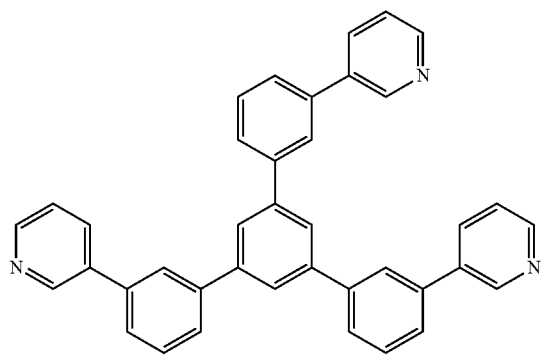
(H-110)
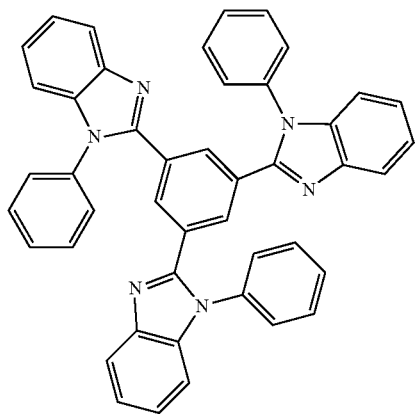
(H-111)
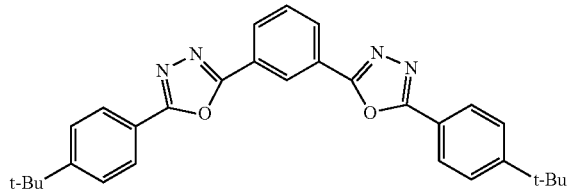
(H-112)
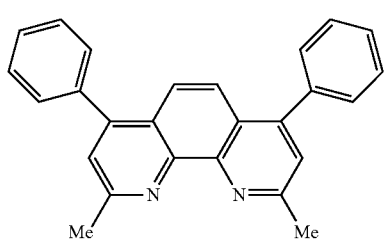
[Chemical Formula 59]
(H-113)
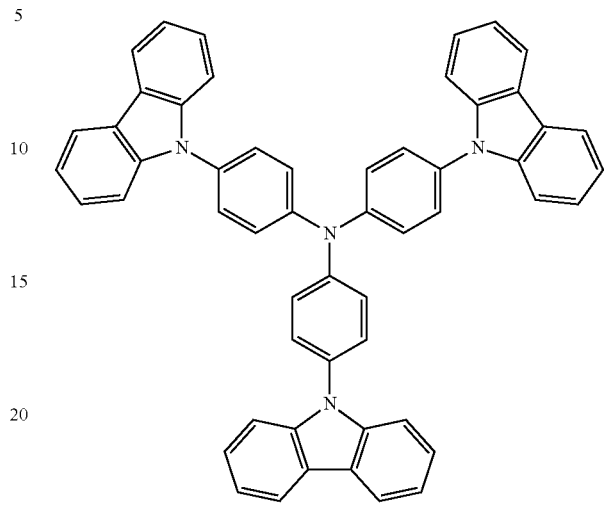
(H-114)
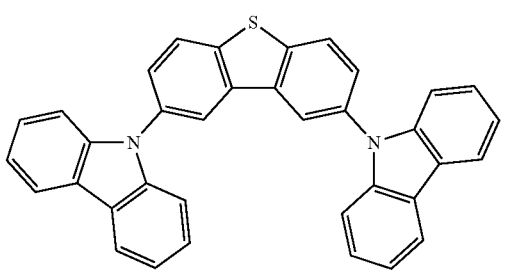
[Chemical Formula 60]
(H-115)
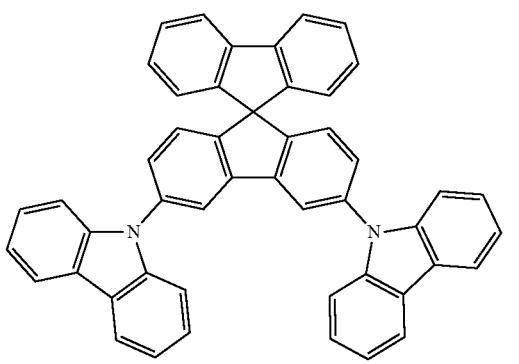
(H-116)
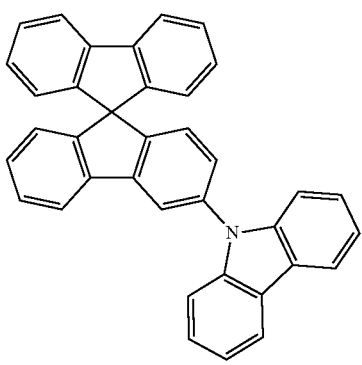

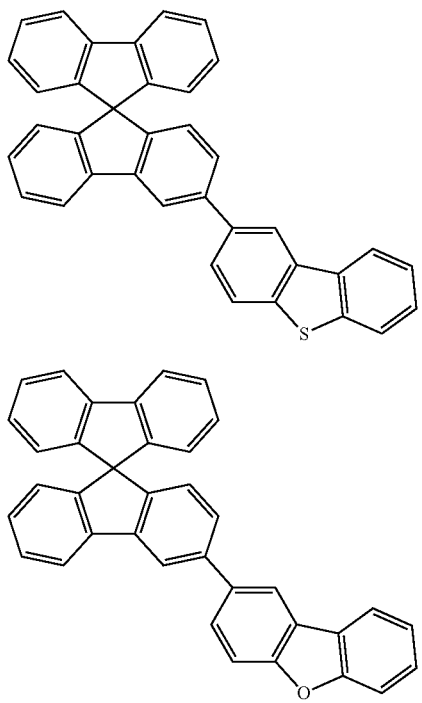

(H-117)

(H-118)

The polymer compound used as the host material includes, for example, a polymer compound described later as a hole transporting material and a polymer compound described later as an electron transporting material.

[Polymer Host]

The polymer compound which is preferable as the host compound (hereinafter, referred to as "polymer host") is preferably a polymer compound containing a constitutional unit represented by the formula (Y).

The arylene group represented by $Ar^{Y1}$ is more preferably a group represented by the formula (A-1) to the formula (1-10), the formula (A-19) or the formula (A-20), further preferably a group represented by the formula (A-1) to the formula (A-3), the formula (A-6) to the formula (A-10), the formula (A-19) or the formula (A-20), particularly preferably a group represented by the formula (A-1) to the formula (A-3), the formula (A-7) to the formula (A-9), the formula (A-19) or the formula (A-20), especially preferably a group represented by the formula (A-1), the formula (A-2), the formula (A-7), the formula (A-9) or the formula (A-19), and these groups optionally have a substituent.

The divalent hetero ring group represented by $Ar^{Y1}$ is more preferably a group represented by the formula (AA-1) to the formula (AA-4), the formula (AA-10) to the formula (AA-15), the formula (AA-18) to the formula (AA-21), the formula (AA-33) or the formula (AA-34), further preferably a group represented by the formula (AA-4), the formula (AA-10), the formula (AA-12), the formula (AA-14) or the formula (AA-33), and these groups optionally have a substituent.

In the divalent group in which at least one arylene group and at least one divalent hetero ring group are bonded directly represented by $Ar^{T1}$, the more preferable range and the further preferable range of the arylene group and the divalent hetero ring group are the same as the more preferable range and the further preferable range of the arylene group and the divalent hetero ring group represented by $Ar^{Y1}$ described above, respectively.

"Divalent group in which at least one arylene group and at least one divalent hetero ring group are bonded directly" includes, for example, groups represented by the following formulae, and these groups optionally have a substituent.

[Chemical Formula 61]

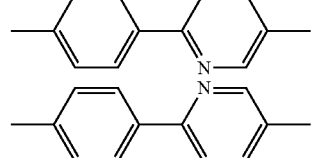

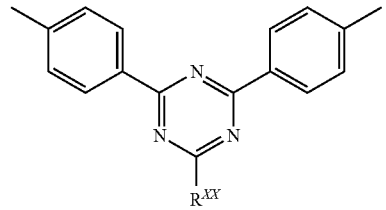

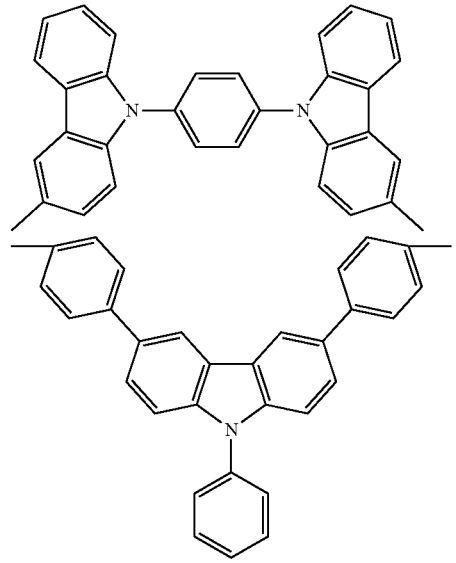

[wherein, $R^{XX}$ represents a hydrogen atom, an alkyl group, a cycloalkyl group, an aryl group or a monovalent hetero ring group, and these groups optionally have a substituent.]

$R^{XX}$ is preferably an alkyl group, a cycloalkyl group or an aryl group, and these groups optionally have a substituent.

The substituent which the group represented by $Ar^{Y1}$ optionally has is preferably an alkyl group, a cycloalkyl group, an alkoxy group, a cycloalkoxy group, an aryl group, a monovalent hetero ring group, a substituted amino group, a fluorine atom or a cyano group, more preferably an alkyl group, a cycloalkyl group, an alkoxy group, a cycloalkoxy group, an aryl group, a monovalent hetero ring group or a substituted amino group, further preferably an alkyl group, a cycloalkyl group, an aryl group or a monovalent hetero ring group, particularly preferably an alkyl group, a cycloalkyl group or an aryl group, and these groups optionally further have a substituent.

The substituent which the substituent which the group represented by $Ar^{Y1}$ optionally has optionally further has is preferably an alkyl group, a cycloalkyl group, an alkoxy group, a cycloalkoxy group, an aryl group, a monovalent hetero ring group, a substituted amino group, a fluorine atom or a cyano group, more preferably an alkyl group, a cycloalkyl group, an aryl group or a monovalent hetero ring group, further preferably an alkyl group or a cycloalkyl group, and these groups optionally further have a substituent.

The constitutional unit represented by the formula (Y) includes, for example, constitutional units represented by the formula (Y-1) to the formula (Y-10), and is preferably a constitutional unit represented by the formula (Y-1) to the formula (Y-3) from the standpoint of the external quantum efficiency of the light emitting device of the present invention, preferably a constitutional unit represented by the formula (Y-4) to the formula (Y-7) from the standpoint of the electron transportability of the light emitting device of the present invention, and preferably a constitutional unit represented by the formula (Y-8) to the formula (Y-10) from the standpoint of the hole transportability of the light emitting device of the present invention.

[Chemical Formula 62]

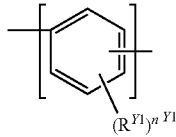

(Y-1)

[wherein, $R^{Y1}$ is a hydrogen atom, an alkyl group, a cycloalkyl group, an alkoxy group, a cycloalkoxy group, an aryl group or a monovalent hetero ring group, and these groups optionally have a substituent. When a plurality of $R^{Y1}$ are present, they may be the same or different, and adjacent $R^{Y1}$ may be combined together to form a ring together with carbon atoms to which they are attached.

$n^{Y1}$ represents 4.]

$R^{Y1}$ is preferably a hydrogen atom, an alkyl group, a cycloalkyl group, an aryl group or a monovalent hetero ring group, more preferably a hydrogen atom, an alkyl group, a cycloalkyl group or an aryl group, further preferably a hydrogen atom, an alkyl group or a cycloalkyl group, particularly preferably a hydrogen atom or an alkyl group, and these groups optionally have a substituent.

The examples and the preferable range of the substituent which $R^{Y1}$ optionally has are the same as the examples and the preferable range of the substituent which the substituent which the group represented by $Ar^{Y1}$ optionally has optionally further has.

The constitutional unit represented by the formula (Y-1) is preferably a constitutional unit represented by the formula (Y-1-1) or the formula (Y-1-2), more preferably a constitutional unit represented by the formula (Y-1-1).

[Chemical Formula 63]

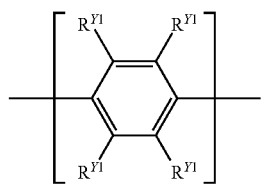

(Y-1-1)

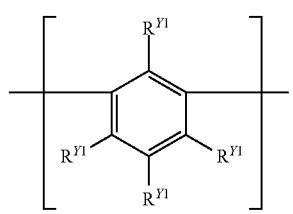

(Y-1-2)

[wherein, $R^{Y1}$ represents the same meaning as described above.]

The constitutional unit represented by the formula (Y-1-1) is preferably a constitutional unit represented by the formula (Y-1-1') or the formula (Y-1-1''), more preferably a constitutional unit represented by the formula (Y-1-1').

The constitutional unit represented by the formula (Y-1-2) is preferably a constitutional unit represented by the formula (Y-1-2') or the formula (Y-1-2''), more preferably a constitutional unit represented by the formula (Y-1-2').

[Chemical Formula 64]

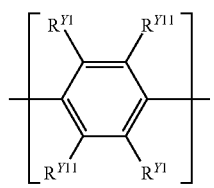

(Y-1-1')

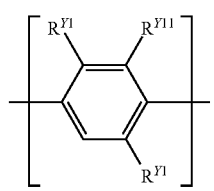

(Y-1-1'')

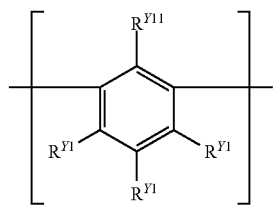

(Y-1-2')

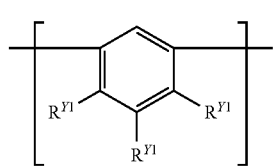

(Y-1-2'')

[wherein, $R^{Y1}$ represents the same meaning as described above.

$R^{Y11}$ represents an alkyl group, a cycloalkyl group, an alkoxy group, a cycloalkoxy group, an aryl group or a monovalent hetero ring group, and these groups optionally have a substituent. A plurality of $R^{Y11}$ may be the same or different.]

$R^{Y11}$ is preferably an alkyl group, a cycloalkyl group, an aryl group or a monovalent hetero ring group, more preferably an alkyl group, a cycloalkyl group or an aryl group, further preferably an alkyl group or a cycloalkyl group, particularly preferably an alkyl group, and these groups optionally have a substituent.

The examples and the preferable range of the substituent which $R^{Y11}$ optionally has are the same as the examples and the preferable range of the substituent which the substituent which the group represented by $Ar^{Y1}$ optionally has optionally further has.

[Chemical Formula 65]

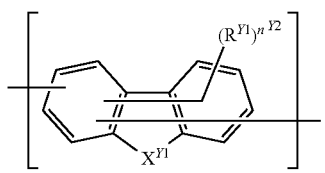

(Y-2)

[wherein, $R^{Y1}$ represents the same meaning as described above.

$X^{Y1}$ represents a group represented by —C($R^{Y2}$)$_2$—, —C($R^{Y2}$)=C($R^{Y2}$)— or C($R^{Y2}$)$_2$-C($R^{Y2}$)$_2$-. $R^{Y2}$ represents a hydrogen atom, an alkyl group, a cycloalkyl group, an alkoxy group, a cycloalkoxy group, an aryl group or a monovalent hetero ring group, and these groups optionally have a substituent. A plurality of $R^{Y2}$ may be the same or different, and groups $R^{Y2}$ may be combined together to form a ring together with carbon atoms to which they are attached.

$n^{Y2}$ represents 6.]

$R^{Y2}$ is preferably an alkyl group, a cycloalkyl group, an aryl group or a monovalent hetero ring group, more preferably an alkyl group, a cycloalkyl group or an aryl group, and these groups optionally have a substituent.

The examples and the preferable range of the substituent which $R^{Y2}$ optionally has are the same as the examples and the preferable range of the substituent which the substituent which the group represented by $Ar^{Y1}$ optionally has optionally further has.

In $X^{Y1}$, the combination of two groups $R^{Y2}$ in the group represented by —C($R^{Y2}$)$_2$- is preferably a combination in which both represent an alkyl group or a cycloalkyl group, both represent an aryl group, both represent a monovalent hetero ring group, or one represents an alkyl group or a cycloalkyl group and the other represents an aryl group or a monovalent hetero ring group, more preferably a combination in which one represents an alkyl group or a cycloalkyl group and the other represents an aryl group, and these groups optionally have a substituent. Two groups $R^{Y2}$ may be combined together to form a ring together with atoms to which they are attached, and when $R^{Y2}$ forms a ring, the group represented by —C($R^{Y2}$)$_2$- is preferably a group represented by the formula (Y-A1) to the formula (Y-A5), more preferably a group represented by the formula (Y-A4), and these groups optionally have a substituent.

[Chemical Formula 66]

(Y-A1)

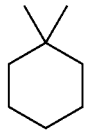
(Y-A2)

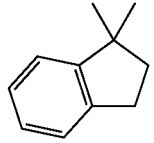
(Y-A3)

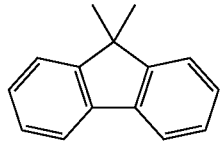
(Y-A4)

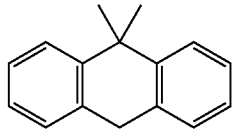
(Y-A5)

In $X^{Y1}$, the combination of two groups $R^{Y2}$ in the group represented by —C($R^{Y2}$)=C($R^{Y2}$)— is preferably a combination in which both represent an alkyl group or a cycloalkyl group, or one represents an alkyl group or a cycloalkyl group and the other represents an aryl group, and these groups optionally have a substituent.

In $X^{Y1}$, four groups $R^{Y2}$ in the group represented by —C($R^{Y2}$)$_2$-C($R^{Y2}$)$_2$- represent preferably an alkyl group or a cycloalkyl group optionally having a substituent. A plurality of $R^{Y2}$ may be combined together to form a ring together with atoms to which they are attached, and when $R^{Y2}$ forms a ring, the group represented by —C($R^{Y2}$)$_2$-C($R^{Y2}$)$_2$- is preferably a group represented by the formula (Y-B1) to the formula (Y-B5), more preferably a group represented by the formula (Y-B3), and these groups optionally have a substituent.

[Chemical Formula 67]

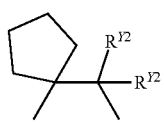
(Y-B1)

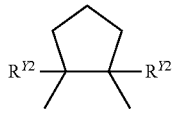
(Y-B2)

(Y-B3)

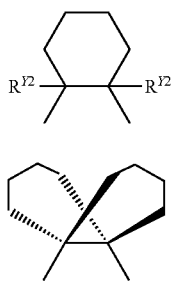

(Y-B4)

(Y-B5)

[wherein, $R^{Y2}$ represents the same meaning as described above.]

The constitutional unit represented by the formula (Y-2) is preferably a constitutional unit represented by the formula (Y-2-1) to (Y-2-4), more preferably a constitutional unit represented by the formula (Y-2-1) to the formula (Y-2-3).

[Chemical Formula 68]

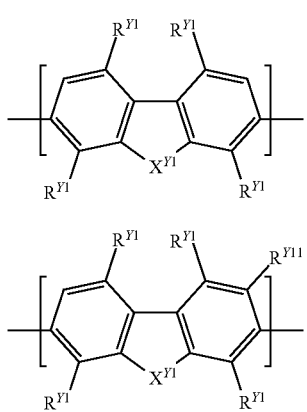

(Y-2-1)

(Y-2-2)

(Y-2-3)

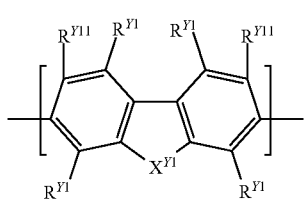

(Y-2-4)

[wherein, $R^{Y1}$, $R^{Y11}$ and $X^{Y1}$ represent the same meaning as described above.]

[Chemical Formula 69]

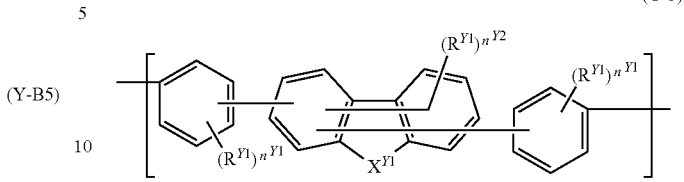

(Y-3)

[wherein, $n^{Y1}$, $n^{Y2}$, $R^{Y1}$ and $X^{Y1}$ represent the same meaning as described above.]

The constitutional unit represented by the formula (Y-3) is preferably a constitutional unit represented by the formula (Y-3-1) to the formula (Y-3-4), more preferably a constitutional unit represented by the formula (Y-3-1) to the formula (Y-3-3).

[Chemical Formula 70]

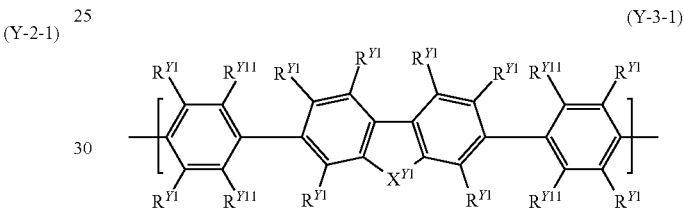

(Y-3-1)

(Y-3-2)

[Chemical Formula 71]

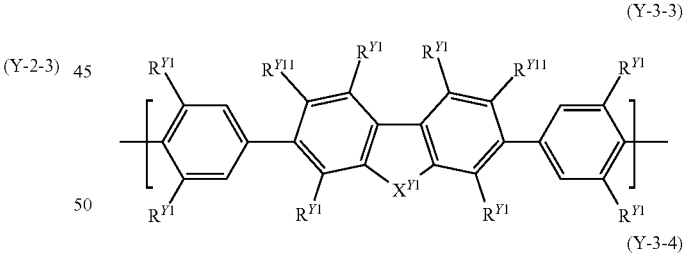

(Y-3-3)

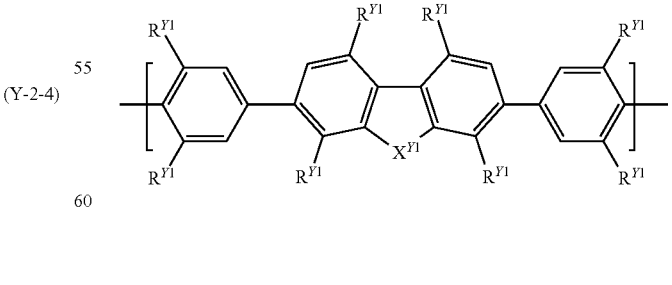

(Y-3-4)

[wherein, $n^{Y1}$, $n^{Y2}$, $R^{Y1}$, $R^{Y11}$ and $X^{Y1}$ represent the same meaning as described above.]

[Chemical Formula 72]

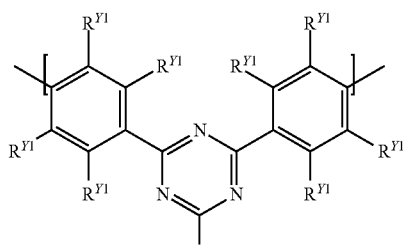
(Y-4)

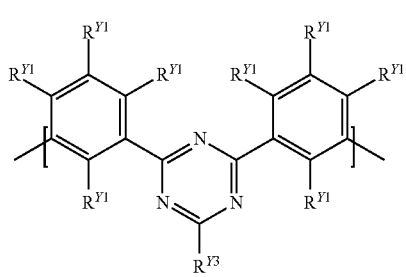
(Y-5)

[Chemical Formula 73]

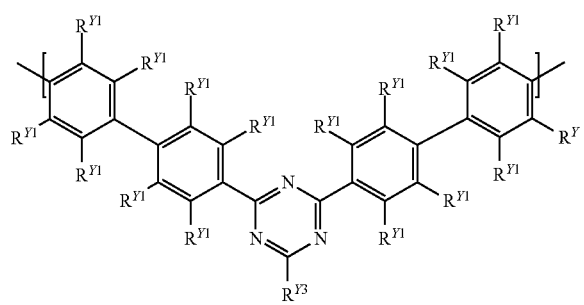
(Y-6)

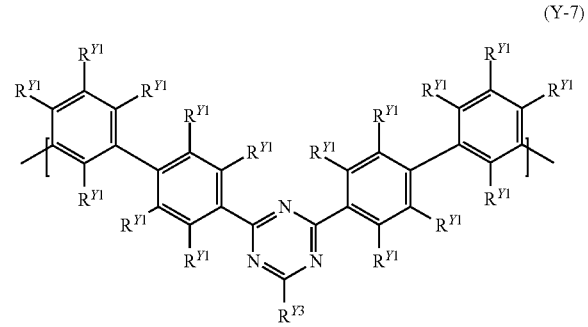
(Y-7)

[wherein, $R^{Y1}$ represents the same meaning as described above.

$R^{Y3}$ represents a hydrogen atom, an alkyl group, a cycloalkyl group, an alkoxy group, a cycloalkoxy group, an aryl group or a monovalent hetero ring group, and these groups optionally have a substituent.]

$R^{Y3}$ is preferably an alkyl group, a cycloalkyl group, an aryl group or a monovalent hetero ring group, more preferably an aryl group or a monovalent hetero ring group, further preferably an aryl group, and these groups optionally have a substituent.

The examples and the preferable range of the substituent which $R^{Y3}$ optionally has are the same as the examples and the preferable range of the substituent which the substituent which the group represented by $Ar^{Y1}$ optionally has optionally further has.

The constitutional unit represented by the formula (Y-4) is preferably a constitutional unit represented by the formula (Y-4').

The constitutional unit represented by the formula (Y-6) is preferably a constitutional unit represented by the formula (Y-6').

[Chemical Formula 74]

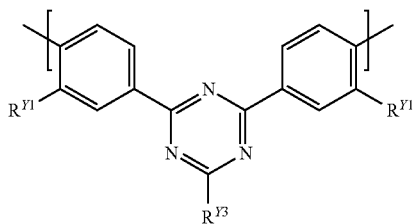
(Y-4')

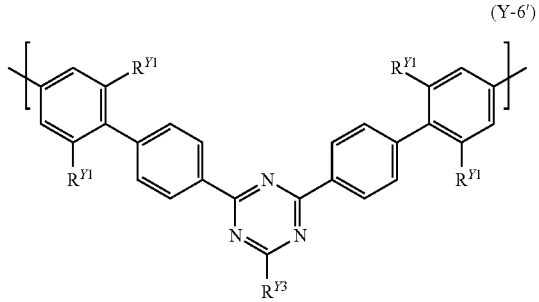
(Y-6')

[wherein, $R^{Y1}$ and $R^{Y3}$ represent the same meaning as described above.]

[Chemical Formula 75]

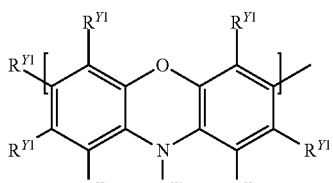
(Y-8)

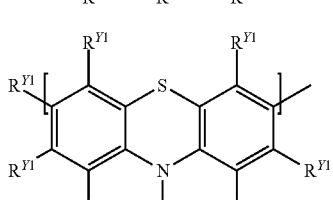
(Y-9)

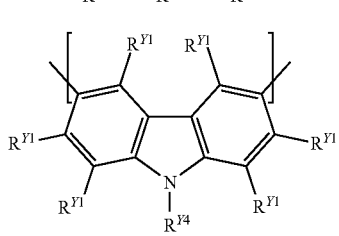
(Y-10)

[wherein, $R^{Y1}$ represents the same meaning as described above. $R^{Y4}$ represents a hydrogen atom, an alkyl group, a cycloalkyl group, an alkoxy group, a cycloalkoxy group, an aryl group or a monovalent hetero ring group, and these groups optionally have a substituent.]

$R^{Y4}$ is preferably an alkyl group, a cycloalkyl group, an aryl group or a monovalent hetero ring group, more preferably an aryl group or a monovalent hetero ring group, further preferably an aryl group, and these groups optionally have a substituent.

The examples and the preferable range of the substituent which $R^{Y4}$ optionally has are the same as the examples and the preferable range of the substituent which the substituent which the group represented by $Ar^{Y1}$ optionally has optionally further has.

The constitutional unit represented by the formula (Y) includes, for example, a constitutional unit composed of the arylene group represented by the formula (Y-101) to the formula (Y-121), a constitutional unit composed of the divalent hetero ring group represented by the formula (Y-201) to the formula (Y-206) and a constitutional unit composed of the divalent group in which at least one arylene group and at least one divalent hetero ring group are bonded directly represented by the formula (Y-300) to the formula (Y-304).

[Chemical Formula 76]

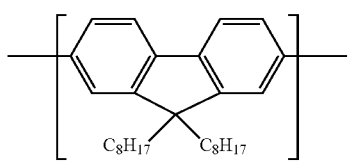
(Y-101)

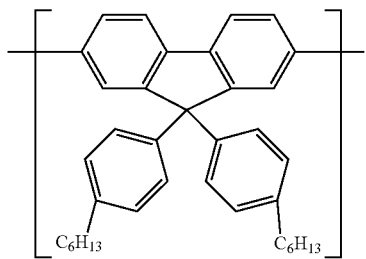
(Y-102)

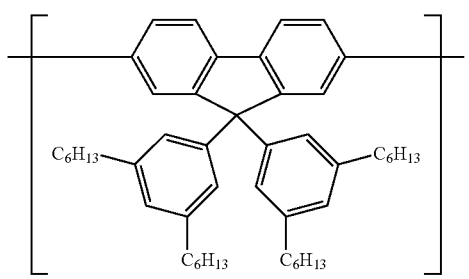
(Y-103)

[Chemical Formula 77]

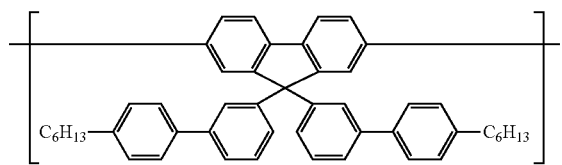
(Y-104)

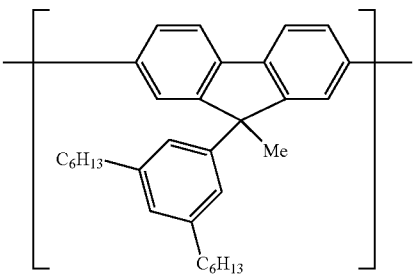
(Y-105)

[Chemical Formula 78]

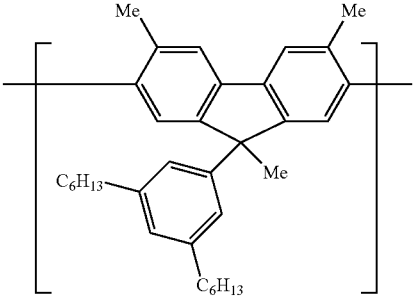
(Y-106)

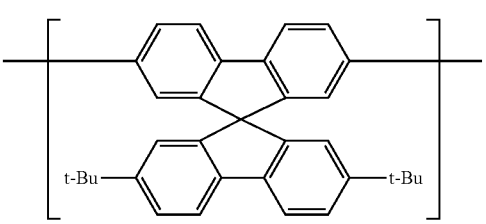
(Y-107)

(Y-108)

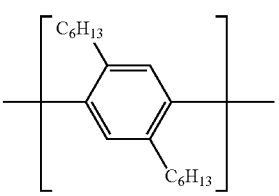
(Y-109)

[Chemical Formula 79]

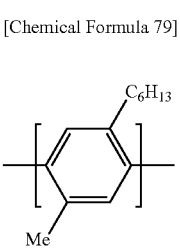
(Y-110)

(Y-111) 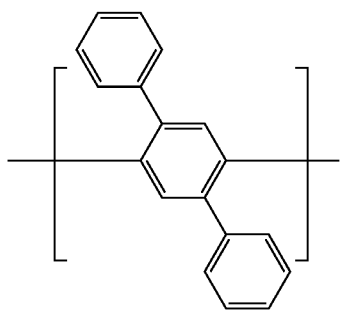
(Y-112) 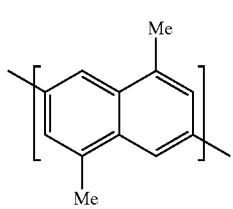
(Y-113)
(Y-114) 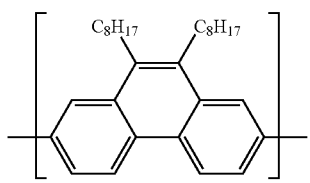
[Chemical Formula 80]
(Y-115) 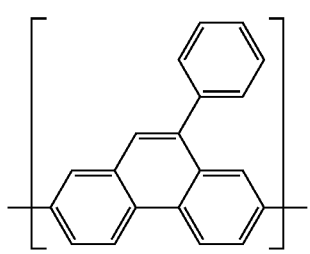
(Y-116)
(Y-117) 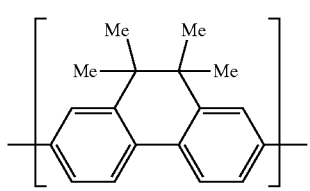
(Y-118)
[Chemical Formula 81]
(Y-119) 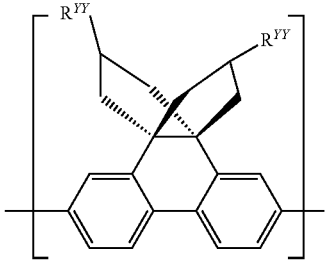
$R^{YY}=$
(Y-120) 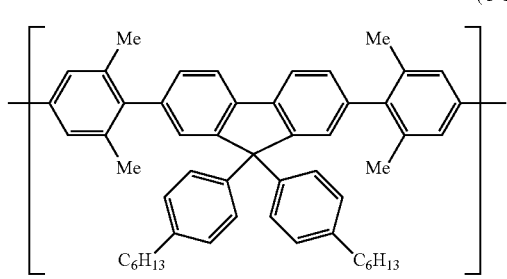
(Y-121) 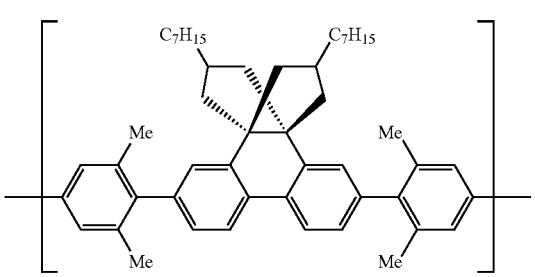
[Chemical Formula 82]
(Y-201) 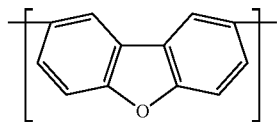
(Y-202) 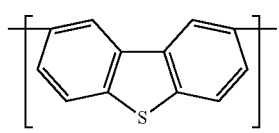

(Y-203) 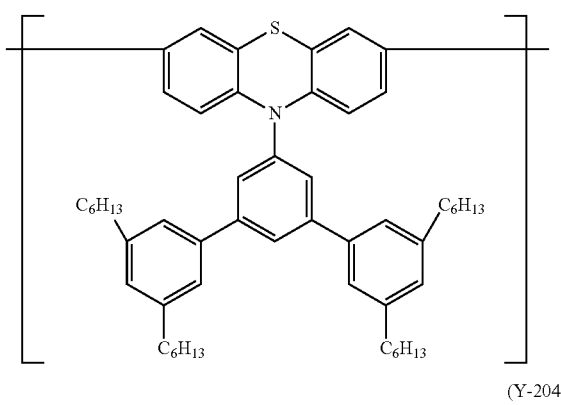
(Y-204) 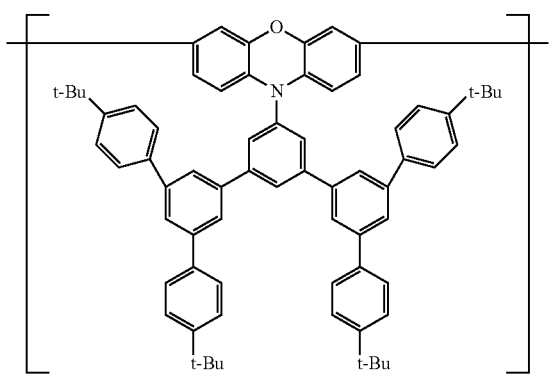
[Chemical Formula 83]
(Y-205) 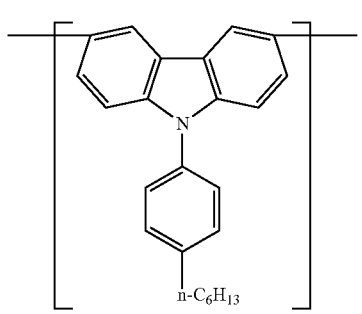
(Y-206) 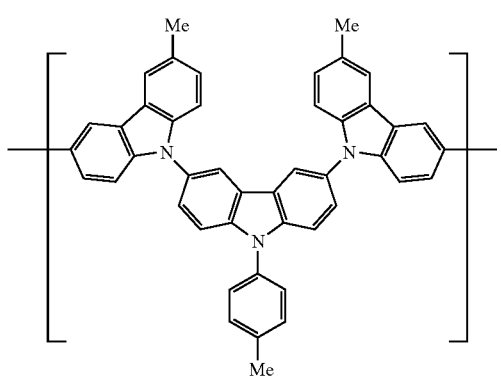
(Y-300) 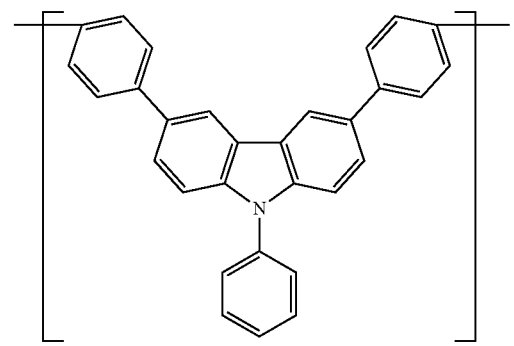
[Chemical Formula 84]
(Y-301) 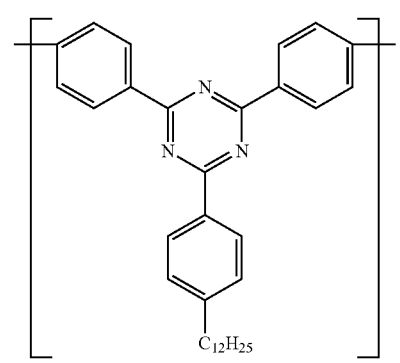
(Y-302) 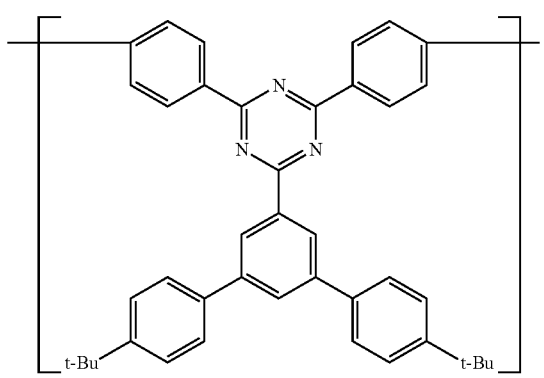
(Y-303) 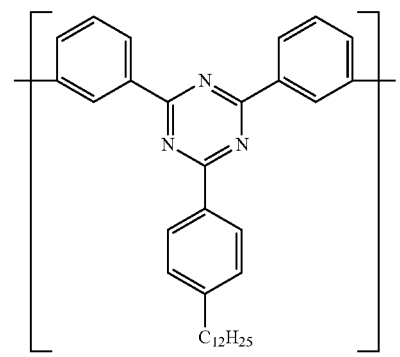

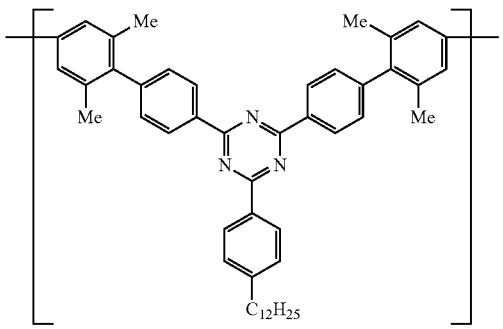

(Y-304)

The amount of the constitutional unit represented by the formula (Y) in which $Ar^{Y1}$ is arylene group is preferably 0.5 to 99% by mol, more preferably 30 to 95% by mol, further preferably 50 to 95% by mol with respect to the total amount of constitutional units contained in the polymer host, since the light emitting device of the present invention is excellent in external quantum efficiency.

The amount of the constitutional unit represented by the formula (Y) in which $Ar^{Y1}$ is a divalent hetero ring group or a divalent group in which at least one arylene group and at least one divalent hetero ring group are bonded directly is preferably 0.5 to 50% by mol, more preferably 1 to 40% by mol, further preferably 5 to 30% by mol with respect to the total amount of constitutional units contained in the polymer host, since the light emitting device of the present invention is excellent in charge transportability.

The constitutional unit represented by the formula (Y) may be contained only singly or in combination of two or more kinds thereof in the polymer host.

It is preferable that the polymer host further contains a constitutional unit represented by the following formula (X), since excellent hole transportability is obtained.

[Chemical Formula 85]

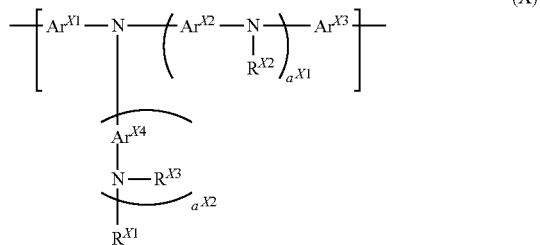

(X)

[wherein, $a^{X1}$ and $a^{X2}$ each independently represent an integer of 0 or more.

$Ar^{X1}$ and $Ar^{X3}$ each independently represent an arylene group or a divalent hetero ring group, and these groups optionally have a substituent.

$Ar^{X2}$ and $Ar^{X4}$ each independently represent an arylene group, a divalent hetero ring group or a divalent group in which at least one arylene group and at least one divalent hetero ring group are bonded directly, and these groups optionally have a substituent. When a plurality of $Ar^{X2}$ and $Ar^{X4}$ are present, they may be the same or different at each occurrence.

$R^{X1}$, $R^{X2}$ and $R^{X3}$ each independently represent a hydrogen atom, an alkyl group, a cycloalkyl group, an aryl group or a monovalent hetero ring group, and these groups optionally have a substituent. When a plurality of $R^{X2}$ and $R^{X3}$ are present, they may be the same or different at each occurrence.]

$a^{X1}$ is preferably 2 or less, more preferably 1 or 0, further preferably 0, since the light emitting device of the present invention is more excellent in external quantum efficiency.

$a^{X2}$ is preferably 2 or less, more preferably 0, since the light emitting device of the present invention is more excellent in external quantum efficiency.

$R^{X1}$, $R^{X2}$ and $R^{X3}$ are each preferably an alkyl group, a cycloalkyl group, an aryl group or a monovalent hetero ring group, more preferably an aryl group or a monovalent hetero ring group, further preferably an aryl group, and these groups optionally have a substituent.

The arylene group represented by $Ar^{X1}$ and $Ar^{X3}$ is more preferably a group represented by the formula (A-1) or the formula (A-9), further preferably a group represented by the formula (A-1), and these groups optionally have a substituent.

The divalent hetero ring group represented by $Ar^{X1}$ and $Ar^{X3}$ is more preferably a group represented by the formula (AA-1), the formula (AA-2) or the formula (AA-7) to the formula (AA-26), and these groups optionally have a substituent.

$Ar^{X1}$ and $Ar^{X3}$ are each preferably an arylene group optionally having a substituent.

The arylene group represented by $Ar^{X2}$ and $Ar^{X4}$ is more preferably a group represented by the formula (A-1), the formula (A-6), the formula (A-7), the formula (A-9) to the formula (A-11) or the formula (A-19), and these groups optionally have a substituent.

The more preferable range of the divalent hetero ring group represented by $Ar^{X2}$ and $Ar^{X4}$ is the same as the more preferable range of the divalent hetero ring group represented by $Ar^{X1}$ and $Ar^{X3}$.

In the divalent group in which at least one arylene group and at least one divalent hetero ring group are bonded directly represented by $Ar^{X2}$ and $Ar^{X4}$, the more preferable range and the further preferable range of the arylene group and the divalent hetero ring group are the same as the more preferable range and the further preferable range of the arylene group and the divalent hetero ring group represented by $Ar^{X1}$ and $Ar^{X3}$, respectively.

The divalent group in which at least one arylene group and at least one divalent hetero ring group are bonded directly represented by $Ar^{X2}$ and $Ar^{X4}$ includes groups which are the same as the divalent group in which at least one arylene group and at least one divalent hetero ring group are bonded directly represented by $Ar^{Y1}$ in the formula (Y).

$Ar^{X2}$ and $Ar^{X4}$ are each preferably an arylene group optionally having a substituent.

The examples and the preferable range of the substituent which the group represented by $Ar^{X1}$ to $Ar^{X4}$ and $R^{X1}$ to $R^{X3}$ optionally has are the same as the examples and the preferable range of the substituent which the group represented by $Ar^{Y1}$ optionally has.

The examples and the preferable range of the substituent which the substituent which the group represented by $Ar^{X1}$ to $Ar^{X4}$ and $R^{X1}$ to $R^{X3}$ optionally has optionally further has are the same as the examples and the preferable range of the substituent which the substituent which the group represented by $Ar^{Y1}$ optionally has optionally further has.

The constitutional unit represented by the formula (X) is preferably a constitutional unit represented by the formula (X-1) to the formula (X-7), more preferably a constitutional unit represented by the formula (X-1) to the formula (X-6), further preferably a constitutional unit represented by the formula (X-3) to the formula (X-6).

[Chemical Formula 86]

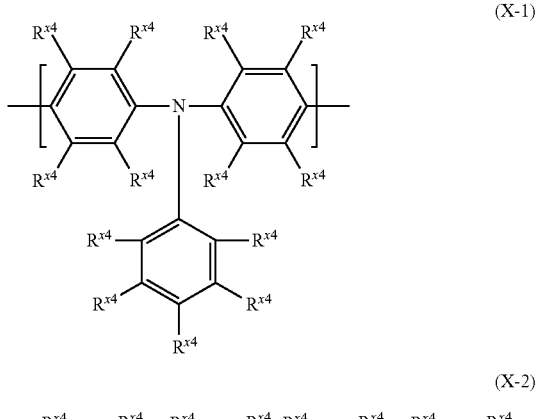

(X-1)

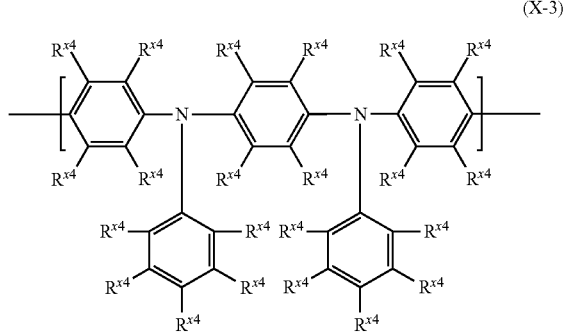

(X-2)

[Chemical Formula 87]

(X-3)

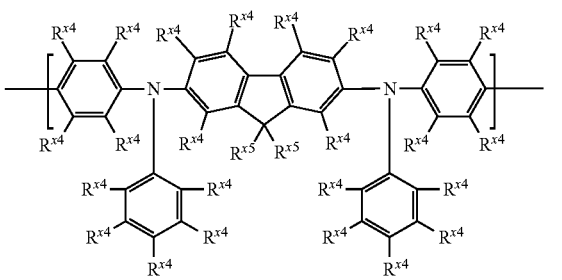

[Chemical Formula 88]

(X-4)

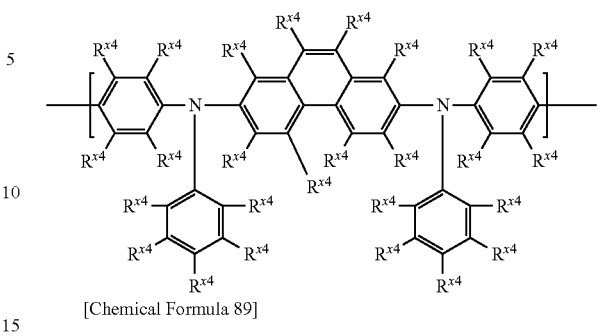

(X-5)

[Chemical Formula 89]

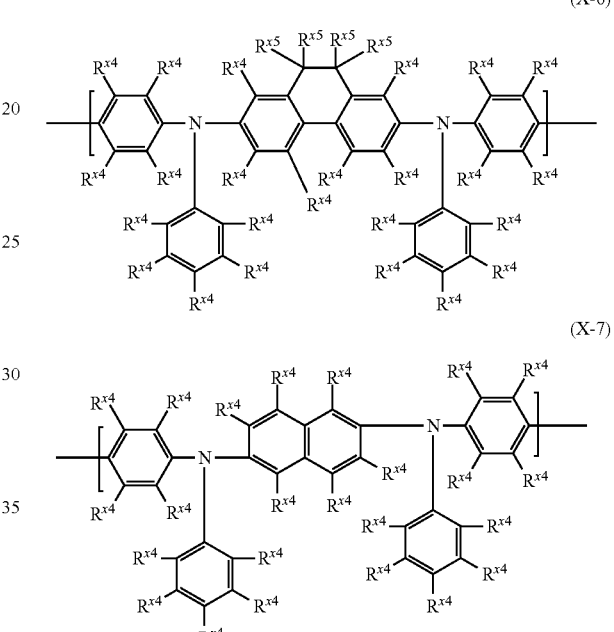

(X-6)

(X-7)

[wherein, $R^{X4}$ and $R^{X5}$ each independently represent a hydrogen atom, an alkyl group, a cycloalkyl group, an alkoxy group, a cycloalkoxy group, an aryl group, an aryloxy group, a halogen atom, a monovalent hetero ring group or a cyano group, and these groups optionally have a substituent. A plurality of $R^{X4}$ may be the same or different. A plurality of $R^{X5}$ may be the same or different, and adjacent $R^{X5}$ may be combined together to form a ring together with carbon atoms to which they are attached.]

$R^{X4}$ is preferably a hydrogen atom, an alkyl group, a cycloalkyl group, an alkoxy group, a cycloalkoxy group, an aryl group or a monovalent hetero ring group, more preferably a hydrogen atom, an alkyl group, a cycloalkyl group, an aryl group or a monovalent hetero ring group, further preferably a hydrogen atom, an alkyl group, a cycloalkyl group or an aryl group, particularly preferably a hydrogen atom or an alkyl group, and these groups optionally further have a substituent.

$R^{X5}$ is preferably a hydrogen atom, an alkyl group, a cycloalkyl group, an alkoxy group, a cycloalkoxy group, an aryl group or a monovalent hetero ring group, more preferably a hydrogen atom, an alkyl group, a cycloalkyl group, an aryl group or a monovalent hetero ring group, further preferably an alkyl group, a cycloalkyl group, an aryl group or a monovalent hetero ring group, particularly preferably an alkyl group or an aryl group, and these groups optionally further have a substituent.

The examples and the preferable range of the substituent which the group represented by $R^{X4}$ and $R^{X5}$ optionally has are the same as the examples and the preferable range of the substituent which the substituent which the group represented by $Ar^{Y1}$ optionally has optionally further has.

The amount of the constitutional unit represented by the formula (X) is preferably 0.1 to 50% by mol, more preferably 1 to 40% by mol, further preferably 5 to 30% by mol with respect to the total amount of constitutional units contained in the polymer host, since excellent hole transportability is obtained.

The constitutional unit represented by the formula (X) includes, for example, constitutional units represented by the formula (X1-1) to the formula (X1-11), and is preferably a constitutional unit represented by the formula (X1-3) to the formula (X1-10).

[Chemical Formula 90]

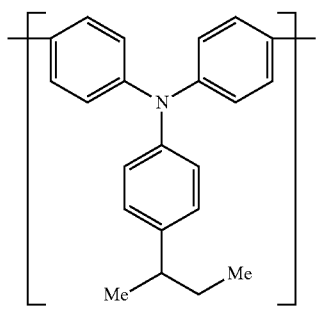
(X1-1)

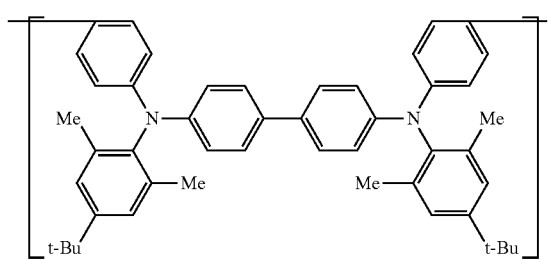
(X1-2)

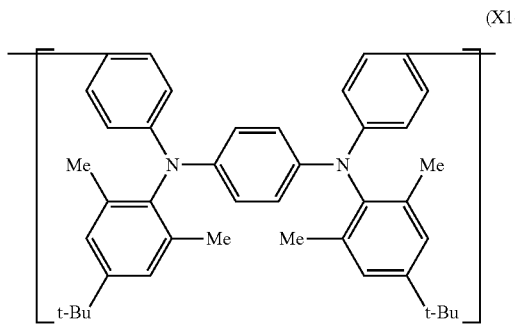
(X1-3)

[Chemical Formula 91]

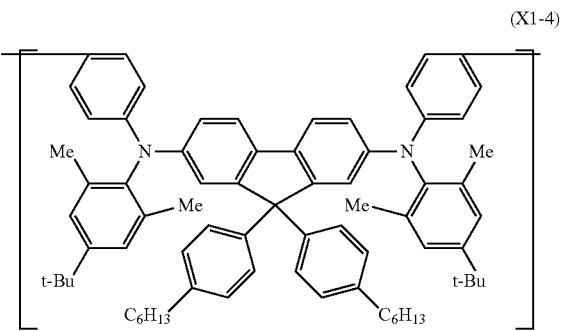
(X1-4)

(X1-5)

[Chemical Formula 92]

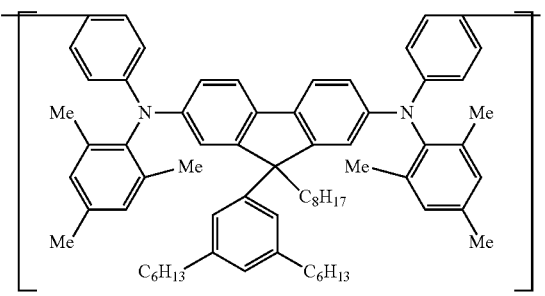
(X1-6)

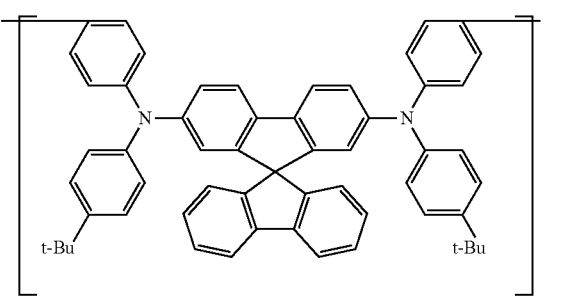
(X1-7)

[Chemical Formula 93]

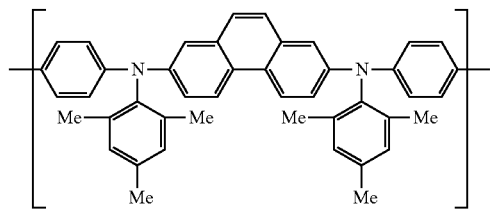
(X1-8)

(X1-9)
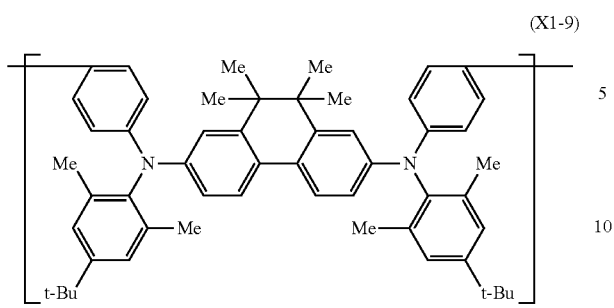
[Chemical Formula 94]
(X1-10)
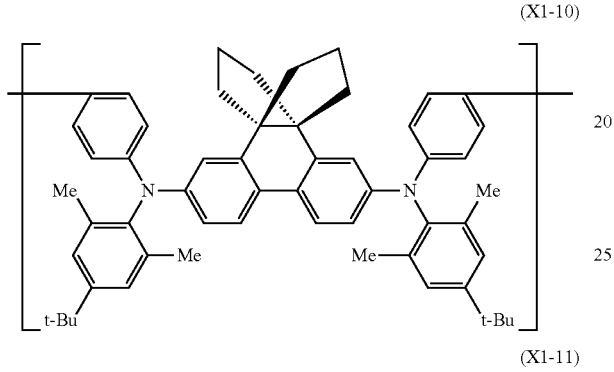
(X1-11)
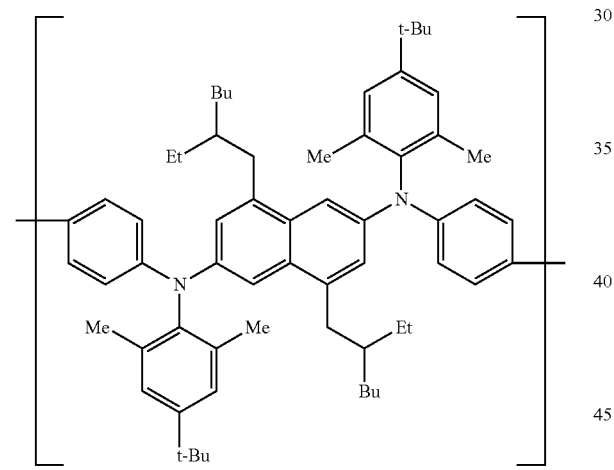
[Chemical Formula 95]
(X1-12)
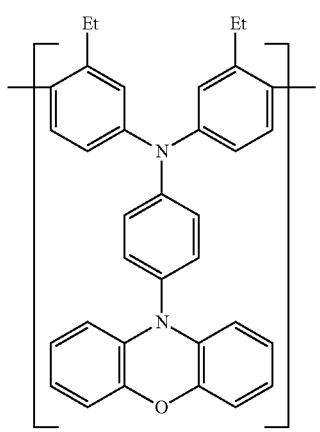
(X1-13)
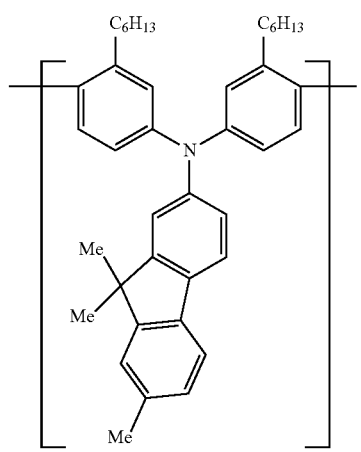
(X1-14)
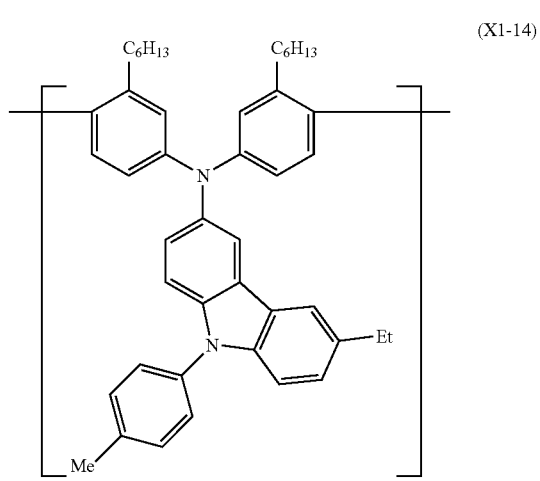
(X1-15)
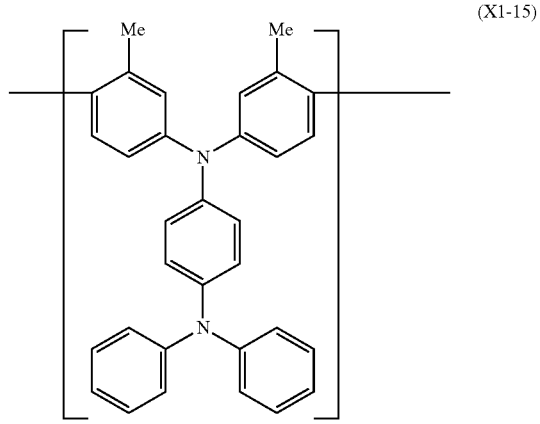
The constitutional unit represented by the formula (X) may be contained only singly or in combination of two or more kinds thereof in the polymer host.
The polymer host includes, for example, polymer compounds P-1 to P-6.

TABLE 1

| polymer compound | constitutional unit and mole fraction thereof | | | | |
|---|---|---|---|---|---|
| | formula (Y) | | | formula (X) | |
| | formulae (Y-1) to (Y-3) p | formulae (Y-4) to (Y-7) q | formulae (Y-8) to (Y-10) r | formulae (X-1) to (X-7) s | other t |
| P-1 | 0.1 to 99.9 | 0.1 to 99.9 | 0 | 0 | 0 to 30 |
| P-2 | 0.1 to 99.9 | 0 | 0.1 to 99.9 | 0 | 0 to 30 |
| P-3 | 0.1 to 99.8 | 0.1 to 99.8 | 0 | 0.1 to 99.8 | 0 to 30 |
| P-4 | 0.1 to 99.8 | 0.1 to 99.8 | 0.1 to 99.8 | 0 | 0 to 30 |
| P-5 | 0.1 to 99.8 | 0 | 0.1 to 99.8 | 0.1 to 99.8 | 0 to 30 |
| P-6 | 0.1 to 99.7 | 0.1 to 99.7 | 0.1 to 99.7 | 0.1 to 99.7 | 0 to 30 |

[in the table, p, q, r, s and t represent the mole fraction of each constitutional unit. p+q+r+s+t=100 and 100≥p+q+r+s≥70. The other constitutional unit denotes a constitutional unit other than the constitutional unit represented by the formula (Y) and the constitutional unit represented by the formula (X).]

The polymer host may be any of a block copolymer, a random copolymer, an alternating copolymer and a graft copolymer, and may also be another form, and is preferably a copolymer obtained by copolymerizing a plurality of raw material monomers.

The polystyrene-equivalent number-average molecular weight of the polymer host is preferably $5 \times 10^3$ to $1 \times 10^6$, more preferably $1 \times 10^4$ to $5 \times 10^5$, further preferably $1.5 \times 10^4$ to $1.5 \times 10^5$.

[Production Method of Polymer Host]

The polymer host can be produced using known polymerization methods described in Chemical Review (Chem. Rev.), vol. 109, pp. 897 to 1091 (2009) and the like, and methods of polymerizing by a coupling reaction using a transition metal catalyst such as the Suzuki reaction, the Yamamoto reaction, the Buchwald reaction, the Stille reaction, the Negishi reaction, the Kumada reaction and the like are exemplified.

In the above-described polymerization methods, the method of charging monomers includes a method in which the entire monomers are charged all at once into the reaction system, a method in which a part of the monomers is charged and reacted, then, the remaining monomers are charged all at once, continuously or in a divided manner, a method of charging monomers continuously or dividedly, and other methods.

The transition metal catalyst includes a palladium catalyst, a nickel catalyst and the like.

For the post treatment of the polymerization reaction, known methods, for example, a method in which water-soluble impurities are removed by liquid separation, a method in which a reaction solution after the polymerization reaction is added to a lower alcohol such as methanol and the like, the deposited precipitate is filtrated, then, dried, and other methods, are used each singly or used in combination. When the purity of the polymer host is low, it can be purified by usual methods such as, for example, recrystallization, reprecipitation, continuous extraction with a Soxhlet extractor, column chromatography and the like.

[First Composition]

The first organic layer may be a layer containing a composition containing the compound (T) and at least one material selected from the group consisting of a host material, a hole transporting material, a hole injection material, an electron transporting material, an electron injection material, a fluorescent light emitting material and an antioxidant described above (hereinafter, referred to also as "first composition"). However, the hole transporting material, the hole injection material, the electron transporting material, the electron injection material and the fluorescent light emitting material are different from the compound (T).

[Hole Transporting Material]

The hole transporting material is classified into low molecular compounds and polymer compounds, and polymer compounds are preferable. The hole transporting material may have a crosslink group.

The polymer compound includes, for example, polyvinylcarbazole and derivatives thereof; polyarylenes having an aromatic amine structure in the side chain or main chain and derivatives thereof. The polymer compound may also be a compound in which an electron accepting site is bonded. The electron accepting site includes, for example, fullerene, tetrafluorotetracyanoquinodimethane, tetracyanoethylene, trinitrofluorenone and the like, and fullerene is preferable.

In the first composition, the compounding amount of the hole transporting material is usually 0.1 to 1000 parts by mass, preferably 1 to 400 parts by mass, more preferably 5 to 150 parts by mass when the amount of the compound (T) is taken as 100 parts by mass.

The hole transporting material may be used singly or in combination of two or more kinds thereof.

[Electron Transporting Material]

The electron transporting material is classified into low molecular compounds and polymer compounds. The electron transporting material may have a crosslink group.

The low molecular compound includes, for example, metal complexes having 8-hydroxyquinoline as a ligand, oxadiazole, anthraquinodimethane, benzoquinone, naphthoquinone, anthraquinone, tetracyanoanthraquinodimethane, fluorenone, diphenyldicyanoethylene and diphenoquinone, and derivatives thereof.

The polymer compound includes, for example, polyphenylene, polyfluorene and derivatives thereof. The polymer compound may be doped with a metal.

In the first composition, the compounding amount of the electron transporting material is usually 0.1 to 1000 parts by mass, preferably 1 to 400 parts by mass, more preferably 5 to 150 parts by mass when the amount of the compound (T) is taken as 100 parts by mass.

The electron transporting material may be used singly or in combination of two or more kinds thereof.

[Hole Injection Material and Electron Injection Material]

The hole injection material and the electron injection material are each classified into low molecular compounds and polymer compounds. The hole injection material and the electron injection material may have a crosslink group.

The low molecular compound includes, for example, metal phthalocyanines such as copper phthalocyanine and the like; carbon; oxides of metals such as molybdenum, tungsten and the like; metal fluorides such as lithium fluoride, sodium fluoride, cesium fluoride, potassium fluoride and the like.

The polymer compound includes, for example, polyaniline, polythiophene, polypyrrole, polyphenylenevinylene, polythienylenevinylene, polyquinoline and polyquinoxaline, and derivatives thereof; electrically conductive polymers such as a polymer containing an aromatic amine structure in the main chain or side chain, and the like.

In the first composition, the compounding amounts of the hole injection material and the electron injection material are each usually 0.1 to 1000 parts by mass, preferably 1 to 400 parts by mass, more preferably 5 to 150 parts by mass when the amount of the compound (T) is taken as 100 parts by mass.

The electron injection material and the hole injection material each may be used singly or in combination of two or more kinds thereof.

[Ion Doping]

When the hole injection material or the electron injection material contains an electrically conductive polymer, the electric conductivity of the electrically conductive polymer is preferably $1 \times 10^{-5}$ S/cm to $1 \times 10^{3}$ S/cm. For adjusting the electric conductivity of the electrically conductive polymer within such a range, the electrically conductive polymer can be doped with an appropriate amount of ions.

The kind of the ion to be doped is an anion for the hole injection material and a cation for the electron injection material. The anion includes, for example, a polystyrenesulfonic ion, an alkylbenzenesulfonic ion and a camphor sulfonic ion. The cation includes, for example, a lithium ion, a sodium ion, a potassium ion and a tetrabutylammonium ion.

The ion to be doped may be used singly or in combination of two or more kinds thereof.

[Fluorescent Light Emitting Material]

The fluorescent light emitting material is classified into low molecular compounds and polymer compounds. The fluorescent light emitting material may have a crosslink group.

The low molecular compound includes, for example, naphthalene and derivatives thereof, anthracene and derivatives thereof and perylene and derivatives thereof.

The polymer compound includes polymer compounds containing, for example, a phenylene group, a naphthalenediyl group, anthracenediyl group, a fluorenediyl group, a phenanthrenediyl group, a dihydrophenanthrenediyl group, a group represented by the formula (X), a carbazolediyl group, a phenoxazinediyl group, a phenothiazinediyl group, a pyrenediyl group and the like.

In the first composition, the compounding amount of the fluorescent light emitting material is usually 0.1 to 1000 parts by mass, preferably 0.1 to 400 parts by mass, more preferably 5 to 150 parts by mass when the amount of the compound (T) is taken as 100 parts by mass.

When the first composition is a composition containing the compound (T) and a fluorescent light emitting material, the compound (T) is preferably a host material.

When first composition is a composition containing the compound (T) and a fluorescent light emitting material and the compound (T) is a host material, the content of the fluorescent light emitting material is usually 0.1 to 50 parts by mass, preferably 1 to 45 parts by mass, more preferably 5 to 40 parts by mass, further preferably 10 to 30 parts by mass when the sum of the compound (T) and the fluorescent light emitting material is taken as 100 parts by mass.

When the first composition is a composition containing the compound (T) and a fluorescent light emitting material and the compound (T) is a host material, the content of the fluorescent light emitting material is preferably 0.01 to 50 parts by mass, more preferably 0.1 to 20 parts by mass, more preferably 0.5 to 5 parts by mass when the sum of the compound (T) and the fluorescent light emitting material is taken as 100 parts by mass, since the light emitting device of the present invention is more excellent in external quantum efficiency.

The fluorescent light emitting material may be used singly or in combination of two or more.

[Antioxidant]

The antioxidant may be a compound which is soluble in a solvent which is the same as the solvent for the compound (T) and does not inhibit light emission and charge transportation, and includes, for example, phenol type antioxidants and phosphorus-based antioxidants.

In the first composition, the compounding amount of the antioxidant is usually 0.001 to 10 parts by mass when the amount of the compound (T) is taken as 100 parts by mass.

The antioxidant may be used singly or in combination of two or more.

[First Ink]

The composition containing the compound (T) and a solvent (hereinafter, referred to also as "first ink") can be suitably used for application methods such as a spin coat method, a casting method, a micro gravure coat method, a gravure coat method, a bar coat method, a roll coat method, a wire bar coat method, a dip coat method, a spray coat method, a screen printing method, a flexo printing method, an offset printing method, an inkjet printing method, a capillary coat method, a nozzle coat method and the like.

The viscosity of the first ink may be adjusted according to the type of the application method, and when applied printing methods in which a solution passes through a discharge device such as an inkjet printing method and the like, the viscosity is preferably 1 to 20 mPa·s at 25° C. since clogging and flight deflection during discharge scarcely occur.

The solvent contained in the first ink is preferably a solvent capable of dissolving or uniformly dispersing solid components in the ink. The solvent includes, for example, chlorine-based solvents such as 1,2-dichloroethane, 1,1,2-trichloroethane, chlorobenzene, o-dichlorobenzene and the like; ether type solvents such as tetrahydrofuran, dioxane, anisole, 4-methylanisole and the like; aromatic hydrocarbon type solvents such as toluene, xylene, mesitylene, ethylbenzene, n-hexylbenzene, cyclohexylbenzene and the like; aliphatic hydrocarbon type solvents such as cyclohexane, methylcyclohexane, n-pentane, n-hexane, n-heptane, n-octane, n-nonane, n-decane, n-dodecane, bicyclohexyl and the like; ketone type solvents such as acetone, methyl ethyl ketone, cyclohexanone, acetophenone and the like; ester type solvents such as ethyl acetate, butyl acetate, ethyl cellosolve acetate, methyl benzoate, phenyl acetate and the like; polyhydric alcohol type solvents such as ethylene glycol, glycerin, 1,2-hexanediol and the like; alcohol type solvents such as isopropyl alcohol, cyclohexanol and the like; sulfoxide type solvents such as dimethyl sulfoxide and the like; and amide type solvents such as N-methyl-2-pyrrolidone, N,N-dimethylformamide and the like. The solvent may be used singly or in combination of two or more kinds thereof.

In the first ink, the compounding amount of the solvent is usually 1000 to 100000 parts by mass, preferably 2000 to 20000 parts by mass when the amount of the compound (T) is taken as 100 parts by mass.

<Second Organic Layer>

The second organic layer is a layer containing a crosslinked body of a polymer compound containing a crosslink constitutional unit (hereinafter, referred to also as "polymer compound of second organic layer").

The crosslinked body of the polymer compound of the second organic layer is obtained by bringing the polymer compound of the second organic layer into crosslinked state by the above-described method.

[Polymer Compound of Second Organic Layer]

The energy level at the lowest triplet excited state of the polymer compound of the second organic layer is preferably 2.30 eV or more, more preferably 2.33 eV or more, further preferably 2.40 eV or more, particularly preferably 2.46 eV or more, since the light emitting device of the present invention is more excellent in external quantum efficiency.

The energy level at the lowest triplet excited state of the polymer compound of the second organic layer is preferably 4.00 eV or less, more preferably 3.50 eV or less, further preferably 3.00 eV or less, particularly preferably 2.70 eV or less, especially preferably 2.60 eV or less, since stability of the polymer compound of the second organic layer is excellent.

The energy level at the lowest triplet excited state of the polymer compound of the second organic layer is preferably 2.30 eV or more and 4.50 eV or less, more preferably 2.33 eV or more and 4.00 eV or less, further preferably 2.40 eV or more and 3.50 eV or less, particularly preferably 2.46 eV or more and 3.00 eV or less, since the light emitting device of the present invention is more excellent in external quantum efficiency and stability of the polymer compound of the second organic layer is excellent.

The energy level at the lowest triplet excited state of the polymer compound can be determined by fabricating a film composed of the polymer compound, measuring the phosphorescent emission spectrum of this film at 77 K, and converting the maximum peak wavelength at the shortest wavelength in the resultant phosphorescent emission spectrum into energy. The thickness of the film is usually 10 nm to 1 µm. For formation of the film, for example, application methods such as a spin coat method, a drop cast method and the like are mentioned, and a drop cast method is preferable.

The magnitude relation of the energy level of the lowest triplet excited state of the polymer compound can be compared by a computational scientific method. Specifically, the energy level of the lowest triplet excited state of each polymer compound is calculated by a computational scientific method, and the magnitude relation can be compared by the calculation result obtained.

In the computational scientific method, Gaussian 09 is used as the quantum chemical calculation program, and the ground state of a dimer as a monomer unit is structurally optimized by the B3LYP level density functional method, and as a basis function, 6-31G* is used in this process. Then, the energy level of the lowest triplet excited state of the polymer compound is calculated by the B3LYP level time dependent density functional method. When an atom for which 6-31G* cannot be used is contained, LANL2DZ is used for this atom. In the case where the polymer compound consists of only one type of monomer unit, the lowest excited triplet energy is calculated for a dimer of the monomer unit and is taken as the lowest excited triplet energy of the polymer compound. When the polymer compound is composed of two or more kinds of monomer units, the lowest excited triplet energy is calculated for all dimers which can occur in the polymerization of the monomer unit contained in a molar ratio of 1% or more, and the lowest value is adopted as the lowest excited triplet energy of the polymer compound.

The polymer compound of the second organic layer is preferably a polymer compound containing a crosslink constitutional unit having at least one crosslink group selected from Group A of crosslink group, since the light emitting device of the present invention is excellent in external quantum efficiency.

The crosslink group selected from Group A of crosslink group is preferably a crosslink group represented by the formula (XL-1) to the formula (XL-4), the formula (XL-7) to the formula (XL-10) or the formula (XL-14) to the formula (XL-17), more preferably a crosslink group represented by the formula (XL-1), the formula (XL-3), the formula (XL-9), the formula (XL-10), the formula (XL-16) or the formula (XL-17), further preferably a crosslink group represented by the formula (XL-1), the formula (XL-16) or the formula (XL-17), particularly preferably a crosslink group represented by the formula (XL-1) or the formula (XL-17), especially preferably a crosslink group represented by the formula (XL-17), since the light emitting device of the present invention is more excellent in external quantum efficiency.

The crosslink group selected from Group A of crosslink group is preferably a crosslink group represented by the formula (XL-2) to the formula (XL-4), the formula (XL-7) to the formula (XL-10), the formula (XL-14), the formula (XL-15) or the formula (XL-17), more preferably a crosslink group represented by the formula (XL-9), the formula (XL-10) or the formula (XL-17), particularly preferably a crosslink group represented by the formula (XL-17), since the light emitting device of the present invention is more excellent in external quantum efficiency and the polymer compound of the second organic layer is more excellent in crosslinkability.

The constitutional unit having at least one crosslink group selected from Group A of crosslink group contained in the polymer compound of the second organic layer is preferably a constitutional unit represented by the formula (2) or a constitutional unit represented by the formula (2'), and constitutional units represented by the following formulae may also be used.

[Chemical Formula 96]

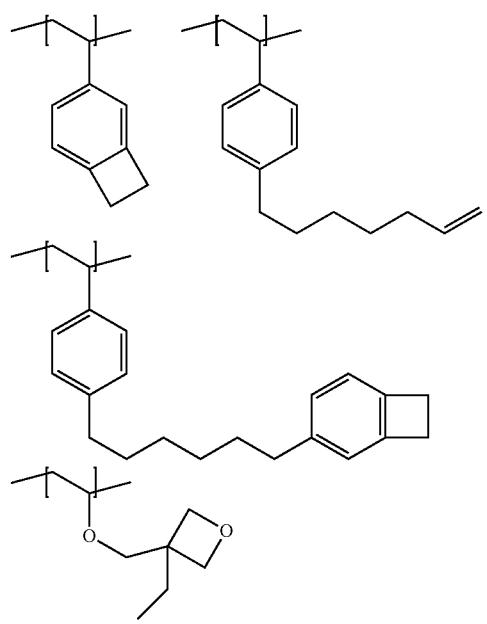

-continued

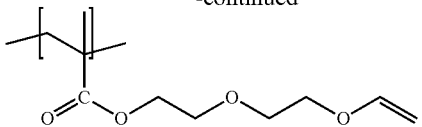

When the polymer compound of the second organic layer contains two or more constitutional units having at least one crosslink group selected from Group A of crosslink group, it is preferable that the crosslink groups are mutually different in at least two constitutional units having at least one crosslink group selected from Group A of crosslink group. The combination of the mutually different crosslink groups is preferably a combination of a crosslink group represented by the formula (XL-1), the formula (XL-2), the formula (XL-5) to the formula (XL-8) or the formula (XL-14) to the formula (XL-16) with a crosslink group represented by the formula (XL-3), the formula (XL-4), the formula (XL-13) or the formula (XL-17), more preferably a combination of a crosslink group represented by the formula (XL-1) or the formula (XL-16) with a crosslink group represented by the formula (XL-17), further preferably a combination of a crosslink group represented by the formula (XL-1) with a crosslink group represented by the formula (XL-17).

Constitutional unit represented by the formula (2) nA is preferably an integer of 0 to 3, more preferably an integer of 0 to 2, further preferably 1, since the light emitting device of the present invention is more excellent in external quantum efficiency.

n is preferably 2, since the light emitting device of the present invention is more excellent in external quantum efficiency.

$Ar^3$ is preferably an aromatic hydrocarbon group optionally having a substituent, since the light emitting device of the present invention is more excellent in external quantum efficiency.

The number of carbon atoms of the aromatic hydrocarbon group represented by $Ar^3$ is, not including the number of carbon atoms of the substituent, usually 6 to 60, preferably 6 to 30, more preferably 6 to 18.

The examples and the preferable range of the arylene group portion obtained by removing n substituents of the aromatic hydrocarbon group represented by $Ar^3$ are the same as the examples and the preferable range of the arylene group represented by $Ar^{Y1}$.

The number of carbon atoms of the hetero ring group represented by $Ar^3$ is, not including the number of carbon atoms of the substituent, usually 2 to 60, preferably 3 to 30, more preferably 4 to 18.

The examples and the preferable range of the divalent hetero ring group portion obtained by removing n substituents of the hetero ring group represented by $Ar^3$ are the same as the examples and the preferable range of the divalent hetero ring group represented by $Ar^{Y1}$.

The examples and the preferable range of the substituent which the group represented by $Ar^3$ optionally has are the same as the examples and the preferable range of the substituent which the group represented by $Ar^{Y1}$ optionally has.

The examples and the preferable range of the substituent which the substituent which the group represented by $Ar^3$ optionally has optionally further has are the same as the examples and the preferable range of the substituent which the substituent which the group represented by $Ar^{Y1}$ optionally has optionally further has.

The number of carbon atoms of the alkylene group represented by $L^A$ is, not including the number of carbon atoms of the substituent, usually 1 to 20, preferably 1 to 15, more preferably 1 to 10. The number of carbon atoms of the cycloalkylene group represented by $L^A$ is, not including the number of carbon atoms of the substituent, usually 3 to 20.

The alkylene group and the cycloalkylene group represented by $L^A$ optionally have a substituent and examples thereof include a methylene group, an ethylene group, a propylene group, a butylene group, a hexylene group, a cyclohexylene group and an octylene group, and groups obtained by substituting a hydrogen atom in these groups with an alkyl group, a cycloalkyl group, an alkoxy group, a cycloalkoxy group, an aryl group, a monovalent hetero ring group, a fluorine atom and the like.

The examples and the preferable range of the arylene group represented by $L^A$ are the same as the examples and the preferable range of the arylene group represented by $Ar^{Y1}$, however, the arylene group represented by $L^A$ is preferably a phenylene group or a fluorenediyl group, more preferably a m-phenylene group, a p-phenylene group, a fluorene-2,7-diyl group or a fluorene-9,9-diyl group, and these groups optionally further have a substituent, since the light emitting device of the present invention is more excellent in external quantum efficiency.

The examples and the preferable range of the divalent hetero ring group represented by $L^A$ are the same as the examples and the preferable range of the divalent hetero ring group represented by $Ar^{Y1}$.

$L^A$ is preferably an arylene group or an alkylene group, more preferably a phenylene group, a fluorenediyl group or an alkylene group, further preferably an alkylene group, and these groups optionally have a substituent, since production of the polymer compound of the second organic layer becomes easy.

The substituent which the group represented by $L^A$ optionally has is preferably an alkyl group, a cycloalkyl group, an alkoxy group, a cycloalkoxy group, an aryl group, a monovalent hetero ring group, a substituted amino group, a fluorine atom, a cyano group or a crosslink group selected from Group A of crosslink group, more preferably an alkyl group, a cycloalkyl group, an alkoxy group, a cycloalkoxy group, an aryl group, a monovalent hetero ring group or a crosslink group selected from Group A of crosslink group, further preferably an alkyl group, a cycloalkyl group, an aryl group or a monovalent hetero ring group, particularly preferably an alkyl group, a cycloalkyl group or an aryl group, and these groups optionally further have a substituent.

The examples and the preferable range of the substituent which the substituent which the group represented by $L^A$ optionally has optionally further has are the same as the examples and the preferable range of the substituent which the substituent which the group represented by $Ar^{Y1}$ optionally has optionally further has.

The crosslink group represented by X is preferably a crosslink group represented by the formula (XL-1) to the formula (XL-4), the formula (XL-7) to the formula (XL-10) or the formula (XL-14) to the formula (XL-17), more preferably a crosslink group represented by the formula (XL-1), the formula (XL-3), the formula (XL-9), the formula (XL-10), the formula (XL-16) or the formula (XL-17), further preferably a crosslink group represented by the formula (XL-1), the formula (XL-16) or the formula (XL-17), particularly preferably a crosslink group represented by the formula (XL-1) or the formula (XL-17), especially preferably a crosslink group represented by the formula (XL-17), since the light emitting device of the present invention is more excellent in external quantum efficiency.

The crosslink group represented by X is preferably a crosslink group represented by the formula (XL-2) to the formula (XL-4), the formula (XL-7) to the formula (XL-10), the formula (XL-14), the formula (XL-15) or the formula (XL-17), more preferably a crosslink group represented by the formula (XL-9), the formula (XL-10) or the formula (XL-17), particularly preferably a crosslink group represented by the formula (XL-17), since the light emitting device of the present invention is more excellent in external quantum efficiency and the polymer compound of the second organic layer is more excellent in crosslinkability.

The amount of the constitutional unit represented by the formula (2) is preferably 0.5 to 80% by mol, more preferably 3 to 65% by mol, further preferably 5 to 50% by mol with respect to the total amount of constitutional units contained in the polymer compound of the second organic layer, since the polymer compound of the second organic layer is excellent in stability and crosslinkability.

The constitutional unit represented by the formula (2) may be contained only singly or in combination of two or more kinds thereof in the polymer compound of the second organic layer.

When the polymer compound of the second organic layer contains two or more constitutional units represented by the formula (2), it is preferable that the crosslink groups represented by X are mutually different in at least two constitutional units represented by the formula (2). The preferable range of the combination of the mutually different crosslink groups represented by X is the same as the preferable range of the combination of the mutually different crosslink groups described above.

Constitutional Unit Represented by the Formula (2')

mA is preferably an integer of 0 to 3, more preferably an integer of 0 to 2, further preferably 0 or 1, particularly preferably 0, since the light emitting device of the present invention is more excellent in external quantum efficiency.

m is preferably 1 or 2, more preferably 2, since the light emitting device of the present invention is more excellent in external quantum efficiency.

c is preferably 0, since production of the polymer compound of the second organic layer becomes easy and the light emitting device of the present invention is more excellent in external quantum efficiency.

$Ar^5$ is preferably an aromatic hydrocarbon group optionally having a substituent, since the light emitting device of the present invention is more excellent in external quantum efficiency.

The definition and the examples of the arylene group portion obtained by removing m substituents of the aromatic hydrocarbon group represented by $Ar^5$ are the same as the definition and the examples of the arylene group represented by $Ar^{X2}$ in the formula (X).

The definition and the examples of the divalent hetero ring group portion obtained by removing m substituents of the hetero ring group represented by $Ar^5$ are the same as the definition and the examples of the divalent hetero ring group portion represented by $Ar^{X2}$ in the formula (X).

The definition and the examples of the divalent group obtained by removing m substituents of a group in which at least one aromatic hydrocarbon ring and at least one hetero ring are bonded directly represented by $Ar^5$ are the same as the definition and the examples of the divalent group in which at least one arylene group and at least one divalent hetero ring group are bonded directly represented by $Ar^{X2}$ in the formula (X).

$Ar^4$ and $Ar^6$ are each preferably an arylene group optionally having a substituent, since the light emitting device of the present invention is more excellent in external quantum efficiency.

The definition and the examples of the arylene group represented by $Ar^4$ and $Ar^6$ are the same as the definition and the examples of the arylene group represented by $Ar^{X1}$ and $Ar^{X3}$ in the formula (X).

The definition and the examples of the divalent hetero ring group represented by $Ar^4$ and $Ar^6$ are the same as the definition and the examples of the divalent hetero ring group represented by $Ar^{X1}$ and $Ar^{X3}$ in the formula (X).

The examples and the preferable range of the substituent which the group represented by $Ar^4$, $Ar^5$ and $Ar^6$ optionally has are the same as the examples and the preferable range of the substituent which the group represented by $Ar^{Y1}$ optionally has. The examples and the preferable range of the substituent which the substituent which the group represented by $Ar^4$, $Ar^5$ and $Ar^6$ optionally has optionally further has are the same as the examples and the preferable range of the substituent which the substituent which the group represented by $Ar^{Y1}$ optionally has optionally further has.

The definition and the examples of the alkylene group, the cycloalkylene group, the arylene group and the divalent hetero ring group represented by $K^A$ are the same as the definition and the examples of the alkylene group, the cycloalkylene group, the arylene group and the divalent hetero ring group represented by $L^A$.

$K^A$ is preferably an arylene group or an alkylene group, more preferably a phenylene group, a fluorenediyl group or an alkylene group, further preferably a phenylene group or a methylene group, and these groups optionally have a substituent, since production of the polymer compound of the second organic layer becomes easy.

The examples and the preferable range of the substituent which the group represented by $K^A$ optionally has are the same as the examples and the preferable range of the substituent which the group represented by $L^A$ optionally has.

The examples and the preferable range of the substituent which the substituent which the group represented by $K^A$ optionally has optionally further has are the same as the examples and the preferable range of the substituent which the substituent which the group represented by $Ar^{Y1}$ optionally has optionally further has.

The definition and the examples of the crosslink group represented by X' are the same as the definition and the examples of the crosslink group represented by X described above.

The amount of the constitutional unit represented by the formula (2') is preferably 0.5 to 50% by mol, more preferably 3 to 30% by mol, further preferably 5 to 20% by mol with respect to the total amount of constitutional units contained in the polymer compound of the second organic layer, since the polymer compound of the second organic layer is excellent in stability and the polymer compound of the second organic layer is excellent in crosslinkability.

The constitutional unit represented by the formula (2') may be contained only singly or in combination of two or more kinds thereof in the polymer compound of the second organic layer.

When the polymer compound of the second organic layer contains two or more constitutional units represented by the formula (2'), it is preferable that the crosslink groups represented by X' are mutually different in at least two constitutional units represented by the formula (2'). The preferable range of the combination of the mutually different crosslink groups represented by X' is the same as the preferable range of the combination of the mutually different crosslink groups described above.

Preferable Embodiment of Constitutional Unit Represented by the Formula (2) or (2')

The constitutional unit represented by the formula (2) includes, for example, constitutional units represented by the formula (2-1) to the formula (2-30), and the constitutional unit represented by the formula (2') includes, for example, constitutional units represented by the formula (2'-1) to the formula (2'-9). Of them, preferable are constitutional units represented by the formula (2-1) to the formula (2-30), more preferable are constitutional units represented by the formula (2-1) to the formula (2-15), the formula (2-19), the formula (2-20), the formula (2-23), the formula (2-25) or the formula (2-30), further preferable are constitutional units represented by the formula (2-1) to the formula (2-9) or the formula (2-30), since the polymer compound of the second organic layer is excellent in crosslinkability.

[Chemical Formula 97]

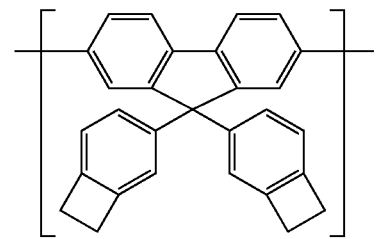
(2-1)

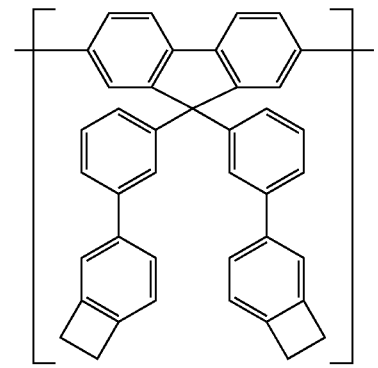
(2-2)

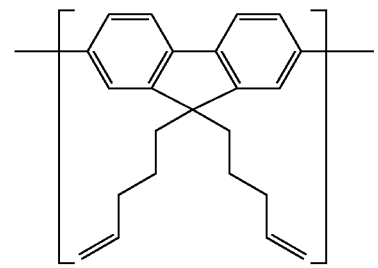
(2-3)

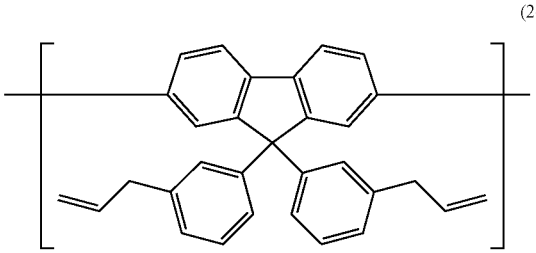
(2-4)

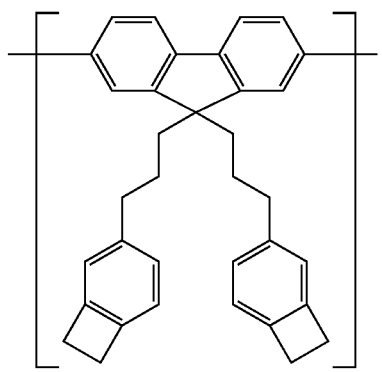
(2-5)

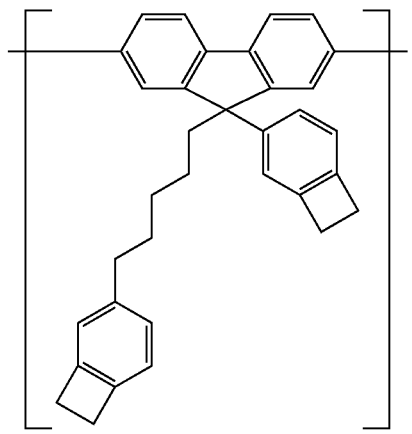
(2-6)

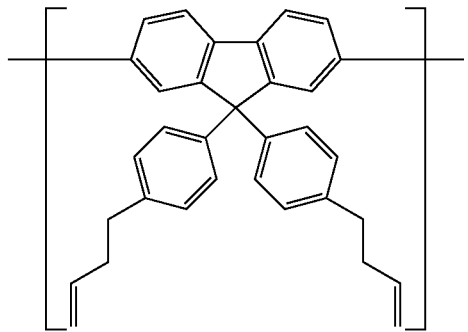
(2-7)

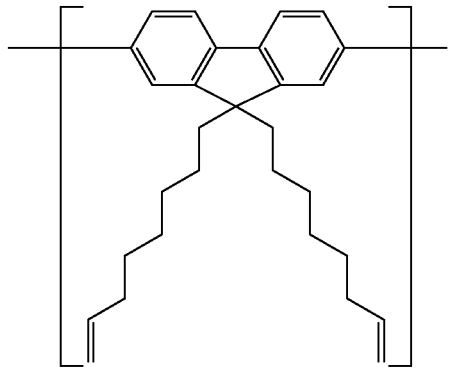
(2-8)

(2-9)
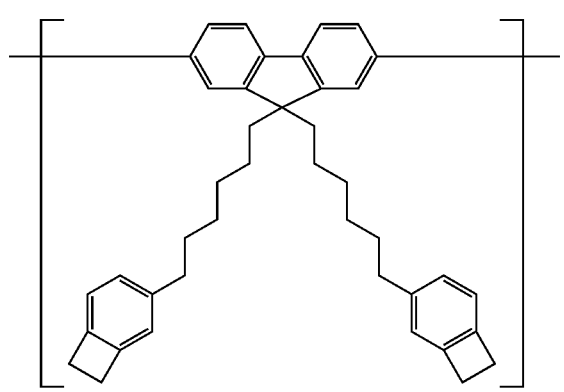
(2-10)
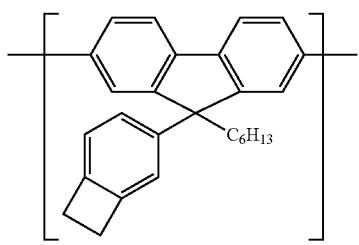
(2-11)
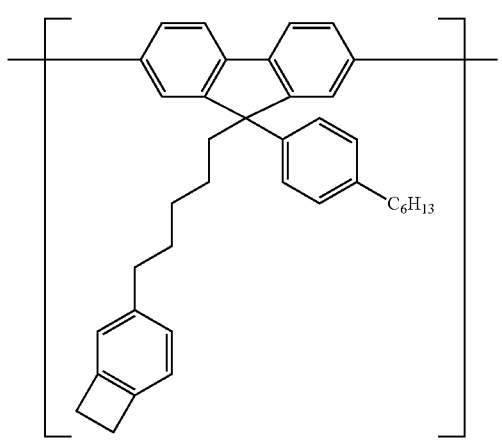
(2-12)
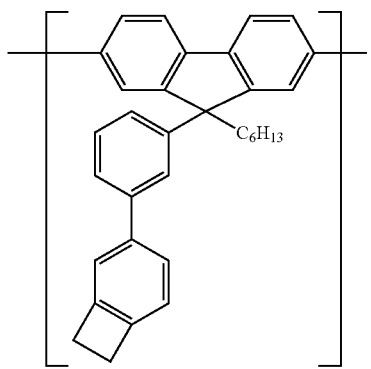
(2-13)
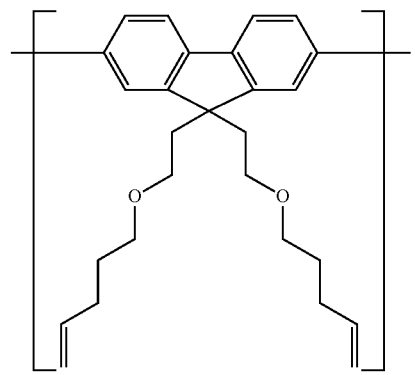
(2-14)
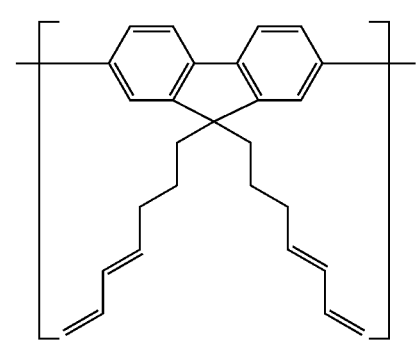
(2-15)
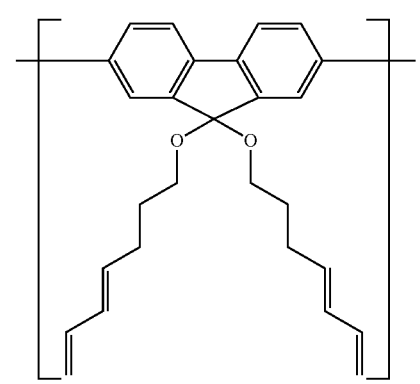
[Chemial Formula 98]
(2-16)
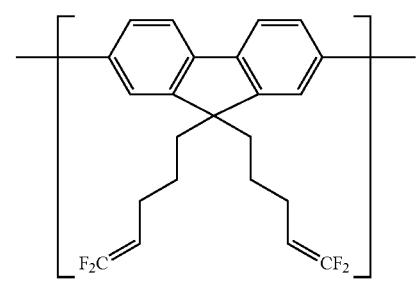

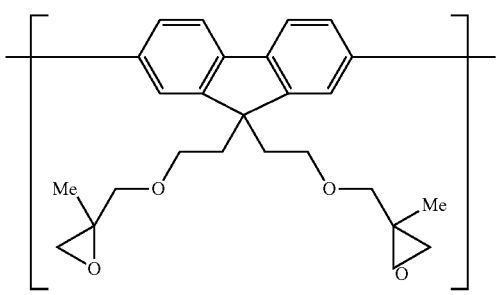
(2-17)
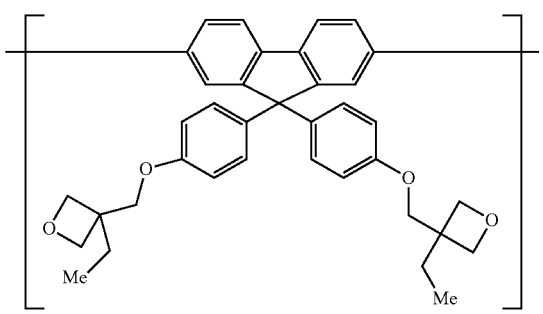
(2-18)
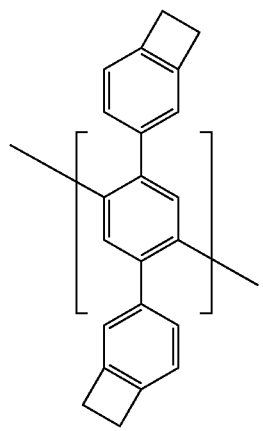
(2-19)
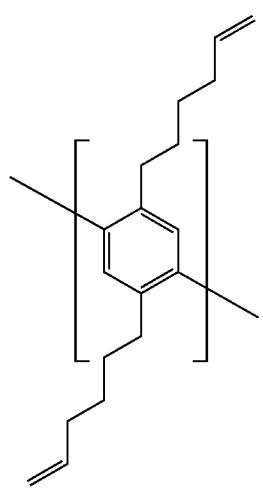
(2-20)
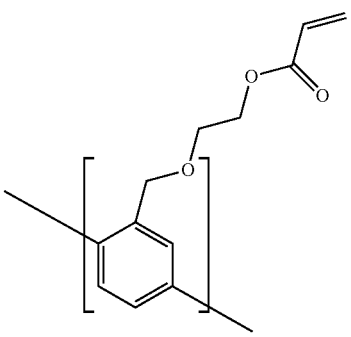
(2-21)
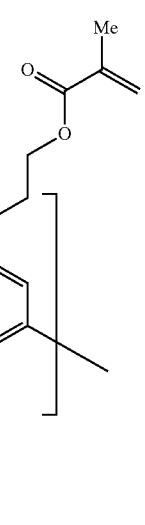
(2-22)
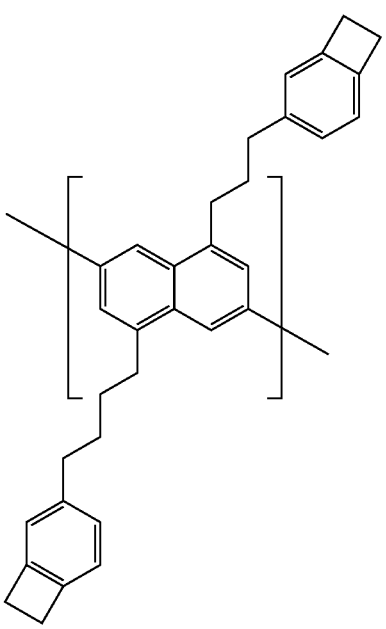
(2-23)

(2-24)
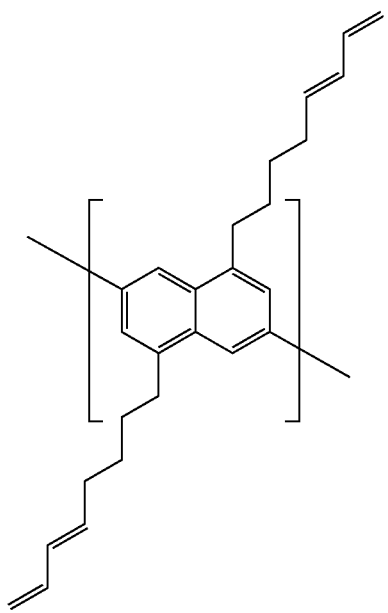
(2-25)
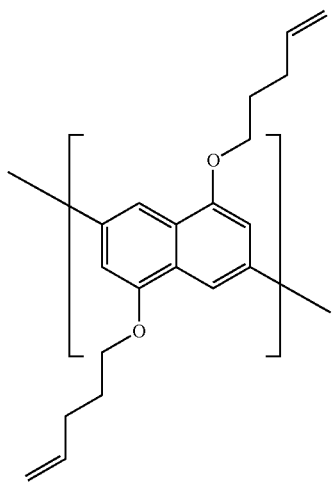
(2-26)
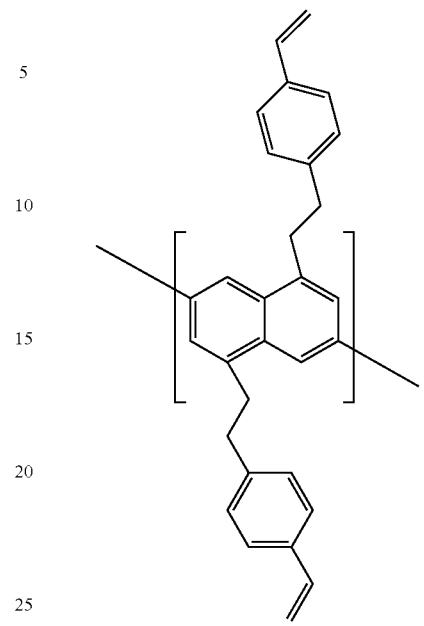
(2-27)
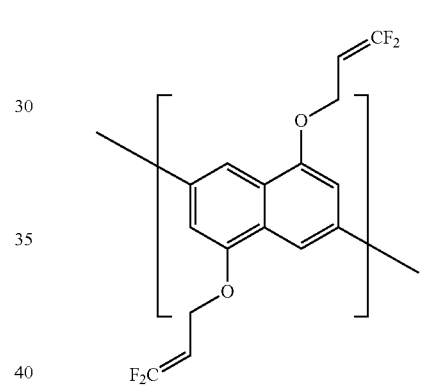
(2-28)
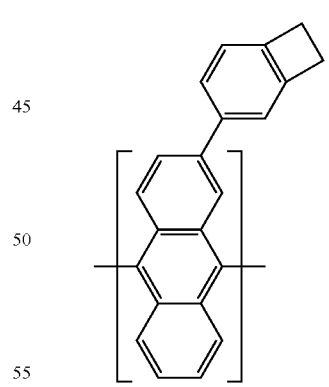
(2-29)
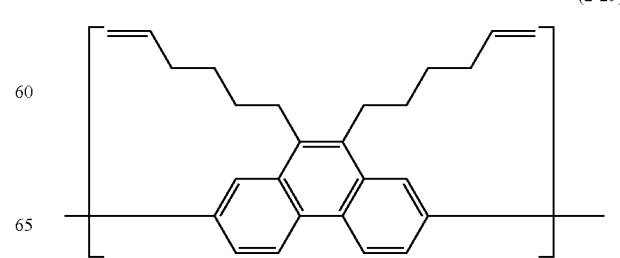

(2-30)
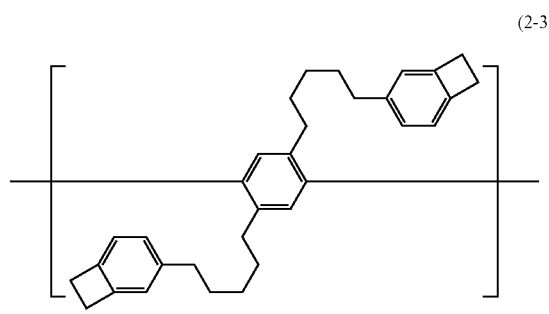

[Chemical Formula 99]

(2'-1)
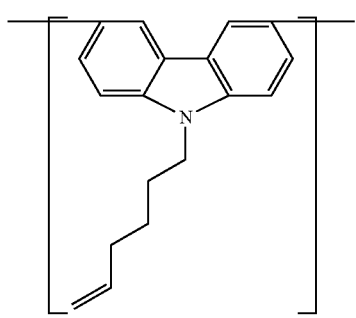

(2'-2)
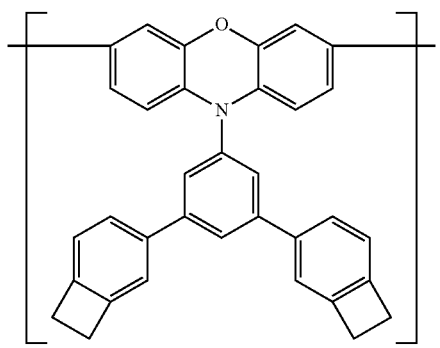

(2'-3)
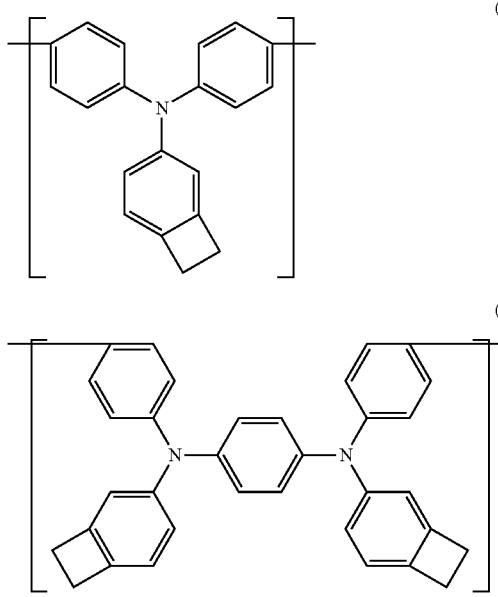

(2'-4)

(2'-5)
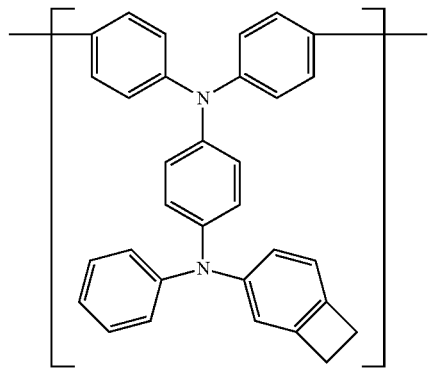

(2'-6)
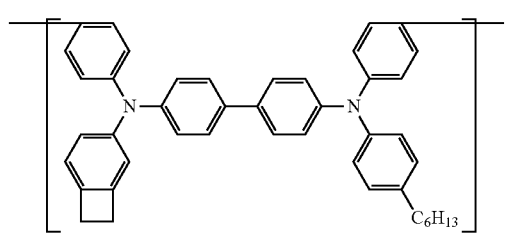

(2'-7)
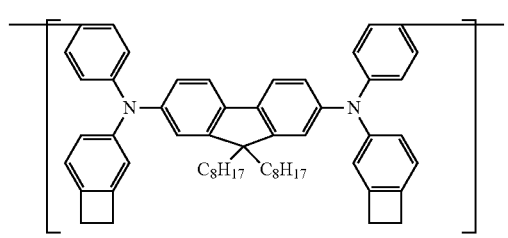

(2'-8)
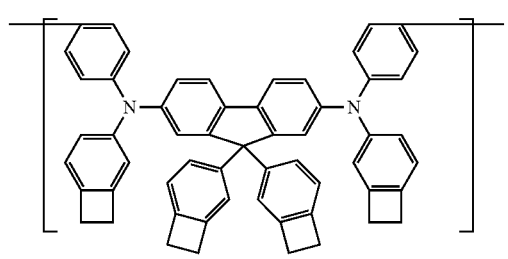

(2'-9)
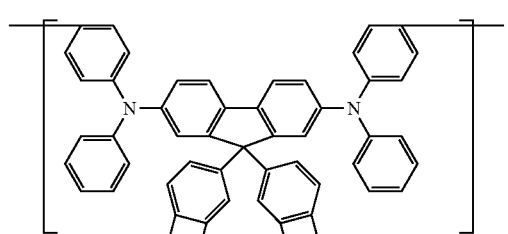

Other Constitutional Unit

It is preferable that the polymer compound of the second organic layer further contains a constitutional unit represented by the formula (X), since excellent hole transportability is obtained. Moreover, it is preferable that the polymer compound of the second organic layer further contains a constitutional unit represented by the formula (Y), since the light emitting device of the present invention is more excellent in external quantum efficiency.

It is preferable that the polymer compound of the second organic layer further contains a constitutional unit represented by the formula (X) and a constitutional unit represented by the formula (Y), since excellent hole transportability is obtained and the light emitting device of the present invention is more excellent in external quantum efficiency.

The definition and the examples of the constitutional unit represented by the formula (X) which the polymer compound of the second organic layer may contain are the same as the definition and the examples of the constitutional unit represented by the formula (X) which the polymer host may contain described above.

When the polymer compound of the second organic layer contains a constitutional unit represented by the formula (X), at least one of $Ar^{X1}$ and $Ar^{X3}$ is preferably a group represented by the formula (X-1-1'), the formula (X-1-1''), the formula (X-1-2'), the formula (X-1-2'') or the formula (X-2-1) to the formula (X-2-4), more preferably a group represented by the formula (X-1-1'), the formula (X-1-1''), the formula (X-1-2'), the formula (X-2-2) or the formula (X-2-3), further preferably a group represented by the formula (X-1-1'), the formula (X-1-1'') or the formula (X-1-2'), particularly preferably a group represented by the formula (X-1-1''), since the energy level at the lowest triplet excited state of the polymer compound of the second organic layer increases.

When the polymer compound of the second organic layer contains a constitutional unit represented by the formula (X), $Ar^{X1}$ and $Ar^{X3}$ are each preferably a group represented by the formula (X-1-1'), the formula (X-1-1''), the formula (X-1-2'), the formula (X-1-2'') or the formula (X-2-1) to the formula (X-2-4), more preferably a group represented by the formula (X-1-1'), the formula (X-1-1''), the formula (X-1-2'), the formula (X-2-2) or the formula (X-2-3), further preferably a group represented by the formula (X-1-1'), the formula (X-1-1'') or the formula (X-1-2'), particularly preferably a group represented by the formula (X-1-1''), since the energy level at the lowest triplet excited state of the polymer compound of the second organic layer is more increased.

[Chemical Formula 100]

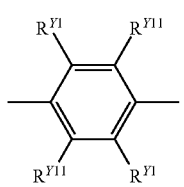
(X-1-1')

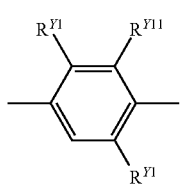
(X-1-1'')

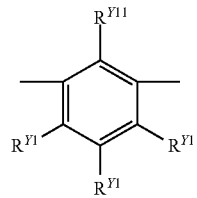
(X-1-2')

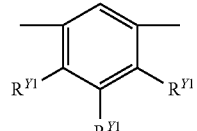
(X-1-2'')

[Chemical Formula 101]

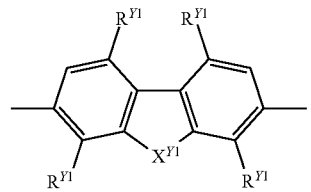
(X-2-1)

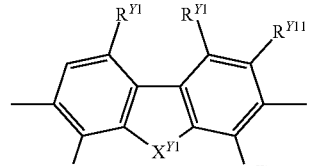
(X-2-2)

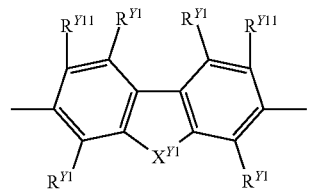
(X-2-3)

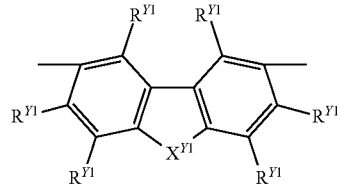
(X-2-4)

[wherein, $R^{Y1}$, $R^{Y11}$ and $X^{Y1}$ represent the same meaning as described above.]

The definition and the examples of the constitutional unit represented by the formula (Y) which the polymer compound of the second organic layer may contain are the same as the definition and the examples of the constitutional unit represented by the formula (Y) which the polymer host may contain described above.

When the polymer compound of the second organic layer contains a constitutional unit represented by the formula (Y), the polymer compound contains preferably a constitutional unit represented by the formula (Y-1-1), the formula (Y-1-2), the formula (Y-2-1) to (Y-2-4) or the formula (Y-Y3-1) to the formula (Y-Y3-4), more preferably a constitutional unit represented by the formula (Y-1-1'), the formula (Y-1-1''), the formula (Y-1-2'), the formula (Y-1-2''), the formula (Y-2-2), the formula (Y-2-3) or the formula (Y-Y3-1) to the formula (Y-Y3-3), further preferably a constitutional unit represented by the formula (Y-1-1'), the formula (Y-1-1"), the formula (Y-1-2'), the formula (Y-2-3) or the formula (Y-Y3-1), particularly preferably a constitutional unit represented by the formula (Y-1-1'), since the energy level at the lowest triplet excited state of the polymer compound of the second organic layer is more increased.

When the polymer compound of the second organic layer contains a constitutional unit represented by the formula (Y), the polymer compound contains preferably a constitutional unit represented by any of the formula (Y-8) to the formula (Y-10), more preferably a constitutional unit represented by the formula (Y-10), since the energy level at the lowest triplet excited state of the polymer compound of the second organic layer is high and the polymer compound of the second organic layer is more excellent in hole transportability.

The constitutional unit represented by the formula (X) may be contained only singly or in combination of two or more kinds thereof in the polymer compound of the second organic layer. The constitutional unit represented by the formula (Y) may be contained only singly or in combination of two or more kinds thereof in the polymer compound of the second organic layer.

When the polymer compound of the second organic layer contains a constitutional unit represented by the formula (X), the amount of the constitutional unit represented by the formula (X) is preferably 0.1 to 90% by mol, more preferably 1 to 70% by mol, further preferably 10 to 50% by mol with respect to the total amount of constitutional units contained in the polymer compound of the second organic layer, since excellent hole transportability is obtained.

When the polymer compound of the second organic layer contains a constitutional unit represented by the formula (Y) in which $Ar^{Y1}$ is an arylene group, the amount of the constitutional unit is preferably 0.5 to 90% by mol, more preferably 30 to 60% by mol with respect to the total amount of constitutional units contained in the polymer compound of the second organic layer, since the light emitting device of the present invention is more excellent in external quantum efficiency.

When the polymer compound of the second organic layer contains a constitutional unit represented by the formula (Y) in which $Ar^{Y1}$ is a divalent hetero ring group or a divalent group in which at least one arylene group and at least one divalent hetero ring group are bonded directly, the amount of the constitutional unit represented by the formula (Y) is preferably 0.1 to 90% by mol, more preferably 1 to 70% by mol, further preferably 10 to 50% by mol with respect to the total amount of constitutional units contained in the polymer compound of the second organic layer, since the polymer compound of the second organic layer is excellent in charge transportability.

The polymer compound of the second organic layer includes, for example, polymer compounds P-7 to P-14. In the present specification, "other constitutional unit" denotes a constitutional unit other than the constitutional units represented by the formula (2), the formula (2'), the formula (X) and the formula (Y).

TABLE 2

| polymer compound | constitutional unit and mole fraction thereof | | | | |
|---|---|---|---|---|---|
| | formula (2) p' | formula (2') q' | formula (X) r' | formula (Y) s' | other t' |
| P-7 | 0.1 to 99.9 | 0.1 to 99.9 | 0 | 0 | 0 to 30 |
| P-8 | 0.1 to 99.9 | 0 | 0.1 to 99.9 | 0 | 0 to 30 |
| P-9 | 0.1 to 99.9 | 0 | 0 | 0.1 to 99.9 | 0 to 30 |
| P-10 | 0 | 0.1 to 99.9 | 0.1 to 99.9 | 0 | 0 to 30 |
| P-11 | 0 | 0.1 to 99.9 | 0 | 0.1 to 99.9 | 0 to 30 |
| P-12 | 0.1 to 99.8 | 0.1 to 99.8 | 0.1 to 99.8 | 0 | 0 to 30 |
| P-13 | 0.1 to 99.8 | 0.1 to 99.8 | 0 | 0.1 to 99.8 | 0 to 30 |
| P-14 | 0.1 to 99.7 | 0.1 to 99.7 | 0.1 to 99.7 | 0.1 to 99.7 | 0 to 30 |

[in the table, p', q', r', s' and t' represent the mole fraction of each constitutional unit. p'+q'+r'+s'+t'=100 and 70≤p'+q'+r'+s'≤100.].

The polymer compound of the second organic layer may be any of a block copolymer, a random copolymer, an alternating copolymer and a graft copolymer, and may also be another form, and is preferably a copolymer obtained by copolymerizing a plurality of raw material monomers.

The polystyrene-equivalent number-average molecular weight of the polymer compound of the second organic layer is preferably $5\times10^3$ to $1\times10^6$, more preferably $1\times10^4$ to $5\times10^5$, more preferably $1.5\times10^4$ to $1\times10^5$.

[Production Method of Polymer Compound of Second Organic Layer]

The polymer compound of the second organic layer can be produced by the same method as the production method of the polymer host described above.

[Second Composition]

The second organic layer may be a layer containing a composition containing a crosslinked body of the polymer compound of the second organic layer and at least one material selected from the group consisting of a hole transporting material, a hole injection material, an electron transporting material, an electron injection material, a light emitting material and an antioxidant (hereinafter, referred to also as "second composition").

The examples and the preferable range of the hole transporting material, the electron transporting material, the hole injection material and the electron injection material contained in the second composition are the same as the examples and the preferable range of the hole transporting material, the electron transporting material, the hole injection material and the electron injection material contained in the first composition.

The light emitting material contained in the second composition includes, for example, fluorescent light emitting materials which may be contained in the first composition, and phosphorescent metal complexes having iridium, platinum or europium as the central metal. The light emitting material may be used singly or in combination of two or more.

In the second composition, the compounding amounts of a hole transporting material, an electron transporting material, a hole injection material, an electron injection material and a light emitting material are each usually 1 to 400 parts by mass, preferably 5 to 150 parts by mass when the amount of a crosslinked body of the polymer compound of the second organic layer is taken as 100 parts by mass.

The examples and the preferable range of the antioxidant contained in the second composition are the same as the examples and the preferable range of the antioxidant contained in the first composition. In the second composition, the compounding amount of the antioxidant is usually 0.001 to 10 parts by mass when the amount of the crosslinked body of the polymer compound of the second organic layer is taken as 100 parts by mass.

A composition containing the polymer compound of the second organic layer and a solvent (hereinafter, referred to also as "second ink") can be suitably used in wet methods explained in the section of the first ink. The preferable range of the viscosity of the second ink is the same as the preferable range of the viscosity of the first ink. The examples and the preferable range of the solvent contained in the second ink are the same as the examples and the preferable range of the solvent contained in the first ink.

In the second ink, the compounding amount of the solvent is usually 1000 to 100000 parts by mass, preferably 2000 to 20000 parts by mass when the amount of the polymer compound of the second organic layer is taken as 100 parts by mass.

<Layer Constitution of Light Emitting Device>

The light emitting device of the present invention may have layers other than the anode, the cathode, the first organic layer and the second organic layer.

In the light emitting device of the present invention, the first organic layer is usually a light emitting layer (hereinafter, referred to as "first light emitting layer").

In the light emitting device of the present invention, the second organic layer is usually a hole transporting layer, a second light emitting layer or an electron transporting layer, preferably a hole transporting layer or a second light emitting layer, more preferably a hole transporting layer.

In the light emitting device of the present invention, it is preferable that the first organic layer and the second organic layer are adjacent, since the light emitting device of the present invention is more excellent in external quantum efficiency.

In the light emitting device of the present invention, the second organic layer is preferably a layer disposed between the anode and the first organic layer, more preferably a hole transporting layer or a second light emitting layer disposed between the anode and the first organic layer, further preferably a hole transporting layer disposed between the anode and the first organic layer, since the light emitting device of the present invention is more excellent in external quantum efficiency.

In the first organic layer of the light emitting device of the present invention, the compound (T) may be contained singly or in combination of two or more kinds thereof. In the second organic layer of the light emitting device of the present invention, the crosslinked body of the polymer compound of the second organic layer may be contained singly or in combination of two or more kinds thereof.

In the light emitting device of the present invention, when the second organic layer is a hole transporting layer disposed between the anode and the first organic layer, it is preferable that a hole injection layer is further provided between the anode and the second organic layer, since the light emitting device of the present invention is more excellent in external quantum efficiency. When the second organic layer is a hole transporting layer disposed between the anode and the first organic layer, it is preferable that at least one of an electron injection layer and an electron transporting layer is further provided between the cathode and the first organic layer, since the light emitting device of the present invention is more excellent in external quantum efficiency.

In the light emitting device of the present invention, when the second organic layer is a second light emitting layer disposed between the anode and the first organic layer, it is preferable that at least one of a hole injection layer and a hole transporting layer is further provided between the anode and the second organic layer, since the light emitting device of the present invention is more excellent in external quantum efficiency. When the second organic layer is a second light emitting layer disposed between the anode and the first organic layer, it is preferable that at least one of an electron injection layer and an electron transporting layer is further provided between the cathode and the first organic layer, since the light emitting device of the present invention is more excellent in external quantum efficiency.

In the light emitting device of the present invention, when the second organic layer is a second light emitting layer disposed between the cathode and the first organic layer, it is preferable that at least one of a hole injection layer and a hole transporting layer is further provided between the anode and the first organic layer, since the light emitting device of the present invention is more excellent in external quantum efficiency. When the second organic layer is a second light emitting layer disposed between the cathode and the first organic layer, it is preferable that at least one of an electron injection layer and an electron transporting layer is further provided between the cathode and the second organic layer, since the light emitting device of the present invention is more excellent in external quantum efficiency.

In the light emitting device of the present invention, when the second organic layer is an electron transporting layer disposed between the cathode and the first organic layer, it is preferable that at least one of a hole injection layer and a hole transporting layer is further provided between the anode and the first organic layer, since the light emitting device of the present invention is more excellent in external quantum efficiency. When the second organic layer is an electron transporting layer disposed between the cathode and the first organic layer, it is preferable that an electron injection layer is further provided between the cathode and the second organic layer, since the light emitting device of the present invention is more excellent in external quantum efficiency.

The specific layer constitution of the light emitting device of the present invention includes, for example, layer constitutions represented by (D1) to (D15). The light emitting device of the present invention usually has a substrate, and an anode may be first laminated on the substrate, or a cathode may be first laminated on the substrate.

(D1) anode/second light emitting layer (second organic layer)/first light emitting layer (first organic layer)/cathode (D2) anode/hole transporting layer (second organic layer)/first light emitting layer (first organic layer)/cathode (D3) anode/hole injection layer/second light emitting layer (second organic layer)/first light emitting layer (first organic layer)/cathode (D4) anode/hole injection layer/second light emitting layer (second organic layer)/first light emitting layer (first organic layer)/electron transporting layer/cathode (D5) anode/hole injection layer/second light emitting layer (second organic layer)/first light emitting layer (first organic layer)/electron injection layer/cathode (D6) anode/hole injection layer/second light emitting layer (second organic layer)/first light emitting layer (first organic layer)/electron transporting layer/electron injection layer/cathode (D7) anode/hole injection layer/hole transporting layer (second organic layer)/first light emitting layer (first organic layer)/cathode (D8) anode/hole injection layer/hole transporting layer (second organic layer)/first light emitting layer (first organic layer)/electron transporting layer/cathode (D9) anode/hole injection layer/hole transporting layer (second organic layer)/first light emitting layer (first organic layer)/electron injection layer/cathode (D10) anode/hole injection layer/hole transporting layer (second organic layer)/first light emitting layer (first organic layer)/electron transporting layer/electron injection layer/cathode (D11) anode/hole injection layer/hole transporting layer/second light emitting layer (second organic layer)/first light emitting layer (first organic layer)/electron transporting layer/electron injection layer/cathode (D12) anode/hole injection layer/hole transporting layer (second organic layer)/first light emitting layer (first organic layer)/second light emitting layer/electron transporting layer/electron injection layer/cathode (D13) anode/hole injection layer/hole transporting layer/first light emitting layer (first organic layer)/second light emitting layer (second organic layer)/electron transporting layer/electron injection layer/cathode (D14) anode/hole injection layer/hole transporting layer/first light emitting layer (first organic layer)/electron transporting layer (second organic layer)/electron injection layer/cathode (D15) anode/hole injection layer/hole transporting layer (second organic layer)/second light emitting layer/first light emitting layer (first organic layer)/electron transporting layer/electron injection layer/cathode In (D1) to (D15), "/" means that layers before and after is are laminated adjacent to each other. Specifically, "second light emitting layer (second organic layer)/first light emitting layer (first organic layer)" means that a second light emitting layer (second organic layer) and a first light emitting layer (first organic layer) are laminated adjacent to each other.

Layer constitutions represented by (D3) to (D12) are preferable, layer constitutions represented by (D7) to (D10) are more preferable, since the light emitting device of the present invention is more excellent in external quantum efficiency.

In the light emitting device of the present invention, two or more layers of the anode, the hole injection layer, the hole transporting layer, the second light emitting layer, the electron transporting layer, the electron injection layer and the cathode may be provided, respectively, as necessary When a plurality of anodes, hole injection layers, hole transporting layers, second light emitting layers, electron transporting layers, electron injection layers and cathodes are present, they may be the same or different at each occurrence.

The thicknesses of the anode, the hole injection layer, the hole transporting layer, the first light emitting layer, the second light emitting layer, the electron transporting layer, the electron injection layer and the cathode are each usually 1 nm to 1 µm, preferably 2 nm to 500 nm, further preferably 5 nm to 150 nm.

In the light emitting device of the present invention, the order, the number and the thickness of layers to be laminated may be adjusted in consideration of the light emission efficiency, the driving voltage and the device life of the light emitting device.

[Second Light Emitting Layer]

The second light emitting layer is usually a layer containing a second organic layer and a light emitting material, and preferably a layer containing a light emitting material. When the second light emitting layer is a layer containing a light emitting material, the light emitting material contained in the second light emitting layer includes, for example, light emitting materials which the second composition may contain described above. The light emitting material contained in the second light emitting layer may be contained singly or in combination of two or more kinds thereof.

When the light emitting device of the present invention has a second light emitting layer and when a hole transporting layer described later and an electron transporting layer described later are not a second organic layer, it is preferable that the second light emitting layer is a second organic layer.

[Hole Transporting Layer]

The hole transporting layer is usually a layer containing a second organic layer or a hole transporting material, and preferably a second organic layer. When the hole transporting layer is a layer containing a hole transporting material, the hole transporting material includes, for example, hole transporting materials which the first composition may contain described above. The hole transporting material contained in the hole transporting layer may be contained singly or in combination of two or more kinds thereof.

When the light emitting device of the present invention has a hole transporting layer and when a second light emitting layer described above and an electron transporting layer described later are not a second organic layer, it is preferable that the hole transporting layer is a second organic layer.

[Electron Transporting Layer]

The electron transporting layer is usually a layer containing a second organic layer or an electron transporting material, and is preferably a layer containing an electron transporting material. When the electron transporting layer is a layer containing an electron transporting material, the electron transporting material contained in the electron transporting layer includes, for example, electron transporting materials which the first composition may contain described above. The electron transporting material contained in the electron transporting layer may be contained singly or in combination of two or more kinds thereof.

When the light emitting device of the present invention has an electron transporting layer and when a second light emitting layer described above and a hole transporting layer described above are not a second organic layer, it is preferable that the electron transporting layer is a second organic layer.

[Hole Injection Layer and Electron Injection Layer]

The hole injection layer is a layer containing a hole injection material. The hole injection material contained in the hole injection layer includes, for example, hole injection materials which the first composition may contain described above. The hole injection material contained in the hole injection layer may be contained singly or in combination of two or more kinds thereof.

The electron injection layer is a layer containing an electron injection material. The electron injection material contained in the electron injection layer includes, for example, electron injection materials which the first composition may contain described above. The electron injection material contained in the electron injection layer may be contained singly or in combination of two or more kinds thereof.

[Substrate/Electrode]

The substrate in the light emitting device may advantageously be a substrate on which an electrode can be formed and which does not change chemically in forming an organic layer, and is, for example, a substrate made of a material such as glass, plastic, silicon and the like. When an opaque substrate is used, it is preferable that the electrode farthest from the substrate is transparent or semi-transparent.

The material of the anode includes, for example, electrically conductive metal oxides and semi-transparent metals, preferably includes indium oxide, zinc oxide, tin oxide; electrically conductive compounds such as indium-tin-oxide (ITO), indium-zinc-oxide and the like; argentine-palladium-copper (APC) complex; NESA, gold, platinum, silver and copper.

The material of the cathode includes, for example, metals such as lithium, sodium, potassium, rubidium, cesium, beryllium, magnesium, calcium, strontium, barium, aluminum, zinc, indium and the like; alloys composed of two or more of them; alloys composed of at least one of them and at least one of silver, copper, manganese, titanium, cobalt, nickel, tungsten and tin; and graphite and graphite intercalation compounds. The alloy includes, for example, a magnesium-silver alloy, a magnesium-indium alloy, a magnesium-aluminum alloy, an indium-silver alloy, a lithium-aluminum alloy, a lithium-magnesium alloy, a lithium-indium alloy and a calcium-aluminum alloy.

In the light emitting device of the present invention, at least one of the anode and the cathode is usually transparent or semi-transparent, and it is preferable that the anode is transparent or semi-transparent.

The method for forming the anode and the cathode includes, for example, a vacuum vapor deposition method, a sputtering method, an ion plating method, a plating method and a lamination method.

[Production Method of Light Emitting Device]

The method for forming each of the first light emitting layer, the second light emitting layer, the hole transporting layer, the electron transporting layer, the hole injection layer, the electron injection layer and the like in the light emitting device of the present invention includes, when a low molecular compound is used, for example, a method of vacuum vapor deposition from a powder and a method of forming a film from a solution or melted state, and when a polymer compound is used, for example, a method of forming a film from a solution or melted state.

The first light emitting layer, the second light emitting layer, the hole transporting layer, the electron transporting layer, the hole injection layer and the electron injection layer can be formed by application methods such as a spin coat method, an inkjet printing method and the like using the first ink, the second ink, and inks containing the light emitting material, the hole transporting material, the electron transporting material, the hole injection material and the electron injection material described above, respectively.

[Application of Light Emitting Device]

In order to obtain planar light emission using a light emitting device, the planar anode and the planar cathode may be arranged so as to overlap each other. In order to obtain patterned light emission, there are a method of installing a mask having a patterned window on the surface of a planar light emitting device, a method in which a layer to be formed as a non-light emitting part is formed extremely thick so as to cause substantially non light emission and a method of forming an anode or a cathode, or both electrodes in a pattern. A segment type display capable of displaying numerals, letters and the like can be obtained by forming a pattern by any one of these methods and disposing several electrodes so that several electrodes can be turned on and off independently. In order to obtain a dot matrix display, both the anode and the cathode may be formed in a stripe shape and arranged so as to be orthogonal to each other. Partial color display and multicolor display become possible by a method of separately coating plural kinds of polymer compounds having different emission colors or a method using a color filter or a fluorescence conversion filter. The dot matrix display can be driven passively or can be driven actively in combination with a TFT and the like. These displays can be used for displays of computers, televisions, portable terminals, and the like. The planar light emitting device can be suitably used as a planar light source for backlight of a liquid crystal display, or as a planar light source for illumination. If a flexible substrate is used, it can be used as a curved light source and a curved display.

EXAMPLES

The present invention will be illustrated further in detail by examples below, but the present invention is not limited to these examples.

In examples, the polystyrene-equivalent number-average molecular weight (Mn) and the polystyrene-equivalent weight-average molecular weight (Mw) of a polymer compound were determined by size exclusion chromatography (SEC) using tetrahydrofuran as a mobile phase. The measurement conditions of SEC are as follows.

A polymer compound to be measured was dissolved at a concentration of about 0.05% by mass in tetrahydrofuran, and 10 µL of the solution was injected into SEC. The mobile phase was run at a flow rate of 2.0 mL/min. As the column, PLgel MIXED-B (manufactured by Polymer Laboratories) was used. As the detector, UV-VIS detector (manufactured by Shimadzu Corp., trade name: SPD-10Avp) was used.

LC-MS was measured by the following method.

A measurement sample was dissolved in chloroform or tetrahydrofuran so as to give a concentration of about 2 mg/mL, and about 1 µL of the solution was injected into LC-MS (manufactured by Agilent, trade name: 1100LCMSD). As the mobile phase for LC-MS, acetonitrile and tetrahydrofuran were used while changing the ratio of them and run at a flow rate of 0.2 mL/min. As the column, L-column 2 ODS (3 µm) (manufactured by Chemical Evaluation and Research Institute, Japan, internal diameter: 2.1 mm, length: 100 mm, particle size: 3 µm) was used.

NMR was measured by the following method.

A measurement sample of 5 to 10 mg was dissolved in about 0.5 mL of deuterated chloroform ($CDCl_3$), deuterated tetrahydrofuran, deuterated dimethyl sulfoxide, deuterated acetone, deuterated N,N-dimethylformamide, deuterated toluene, deuterated methanol, deuterated ethanol, deuterated 2-propanol or deuterated methylene chloride, and NMR was measured using an NMR apparatus (manufactured by Agilent, trade name: INOVA300 or MERCURY 400VX).

As an indicator of the purity of the compound, the value of high performance liquid chromatography (HPLC) area percentage was used. This value is a value by HPLC (manufactured by Shimadzu Corp., trade name: LC-20A) at UV=254 nm unless otherwise stated. In this procedure, the compound to be measured was dissolved in tetrahydrofuran or chloroform so as to give a concentration of 0.01 to 0.2% by mass, and the solution was injected into HPLC in an amount of 1 to 10 μL depending on the concentration. As the mobile phase of HPLC, acetonitrile and tetrahydrofuran were used at a ratio of acetonitrile/tetrahydrofuran changing from 100/0 to 0/100 (volume ratio), and the solution was run at a flow rate of 1.0 mL/min. As the column, Kaseisorb LC ODS 2000 (manufactured by Tokyo Chemical Industry Co., Ltd.) or an ODS column having the equivalent performance was used. As the detector, a photo diode array detector (manufactured by Shimadzu Corp., trade name: SPD-M20A) was used.

For calculation of $\Delta E_{ST}$ and oscillator strength value of a compound, the structure of the ground state of the compound was optimized by the B3LYP level density functional method, and 6-31G* was used as the basis function in this operation. Using Gaussian09 as a quantum chemical calculation program, $\Delta E_{ST}$ and oscillator strength of a compound were calculated by the B3LYP level time-dependent density functional method.

The energy level of the lowest triplet excited state of a polymer compound was determined by measuring the phosphorescent emission spectrum of the polymer compound at 77 K.

Specifically, the polymer compound was dissolved in xylene at a concentration of 3.0% by mass. The resultant xylene solution was used to form a film on a glass substrate by a drop cast method, then, vacuum-dried at room temperature, to form a film of the polymer compound. The glass substrate carrying the polymer compound film formed thereon was placed in a glass tube containing a nitrogen atmosphere having an oxygen concentration of less than 5 ppm, then, the glass tube was sealed. The sealed glass tube was cooled to 77 K with liquid nitrogen, and used as a measurement sample. The resultant measurement sample was irradiated with excitation light (excitation wavelength: 325 nm), and the phosphorescent emission spectrum of the polymer compound was measured. A value obtained by converting the maximum peak wavelength of the shortest wavelength in the phosphorescent emission spectrum of the resultant polymer compound into energy was defined as the energy level of the lowest triplet excited state of the polymer compound.

In the measurement of the phosphorescent emission spectrum of the polymer compound, a rotary optical chopper was used. As an excitation light source, He—Cd laser (manufactured by Kimmon Koha Co., Ltd.) was used. As a detector, a multichannel spectrometer (trade name: PMA-12) manufactured by Hamamatsu Photonics K.K. was used.

<Synthesis Examples T1 and T2> Synthesis of Compounds T1 and T2

A compound T1 was synthesized as well as a method described in International Publication WO2010/136109.

A compound T2 was synthesized as well as a method described in International Publication WO2007/063754.

[Chemical Formula 102]

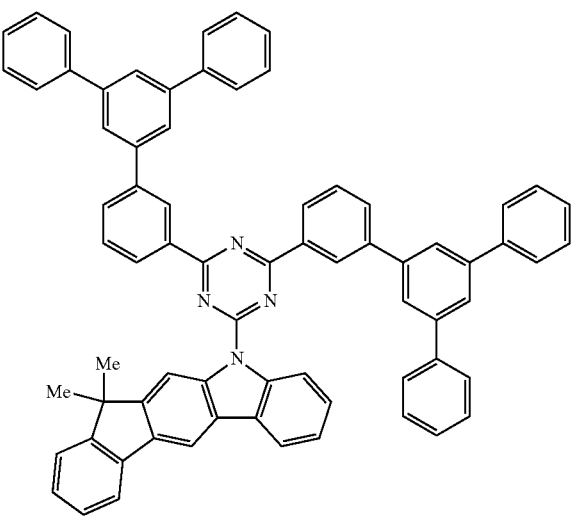

compound T1

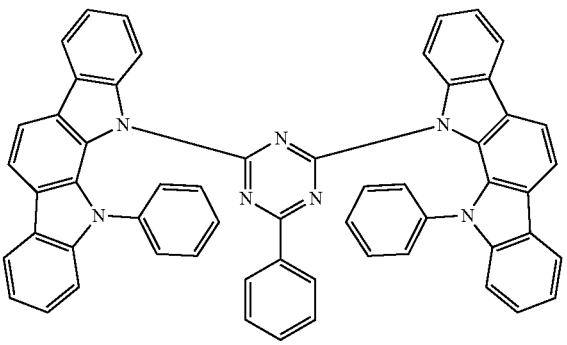

compound T2

$\Delta E_{ST}$ and oscillator strength of the compound T1 were 0.1295 eV and 0.0011, respectively.

$\Delta E_{ST}$ and oscillator strength of the compound T2 were 0.1072 eV and 0.0062, respectively.

<Synthesis Example T3> Synthesis of Compound T3

[Chemical Formula 103]

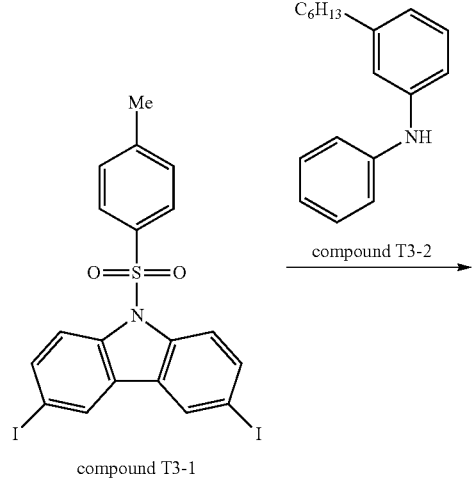

compound T3-1 + compound T3-2 →

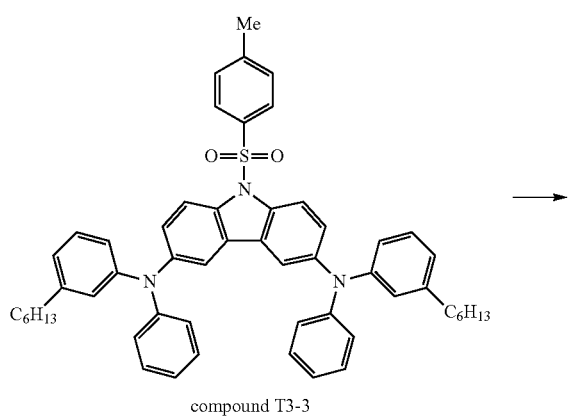

compound T3-3

→

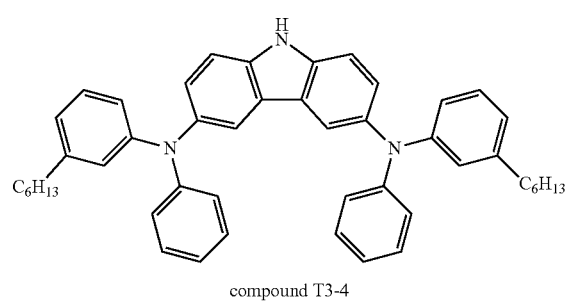

compound T3-4

[Chemical Formula 104]

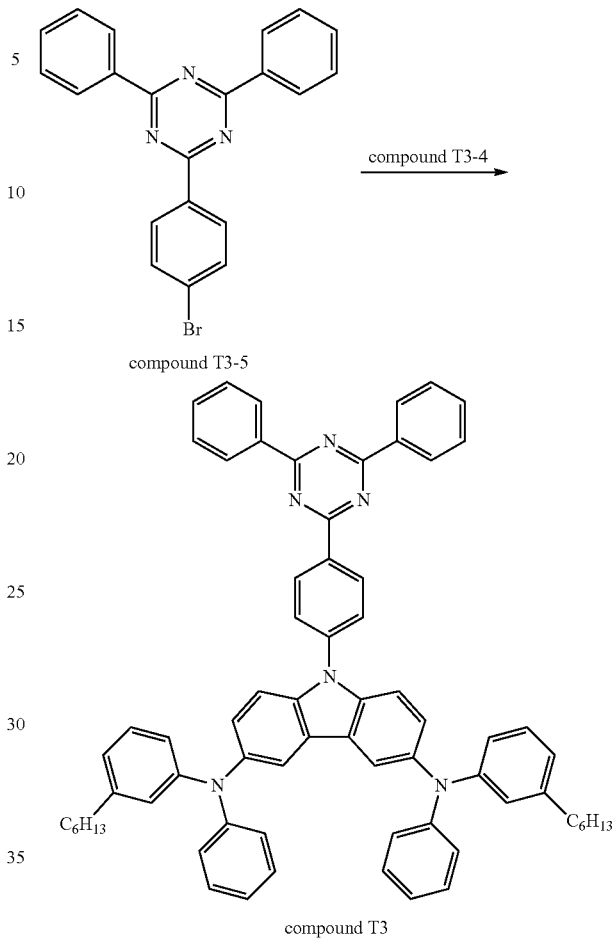

compound T3-5 → compound T3-4 → compound T3

(Synthesis of compound T3-3)

An argon atmosphere was prepared in a reaction vessel, then, the compound T3-1 (2.5 g), the compound T3-2 (2.8 g), tris(dibenzylideneacetone)dipalladium(0) (0.25 g), tri-tert-butylphosphonium tetrafluoroborate (0.13 g), sodium tert-butoxide (1.3 g) and toluene (75 ml) were added, and stirred at room temperature for 1 hour. Thereafter, to this were added hexane and silica gel, and the mixture was stirred at 50° C., then, filtrated through a filter paved with silica gel. The resultant filtrate was concentrated under reduced pressure, to obtain a solid. The resultant solid was purified by silica gel column chromatography (a mixed solvent of hexane and toluene), then, dried under reduced pressure at 50° C., to obtain a coarse product (3.1 g, brown oil) of a compound T3-3. To the resultant coarse product were added hexane and activated carbon, and the mixture was stirred at room temperature, then, filtrated under reduced pressure. The resultant filtrate was concentrated under reduced pressure, to obtain a compound T3-3 (2.7 g, yellow solid). The compound T3-3 had a HPLC area percentage value of 98.5%.

$^1$H-NMR (CDCl$_3$, 400 MHz): δ (ppm)=8.20-8.11 (m, 2H), 7.74-6.85 (m, 26H), 2.50-2.30 (m, 7H), 1.53-0.82 (m, 22H).

(Synthesis of Compound T3-4)

A nitrogen atmosphere was prepared in a reaction vessel, then, the compound T3-3 (2.6 g), tetrahydrofuran (26 ml), dimethyl sulfoxide (16 ml) and a 33% by mass potassium hydroxide aqueous solution (5.4 g) were added, and stirred for 6.5 hours under reflux. The resultant mixture was cooled down to room temperature, then, extraction was performed using a mixed solution of ion exchanged water and toluene, and further, the resultant organic layer was washed with ion exchanged water. The resultant organic layer was dried over anhydrous sodium sulfate, then, filtrated, and the resultant filtrate was concentrated under reduced pressure, to obtain a coarse product. The resultant coarse product was purified by silica gel column chromatography (a mixed solvent of hexane and toluene), then, dried under reduced pressure at 50° C., to obtain a compound T3-4 (2.1 g, brown oil). The compound T3-4 had a HPLC area percentage value of 97.6'.

(Synthesis of Compound T3)

A nitrogen atmosphere was prepared in a reaction vessel, then, the compound T3-4 (2.1 g), the compound T3-5 (1.3 g), palladium acetate (0.071 g), tri-tert-butylphosphonium tetrafluoroborate (0.096 g) and xylene (84 ml) were added. Thereafter, to this was added sodium tert-butoxide (0.76 g), and the mixture was stirred at 100° C. for 1 hour. The resultant mixture was cooled down to room temperature, then, hexane and silica gel were added and the mixture was stirred at room temperature, then, filtrated through a filter paved with silica gel. The resultant filtrate was concentrated under reduced pressure, to obtain a coarse product. The resultant coarse product was crystallized with a mixed solvent of hexane and ethanol, to obtain a solid. The resultant solid was purified by silica gel column chromatography (a mixed solvent of hexane and toluene), and further, crystallized with a mixed solvent of toluene, ethyl acetate and acetonitrile. The resultant solid was dried under reduced pressure at 50° C., to obtain a compound T3 (1.2 g, yellow solid). The compound T3 had a HPLC area percentage value of 99.5% or more.

LC-MS (APCI, positive): m/z=977.5 [M+H]$^+$ $^1$H-NMR (CDCl$_3$, 400 MHz): δ (ppm)=9.06-8.98 (m, 2H), 8.82-8.80 (m, 4H), 7.90-6.80 (m, 32H), 2.54-2.43 (m, 4H), 1.53-1.49 (m, 4H), 1.25 (m, 12H), 0.85-0.83 (m, 6H).

ΔE$_{ST}$ and oscillator strength of the compound T3 were 0.1088 eV and 0.1848, respectively.

<Compounds T4 to T12> Synthesis or Acquisition of Compounds T4 to T12

Compounds T4, T5, T6, T7 and T10 were purchased from Luminescense Technology.

A compound T8 was synthesized as well as a method described in International Publication WO2008/056746.

A compound T9 was synthesized as well as a method described in International Publication WO2006/114966.

A compound T11 was synthesized as well as a method described in International Publication WO2015/102118.

A compound T12 was synthesized as well as a method described in JP-A No. 2010-254676.

[Chemical Formula 105]

compound T4

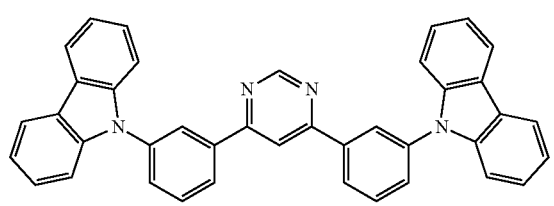

compound T5

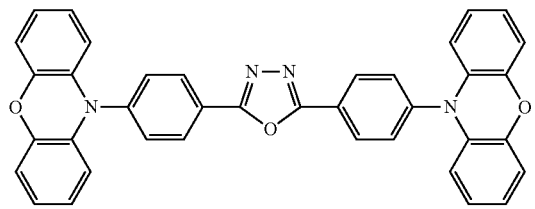

compound T6

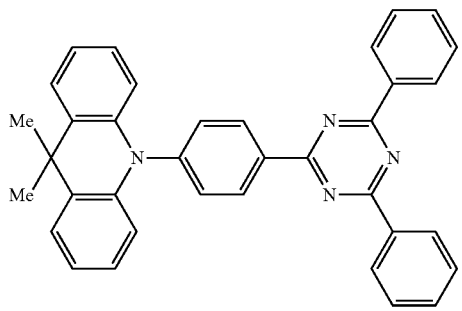

[Chemical Formula 106]

compound T7

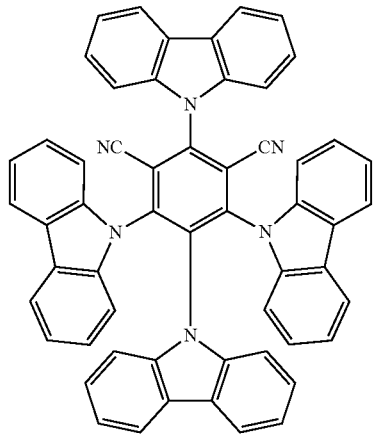

compound T8

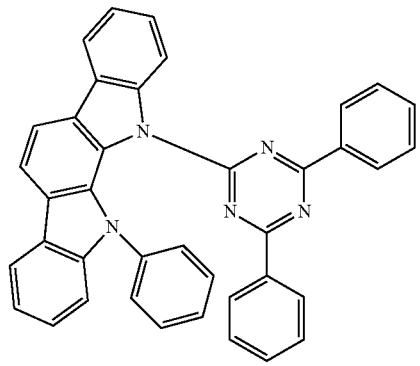

-continued compound T9

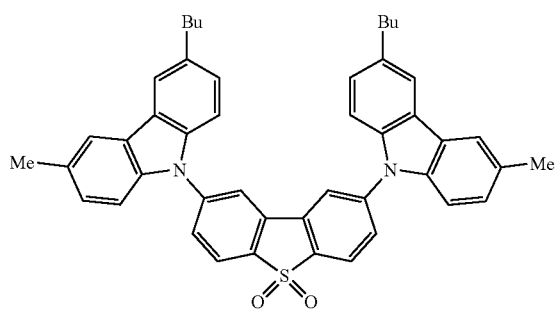

[Chemical Formula 107]

compound T10

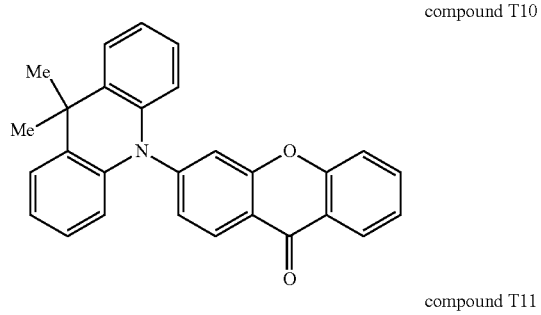

compound T11

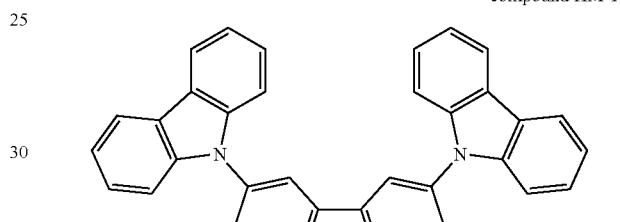

compound T12

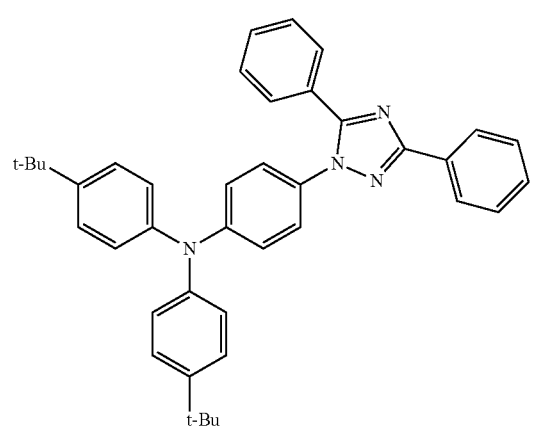

$\Delta E_{ST}$ and oscillator strength of the compound T4 were 0.1563 eV and 0.0069, respectively.

$\Delta E_{ST}$ and oscillator strength of the compound T5 were 0.0265 eV and 0.0323, respectively.

$\Delta E_{ST}$ and oscillator strength of the compound T6 were 0.0065 eV and 0, respectively.

$\Delta E_{ST}$ and oscillator strength of the compound T7 were 0.1185 eV and 0.0574, respectively.

$\Delta E_{ST}$ and oscillator strength of the compound T8 were 0.0659 eV and 0.0007, respectively.

$\Delta E_{ST}$ and oscillator strength of the compound T9 were 0.3215 eV and 0.0448, respectively.

$\Delta E_{ST}$ and oscillator strength of the compound T10 were 0.0102 eV and 0, respectively.

$\Delta E_{ST}$ and oscillator strength of the compound T11 were 0.4464 eV and 0.4672, respectively.

$\Delta E_{ST}$ and oscillator strength of the compound T12 were 0.5762 eV and 0.3640, respectively.

<Compounds HM-1 and E1> Synthesis or Acquisition of Compounds HM-1 and E1

A compound E1 was synthesized according to a method described in International Publication WO2007/058368.

A compound HM-1 was purchased from Luminescense Technology.

[Chemical Formula 108]

[Chemical Formula 108]

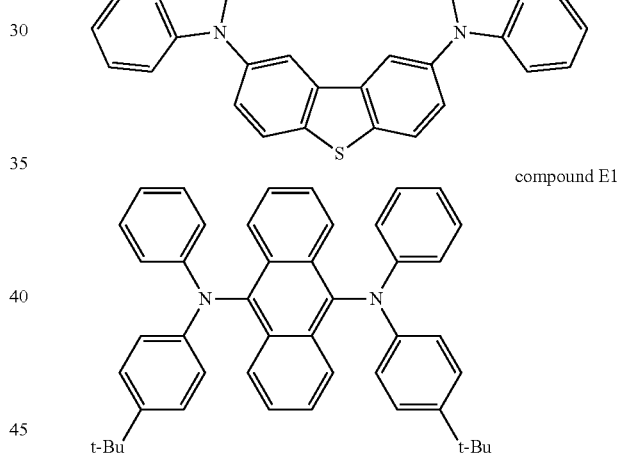

$\Delta E_{ST}$ and oscillator strength of the compound HM-1 were 0.2966 eV and 0.0082, respectively.

$\Delta E_{ST}$ and oscillator strength of the compound E1 were 0.7881 eV and 0.1353, respectively.

<Synthesis Example M> Synthesis of Compounds M1 to M25

A compound M1 and a compound M3 were synthesized according to a method described in JP-A No. 2010-189630.

A compound M2 was synthesized according to a method described in International Publication WO2012/086671.

A compound M4, a compound M5, a compound M20 and a compound M21 were synthesized according to a method described in International Publication WO2013/191088.

A compound M6 and a compound M7 were synthesized according to a method described in International Publication WO2002/045184.

A compound M8 was synthesized according to a method described in International Publication WO2011/049241.

A compound M9 and a compound M10 were synthesized according to a method described in International Publication WO2013/146806.

A compound M11 was synthesized according to a method described in International Publication WO2005/049546.

A compound M12 was synthesized according to a method described in International Publication WO2015/145871.

A compound M13 was synthesized as well as a method described in JP-A No. 2010-215886.

A compound M14 was synthesized according to a method described in JP-A No. 2008-106241.

A compound M15 was synthesized according to a method described in JP-A No. 2010-215886.

A compound M16 and a compound M24 were synthesized as well as a method described in International Publication WO2016/031639.

A compound M17 and a compound M19 were synthesized according to a method described in JP-A No. 2011-174062.

A compound M18, a compound M22 and a compound M23 were synthesized according to a method described in International Publication WO2016/031639.

A compound M25 was synthesized as well as a method described in International Publication WO2002/045184.

[Chemical Formula 109]

compound M1

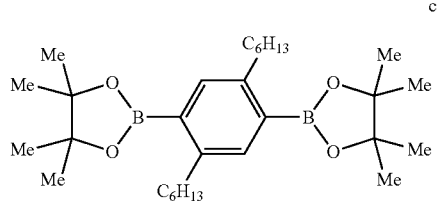

compound M2

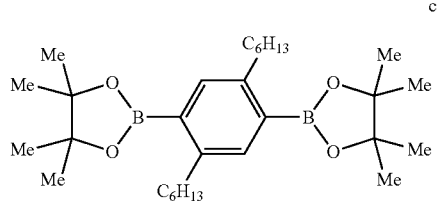

compound M3

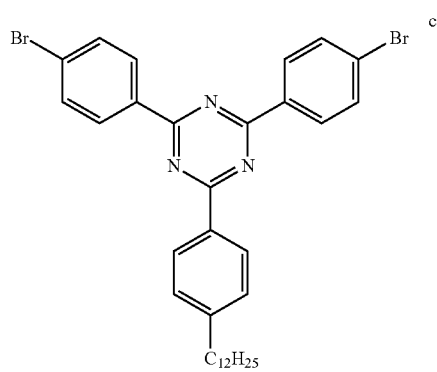

compound M4

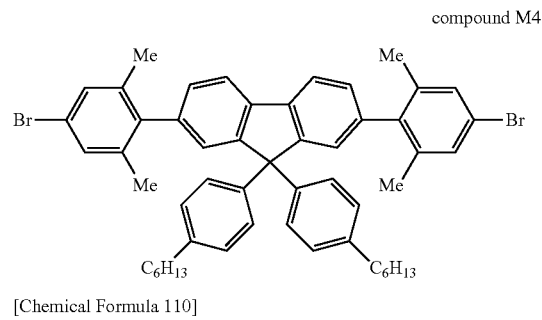

[Chemical Formula 110]

compound M5

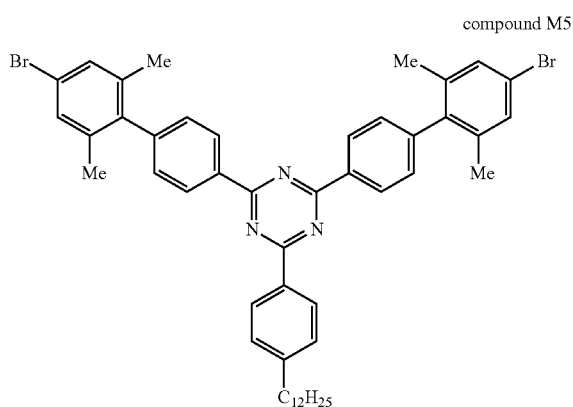

compound M6

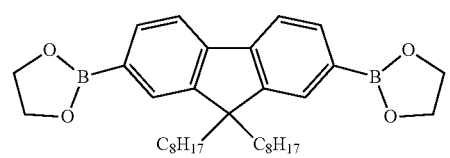

compound M7

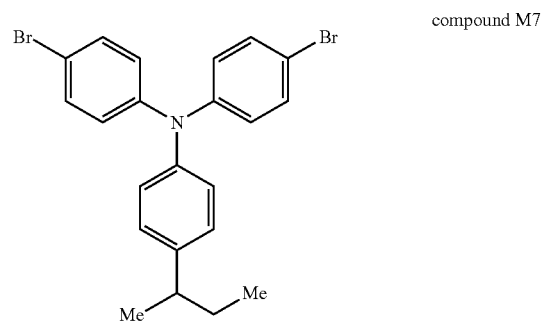

compound M8

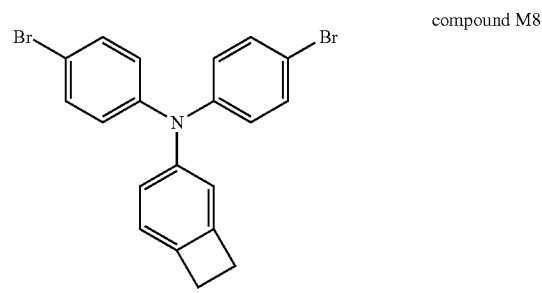

[Chemical Formula 111]
compound M9
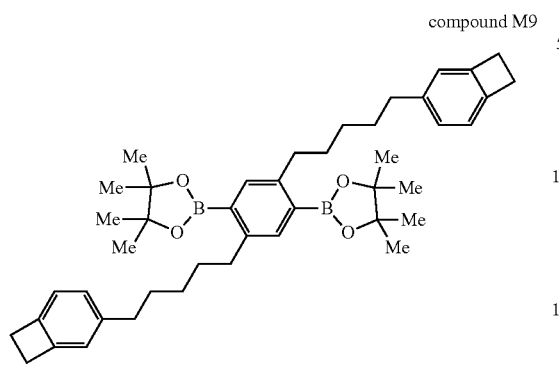
compound M10
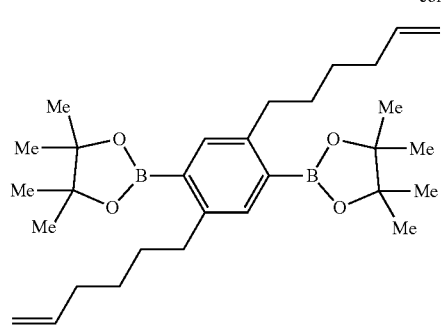
compound M11
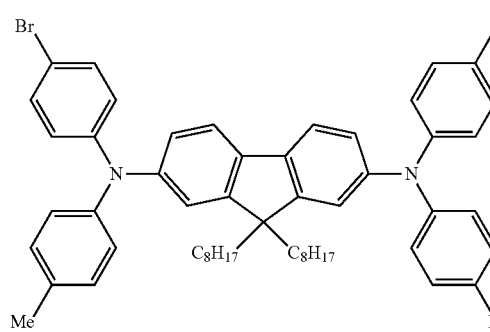
[Chemical Formula 112]
compound M12
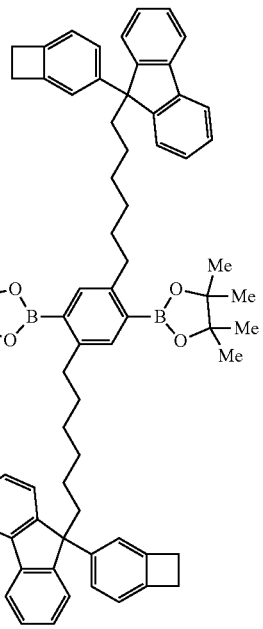
compound M13
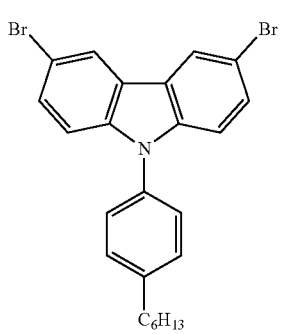
compound M14
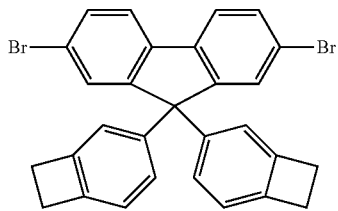
compound M15
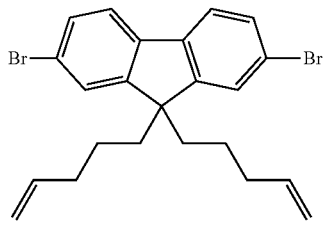

compound M16
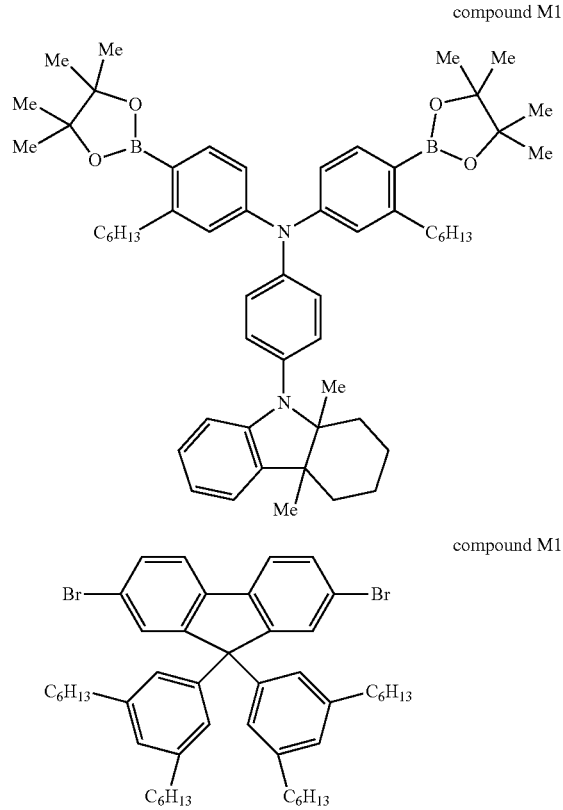
compound M17
[Chemical Formula 113]
compound M18
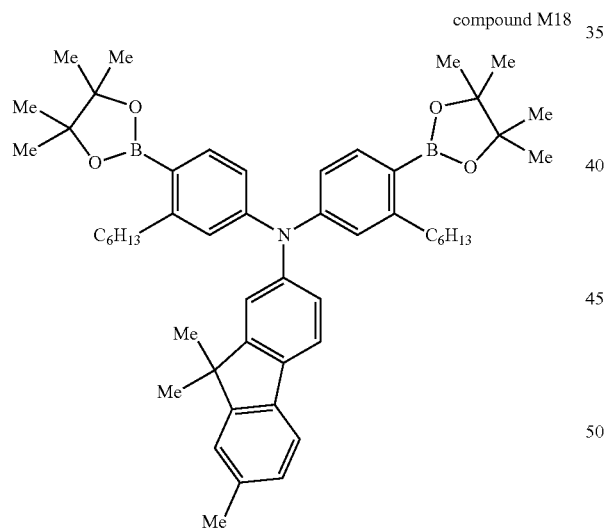
compound M19
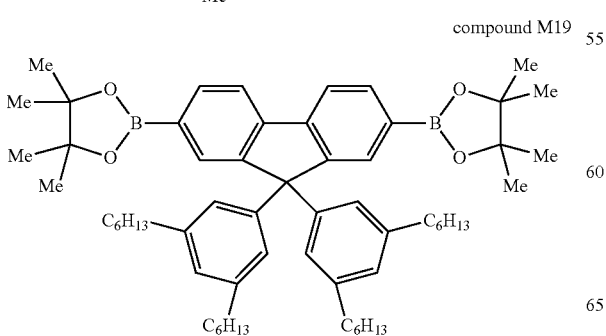
compound M20
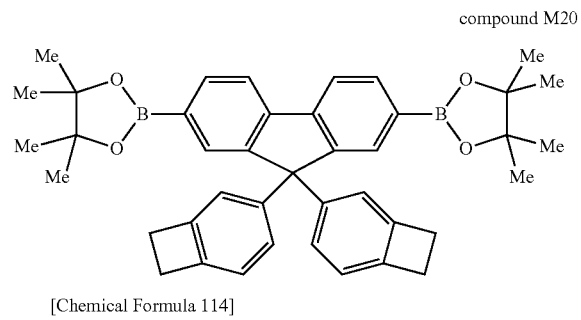
[Chemical Formula 114]
compound M21
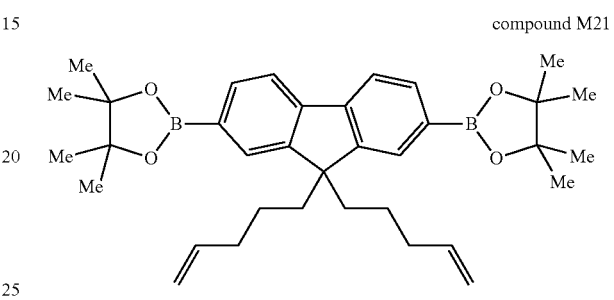
compound M22
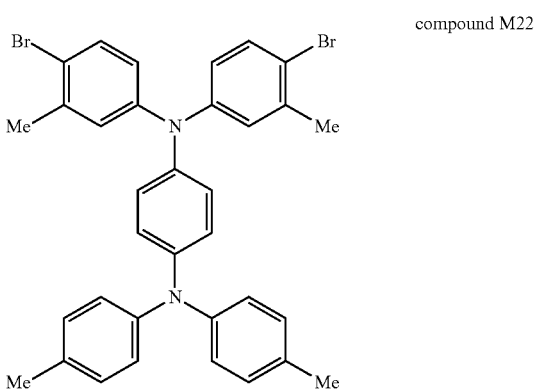
compound M23
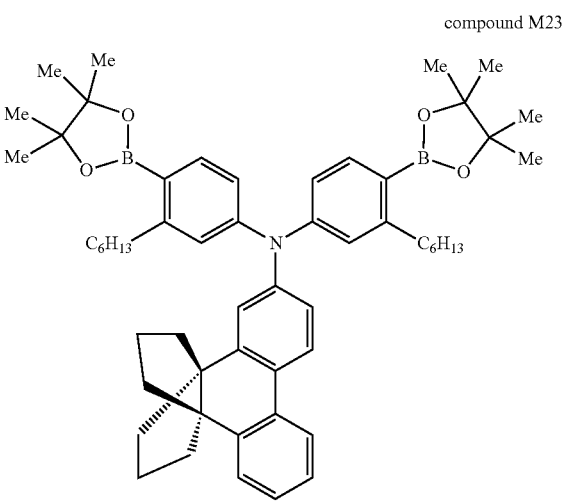

-continued

[Chemical Formula 115]

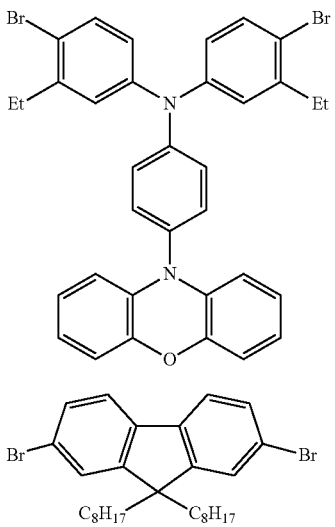

compound M24 compound M25

<Synthesis Example HP1> Synthesis of Polymer Compound HP-1

The polymer compound HP-1 was synthesized according to a method described in JP-A No. 2012-036388 using the compound M1, the compound M2 and the compound M3. The polymer compound HP-1 had an Mn of $9.6 \times 10^4$ and an Mw of $2.2 \times 10^5$.

The polymer compound HP-1 is a copolymer constituted of a constitutional unit derived from the compound M1, a constitutional unit derived from the compound M2, a constitutional unit derived from the compound M3 at a molar ratio of 50:40:10 according to the theoretical values determined from the amounts of the charging raw materials.

<Synthesis Example HP2> Synthesis of Polymer Compound HP-2

The polymer compound HP-2 was synthesized according to a method described in International Publication WO2015/008851 using the compound M1, the compound M4 and the compound M5. The polymer compound HP-2 had an Mn of $8.5 \times 10^4$ and an Mw of $2.2 \times 10^5$.

The polymer compound HP-2 is a copolymer constituted of a constitutional unit derived from the compound M1, a constitutional unit derived from the compound M4, a constitutional unit derived from the compound M5 at a molar ratio of 50:26:24 according to the theoretical values determined from the amounts of the charging raw materials.

<Synthesis Example HTL1> Synthesis of Polymer Compound HTL-1

The polymer compound HTL-1 was synthesized according to a method described in JP-A No. 2012-36381 using the compound M6 and the compound M7. The polystyrene-equivalent number-average molecular weight and the polystyrene-equivalent weight-average molecular weight of the polymer compound HTL-1 were Mn=$8.1 \times 10^4$ and Mw=$3.4 \times 10^5$.

The polymer compound HTL-1 is a copolymer constituted of a constitutional unit derived from the compound M6, a constitutional unit derived from the compound M7 at a molar ratio of 50:50 according to the theoretical values determined from the amounts of the charging raw materials.

The polymer compound HTL-1 had an energy level at the lowest triplet excited state of 2.16 eV.

<Synthesis Example HTL2> Synthesis of Polymer Compound HTL-2

The polymer compound HTL-2 was synthesized as well as a method described in JP-A No. 2012-144722 using the compound M19, the compound M11, the compound M25 and the compound M15. The polymer compound HTL-2 had an Mn of $5.0 \times 10^4$ and an Mw of $2.5 \times 10^5$.

The polymer compound HTL-2 is a copolymer constituted of a constitutional unit derived from the compound M19, a constitutional unit derived from the compound M11, a constitutional unit derived from the compound M25, a constitutional unit derived from the compound M15 at a molar ratio of 50:30:12.5:7.5 according to the theoretical values determined from the amounts of the charging raw materials.

The polymer compound HTL-2 had an energy level at the lowest triplet excited state of 2.16 eV.

<Synthesis Example HTL3> Synthesis of Polymer Compound HTL-3

The polymer compound HTL-3 was synthesized according to a method described in International Publication WO2015/194448 using the compound M1 and the compound M11. The polystyrene-equivalent number-average molecular weight and the polystyrene-equivalent weight-average molecular weight of the polymer compound HTL-3 were Mn=$4.5 \times 10^4$ and Mw=$1.5 \times 10^5$.

The polymer compound HTL-3 is a copolymer constituted of a constitutional unit derived from the compound M1, a constitutional unit derived from the compound M11 at a molar ratio of 50:50 according to the theoretical values determined from the amounts of the charging raw materials.

The polymer compound HTL-3 had an energy level at the lowest triplet excited state of 2.33 eV.

<Synthesis Example HTL4> Synthesis of Polymer Compound HTL-4

The polymer compound HTL-4 was synthesized according to a method described in International Publication WO2013/146806 using the compound M1, the compound M11 and the compound M8. The polymer compound HTL-4 had an Mn of $1.9 \times 10^4$ and an Mw of $9.9 \times 10^4$.

The polymer compound HTL-4 is a copolymer constituted of a constitutional unit derived from the compound M1, a constitutional unit derived from the compound M11, a constitutional unit derived from the compound M8 at a molar ratio of 50:42.5:7.5 according to the theoretical values determined from the amounts of the charging raw materials.

The polymer compound HTL-4 had an energy level at the lowest triplet excited state of 2.33 eV.

<Synthesis Example HTL5> Synthesis of Polymer Compound HTL-5

(Step 1) An inert gas atmosphere was prepared in a reaction vessel, then, the compound M9 (1.07 g), the compound M10 (0.198 g), the compound M7 (0.919 g), dichlorobis[tris(2-methoxyphenyl)phosphine]palladium (1.8 mg) and toluene (50 ml) were added, and heated at 100° C.

(Step 2) Into the resultant reaction solution, a 20% by mass tetraethylammonium hydroxide aqueous solution (8.7 ml) was dropped, and the mixture was refluxed for 6 hours.

(Step 3) Thereafter, to this were added 2-ethylphenylboronic acid (60.0 mg), a 20% by mass tetraethylammonium hydroxide aqueous solution (8.7 ml) and dichlorobis[tris(2-methoxyphenyl)phosphine]palladium (1.8 mg), and the mixture was refluxed for 16 hours.

(Step 4) Thereafter, to this was added a sodium diethyldithiacarbamate aqueous solution, and the mixture was stirred at 80° C. for 2 hours. The resultant reaction solution was cooled, then, washed with 3.6% by mass hydrochloric acid twice, with a 2.5% by mass ammonia aqueous solution twice and with water 6 times, and the resultant solution was dropped into methanol, to cause precipitation. The resultant precipitate was dissolved in toluene, and purified by passing through an alumina column and a silica gel column in this order. The resultant solution was dropped into methanol, and stirred, to cause precipitation. The resultant precipitate was collected by filtration, and dried, to obtain 1.14 g of a polymer compound HTL-5. The polymer compound HTL-5 had an Mn of $3.6 \times 10^4$ and an Mw of $2.0 \times 10^5$.

The polymer compound HTL-5 is a copolymer constituted of a constitutional unit derived from the compound M9, a constitutional unit derived from the compound M10, a constitutional unit derived from the compound M7 at a molar ratio of 40:10:50 according to the theoretical values determined from the amounts of the charging raw materials.

The polymer compound HTL-5 had an energy level at the lowest triplet excited state of 2.46 eV.

<Synthesis Example HTL6> Synthesis of Polymer Compound HTL-6

The polymer compound HTL-6 was synthesized as well as a method described in International Publication WO2015/145871 using the compound M12, the compound M10 and the compound M24. The polymer compound HTL-6 had an Mn of $2.8 \times 10^4$ and an Mw of $1.1 \times 10^5$.

The polymer compound HTL-6 is a copolymer constituted of a constitutional unit derived from the compound M12, a constitutional unit derived from the compound M10, a constitutional unit derived from the compound M24 at a molar ratio of 40:10:50 according to the theoretical values determined from the amounts of the charging raw materials.

The polymer compound HTL-6 had an energy level at the lowest triplet excited state of 2.69 eV.

<Synthesis Example HTL7> Synthesis of Polymer Compound HTL-7

The polymer compound HTL-7 was synthesized as well as a method described in International Publication WO02016/031639 using the compound M1, the compound M13, the compound M14 and the compound M15. The polymer compound HTL-7 had an Mn of $2.4 \times 10^4$ and an Mw of $1.7 \times 10^5$.

The polymer compound HTL-7 is a copolymer constituted of a constitutional unit derived from the compound M1, a constitutional unit derived from the compound M13, a constitutional unit derived from the compound M14, a constitutional unit derived from the compound M15 at a molar ratio of 50:40:5:5 according to the theoretical values determined from the amounts of the charging raw materials.

The polymer compound HTL-7 had an energy level at the lowest triplet excited state of 2.49 eV.

<Synthesis Example HTL8> Synthesis of Polymer Compound HTL-8

(Step 1) An inert gas atmosphere was prepared in a reaction vessel, then, the compound M1 (0.995 g), the compound M7 (0.736 g), the compound M14 (0.106 g), the compound M15 (0.0924 g), dichlorobis[tris(2-methoxyphenyl)phosphine]palladium (1.8 mg) and toluene (50 ml) were added, and heated at 105° C.

(Step 2) Into the resultant reaction solution, a 20% by mass tetraethylammonium hydroxide aqueous solution (6.6 ml) was dropped, and the mixture was refluxed for 5.5 hours.

(Step 3) Thereafter, to this were added phenylboronic acid (24.4 mg), a 20% by mass tetraethylammonium hydroxide aqueous solution (6.6 ml) and dichlorobis[tris(2-methoxyphenyl)phosphine]palladium (1.8 mg), and the mixture was refluxed for 14 hours.

(Step 4) Thereafter, to this was added a sodium diethyldithiacarbamate aqueous solution, and the mixture was stirred at 80° C. for 2 hours. The resultant reaction solution was cooled, then, washed with water twice, with a 3% by mass acetic acid aqueous solution twice and with water twice, and the resultant solution was dropped into methanol, to cause precipitation. The resultant precipitate was dissolved in toluene, and purified by passing through an alumina column and a silica gel column in this order. The resultant solution was dropped into methanol, and stirred, to cause precipitation. The resultant precipitate was collected by filtration, and dried, to obtain 0.91 g of a polymer compound HTL-8. The polymer compound HTL-8 had an Mn of $5.2 \times 10^4$ and an Mw of $2.5 \times 10^5$.

The polymer compound HTL-8 is a copolymer constituted of a constitutional unit derived from the compound M1, a constitutional unit derived from the compound M7, a constitutional unit derived from the compound M14, a constitutional unit derived from the compound M15 at a molar ratio of 50:40:5:5 according to the theoretical values determined from the amounts of the charging raw materials.

The polymer compound HTL-8 had an energy level at the lowest triplet excited state of 2.45 eV.

<Synthesis Example HTL9> Synthesis of Polymer Compound HTL-9

The polymer compound HTL-9 was synthesized as well as a method described in International Publication WO2016/125560 using the compound M16, the compound M17, the compound M14 and the compound M15. The polymer compound HTL-9 had an Mn of $3.5 \times 10^4$ and an Mw of $1.6 \times 10^5$.

The polymer compound HTL-9 is a copolymer constituted of a constitutional unit derived from the compound M16, a constitutional unit derived from the compound M17, a constitutional unit derived from the compound M14, a constitutional unit derived from the compound M15 at a molar ratio of 50:40:5:5 according to the theoretical values determined from the amounts of the charging raw materials.

The polymer compound HTL-9 had an energy level at the lowest triplet excited state of 2.39 eV.

<Synthesis Example HTL10> Synthesis of Polymer Compound HTL-10

The polymer compound HTL-10 was synthesized according to a method described in International Publication WO2016/031639 using the compound M18, the compound M17, the compound M14 and the compound M15. The polymer compound HTL-10 had an Mn of $5.3 \times 10^4$ and an Mw of $2.0 \times 10^5$.

The polymer compound HTL-10 is a copolymer constituted of a constitutional unit derived from the compound M18, a constitutional unit derived from the compound M17, a constitutional unit derived from the compound M14, a constitutional unit derived from the compound M15 at a molar ratio of 50:40:5:5 according to the theoretical values determined from the amounts of the charging raw materials.

The polymer compound HTL-10 had an energy level at the lowest triplet excited state of 2.37 eV.

<Synthesis Example HTL11> Synthesis of Polymer Compound HTL-11

The polymer compound HTL-11 was synthesized according to a method described in International Publication WO2016/031639 using the compound M19, the compound M20, the compound M21 and the compound M22. The polymer compound HTL-11 had an Mn of $5.1 \times 10^4$ and an Mw of $2.0 \times 10^5$.

The polymer compound HTL-11 is a copolymer constituted of a constitutional unit derived from the compound M19, a constitutional unit derived from the compound M20, a constitutional unit derived from the compound M21, a constitutional unit derived from the compound M22 at a molar ratio of 40:5:5:50 according to the theoretical values determined from the amounts of the charging raw materials.

The polymer compound HTL-11 had an energy level at the lowest triplet excited state of 2.33 eV.

<Synthesis Example HTL12> Synthesis of Polymer Compound HTL-12

The polymer compound HTL-12 was synthesized according to a method described in International Publication WO2016/125560 using the compound M23, the compound M17, the compound M14 and the compound M15. The polymer compound HTL-12 had an Mn of $5.2 \times 10^4$ and an Mw of $2.2 \times 10^5$.

The polymer compound HTL-12 is a copolymer constituted of a constitutional unit derived from the compound M23, a constitutional unit derived from the compound M17, a constitutional unit derived from the compound M14, a constitutional unit derived from the compound M15 at a molar ratio of 50:40:5:5 according to the theoretical values determined from the amounts of the charging raw materials.

The polymer compound HTL-12 had an energy level at the lowest triplet excited state of 2.33 eV.

<Synthesis Example HTL13> Synthesis of Polymer Compound HTL-13

The polymer compound HTL-13 was synthesized according to a method described in International Publication WO2015/145871 using the compound M12, the compound M10 and the compound M11. The polymer compound HTL-13 had an Mn of $2.3 \times 10^4$ and an Mw of $1.2 \times 10^5$.

The polymer compound HTL-13 is a copolymer constituted of a constitutional unit derived from the compound M12, a constitutional unit derived from the compound M10, a constitutional unit derived from the compound M11 at a molar ratio of 45:5:50 according to the theoretical values determined from the amounts of the charging raw materials.

The polymer compound HTL-13 had an energy level at the lowest triplet excited state of 2.33 eV.

<Example D1> Fabrication and Evaluation of Light Emitting Device D1

(Formation of Anode and Hole Injection Layer)

An ITO film was deposited with a thickness of 45 nm on a glass substrate by a sputtering method to form an anode. On the anode, ND-3202 (manufactured by Nissan Chemical Industries, Ltd.) as a hole injection material was spin-coated to form a film with a thickness of 50 nm. Under an air atmosphere, the film was heated at 50° C. for 3 minutes, and further, heated at 230° C. for 15 minutes, to form a hole injection layer.

(Formation of Second Organic Layer)

The polymer compound HTL-5 was dissolved at a concentration of 0.6% by mass in xylene. The resultant xylene solution was spin-coated on the hole injection layer, to form a film with a thickness of 20 nm, and the film was heated on a hot plate at 200° C. for 30 minutes under a nitrogen gas atmosphere, to form a second organic layer. By this heating, the polymer compound HTL-5 became a crosslinked body.

(Formation of First Organic Layer)

The polymer compound HP-1 and the compound T3 (polymer compound HP-1/compound T3=85% by mass/15% by mass) were dissolved at a concentration of 1.8% by mass in xylene. The resultant xylene solution was spin-coated on the second organic layer to form a film with a thickness of 70 nm, and the film was heated at 130° C. for 10 minutes under a nitrogen gas atmosphere, to form a first organic layer.

(Formation of Cathode)

The substrate carrying the first organic layer formed was placed in a vapor deposition machine, and the pressure in the machine was reduced to $1.0 \times 10^{-4}$ Pa or less, then, sodium fluoride was vapor-deposited with a thickness of about 4 nm on the first organic layer, then, aluminum was vapor-deposited with a thickness of about 80 nm on the sodium fluoride layer, as a cathode. After vapor deposition, sealing with a glass substrate was performed, to fabricate a light emitting device D1.

(Evaluation of Light Emitting Device)

By applying voltage to the light emitting device D1, EL emission was observed. At 2 mA/cm², the external quantum efficiency was 12.0[%] and CIE chromaticity coordinate (x,y)=(0.29,0.57).

<Example D2> Fabrication and Evaluation of Light Emitting Device D2

A light emitting device D2 was fabricated in the same manner as in Example D1 except that "the polymer compound HP-2" was used instead of "the polymer compound HP-1" in (Formation of first organic layer) in Example D1. By applying voltage to the light emitting device D2, EL emission was observed. At 2 mA/cm², the external quantum efficiency was 14.2[%] and CIE chromaticity coordinate (x,y)=(0.27,0.56).

<Example D3> Fabrication and Evaluation of Light Emitting Device D3

A light emitting device D3 was fabricated in the same manner as in Example D1 except that "the compound HM1 and the compound T3 (compound HM1/compound T3=85% by mass/15% by mass) were dissolved at a concentration of 2% by mass in toluene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1. By applying voltage to the light emitting device D3, EL emission was observed. At 2 mA/cm$^2$, the external quantum efficiency was 11.3[%] and CIE chromaticity coordinate (x,y)=(0.31,0.57).

<Example D4> Fabrication and Evaluation of Light Emitting Device D4

A light emitting device D4 was fabricated in the same manner as in Example D1 except that "the compound HM1 and the compound T3 (compound HM1/compound T3=85% by mass/15% by mass) were dissolved at a concentration of 2% by mass in toluene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1 and "the polymer compound HTL-4" was used instead of "the polymer compound HTL-5" in (Formation of second organic layer) in Example D1. By applying voltage to the light emitting device D4, EL emission was observed. At 2 mA/cm$^2$, the external quantum efficiency was 7.4[%] and CIE chromaticity coordinate (x,y)=(0.31,0.58).

<Comparative Example CD1> Fabrication and Evaluation of Light Emitting Device CD1

A light emitting device CD1 was fabricated in the same manner as in Example D1 except that "the compound HM1 and the compound T3 (compound HM1/compound T3=85% by mass/15% by mass) were dissolved at a concentration of 2% by mass in toluene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1 and "the polymer compound HTL-3" was used instead of "the polymer compound HTL-5" in (Formation of second organic layer) in Example D1. By applying voltage to the light emitting device CD1, EL emission was observed. At 2 mA/cm$^2$, the external quantum efficiency was 4.6[%] and CIE chromaticity coordinate (x,y)=(0.31,0.58).

<Comparative Example CD2> Fabrication and Evaluation of Light Emitting Device CD2

A light emitting device CD2 was fabricated in the same manner as in Example D1 except that "the compound HM1 and the compound T3 (compound HM1/compound T3=85% by mass/15% by mass) were dissolved at a concentration of 2% by mass in toluene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1 and "the polymer compound HTL-1" was used instead of "the polymer compound HTL-5" in (Formation of second organic layer) in Example D1. By applying voltage to the light emitting device CD2, EL emission was observed. At 2 mA/cm$^2$, the external quantum efficiency was 2.3[%] and CIE chromaticity coordinate (x,y)=(0.31,0.57).

TABLE 3

| light emitting device | second organic layer | | first organic layer | | external quantum efficiency [%] |
|---|---|---|---|---|---|
| | material | lowest triplet excited state | composition | composition ratio (% by mass) | |
| Example D1 | D1 | crosslinked body of HTL-5 | 2.46 eV | HP-1/T3 | 85/15 | 12.0 |
| Example D2 | D2 | crosslinked body of HTL-5 | 2.46 eV | HP-2/T3 | 85/15 | 14.2 |
| Example D3 | D3 | crosslinked body of HTL-5 | 2.46 eV | HM-1/T3 | 85/15 | 11.3 |
| Example D4 | D4 | crosslinked body of HTL-4 | 2.33 eV | HM-1/T3 | 85/15 | 7.4 |
| Comparative Example CD1 | CD1 | HTL-3 | 2.33 eV | HM-1/T3 | 85/15 | 4.6 |
| Comparative Example CD2 | CD2 | HTL-1 | 2.16 eV | HM-1/T3 | 85/15 | 2.3 |

<Example D5> Fabrication and Evaluation of Light Emitting Device D5

A light emitting device D5 was fabricated in the same manner as in Example D1 except that "the compound HM1 and the compound T3 (compound HM1/compound T3=85% by mass/15% by mass) were dissolved at a concentration of 2% by mass in toluene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1 and "the polymer compound HTL-6" was used instead of "the polymer compound HTL-5" in (Formation of second organic layer) in Example D1.

By applying voltage to the light emitting device D5, EL emission was observed. At 0.5 mA/cm², the external quantum efficiency was 7.2[%] and CIE chromaticity coordinate (x,y)=(0.32,0.57).

<Example D6> Fabrication and Evaluation of Light Emitting Device D6

A light emitting device D6 was fabricated in the same manner as in Example D5 except that "the polymer compound HTL-7" was used instead of "the polymer compound HTL-6" in (Formation of second organic layer) of Example D5.

By applying voltage to the light emitting device D6, EL emission was observed. At 0.5 mA/cm², the external quantum efficiency was 11.1[%] and CIE chromaticity coordinate (x,y)=(0.30,0.56).

<Example D7> Fabrication and Evaluation of Light Emitting Device D7

A light emitting device D7 was fabricated in the same manner as in Example D5 except that "the polymer compound HTL-5" was used instead of "the polymer compound HTL-6" in (Formation of second organic layer) of Example D5.

By applying voltage to the light emitting device D7, EL emission was observed. At 0.5 mA/cm², the external quantum efficiency was 12.4[%] and CIE chromaticity coordinate (x,y)=(0.32,0.57).

<Example D8> Fabrication and Evaluation of Light Emitting Device D8

A light emitting device D8 was fabricated in the same manner as in Example D5 except that "the polymer compound HTL-8" was used instead of "the polymer compound HTL-6" in (Formation of second organic layer) of Example D5.

By applying voltage to the light emitting device D8, EL emission was observed. At 0.5 mA/cm², the external quantum efficiency was 10.6[%] and CIE chromaticity coordinate (x,y)=(0.31,0.57).

<Example D9> Fabrication and Evaluation of Light Emitting Device D9

A light emitting device D9 was fabricated in the same manner as in Example D5 except that "the polymer compound HTL-9" was used instead of "the polymer compound HTL-6" in (Formation of second organic layer) of Example D5.

By applying voltage to the light emitting device D9, EL emission was observed. At 0.5 mA/cm², the external quantum efficiency was 8.6[%] and CIE chromaticity coordinate (x,y)=(0.32,0.57).

<Example D10> Fabrication and Evaluation of Light Emitting Device D10

A light emitting device D10 was fabricated in the same manner as in Example D5 except that "the polymer compound HTL-10" was used instead of "the polymer compound HTL-6" in (Formation of second organic layer) of Example D5.

By applying voltage to the light emitting device D10, EL emission was observed. At 0.5 mA/cm², the external quantum efficiency was 8.7[%] and CIE chromaticity coordinate (x,y)=(0.31,0.57).

<Example D11> Fabrication and Evaluation of Light Emitting Device D11

A light emitting device D11 was fabricated in the same manner as in Example D5 except that "the polymer compound HTL-4" was used instead of "the polymer compound HTL-6" in (Formation of second organic layer) of Example D5.

By applying voltage to the light emitting device D11, EL emission was observed. At 0.5 mA/cm², the external quantum efficiency was 8.0[%] and CIE chromaticity coordinate (x,y)=(0.32,0.58).

<Example D12> Fabrication and Evaluation of Light Emitting Device D12

A light emitting device D12 was fabricated in the same manner as in Example D5 except that "the polymer compound HTL-11" was used instead of "the polymer compound HTL-6" in (Formation of second organic layer) of Example D5.

By applying voltage to the light emitting device D12, EL emission was observed. At 0.5 mA/cm², the external quantum efficiency was 7.3[%] and CIE chromaticity coordinate (x,y)=(0.32,0.57).

<Example D13> Fabrication and Evaluation of Light Emitting Device D13

A light emitting device D13 was fabricated in the same manner as in Example D5 except that "the polymer compound HTL-12" was used instead of "the polymer compound HTL-6" in (Formation of second organic layer) of Example D5.

By applying voltage to the light emitting device D13, EL emission was observed. At 0.5 mA/cm², the external quantum efficiency was 7.9[%] and CIE chromaticity coordinate (x,y)=(0.31,0.58).

<Comparative Example CD3> Fabrication and Evaluation of Light Emitting Device CD3

A light emitting device CD3 was fabricated in the same manner as in Example D5 except that "the polymer compound HTL-3" was used instead of "the polymer compound HTL-6" in (Formation of second organic layer) of Example D5.

By applying voltage to the light emitting device CD3, EL emission was observed. At 0.5 mA/cm², the external quantum efficiency was 4.7[%] and CIE chromaticity coordinate (x,y)=(0.32,0.58).

<Comparative Example CD4> Fabrication and Evaluation of Light Emitting Device CD4

A light emitting device CD4 was fabricated in the same manner as in Example D5 except that "the polymer compound HTL-2" was used instead of "the polymer compound HTL-6" in (Formation of second organic layer) of Example D5.

By applying voltage to the light emitting device CD4, EL emission was observed. At 0.5 mA/cm$^2$, the external quantum efficiency was 4.2[%] and CIE chromaticity coordinate (x,y)=(0.31,0.57).

<Comparative Example CD5> Fabrication and Evaluation of Light Emitting Device CD5

A light emitting device CD5 was fabricated in the same manner as in Example D5 except that "the polymer compound HTL-1" was used instead of "the polymer compound HTL-6" in (Formation of second organic layer) of Example D5.

By applying voltage to the light emitting device CD5, EL emission was observed. At 0.5 mA/cm$^2$, the external quantum efficiency was 2.3[%] and CIE chromaticity coordinate (x,y)=(0.31,0.58).

compound HTL-13" was used instead of "the polymer compound HTL-5" in (Formation of second organic layer) in Example D1.

By applying voltage to the light emitting device D14, EL emission was observed. At 0.15 mA/cm$^2$, the external quantum efficiency was 3.9[%] and CIE chromaticity coordinate (x,y)=(0.29,0.63).

<Example D15> Fabrication and Evaluation of Light Emitting Device D15

A light emitting device D15 was fabricated in the same manner as in Example D1 except that "the compound HM1, the compound T1 and the compound E1 (compound HM1/compound T1/compound E1=75% by mass/15% by mass/10% by mass) were dissolved at a concentration of 2.6% by mass in chlorobenzene." instead of "the polymer compound

TABLE 4

| | light emitting device | second organic layer | | first organic layer | | external quantum efficiency [%] |
|---|---|---|---|---|---|---|
| | | material | lowest triplet excited state | composition | composition ratio (% by mass) | |
| Example D5 | D5 | crosslinked body of HTL-6 | 2.69 eV | HM-1/T3 | 85/15 | 7.2 |
| Example D6 | D6 | crosslinked body of HTL-7 | 2.49 eV | HM-1/T3 | 85/15 | 11.1 |
| Example D7 | D7 | crosslinked body of HTL-5 | 2.46 eV | HM-1/T3 | 85/15 | 12.4 |
| Example D8 | D8 | crosslinked body of HTL-8 | 2.45 eV | HM-1/T3 | 85/15 | 10.6 |
| Example D9 | D9 | crosslinked body of HTL-9 | 2.39 eV | HM-1/T3 | 85/15 | 8.6 |
| Example D10 | D10 | crosslinked body of HTL-10 | 2.37 eV | HM-1/T3 | 85/15 | 8.7 |
| Example D11 | D11 | crosslinked body of HTL-4 | 2.33 eV | HM-1/T3 | 85/15 | 8.0 |
| Example D12 | D12 | crosslinked body of HTL-11 | 2.33 eV | HM-1/T3 | 85/15 | 7.3 |
| Example D13 | D13 | crosslinked body of HTL-12 | 2.33 eV | HM-1/T3 | 85/15 | 7.9 |
| Comparative Example CD3 | CD3 | HTL-3 | 2.33 eV | HM-1/T3 | 85/15 | 4.7 |
| Comparative Example CD4 | CD4 | crosslinked body of HTL-2 | 2.16 eV | HM-1/T3 | 85/15 | 4.2 |
| Comparative Example CD5 | CD5 | HTL-1 | 2.16 eV | HM-1/T3 | 85/15 | 2.3 |

<Example D14> Fabrication and Evaluation of Light Emitting Device D14

A light emitting device D14 was fabricated in the same manner as in Example D1 except that "the compound HM1, the compound T1 and the compound E1 (compound HM1/compound T1/compound E1=75% by mass/15% by mass/10% by mass) were dissolved at a concentration of 2.6% by mass in chlorobenzene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1 and "the polymer HP-1 and the compound T3 (polymer compound HP-1/compound T3=85% by mass/15% by mass) were dissolved at a concentration of 1.8% by mass in xylene." in (Formation of first organic layer) in Example D1 and "the polymer compound HTL-4" was used instead of "the polymer compound HTL-5" in (Formation of second organic layer) in Example D1.

By applying voltage to the light emitting device D15, EL emission was observed. At 0.15 mA/cm$^2$, the external quantum efficiency was 3.8[%] and CIE chromaticity coordinate (x,y)=(0.29,0.63).

<Example D16> Fabrication and Evaluation of Light Emitting Device D16

A light emitting device D16 was fabricated in the same manner as in Example D14 except that "the compound HM1, the compound T2 and the compound E1 (compound HM1/compound T2/compound E1=75% by mass/15% by mass/10% by mass)" were used instead of "the compound HM1, the compound T1 and the compound E1 (compound HM1/compound T1/compound E1=75% by mass/15% by mass/10% by mass)" in (Formation of first organic layer) in Example D14.

By applying voltage to the light emitting device D16, EL emission was observed. At 0.15 mA/cm$^2$, the external quantum efficiency was 5.2[%] and CIE chromaticity coordinate (x,y)=(0.29,0.63)

<Example D17> Fabrication and Evaluation of Light Emitting Device D17

A light emitting device D17 was fabricated in the same manner as in Example D15 except that "the compound HM1, the compound T2 and the compound E1 (compound HM1/compound T2/compound E1=75% by mass/15% by mass/10% by mass)" were used instead of "the compound HM1, the compound T1 and the compound E1 (compound HM1/compound T1/compound E1=75% by mass/15% by mass/10% by mass)" in (Formation of first organic layer) in Example D15.

By applying voltage to the light emitting device D17, EL emission was observed. At 0.15 mA/cm$^2$, the external quantum efficiency was 4.6[%] and CIE chromaticity coordinate (x,y)=(0.29,0.63).

<Example D18> Fabrication and Evaluation of Light Emitting Device D18

A light emitting device D18 was fabricated in the same manner as in Example D14 except that "the compound HM1, the compound T4 and the compound E1 (compound HM1/compound T4/compound E1=75% by mass/15% by mass/10% by mass)" were used instead of "the compound HM1, the compound T1 and the compound E1 (compound HM1/compound T1/compound E1=75% by mass/15% by mass/10% by mass)" in (Formation of first organic layer) in Example D14.

By applying voltage to the light emitting device D18, EL emission was observed. At 0.15 mA/cm$^2$, the external quantum efficiency was 4.6[%] and CIE chromaticity coordinate (x,y)=(0.29,0.64)

<Example D19> Fabrication and Evaluation of Light Emitting Device D19

A light emitting device D19 was fabricated in the same manner as in Example D15 except that "the compound HM1, the compound T4 and the compound E1 (compound HM1/compound T4/compound E1=75% by mass/15% by mass/10% by mass)" were used instead of "the compound HM1, the compound T1 and the compound E1 (compound HM1/compound T1/compound E1=75% by mass/15% by mass/10% by mass)" in (Formation of first organic layer) in Example D15.

By applying voltage to the light emitting device D19, EL emission was observed. At 0.15 mA/cm$^2$, the external quantum efficiency was 3.7[%] and CIE chromaticity coordinate (x,y)=(0.29,0.63).

<Example D20> Fabrication and Evaluation of Light Emitting Device D20

A light emitting device D20 was fabricated in the same manner as in Example D14 except that "the compound HM1, the compound T3 and the compound E1 (compound HM1/compound T3/compound E1=75% by mass/15% by mass/10% by mass)" were used instead of "the compound HM1, the compound T1 and the compound E1 (compound HM1/compound T1/compound E1=75% by mass/15% by mass/10% by mass)" in (Formation of first organic layer) in Example D14.

By applying voltage to the light emitting device D20, EL emission was observed. At 0.15 mA/cm$^2$, the external quantum efficiency was 6.0[%] and CIE chromaticity coordinate (x,y)=(0.31,0.62)

<Example D21> Fabrication and Evaluation of Light Emitting Device D21

A light emitting device D21 was fabricated in the same manner as in Example D15 except that "the compound HM1, the compound T3 and the compound E1 (compound HM1/compound T3/compound E1=75% by mass/15% by mass/10% by mass)" were used instead of "the compound HM1, the compound T1 and the compound E1 (compound HM1/compound T1/compound E1=75% by mass/15% by mass/10% by mass)" in (Formation of first organic layer) in Example D15.

By applying voltage to the light emitting device D21, EL emission was observed. At 0.15 mA/cm$^2$, the external quantum efficiency was 4.7[%] and CIE chromaticity coordinate (x,y)=(0.31,0.62).

<Example D22> Fabrication and Evaluation of Light Emitting Device D22

A light emitting device D22 was fabricated in the same manner as in Example D14 except that "the compound HM1, the compound T3 and the compound E1 (compound HM1/compound T3/compound E1=82% by mass/15% by mass/3% by mass)" were used instead of "the compound HM1, the compound T1 and the compound E1 (compound HM1/compound T1/compound E1=75% by mass/15% by mass/10% by mass)" in (Formation of first organic layer) in Example D14.

By applying voltage to the light emitting device D22, EL emission was observed. At 0.15 mA/cm$^2$, the external quantum efficiency was 8.1[%] and CIE chromaticity coordinate (x,y)=(0.32,0.61).

<Example D23> Fabrication and Evaluation of Light Emitting Device D23

A light emitting device D23 was fabricated in the same manner as in Example D14 except that "the compound HM1, the compound T3 and the compound E1 (compound HM1/compound T3/compound E1=84% by mass/15% by mass/1% by mass)" were used instead of "the compound HM1, the compound T1 and the compound E1 (compound HM1/compound T1/compound E1=75% by mass/15% by mass/10% by mass)" in (Formation of first organic layer) in Example D14.

By applying voltage to the light emitting device D23, EL emission was observed. At 0.15 mA/cm$^2$, the external quantum efficiency was 9.8[%] and CIE chromaticity coordinate (x,y)=(0.32,0.60).

<Example D24> Fabrication and Evaluation of Light Emitting Device D24

A light emitting device D24 was fabricated in the same manner as in Example D15 except that "the compound HM1, the compound T3 and the compound E1 (compound HM1/compound T3/compound E1=84% by mass/15% by mass/1 % by mass)" were used instead of "the compound HM1, the compound T1 and the compound E1 (compound HM1/compound T1/compound E1=75% by mass/15% by mass/10% by mass)" in (Formation of first organic layer) in Example D15.

By applying voltage to the light emitting device D24, EL emission was observed. At 0.15 mA/cm², the external quantum efficiency was 7.5[%] and CIE chromaticity coordinate (x,y)=(0.31,0.60).

<Example D25> Fabrication and Evaluation of Light Emitting Device D25

A light emitting device D25 was fabricated in the same manner as in Example D14 except that "the compound HM1, the compound T3 and the compound E1 (compound HM1/compound T3/compound E1=84% by mass/15% by mass/1% by mass)" were used instead of "the compound HM1, the compound T1 and the compound E1 (compound HM1/compound T1/compound E1=75% by mass/15% by mass/10% by mass)" in (Formation of first organic layer) in Example D14 and "the polymer compound HTL-5" was used instead of "the polymer compound HTL-13" in (Formation of second organic layer) in Example D14.

By applying voltage to the light emitting device D25, EL emission was observed. At 0.15 mA/cm², the external quantum efficiency was 12.1[%] and CIE chromaticity coordinate (x,y)=(0.32,0.59).

<Example D26> Fabrication and Evaluation of Light Emitting Device D26

A light emitting device D26 was fabricated in the same manner as in Example D14 except that "the compound HM1, the compound T3 and the compound E1 (compound HM1/compound T3/compound E1=84% by mass/15% by mass/1 % by mass)" were used instead of "the compound HM1, the compound T1 and the compound E1 (compound HM1/compound T1/compound E1=75% by mass/15% by mass/10% by mass)" in (Formation of first organic layer) in Example D14 and "the polymer compound HTL-6" was used instead of "the polymer compound HTL-13" in (Formation of second organic layer) in Example D14.

By applying voltage to the light emitting device D26, EL emission was observed. At 0.15 mA/cm², the external quantum efficiency was 6.3[%] and CIE chromaticity coordinate (x,y)=(0.32,0.59).

<Example D27> Fabrication and Evaluation of Light Emitting Device D27

A light emitting device D27 was fabricated in the same manner as in Example D14 except that "the compound HM1, the compound T5 and the compound E1 (compound HM1/compound T5/compound E1=75% by mass/15% by mass/10% by mass)" were used instead of "the compound HM1, the compound T1 and the compound E1 (compound HM1/compound T1/compound E1=75% by mass/15% by mass/10% by mass)" in (Formation of first organic layer) in Example D14.

By applying voltage to the light emitting device D27, EL emission was observed. At 0.15 mA/cm², the external quantum efficiency was 3.7[%] and CIE chromaticity coordinate (x,y)=(0.29,0.63).

<Example D28> Fabrication and Evaluation of Light Emitting Device D28

A light emitting device D28 was fabricated in the same manner as in Example D15 except that "the compound HM1, the compound T5 and the compound E1 (compound HM1/compound T5/compound E1=75% by mass/15% by mass/10% by mass)" were used instead of "the compound HM1, the compound T1 and the compound E1 (compound HM1/compound T1/compound E1=75% by mass/15% by mass/10% by mass)" in (Formation of first organic layer) in Example D15.

By applying voltage to the light emitting device D28, EL emission was observed. At 0.15 mA/cm², the external quantum efficiency was 3.2[%] and CIE chromaticity coordinate (x,y)=(0.29,0.64).

<Example D29> Fabrication and Evaluation of Light Emitting Device D29

A light emitting device D29 was fabricated in the same manner as in Example D14 except that "the compound HM1, the compound T8 and the compound E1 (compound HM1/compound T8/compound E1=75% by mass/15% by mass/10% by mass)" were used instead of "the compound HM1, the compound T1 and the compound E1 (compound HM1/compound T1/compound E1=75% by mass/15% by mass/10% by mass)" in (Formation of first organic layer) in Example D14.

By applying voltage to the light emitting device D29, EL emission was observed. At 0.15 mA/cm², the external quantum efficiency was 3.8[%] and CIE chromaticity coordinate (x,y)=(0.29,0.63)

<Example D30> Fabrication and Evaluation of Light Emitting Device D30

A light emitting device D30 was fabricated in the same manner as in Example D14 except that "the compound HM1, the compound T6 and the compound E1 (compound HM1/compound T6/compound E1=75% by mass/15% by mass/10% by mass)" were used instead of "the compound HM1, the compound T1 and the compound E1 (compound HM1/compound T1/compound E1=75% by mass/15% by mass/10% by mass)" in (Formation of first organic layer) in Example D14.

By applying voltage to the light emitting device D30, EL emission was observed. At 0.15 mA/cm², the external quantum efficiency was 4.8[%] and CIE chromaticity coordinate (x,y)=(0.29,0.63).

<Example D31> Fabrication and Evaluation of Light Emitting Device D31

A light emitting device D31 was fabricated in the same manner as in Example D15 except that "the compound HM1, the compound T6 and the compound E1 (compound HM1/compound T6/compound E1=75% by mass/15% by mass/10% by mass)" were used instead of "the compound HM1, the compound T1 and the compound E1 (compound HM1/compound T1/compound E1=75% by mass/15% by mass/10% by mass)" in (Formation of first organic layer) in Example D15.

By applying voltage to the light emitting device D31, EL emission was observed. At 0.15 mA/cm², the external quantum efficiency was 4.1[%] and CIE chromaticity coordinate (x,y)=(0.29,0.63)

<Comparative Example CD6> Fabrication and Evaluation of Light Emitting Device CD6

A light emitting device CD6 was fabricated in the same manner as in Example D14 except that "the compound HM1, the compound T6 and the compound E1 (compound HM1/compound T6/compound E1=75% by mass/15% by mass/10% by mass)" were used instead of "the compound HM1, the compound T1 and the compound E1 (compound HM1/compound T1/compound E1=75% by mass/15% by mass/10% by mass)" in (Formation of first organic layer) in Example D14 and "the polymer compound HTL-3" was used instead of "the polymer compound HTL-13" in (Formation of second organic layer) in Example D14.

By applying voltage to the light emitting device CD6, EL emission was observed. At 0.15 mA/cm², the external quantum efficiency was 1.6[%] and CIE chromaticity coordinate (x,y)=(0.29,0.62).

TABLE 5

|  | light emitting device | second organic layer material | second organic layer lowest triplet excited state | first organic layer composition | first organic layer composition ratio (% by mass) | external quantum efficiency [%] |
|---|---|---|---|---|---|---|
| Example D14 | D14 | crosslinked body of HTL-13 | 2.33 eV | HM-1/T1/E1 | 75/15/10 | 3.9 |
| Example D15 | D15 | crosslinked body of HTL-4 | 2.33 eV | HM-1/T1/E1 | 75/15/10 | 3.8 |
| Example D16 | D16 | crosslinked body of HTL-13 | 2.33 eV | HM-1/T2/E1 | 75/15/10 | 5.2 |
| Example D17 | D17 | crosslinked body of HTL-4 | 2.33 eV | HM-1/T2/E1 | 75/15/10 | 4.6 |
| Example D18 | D18 | crosslinked body of HTL-13 | 2.33 eV | HM-1/T4/E1 | 75/15/10 | 4.6 |
| Example D19 | D19 | crosslinked body of HTL-4 | 2.33 eV | HM-1/T4/E1 | 75/15/10 | 3.7 |
| Example D20 | D20 | crosslinked body of HTL-13 | 2.33 eV | HM-1/T3/E1 | 75/15/10 | 6.0 |
| Example D21 | D21 | crosslinked body of HTL-4 | 2.33 eV | HM-1/T3/E1 | 75/15/10 | 4.7 |
| Example D22 | D22 | crosslinked body of HTL-13 | 2.33 eV | HM-1/T3/E1 | 82/15/3 | 8.1 |
| Example D23 | D23 | crosslinked body of HTL-13 | 2.33 eV | HM-1/T3/E1 | 84/15/1 | 9.8 |
| Example D24 | D24 | crosslinked body of HTL-4 | 2.33 eV | HM-1/T3/E1 | 84/15/1 | 7.5 |
| Example D25 | D25 | crosslinked body of HTL-5 | 2.46 eV | HM-1/T3/E1 | 84/15/1 | 12.1 |
| Example D26 | D26 | crosslinked body of HTL-6 | 2.69 eV | HM-1/T3/E1 | 84/15/1 | 6.3 |
| Example D27 | D27 | crosslinked body of HTL-13 | 2.33 eV | HM-1/T5/E1 | 75/15/10 | 3.7 |
| Example D28 | D28 | crosslinked body of HTL-4 | 2.33 eV | HM-1/T5/E1 | 75/15/10 | 3.2 |
| Example D29 | D29 | crosslinked body of HTL-13 | 2.33 eV | HM-1/T8/E1 | 75/15/10 | 3.8 |
| Example D30 | D30 | crosslinked body of HTL-13 | 2.33 eV | HM-1/T6/E1 | 75/15/10 | 4.8 |
| Example D31 | D31 | crosslinked body of HTL-4 | 2.33 eV | HM-1/T6/E1 | 75/15/10 | 4.1 |
| Comparative Example CD6 | CD6 | HTL-3 | 2.33 eV | HM-1/T6/E1 | 75/15/10 | 1.6 |

\<Example D32\> Fabrication and Evaluation of Light Emitting Device D32

A light emitting device D32 was fabricated in the same manner as in Example D1 except that "the compound HM1 and the compound T7 (compound HM1/compound T7=85% by mass/15% by mass) were dissolved at a concentration of 2% by mass in chlorobenzene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1.

By applying voltage to the light emitting device D32, EL emission was observed. At 0.25 mA/cm$^2$, the external quantum efficiency was 5.0[%] and CIE chromaticity coordinate (x,y)=(0.32,0.59).

\<Comparative Example CD7\> Fabrication and Evaluation of Light Emitting Device CD7

A light emitting device CD7 was fabricated in the same manner as in Example D1 except that "the compound HM1 and the compound T7 (compound HM1/compound T7=85% by mass/15% by mass) were dissolved at a concentration of 2% by mass in chlorobenzene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1 and "the polymer compound HTL-2" was used instead of "the polymer compound HTL-5" in (Formation of second organic layer) in Example D1.

By applying voltage to the light emitting device CD7, EL emission was observed. At 0.25 mA/cm$^2$, the external quantum efficiency was 0.8[%] and CIE chromaticity coordinate (x,y)=(0.32,0.57).

\<Example D34\> Fabrication and Evaluation of Light Emitting Device D34

A light emitting device D34 was fabricated in the same manner as in Example D1 except that "the polymer compound HP-1 and the compound T9 (polymer compound HP-1/compound T9=85% by mass/15% by mass)" were used instead of "the polymer compound HP-1 and the compound T3 (polymer compound HP-1/compound T3=85% by mass/15% by mass)" in (Formation of first organic layer) in Example D1.

By applying voltage to the light emitting device D34, EL emission was observed. At 0.75 mA/cm$^2$, the external quantum efficiency was 1.7[%] and CIE chromaticity coordinate (x,y)=(0.24,0.40).

\<Example D35\> Fabrication and Evaluation of Light Emitting Device D35

A light emitting device D35 was fabricated in the same manner as in Example D1 except that "the polymer compound HP-2 and the compound T10 (polymer compound HP-2/compound T10=85% by mass/15%. by mass)" were used instead of "the polymer compound HP-1 and the compound T3 (polymer compound HP-1/compound T3=85% by mass/15% by mass)" in (Formation of first organic layer) in Example D1.

By applying voltage to the light emitting device D35, EL emission was observed. At 0.75 mA/cm$^2$, the external quantum efficiency was 3.4[%] and CIE chromaticity coordinate (x,y)=(0.17,0.31).

\<Example D36\> Fabrication and Evaluation of Light Emitting Device D36

A light emitting device D36 was fabricated in the same manner as in Example D1 except that "the polymer compound HP-2 and the compound T6 (polymer compound HP-2/compound T6=85% by mass/15% by mass)" were used instead of "the polymer compound HP-1 and the compound T3 (polymer compound HP-1/compound T3=85% by mass/15% by mass)" in (Formation of first organic layer) in Example D1.

By applying voltage to the light emitting device D36, EL emission was observed. At 0.75 mA/cm$^2$, the external quantum efficiency was 4.3[%] and CIE chromaticity coordinate (x,y)=(0.18,0.36)

\<Example D37\> Fabrication and Evaluation of Light Emitting Device D37

A light emitting device D37 was fabricated in the same manner as in Example D1 except that "the polymer compound HP-2 and the compound T6 (polymer compound

TABLE 6

| | | second organic layer | first organic layer | | external |
|---|---|---|---|---|---|
| | light emitting device | material | lowest triplet excited state | composition | composition ratio (% by mass) | quantum efficiency [%] |
| Example D32 | D32 | HTL-5 | 2.46 | HM-1/T7 | 85/15 | 5.0 |
| Comparative Example CD7 | CD7 | HTL-2 | 2.16 | HM-1/T7 | 85/15 | 0.8 |

\<Example D33\> Fabrication and Evaluation of Light Emitting Device D33

A light emitting device D33 was fabricated in the same manner as in Example D1 except that "the polymer compound HP-2 and the compound T9 (polymer compound HP-2/compound T9=85% by mass/15% by mass)" were used instead of "the polymer compound HP-1 and the compound T3 (polymer compound HP-1/compound T3=85% by mass/15% by mass)" in (Formation of first organic layer) in Example D1.

By applying voltage to the light emitting device D33, EL emission was observed. At 0.75 mA/cm$^2$, the external quantum efficiency was 1.7[%] and CIE chromaticity coordinate (x,y)=(0.24,0.41).

HP-2/compound T6=85% by mass/15% by mass)" were used instead of "the polymer compound HP-1 and the compound T3 (polymer compound HP-1/compound T3=85% by mass/15% by mass)" in (Formation of first organic layer) in Example D1 and "the polymer compound HTL-4" was used instead of "the polymer compound HTL-5" in (Formation of second organic layer) in Example D1.

By applying voltage to the light emitting device D37, EL emission was observed. At 0.75 mA/cm$^2$, the external quantum efficiency was 2.4[%] and CIE chromaticity coordinate (x,y)=(0.24,0.40).

<Example D38> Fabrication and Evaluation of Light Emitting Device D38

A light emitting device D38 was fabricated in the same manner as in Example D1 except that "the polymer compound HP-1 and the compound T5 (polymer compound HP-1/compound T5=85% by mass/15% by mass)" were used instead of "the polymer compound HP-1 and the compound T3 (polymer compound HP-1/compound T3=85% by mass/15% by mass)" in (Formation of first organic layer) in Example D1.

By applying voltage to the light emitting device D38, EL emission was observed. At 0.75 mA/cm$^2$, the external quantum efficiency was 1.8[%] and CIE chromaticity coordinate (x,y)=(0.24,0.47).

<Example D39> Fabrication and Evaluation of Light Emitting Device D39

A light emitting device D39 was fabricated in the same manner as in Example D1 except that "the polymer compound HP-2 and the compound T1 (polymer compound HP-2/compound T1=85% by mass/15% by mass)" were used instead of "the polymer compound HP-1 and the compound T3 (polymer compound HP-1/compound T3=85% by mass/15% by mass)" in (Formation of first organic layer) in Example D1.

By applying voltage to the light emitting device D39, EL emission was observed. At 0.75 mA/cm$^2$, the external quantum efficiency was 3.3[%] and CIE chromaticity coordinate (x,y)=(0.24,0.46).

<Example D40> Fabrication and Evaluation of Light Emitting Device D40

A light emitting device D40 was fabricated in the same manner as in Example D1 except that "the polymer compound HP-1 and the compound T1 (polymer compound HP-1/compound T1=85% by mass/15% by mass)" were used instead of "the polymer compound HP-1 and the compound T3 (polymer compound HP-1/compound T3=85% by mass/15% by mass)" in (Formation of first organic layer) in Example D1.

By applying voltage to the light emitting device D40, EL emission was observed. At 0.75 mA/cm$^2$, the external quantum efficiency was 2.7[%] and CIE chromaticity coordinate (x,y)=(0.24,0.47).

<Example D41> Fabrication and Evaluation of Light Emitting Device D41

A light emitting device D41 was fabricated in the same manner as in Example D1 except that "the compound HM1 and the compound T9 (compound HM1/compound T9=85% by mass/15% by mass) were dissolved at a concentration of 2% by mass in toluene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1.

By applying voltage to the light emitting device D41, EL emission was observed. At 0.75 mA/cm$^2$, the external quantum efficiency was 1.2[%] and CIE chromaticity coordinate (x,y)=(0.17,0.24).

<Example D42> Fabrication and Evaluation of Light Emitting Device D42

A light emitting device D42 was fabricated in the same manner as in Example D1 except that "the compound HM1 and the compound T1 (compound HM1/compound T1=85% by mass/15% by mass) were dissolved at a concentration of 2% by mass in toluene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1.

By applying voltage to the light emitting device D42, EL emission was observed. At 0.75 mA/cm$^2$, the external quantum efficiency was 1.5[%] and CIE chromaticity coordinate (x,y)=(0.26,0.47).

<Example D43> Fabrication and Evaluation of Light Emitting Device D43

A light emitting device D43 was fabricated in the same manner as in Example D1 except that "the compound HM1 and the compound T2 (compound HM1/compound T2=85% by mass/15% by mass) were dissolved at a concentration of 1.8% by mass in chlorobenzene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1.

By applying voltage to the light emitting device D43, EL emission was observed. At 0.75 mA/cm$^2$, the external quantum efficiency was 2.1[%] and CIE chromaticity coordinate (x,y)=(0.18,0.27).

<Example D44> Fabrication and Evaluation of Light Emitting Device D44

A light emitting device D44 was fabricated in the same manner as in Example D1 except that "the compound HM1 and the compound T11 (compound HM1/compound T11=85% by mass/15% by mass) were dissolved at a concentration of 2% by mass in toluene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1.

By applying voltage to the light emitting device D44, EL emission was observed. At 0.75 mA/cm$^2$, the external quantum efficiency was 2.8[%] and CIE chromaticity coordinate (x,y)=(0.14,0.09).

<Example D45> Fabrication and Evaluation of Light Emitting Device D45

A light emitting device D45 was fabricated in the same manner as in Example D1 except that "the compound HM1 and the compound T11 (compound HM1/compound T11=85% by mass/15% by mass) were dissolved at a concentration of 2% by mass in toluene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1 and "the polymer compound HTL-13" was used instead of "the polymer compound HTL-5" in (Formation of second organic layer) in Example D1.

By applying voltage to the light emitting device D45, EL emission was observed. At 0.75 mA/cm$^2$, the external quantum efficiency was 5.5[%] and CIE chromaticity coordinate (x,y)=(0.14,0.09).

<Example D46> Fabrication and Evaluation of Light Emitting Device D46

A light emitting device D46 was fabricated in the same manner as in Example D1 except that "the compound HM1 and the compound T11 (compound HM1/compound T11=85% by mass/15% by mass) were dissolved at a concentration of 2% by mass in toluene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1 and "the polymer compound HTL-4" was used instead of "the polymer compound HTL-5" in (Formation of second organic layer) in Example D1.

By applying voltage to the light emitting device D46, EL emission was observed. At 0.75 mA/cm$^2$, the external quantum efficiency was 4.4[%] and CIE chromaticity coordinate (x,y)=(0.14,0.09).

<Example D47> Fabrication and Evaluation of Light Emitting Device D47

A light emitting device D47 was fabricated in the same manner as in Example D1 except that "the polymer compound HP-2 and the compound T11 (polymer compound HP-2/compound T11=85% by mass/15% by mass)" were used instead of "the polymer compound HP-1 and the compound T3 (polymer compound HP-1/compound T3=85% by mass/15% by mass)" in (Formation of first organic layer) in Example D1 and "the polymer compound HTL-7" was used instead of "the polymer compound HTL-5" in (Formation of second organic layer) in Example D1.

By applying voltage to the light emitting device D47, EL emission was observed. At 0.75 mA/cm$^2$, the external quantum efficiency was 6.3[%] and CIE chromaticity coordinate (x,y)=(0.14,0.22)

<Example D48> Fabrication and Evaluation of Light Emitting Device D48

A light emitting device D48 was fabricated in the same manner as in Example D1 except that "the polymer compound HP-2 and the compound T11 (polymer compound HP-2/compound T11=85% by mass/15% by mass)" were used instead of "the polymer compound HP-1 and the compound T3 (polymer compound HP-1/compound T3=85% by mass/15% by mass)" in (Formation of first organic layer) in Example D1.

By applying voltage to the light emitting device D48, EL emission was observed. At 0.75 mA/cm$^2$, the external quantum efficiency was 6.6[%] and CIE chromaticity coordinate (x,y)=(0.15,0.26)

<Example D49> Fabrication and Evaluation of Light Emitting Device D49

A light emitting device D49 was fabricated in the same manner as in Example D1 except that "the polymer compound HP-2 and the compound T11 (polymer compound HP-2/compound T11=85% by mass/15% by mass)" were used instead of "the polymer compound HP-1 and the compound T3 (polymer compound HP-1/compound T3=85% by mass/15% by mass)" in (Formation of first organic layer) in Example D1 and "the polymer compound HTL-4" was used instead of "the polymer compound HTL-5" in (Formation of second organic layer) in Example D1.

By applying voltage to the light emitting device D49, EL emission was observed. At 0.75 mA/cm$^2$, the external quantum efficiency was 8.6[%] and CIE chromaticity coordinate (x,y)=(0.15,0.28).

<Comparative Example CD8> Fabrication and Evaluation of Light Emitting Device CD8

A light emitting device CD8 was fabricated in the same manner as in Example D1 except that "the compound HM1 and the compound T1 (compound HM1/compound T1=85% by mass/15% by mass) were dissolved at a concentration of 2% by mass in toluene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1 and "the polymer compound HTL-2" was used instead of "the polymer compound HTL-5" in (Formation of second organic layer) in Example D1.

By applying voltage to the light emitting device CD8, EL emission was observed. At 0.75 mA/cm$^2$, the external quantum efficiency was 0.7[%] and CIE chromaticity coordinate (x,y)=(0.20,0.30).

<Comparative Example CD9> Fabrication and Evaluation of Light Emitting Device CD9

A light emitting device CD9 was fabricated in the same manner as in Example D1 except that "the compound HM1 and the compound T1 (compound HM1/compound T1=85% by mass/15% by mass) were dissolved at a concentration of 2% by mass in toluene." instead of "the polymer compound HP-1 and the compound T3 (polymer compound HP-1/compound T3=85% by mass/15% by mass) were dissolved at a concentration of 1.8% by mass in xylene." in (Formation of first organic layer) in Example D1 and "the polymer compound HTL-3" was used instead of "the polymer compound HTL-5" in (Formation of second organic layer) in Example D1.

By applying voltage to the light emitting device CD9, EL emission was observed. At 0.75 mA/cm$^2$, the external quantum efficiency was 0.5[%] and CIE chromaticity coordinate (x,y)=(0.31,0.48).

<Comparative Example CD10> Fabrication and Evaluation of Light Emitting Device CD10

A light emitting device CD10 was fabricated in the same manner as in Example D1 except that "the polymer compound HP-1 and the compound T12 (polymer compound HP-1/compound T12=85% by mass/15% by mass)" were used instead of "the polymer compound HP-1 and the compound T3 (polymer compound HP-1/compound T3=85% by mass/15% by mass)" in (Formation of first organic layer) in Example D1.

By applying voltage to the light emitting device CD10, EL emission was observed. At 0.75 mA/cm², the external quantum efficiency was 0.7[%] and CIE chromaticity coordinate (x,y)=(0.19,0.21).

TABLE 7

| | | second organic layer | | first organic layer | | external |
|---|---|---|---|---|---|---|
| | light emitting device | material | lowest triplet excited state | composition | composition ratio (% by mass) | quantum efficiency [%] |
| Example D33 | D33 | crosslinked body of HTL-5 | 2.46 eV | HP-2/T9 | 85/15 | 1.7 |
| Example D34 | D34 | crosslinked body of HTL-5 | 2.46 eV | HP-1/T9 | 85/15 | 1.7 |
| Example D35 | D35 | crosslinked body of HTL-5 | 2.46 eV | HP-2/T10 | 85/15 | 3.4 |
| Example D36 | D36 | crosslinked body of HTL-5 | 2.46 eV | HP-2/T6 | 85/15 | 4.3 |
| Example D37 | D37 | crosslinked body of HTL-4 | 2.33 eV | HP-2/T6 | 85/15 | 2.4 |
| Example D38 | D38 | crosslinked body of HTL-5 | 2.46 eV | HP-1/T5 | 85/15 | 1.8 |
| Example D39 | D39 | crosslinked body of HTL-5 | 2.46 eV | HP-2/T1 | 85/15 | 3.3 |
| Example D40 | D40 | crosslinked body of HTL-5 | 2.46 eV | HP-1/T1 | 85/15 | 2.7 |
| Example D41 | D41 | crosslinked body of HTL-5 | 2.46 eV | HM-1/T9 | 85/15 | 1.2 |
| Example D42 | D42 | crosslinked body of HTL-5 | 2.46 eV | HM-1/T1 | 85/15 | 1.5 |
| Example D43 | D43 | crosslinked body of HTL-5 | 2.46 eV | HM-1/T2 | 85/15 | 2.1 |
| Example D44 | D44 | crosslinked body of HTL-5 | 2.46 eV | HM-1/T11 | 85/15 | 2.8 |
| Example D45 | D45 | crosslinked body of HTL-13 | 2.33 eV | HM-1/T11 | 85/15 | 5.5 |
| Example D46 | D46 | crosslinked body of HTL-4 | 2.33 eV | HM-1/T11 | 85/15 | 4.4 |
| Example D47 | D47 | crosslinked body of HTL-7 | 2.49 eV | HP-2/T11 | 85/15 | 6.3 |
| Example D48 | D48 | crosslinked body of HTL-5 | 2.46 eV | HP-2/T11 | 85/15 | 6.6 |
| Example D49 | D49 | crosslinked body of HTL-4 | 2.33 eV | HP-2/T11 | 85/15 | 8.6 |
| Comparative Example D8 | CD8 | crosslinked body of HTL-2 | 2.16 eV | HM-1/T1 | 85/15 | 0.7 |
| Comparative Example CD9 | CD9 | HTL-3 | 2.33 eV | HM-1/T1 | 85/15 | 0.5 |
| Comparative Example CD10 | CD10 | crosslinked body of HTL-5 | 2.46 eV | HM-1/T12 | 85/15 | 0.7 |

INDUSTRIAL APPLICABILITY

According to the present invention, it is possible to provide a light emitting device excellent in external quantum efficiency and a composition useful for production of the light emitting device.

The invention claimed is:

1. A light emitting device having an anode, a cathode, a first organic layer disposed between the anode and the cathode and a second organic layer disposed between the anode and the cathode, wherein,
said first organic layer is a layer containing a compound (T) in which the absolute value of the difference between the energy level at the lowest triplet excited state and the energy level at the lowest singlet excited state is 0.5 eV or less and not containing a phosphorescent metal complex,
said second organic layer is a layer containing a crosslinked body of a polymer compound containing a crosslink constitutional unit and the energy level at the lowest triplet excited state of the polymer compound is 2.25 eV or more, and
said compound (T) is a compound represented by the formula (T-1):

(T-1)

wherein,
$n^{T1}$ represents an integer of 0 or more and 5 or less, when a plurality of $n^{T1}$ are present, they may be the same or different,
$Ar^{T1}$ represents an aryl group, a substituted amino group or a monovalent hetero ring group, and these groups optionally have a substituent, when a plurality of $Ar^{T1}$ are present, they may be the same or different and may be bonded directly or bonded via a divalent group to form a ring, however, at least one of $Ar^{T1}$ is a substituted amino group or a monovalent hetero ring group containing a nitrogen atom having no double bond in the ring and not containing a group represented by =N—, a boron atom, a group represented by —C(=$z^{T1}$)—, a group represented by —S(=O)—, a group represented by —S(=O)$_2$— and a group represented by the formula (P):

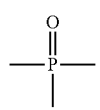

(P)

in the ring, $Z^{T1}$ represents an oxygen atom, a sulfur atom or a group represented by =N($R^{ZT1}$)—, $R^{ZT1}$ represents a hydrogen atom, an alkyl group, a cycloalkyl group, an aryl group or a monovalent hetero ring group, and these groups optionally have a substituent,
$L^{T1}$ represents an alkylene group, a cycloalkylene group, an arylene group, a divalent hetero ring group, a group represented by —N($R^{T1'}$)—, an oxygen atom or a sulfur atom, and these groups optionally have a substituent, $R^{T1'}$, represents a hydrogen atom, an alkyl group, a cycloalkyl group, an aryl group or a monovalent hetero ring group, and these groups optionally have a substituent, when a plurality of $L^{T1}$ are present, they may be the same or different and may be bonded directly or bonded via a divalent group to form a ring,
$Ar^{T2}$ is a boron atom, a group represented by —C(=$Z^{T1}$)—, a group represented by —S(=O)—, a group represented by —S(=O)$_2$—, a group represented by said formula (P), an aromatic hydrocarbon group having an electron withdrawing group or a hetero ring group containing a group represented by =N— in the ring, and these groups optionally have a substituent,
$n^{T2}$ represents an integer of 1 or more and 15 or less, when $Ar^{T2}$ is a boron atom or a group represented by said formula (P), $n^{T2}$ is 3 while when $Ar^{T2}$ is a group represented by —C(=$Z^{T1}$)—, a group represented by —S(=O)— or a group represented by —S(=O)$_2$-, $n^{T2}$ is 2,)
$Ar^{T1}$ and $L^{T1}$ may be bonded directly or bonded via a divalent group to form a ring, $Ar^{T2}$ and $L^{T1}$ may be bonded directly or bonded via a divalent group to form a ring, and $Ar^{T1}$ and $Ar^{T2}$ may be bonded directly or bonded via a divalent group to form a ring.

2. The light emitting device according to claim 1, wherein said crosslink constitutional unit is a constitutional unit having at least one crosslink group selected from Group A of crosslink group, wherein Group A is a crosslink group selected from the group consisting of:

(XL-1)

(XL-2)

(XL-3)

(XL-4)

(XL-5)

(XL-6)

(XL-7)

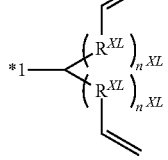

(XL-8) 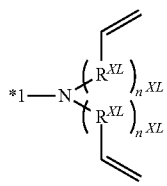

(XL-9) 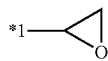

(XL-10) 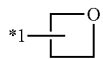

(XL-11) 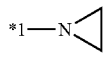

(XL-12) 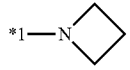

(XL-13) 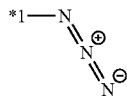

(XL-14) 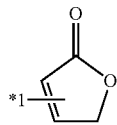

(XL-15) 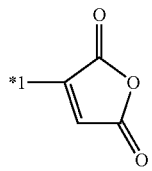

(XL-16) 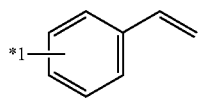

(XL-17) 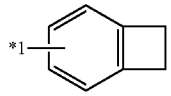

wherein, $R^{XL}$ represents a methylene group, an oxygen atom or a sulfur atom, and $n^{XL}$ represents an integer of 0 to 5, when a plurality of $R^{XL}$ are present, they may be the same or different, when a plurality of $n^{XL}$ are present, they may be the same or different, *1 represents a binding position, and these crosslink groups optionally have a substituent.

3. The light emitting device according to claim 2, wherein said crosslink constitutional unit is a constitutional unit represented by the formula (2) or a constitutional unit represented by the formula (2'):

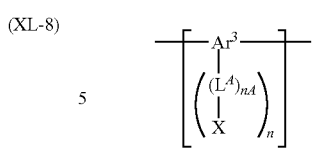 (2)

wherein, nA represents an integer of 0 to 5, and n represents 1 or 2, when a plurality of nA are present, they may be the same or different, $Ar^3$ represents an aromatic hydrocarbon group or a hetero ring group, and these groups optionally have a substituent, $L^A$ represents an alkylene group, a cycloalkylene group, an arylene group, a divalent hetero ring group, a group represented by —N(R')—, an oxygen atom or a sulfur atom, and these groups optionally have a substituent, R' represents a hydrogen atom, an alkyl group, a cycloalkyl group, an aryl group or a monovalent hetero ring group, and these groups optionally have a substituent, when a plurality of $L^A$ are present, they may be the same or different, X represents a crosslink group selected from said Group A of crosslink group, when a plurality of X are present, they may be the same or different,

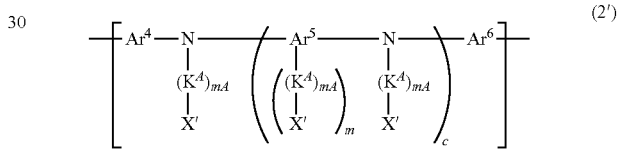 (2')

wherein, mA represents an integer of 0 to 5, m represents an integer of 1 to 4 and c represents 0 or 1, when a plurality of mA are present, they may be the same or different, $Ar^5$ represents an aromatic hydrocarbon group, a hetero ring group or a group in which at least one aromatic hydrocarbon ring and at least one hetero ring are bonded directly, and these groups optionally have a substituent, $Ar^4$ and $Ar^6$ each independently represent an arylene group or a divalent hetero ring group, and these groups optionally have a substituent, $Ar^4$, $Ar^5$ and $Ar^6$ each may be bonded directly or bonded via an oxygen atom or a sulfur atom to a group other than this group, bonded to a nitrogen atom to which the group is attached, to form a ring, $K^A$ represents an alkylene group, a cycloalkylene group, an arylene group, a divalent hetero ring group, a group represented by —N(R')—, an oxygen atom or a sulfur atom, and these groups optionally have a substituent, R' represents the same meaning as described above, when a plurality of $K^A$ are present, they may be the same or different, X' represents a crosslink group selected from said Group A of crosslink group, a hydrogen atom, an alkyl group, a cycloalkyl group, an aryl group or a monovalent hetero ring group, and these groups optionally have a substituent, when a plurality of X' are present, they may be the same or different, however, at least one X' is a crosslink group selected from said Group A of crosslink group.

4. The light emitting device according to claim 1, wherein at least one of said $Ar^{T1}$ is a group represented by the formula (T1-1):

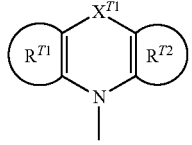

(T1-1)

wherein,
the ring $R^{T1}$ and the ring $R^{T2}$ each independently represent an aromatic hydrocarbon ring not containing a group represented by —C(=$Z^{T1}$)— in the ring or a hetero ring not containing a group represented by =N—, a boron atom, a group represented by —C(=$z^{T1}$)—, a group represented by —S(=O)—, a group represented by —S(=O)$_2$— and a group represented by said formula (P) in the ring, and these rings optionally have a substituent, $Z^{T1}$ represents the same meaning as described above, $X^{T1}$ represents a single bond, an oxygen atom, a sulfur atom, a group represented by —N($R^{XT1}$)— or a group represented by —C($R^{XT1'}$)$_2$-, $R^{XT1}$ and $R^{XT1'}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and these groups optionally have a substituent, a plurality of $R^{XT1}$, may be the same or different and may be combined together to form a ring together with carbon atoms to which they are attached, $R^{XT1}$ and the substituent which the ring $R^{T1}$ optionally has, $R^{XT1}$ and the substituent which the ring $R^{T2}$ optionally has, $R^{XT1'}$, and the substituent which the ring $R^{T1}$ optionally has, and $R^{XT1'}$ and the substituent which the ring $R^{T2}$ optionally has each may be bonded directly or bonded via a divalent group to form a ring together with atoms to which they are attached.

5. The light emitting device according to claim 4, wherein said group represented by the formula (T1-1) is a group represented by the formula (T1-1A), a group represented by the formula (T1-1B), a group represented by the formula (T1-1C) or a group represented by the formula (T1-1D):

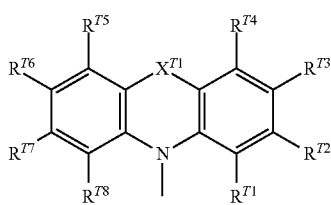

(T1-1A)

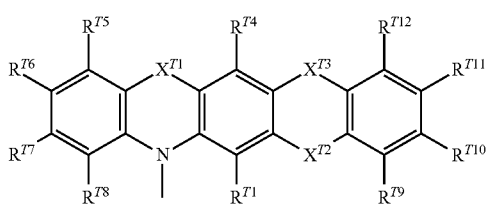

(T1-1B)

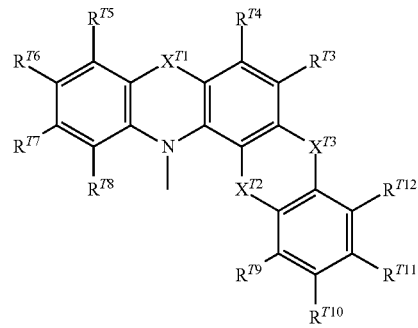

(T1-1C)

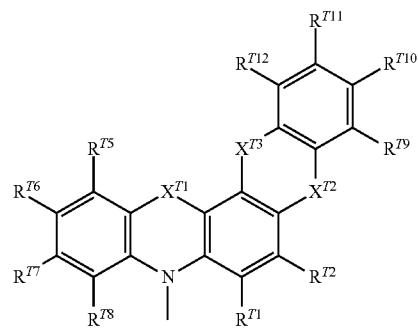

(T1-1D)

wherein,
$X^{T1}$ represents the same meaning as described above,
$X^{T2}$ and $X^{T3}$ each independently represent a single bond, an oxygen atom, a sulfur atom, a group represented by —N($R^{XT2}$)— or a group represented by —C($R^{XT2'}$)$_2$-, $R^{XT2}$ and $R^{XT2'}$, each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and these groups optionally have a substituent, a plurality of $R^{XT2'}$ may be the same or different and may be bonded directly or bonded via a divalent group to form a ring together with carbon atoms to which they are attached, $R^{T1}$, $R^{T2}$, $R^{T3}$, $R^{T4}$, $R^{T5}$, $R^{T6}$, $R^{T7}$, $R^{T8}$, $R^{T9}$, $R^{T10}$, $R^{T11}$ and $R^{T12}$ each independently represent a hydrogen atom, an alkyl group, a cycloalkyl group, an alkoxy group, a cycloalkoxy group, an aryl group, an aryloxy group, a monovalent hetero ring group, a substituted amino group, a halogen atom or a cyano group, and these groups optionally have a substituent, $R^{T1}$ and $R^{T2}$ $R^{T2}$ and $R^{T3}$ $R^{T3}$ and $R^{T4}$, $R^{T5}$ and $R^{T6}$ $R^{T6}$ and $R^{T7}$, $R^{T7}$ and $R^{T8}$, $R^{T9}$ and $R^{T10}$ and $R^{T10}$ and $R^{T11}$, and $R^{T11}$ and $R^{T12}$ may each be combined directly or combined via a divalent group to form a ring together with carbon atoms to which they are attached.

6. The light emitting device according to claim 1, wherein said $Ar^{T2}$ is a hetero ring group containing a group represented by =N— in the ring, wherein the group optionally has a substituent.

7. The light emitting device according to claim 6, wherein said $Ar^{T2}$ is a group obtained by removing from a diazole ring, a triazole ring, an oxadiazole ring, a thiadiazole ring, a thiazole ring, an oxazole ring, an isothiazole ring, an isooxazole ring, a benzodiazole ring, a benzotriazole ring, a benzooxadiazole ring, a benzothiadiazole ring, a benzothiazole ring, a benzooxazole ring, an azacarbazole ring, a diazacarbazole ring, a pyridine ring, a diazabenzene ring, a triazine ring, an azanaphthalene ring, a diazanaphthalene ring, a triazanaphthalene ring, a tetraazanaphthalene ring, an azaanthracene ring, a diazaanthracene ring, a triazaanthracene ring, a tetraazaanthracene ring, an azaphenanthrene ring, a diazaphenanthrene ring, a triazaphenanthrene ring or a tetraazaphenanthrene ring one hydrogen atom bonding directly to an atom constituting the ring, the group optionally having a substituent.

8. The light emitting device according to claim 1, wherein the oscillator strength of said compound (T) is 0.0001 or more.

9. The light emitting device according to claim 1, wherein said first organic layer further contains at least one selected from the group consisting of a host material, a hole transporting material, a hole injection material, an electron transporting material, an electron injection material, a fluorescent light emitting material and an antioxidant.

10. The light emitting device according to claim 1, wherein said first organic layer and said second organic layer are adjacent.

11. The light emitting device according to claim 1, wherein said second organic layer is a layer disposed between said anode and said first organic layer.

12. A composition comprising a compound (T) in which the absolute value of the difference between the energy level at the lowest triplet excited state and the energy level at the lowest singlet excited state is 0.5 eV or less and a polymer compound containing a constitutional unit represented by the formula (Y) and not comprising a phosphorescent metal complex:

(Y)

wherein, Ar$^{Y1}$ represents an arylene group, a divalent hetero ring group or a divalent group in which at least one arylene group and at least one divalent hetero ring group are bonded directly, and these groups optionally have a substituent.

13. A light emitting device having an anode, a cathode, a first organic layer disposed between the anode and the cathode and a second organic layer disposed between the anode and the cathode, wherein said first organic layer is a layer containing the composition according to claim 12.

14. A light emitting device having an anode, a cathode, a first organic layer disposed between the anode and the cathode and a second organic layer disposed between the anode and the cathode, wherein,
said first organic layer is a layer containing a compound (T) in which the absolute value of the difference between the energy level at the lowest triplet excited state and the energy level at the lowest singlet excited state is 0.5 eV or less and not containing a phosphorescent metal complex,
said second organic layer is a layer containing a cross-linked body of a polymer compound containing a crosslink constitutional unit and the energy level at the lowest triplet excited state of the polymer compound is 2.25 eV or more, and
the oscillator strength of said compound (T) is 0.0001 or more.

15. The light emitting device according to claim 14, wherein said first organic layer further contains at least one selected from the group consisting of a host material, a hole transporting material, a hole injection material, an electron transporting material, an electron injection material, a fluorescent light emitting material and an antioxidant.

16. The light emitting device according to claim 14, wherein said first organic layer and said second organic layer are adjacent.

17. The light emitting device according to claim 14, wherein said second organic layer is a layer disposed between said anode and said first organic layer.

18. The light emitting device according to claim 14, wherein said crosslink constitutional unit is a constitutional unit having at least one crosslink group selected from Group A of crosslink group, wherein Group A is a crosslink group selected from the group consisting of:

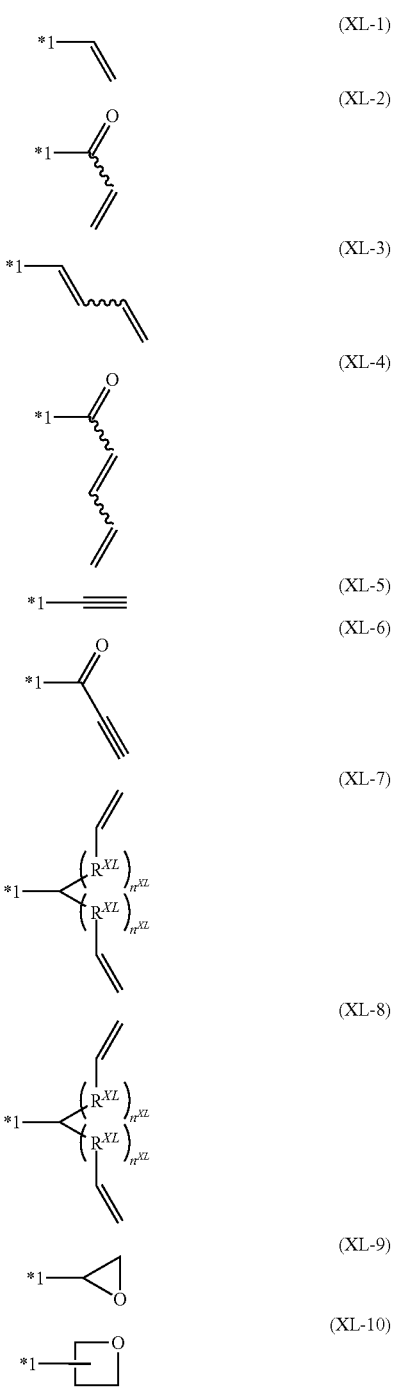

-continued (XL-11)
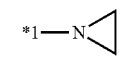

(XL-12)
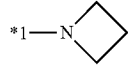

(XL-13)
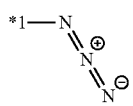

(XL-14)
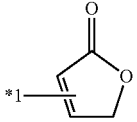

(XL-15)
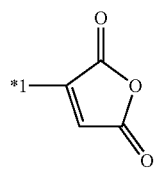

(XL-16)
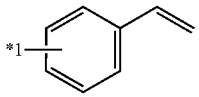

(XL-17)
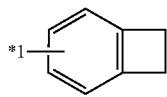

wherein, $R^{XL}$ represents a methylene group, an oxygen atom or a sulfur atom, and $n^{XL}$ represents an integer of 0 to 5, when a plurality of $R^{XL}$ are present, they may be the same or different, when a plurality of $n^{XL}$ are present, they may be the same or different, *1 represents a binding position, and these crosslink groups optionally have a substituent.

19. The light emitting device according to claim 18, wherein
said crosslink constitutional unit is a constitutional unit represented by the formula (2) or a constitutional unit represented by the formula (2'):

(2)
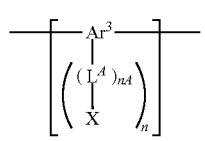

wherein,
nA represents an integer of 0 to 5, and n represents 1 or 2, when a plurality of nA are present, they may be the same or different, $Ar^3$ represents an aromatic hydrocarbon group or a hetero ring group, and these groups optionally have a substituent, $L^A$ represents an alkylene group, a cycloalkylene group, an arylene group, a divalent hetero ring group, a group represented by —N(R')—, an oxygen atom or a sulfur atom, and these groups optionally have a substituent, R' represents a hydrogen atom, an alkyl group, a cycloalkyl group, an aryl group or a monovalent hetero ring group, and these groups optionally have a substituent, when a plurality of $L^A$ are present, they may be the same or different, X represents a crosslink group selected from said Group A of crosslink group, when a plurality of X are present, they may be the same or different, (2')
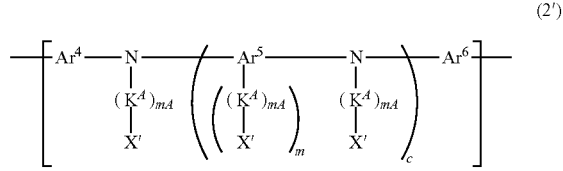

wherein,
mA represents an integer of 0 to 5, m represents an integer of 1 to 4 and c represents 0 or 1, when a plurality of mA are present, they may be the same or different, $Ar^5$ represents an aromatic hydrocarbon group, a hetero ring group or a group in which at least one aromatic hydrocarbon ring and at least one hetero ring are bonded directly, and these groups optionally have a substituent, $Ar^4$ and $Ar^6$ each independently represent an arylene group or a divalent hetero ring group, and these groups optionally have a substituent, $Ar^4$ $Ar^5$ and $Ar^6$ each may be bonded directly or bonded via an oxygen atom or a sulfur atom to a group other than this group, bonded to a nitrogen atom to which the group is attached, to form a ring, $K^A$ represents an alkylene group, a cycloalkylene group, an arylene group, a divalent hetero ring group, a group represented by —N(R')—, an oxygen atom or a sulfur atom, and these groups optionally have a substituent, R' represents the same meaning as described above, when a plurality of $K^A$ are present, they may be the same or different, X' represents a crosslink group selected from said Group A of crosslink group, a hydrogen atom, an alkyl group, a cycloalkyl group, an aryl group or a monovalent hetero ring group, and these groups optionally have a substituent, when a plurality of X' are present, they may be the same or different, however, at least one X' is a crosslink group selected from said Group A of crosslink group.

* * * * *